United States Patent
Ishida et al.

(10) Patent No.: US 6,661,839 B1
(45) Date of Patent: Dec. 9, 2003

(54) METHOD AND DEVICE FOR COMPRESSING AND EXPANDING DATA PATTERN

(75) Inventors: Masahiro Ishida, Sendai (JP); Takahiro Yamaguchi, Sendai (JP); Marco Tilgner, Sendai (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/194,220

(22) PCT Filed: Mar. 24, 1998

(86) PCT No.: PCT/JP98/01273

§ 371 (c)(1),
(2), (4) Date: Nov. 20, 1998

(87) PCT Pub. No.: WO98/43359

PCT Pub. Date: Oct. 1, 1998

(51) Int. Cl.$^7$ ................................................. H04B 1/66
(52) U.S. Cl. ........................ 375/240; 375/224; 714/738; 341/51
(58) Field of Search ................................ 375/240, 224; 714/738, 741; 341/51

(56) References Cited

U.S. PATENT DOCUMENTS

| | | | |
|---|---|---|---|
| 3,787,669 A | 1/1974 | Muehldorf | 235/152 |
| 4,706,265 A | 11/1987 | Furukawa | |
| 5,467,087 A | 11/1995 | Chu | 341/51 |
| 5,535,311 A | 7/1996 | Zimmerman | 395/114 |
| 5,581,177 A | 12/1996 | Hussey et al. | |
| 6,327,687 B1 * | 12/2001 | Rajski et al. | 714/738 |

FOREIGN PATENT DOCUMENTS

| | | |
|---|---|---|
| DE | 4423186 A | 1/1995 |
| EP | 0180469 A | 7/1986 |
| EP | 0696114 | 2/1996 |

(List continued on next page.)

OTHER PUBLICATIONS

P. M. Fenwick, "The Burrows–Wheeler Transform for Block Sorting Text Compression: Principles and Improvements," The Computer Journal, Council of European Processional Informatics Societies, vol. 39 (No. 9), p. 731–740, (Jun. 26, 1996).

Hidetoshi Yokoo and Masaharu Takahashi, "Data Compression by Context Sorting," IEICE Transactions on Fundamentals of Electronics, Communications and Computer Sciences, Engineering Sciences Society (Japan), vol. E79A (No. 5), p. 681–686, (May 5, 1996).

Omusha, Electronics Magazine, p. 52–53, (Mar. 1, 1996).

J. Ziv and A. Lempel, "Compression of Individual Sequences via Variable–Rate Coding," IEEE Trnaactions on Information Theory, vol. IT24 (No. 5), p. 530–536, (Sep. 1, 1978).

J. Ziv and A. Lempel, "A Universla Algorithm for Sequential Data Compression," IEEE Transactions on Information Theory, vol. IT23 (No. 3), p. 337–343, (May 1, 1977).

Panos Nasiopoulos, et al.: "Adaptive Compression Coding," IEEE Transactions on Communications, US, IEEE Inc., New York, vol. 39, No. 8, pp. 1245–1254.

(List continued on next page.)

*Primary Examiner*—Temesghen Ghebretinsae
(74) *Attorney, Agent, or Firm*—David N. Lathrop, Esq.; Gallagher & Lathrop

(57) ABSTRACT

There are provided methods each of which is for efficiently compressing a test pattern to be applied to an IC for testing. The number of data changes $\phi$ and a data entropy H of a pattern for each pin of an IC are obtained and then the test pattern is divided and the divided patterns are distributed to a block for $\phi$ that is equal to or less than a threshold value $\phi_M$ ($\phi<\phi_M$), a block for $\phi>\phi_M$ and for H that is equal to or less than a threshold value $H_M$ ($H<H_M$), and a block for $H>H_M$ (411). The block for $\phi<\phi_M$ is compressed by a run length compressing method, the block for $\phi>\phi_M$ and $H<H_M$ is compressed by the run length compressing method after application of Burrows wheeler transform, and the block for $H>H_M$ is compressed by an LZ compressing method.

53 Claims, 74 Drawing Sheets

FOREIGN PATENT DOCUMENTS

| | | | |
|---|---|---|---|
| GB | 2280963 | A | 2/1995 |
| JP | 61-107818 | A | 5/1986 |
| JP | 62-82723 | A | 4/1987 |
| JP | 62-98919 | A | 5/1987 |
| JP | 62-98921 | A | 5/1987 |
| JP | 62118642 | | 5/1987 |
| JP | 62-118642 | A | 5/1987 |
| JP | 1-93217 | A | 12/1989 |
| JP | 2-34038 | A | 2/1990 |
| JP | 2034038 | | 2/1990 |
| JP | 04043720 | | 2/1992 |
| JP | 61-3569 | A | 1/1996 |
| JP | 8-146088 | A | 6/1996 |

OTHER PUBLICATIONS

Burrows, Mr., et al.: "A Block–Sorting Lossless Data Compression Algorithm", SRC Research report, XX, XX, May 10, 1994, pp. 1–18.

Tilgner, M., et al.: "Recursive block structured data compression," Proceedings DCC '97. Data Compression Conference (Cat. No. 97TB100108), Proceedings DCC '97 Data Compression Conference, Snowbird, UT, USA Mar. 25–27 1994; p. 471 XP002147470 1997, Los Alamitos, CA, USA, IEEE Comput. Soc. Press, USA ISBN: 0–8186–7761–9.

Yamaguchi, T., et al.: "An efficient method for compressing test data" Proceedings. International Test Conference 1997 (IEEE Cat. No. 97CH36126), Proceedings International Test Conference 1997, Washington, D.C. USA, Nov. 1–6, 1997, pp. 79–88, XP000946220 1997, Washington. DC, USA, Int. test Conference USA ISBN: 0–7803–4209–7.

Nasiopoulos, Panos; et al., "Adaptive compression coding," IEEE Transactions on Communications, US, IEEE Inc. New York, vol. 39, No. 8, Aug. 1991.

\* cited by examiner

FIG. 1

|  | PIN 1 | PIN 2 | PIN 3 | PIN 4 | PIN 5 | PIN 6 |
|---|---|---|---|---|---|---|
| PATTERN 1 | 0 | 0 | 1 | × | × | × |
| PATTERN 2 | 0 | 0 | × | 1 | × | 1 |
| PATTERN 3 | 0 | × | × | 1 | × | × |
| PATTERN 4 | 0 | × | 1 | 1 | × | 1 |
| PATTERN 5 | 0 | × | 1 | 1 | × | × |
| PATTERN 6 | 0 | × | 0 | × | × | 0 |

PATTERN 1 row → TEST VECTOR

PIN 6 column → TEST SEQUENCE

1 : HIGH LEVEL SIGNAL
0 : LOW LEVEL SIGNAL
× : DON'T CARE

|  | PIN 1 | PIN 2 | PIN 3 | PIN 4 | PIN 5 | PIN 6 |
|---|---|---|---|---|---|---|
| PATTERN 1 | 0 | 0 | 1 | × | × | × |
| PATTERN 2 | 0 | 0 | × | 1 | × | 1 |
| PATTERN 3 | 0 | × | × | 1 | × | × |
| PATTERN 4 | 0 | × | 1 | 1 | × | 1 |
| PATTERN 5 | 0 | × | 1 | 1 | × | × |
| PATTERN 6 | 0 | × | 0 | × | × | 0 |

(b)  $\phi_{max} = 2$ (c)  $\phi = [\ 0\ \ 1\ \ 3\ \ 2\ \ 0\ \ 5\ ]$ (d)

|  | BLOCK 1 |  |  | BLOCK 2 |  |
|---|---|---|---|---|---|
| 0 | 0 | × | × | 1 | × |
| 0 | 0 | 1 | × | × | 1 |
| 0 | × | 1 | × | × | × |
| 0 | × | 1 | × | 1 | 1 |
| 0 | × | 1 | × | 1 | × |
| 0 | × | × | × | 0 | 0 |
|  | ($\phi \leq \phi_{max}$) |  |  | ($\phi > \phi_{max}$) |  |

|  | PIN 1 | PIN 2 | PIN 3 | PIN 4 | PIN 5 | PIN 6 |
|---|---|---|---|---|---|---|
| PATTERN 1 | 0 | 0 | 1 | X | X | X |
| PATTERN 2 | 0 | 0 | X | 1 | X | 1 |
| PATTERN 3 | 0 | X | X | 1 | X | X |
| PATTERN 4 | 0 | X | 1 | 1 | X | 1 |
| PATTERN 5 | 0 | X | 1 | 1 | X | X |
| PATTERN 6 | 0 | X | 0 | X | X | 0 |

(b) $H_{max} = 1.0$ (c) $H = [\, 0.0 \;\; 0.92 \;\; 1.46 \;\; 0.92 \;\; 0.0 \;\; 1.46 \,]$ (d)

| | BLOCK 1 | | | BLOCK 2 | |
|---|---|---|---|---|---|
| 0 | 0 | X | X | 1 | X |
| 0 | 0 | 1 | X | X | 1 |
| 0 | X | 1 | X | X | X |
| 0 | X | 1 | X | 1 | 1 |
| 0 | X | 1 | X | 1 | X |
| 0 | X | X | X | 0 | 0 |

$(H \leq H_{max})$   $(H > H_{max})$

| i | $T^{i-1}[I]$ | $S[i]=F[T^{i-1}[I]]$ |
|---|---|---|
| 1 | 2 | a |
| 2 | 4 | b |
| 3 | 6 | r |
| 4 | 3 | a |
| 5 | 5 | c |
| 6 | 1 | a |

| i | $T^{i-1}[I]$ | $S[i]=F[T^{i-1}[I]]$ |
|---|---|---|
| 1 | 2 | a |
| 2 | 4 | b |
| 3 | 6 | r |
| 4 | 3 | a |
| 5 | 5 | c |
| 6 | 1 | a |

METHOD AND DEVICE FOR COMPRESSING AND EXPANDING DATA PATTERN

TECHNICAL FIELD

The present invention relates to a method of compressing a data to be compressed such as a test pattern used for testing, for example, a semiconductor integrated circuit (IC), a method of expanding such data, an apparatus for compressing such data, and an apparatus for expanding such data. In addition, the present invention relates to a compressing method, an expanding method, a compressing apparatus and an expanding apparatus for compressing and expanding a test pattern used for testing a large scale semiconductor integrated circuit (LSI) by each pin basis of a large scale semiconductor integrated circuit (hereinafter referred to as LSI).

BACKGROUND ART

In an IC testing apparatus (commonly called IC tester) for testing a semiconductor integrated circuit (hereinafter referred to as IC), the data quantity or volume of test patterns applied to an IC to be tested (IC under test) becomes extensive. Therefore, the extensive test pattern data are compressed to be transmitted and the compressed test pattern data are expanded at a receiving side to reconstruct original test pattern data which are applied to an IC under test. As a method for compressing test patterns or other extensive data, a Lempel Ziv's algorithm (LZ compressing method) which utilizes a dictionary, a Huffman's algorithm (Huffman compressing method) which utilizes statistical characteristics of the data, or variations of those various compressing methods have conventionally been used in a data compressing apparatus. Each of those compressing methods is a single compressing method and each of the data compressing apparatus applies this single compressing method to all the data to be compressed to perform the compression of those data.

However, since each data such as a test pattern has a uniform data type and is composed of a plurality of unit data sequences but a considerably different data structure or a statistical characteristic from each other, an efficient compression has not been possible depending on the data to be used. For example, when each of different portions within a same data is significantly different from each other in terms of the pattern structure or the statistical characteristic, a high compression efficiency can be obtainable for a certain portion but the compression efficiency becomes low for remaining portions. As a result, the compression rate is relatively low for the entire data. In addition, regarding the processing time, since the processing time is different depending on the structure of a data, an optimum processing time has not been attained.

There has been proposed, from this stand point, a data compression wherein a test pattern is divided into blocks each having a different data structure or a statistical characteristic from the others and an appropriate compressing method is applied to each block to compress the data.

However, since, in this data compressing method, the test pattern to be compressed is compressed in a block basis, it is required that the data expansion is also performed in a block basis. Therefore, it is impossible, in this compressing method, to expand the compressed test pattern in a real time basis.

Further, talking about the microprocessors produced by Intel Corporation as example, the number of pins has increased year by year as the integration degree is improved as seen in the models 4004 in 1971 having 16 pins, 80286 in 1982 having 68 pins, 80386 in 1985 having 132 pins, 80486 in 1989 having 168 pins, Pentium in 1993 having 296 pins, and Pentium Pro. in 1995 having 387 pins. As a result, an automatic IC test system (ATE) has also been shifted to a system wherein the hardware of a testing apparatus corresponds to a pin (per-pin system). This is because, with the per-pin architecture, the automatic IC testing system can flexibly cope with the increasing number of pins.

In order to solve the test pattern problems described above, there are required a per-pin compressing apparatus and a per-pin expanding apparatus wherein a test pattern is handled in the state that the test pattern is divided into a plurality of data each corresponding to a pin. The per-pin architecture has advantages such as (a) since the test data each corresponding to each pin can be down loaded into an internal memory of an automatic test system at the same time, the down loading time of a compressed test pattern can be reduced, (b) since management of the compressing apparatus and the expanding apparatus is simplified, the automatic test system can flexibly cope with increase of the number of pins of an IC.

A conventional automatic IC testing system (hereinafter referred to as ATE) holds therein a test pattern for testing an IC in a pattern generator. Therefore, in the ATE, a very long time is required for down loading a test pattern from a disk drive storing the test pattern therein to a pattern generator of the ATE. For example, approximately one hour is required, in case of a down loading via a network, for down loading a test pattern having approximately one (1) G bytes (giga bytes). Therefore, it is a serious problem to be solved to decrease the down loading time and to improve an availability factor of the ATE.

DISCLOSURE OF THE INVENTION

It is an object of the present invention to provide a data compressing method wherein the data to be compressed having data portions, which are called hereinafter as unit data sequences and each of which has a different structure or a different statistical characteristic is divided into the unit data sequences which are distributed into a plurality of blocks each corresponding to one of those factors of data structure and structural characteristics of data and the unit data sequences distributed to the respective blocks can efficiently be compressed by applying optimum compressing methods to the respective blocks.

It is another object of the present invention to provide a data expanding method wherein the respective data sequences divided into a plurality of blocks and compressed can be expanded and reconstructed to the original data without any information loss.

It is still another object of the present invention to provide a test pattern compressing method and a test pattern compressing apparatus wherein a test pattern is divided into test sequences each corresponding to each pin of a semiconductor integrated circuit and the test pattern to be compressed can efficiently be compressed by measuring the structure or the statistical characteristic of the data to apply an optimum compressing method to each test sequence.

It is still another object of the present invention to provide a test pattern expanding method and a test pattern expanding apparatus wherein respective test sequences for each pin of a semiconductor integrated circuit compressed by the above compressing method or compressing apparatus can be expanded to the original test pattern data in real time basis for each pin without any information loss.

It is yet still another object of the present invention to provide a test pattern compressing method and a test pattern expanding method wherein data sequences divided into a plurality of blocks is compressed by applying an optimum compressing method to each of the blocks and the compressed data divided into those plurality of blocks can be reconstructed to the original data from the respective blocks without any information loss.

It is yet still another object of the present invention to provide an automatic test system of a semiconductor integrated circuit wherein a down loading time of a test pattern is reduced using the test pattern compressing apparatus and/or the test pattern expanding apparatus.

The data compressing method according to the present invention is characterized in that in a compressing method wherein an input data having a redundancy, for example, a test pattern data, is divided into test sequences and compressed in each pin basis of a semiconductor integrated circuit, the data compressing method comprises the steps of: dividing each input data into a plurality of data portions, namely unit data sequences, to distribute each portion to one of blocks in accordance with at least one one of factors of the data structure or the statistical characteristic of the data; and applying an appropriate compressing method to each of the blocks; whereby a proper compression can be obtained for all the data.

The data expanding method according to the present invention comprises the steps of: dividing the input compressed data from data compressing step according to any preceding data compressing method into a plurality of compressed unit data sequences and distributing them into a plurality of blocks in accordance with the structure of the compressed data; and applying an appropriate expanding method to each of the blocks; whereby the compressed data can be reconstructed to the original data without any information loss.

In a datacompressing method of a preferred embodiment, the dividing step includes the steps of: calculating a threshold value of the number of data changes for dividing the input data into unit data sequences; counting the number of data changes of each the divided unit data sequence of the input data; comparing the actual number of data changes with the threshold value; and distributing a divided unit data sequence to one of the plurality of blocks in accordance with the comparison result; whereby the input data can be divided into proper blocks.

In the data compressing method of another preferred embodiment, the dividing step includes the step of: calculating a threshold value of entropy for dividing the input data into blocks; measuring an appearing probability of each symbol in the input data to calculate a data entropy from the appearing probabilities of symbols; comparing an actual data entropy with the threshold value; and distributing a divided data portion to one of the plurality of blocks in accordance with the comparison result; whereby the input data can be divided into proper blocks.

In the data compressing method of still preferred another embodiment, the dividing step is a step wherein the number of data changes is counted for the input data and the input data is divided into blocks in accordance with the number of data changes; a run length compressing method is applied, in the step of applying the appropriate compressing method, to a block having smaller number of data changes than the threshold value; and respective proper compressing methods are applied to the other blocks; whereby a proper compression can be obtained for all the data.

In a data expanding method of a preferred embodiment, the dividing step for expanding the compressed data is characterized in that the compressed data is divided into a data block of compressed unit sequences compressed by the run length compressing method and a data block of compressed unit data sequences compressed by the other plurality of compressing methods and the divided compressed unit data sequences compressed by the run length compressing method are expanded by a run length expanding method in the step of applying the appropriate expanding method; whereby the compressed data is reconstructed to the original data without any information loss.

In the data expanding method of still preferred another embodiment, the data expanding method is characterized in that there is included therein a step for performing Burrows Wheeler transform (hereinafter referred to as BW transform) at least once for the block divided in the dividing step and having high periodicity data; the run length compressing method is applied, in the compressing step, to the data transformed by BW transform; and respective appropriate compressing methods are applied to the other blocks; whereby a proper compression is obtained for all the data.

In the data expanding method of preferred another embodiment, the dividing step for expanding a compressed data is characterized in that the compressed data is divided into unit data sequence compressed by the run length compressing method after the compressed data is transformed by BW transform and unit data sequences compressed by the other compressing methods; the unit data sequence compressed by the run length compressing method after BW transform is applied is expanded by the run length expanding method in the step of applying an appropriate expanding method and thereafter, inverse BW transform is applied to the unit data sequence compressed by the run length compressing method by the number of application times of the BW transform; whereby the compressed data is reconstructed to the original data without any information loss.

In the data compressing method of still preferred another embodiment, the data compressing method is characterized in that a Huffman compressing method is applied, in the step for applying an appropriate compressing method, to the block having an entropy smaller than a threshold value among the blocks divided in the dividing step and respective appropriate compressing methods are applied to the other blocks: whereby a proper compression can be obtained for all the data.

In the data expanding method of still preferred another embodiment, the data expanding method is characterized in that a compressed data is divided into unit data sequences compressed by the Huffman compressing method and unit data sequences compressed by the other compressing methods; and a Huffman expanding method is applied, in the step of applying an appropriate expanding method, to the unit data sequences compressed by the Huffman compressing method; whereby the data can be reconstructed to the original data without any information loss.

In the data compressing method of still preferred another embodiment, the data compressing method is characterized in that an LZ compressing method is applied, in the step of applying an appropriate compressing method, to the block having a small entropy among the divided blocks; and respective optimum compressing methods are applied to the other blocks; whereby a proper compression can be obtained for all the data.

In the data expanding method of still preferred another embodiment, the data expanding method is characterized in that a compressed data is divided into unit data sequences compressed by the LZ compressing method and unit data sequences compressed by the other compressing methods; and an LZ expanding method is applied, in the step of applying an appropriate expanding method, to the unit data sequences compressed by the LZ compressing method; whereby the compressed data can be reconstructed to the original data without any information loss.

In the data compressing method of still preferred another embodiment, the data compressing method is characterized in that an arithmetic coding compressing method is applied, in the step of applying an appropriate compressing method, to the block having a small entropy among the divided blocks; and respective appropriate compressing methods are applied to the other blocks; whereby an optimum compression can be obtained for all the data.

In the data expanding method of still preferred another embodiment, the data expanding method is characterized in that the compressed data is divided, in the dividing step, into data compressed by an arithmetic coding compressing method and data compressed by the other compressing methods; and an arithmetic coding expanding method is applied, in the step of applying an appropriate expanding method, to the data compressed by the arithmetic coding compressing method; whereby the compressed data can be reconstructed to the original data without any information loss.

In the data compressing method of still preferred another embodiment, the dividing step includes the steps of: inputting environmental parameters for a proper block division; and calculating a threshold value of the number of data changes for the block division using the inputted environmental parameters; whereby an optimum block division can be performed.

In the data compressing method of still preferred another embodiment, the dividing step includes the steps of inputting environmental parameters for an appropriate block division, and using the inputted environmental parameters to calculate a threshold value of an entropy for a block division.

In the data compressing method of still preferred another embodiment, the data compressing method includes the steps of calculating a threshold value of the number of data changes for a data division, and using the calculated threshold value to estimate a compression rate of the inputted data and to optimize the threshold value so that the compression rate is maximized, whereby an optimum block division can be made possible using the optimized threshold value in the dividing step.

In the data compressing method of still preferred embodiment, the data compressing method is characterized in that the data compressing method comprises the steps of calculating a threshold value of entropy for a data division, and using the calculated threshold value to estimate a compression rate of the inputted data and to optimize the threshold value so that the compression rate is maximized, and in that the optimized threshold value is used in the dividing step, whereby an optimum block division can be made possible.

A test pattern compressing apparatus according to the present invention is characterized in that the test pattern compressing apparatus comprises dividing means for dividing an inputted test pattern into test sequences each corresponding to a pin of an integrated circuit under test, and test sequence compressing means for selecting an appropriate compressing method in accordance with a data structure of each test sequence to compress the test sequence for each pin, whereby the maximum compression rate for all the data can be obtained. In this test pattern compressing apparatus, a test pattern is inputted thereto and data each being compressed in a pin basis can be collectively outputted or can be outputted in the sequence of compression.

In the test pattern compressing method of further preferred another embodiment, the test pattern compressing method comprises the steps of dividing an inputted test pattern into test sequences each corresponding to a pin of an integrated circuit under test, and selecting an appropriate compressing method in accordance with a data structure of each test sequence to compress the test sequence for each pin.

In the test pattern compressing apparatus of further preferred another embodiment, the test sequence compressing means is provided for each pin, and those test sequence compressing means operate in parallel to output compressed data in parallel.

In the test pattern compressing method of still preferred another embodiment, the compressing steps are performed in parallel for respective test sequences divided in pin basis. A high speed and highly efficient compression can be obtained.

The test pattern expanding apparatus according to the present invention comprises compressed data dividing means for dividing an inputted compressed data into compressed data each corresponding to each pin of an integrated circuit under test, and test sequence expanding means for selecting an appropriate expanding method in accordance with a flag indicating a compressing method for each divided compressed data and for applying the selected expanding method thereto.

In the test pattern expanding method of still preferred another embodiment, the test pattern expanding method comprises the steps of dividing an inputted compressed data into compressed data each corresponding to each pin of an integrated circuit under test, and selecting an appropriate expanding method in accordance with a flag indicating a compressing method for each divided compressed data and applying the selected expanding method thereto.

The test pattern expanding apparatus according to the present invention is characterized in that the test pattern expanding apparatus comprises the test sequence expanding means each being for each pin and those test sequence expanding means operate in parallel.

In the test pattern expanding method of further preferred another embodiment, the expanding steps are performed in parallel in respective pin basis.

The test sequence compressing means in the test pattern compressing apparatus according to the present invention comprises compressing method determining means for determining a proper compressing method adapted for an inputted test sequence, run length compressing means for compressing a test sequence using a run length compressing method, and BWT run length compressing means for applying a run length compression after applying BW transform at least once to the test sequence.

This test pattern compressing apparatus also includes, as compressing means, means for using an LZ compressing method, a Huffman compressing method, an arithmetic coding compressing method, and the like as compressing means of further other compressing methods.

The test pattern compressing method according to the present invention comprises, in the test sequence compressing step, the steps of determining a proper compressing method to be applied to an inputted test sequence, and applying the run length compressing method or applying the run length compressing method after applying BW transform one or more times (herein after referred to as a BWT run length compressing method), or applying any one of the other compressing methods (an LZ compressing method, a Huffman compressing method, an arithmetic coding compressing method and the like) to a test sequence to perform a compression of the test sequence.

The test sequence expanding apparatus in the test pattern expanding apparatus according to the present invention comprises compressing method determining means for determining whether a compressed data is a data compressed by the run length compressing method, a data compressed by the BWT run length compressing method or a data compressed by one of the other compressing methods such as the LZ compressing method, run length expanding means for performing an expansion of the compressed data using the run length expanding method, repetitive inverse BW transform means for applying inverse BW transform at least once to a data expanded by the run length expanding means to perform a data transform, and other expanding means for performing expansions of the compressed data using expanding methods corresponding to the other compressing methods.

The test pattern expanding method according to the present invention comprises the steps of determining, in the step of expanding the test sequence, whether a compressed data is a data compressed by the run length compressing method, a data compressed by the BWT run length compressing method or a data compressed by one of the other compressing methods such as the LZ compressing method, and selecting a proper expanding method corresponding to the compressing method for the compressed data to apply the selected expanding method to the compressed data.

The compressing method determining means in the test pattern compressing apparatus according to the present invention comprises BW transform optimizing means for calculating the proper number of times which is appropriate for applying BW transform to a test sequence, threshold value storage means for storing a threshold value of compression rate, compression rate comparator means for comparing the maximum value of compression rate obtained by the BW transform optimizing means with the threshold value stored in the threshold value storage means, and compressing method selecting means for selecting, in accordance with a comparison result obtained by the compression rate comparator means and the optimum number of times of applying BW transform obtained by the BW transform optimizing means, as to whether the test sequence should be compressed by the run length compressing method, by the BWT run length compressing method, or one of the other compressing methods such as LZ compressing method.

The BW transform optimizing means in the compressing method determining means comprises the steps of applying BW transform to a test sequence, measuring the number of data changes of a transformed data by applying BW transform, calculating a compression rate from the number of data changes, and obtaining the maximum value of compression rate and the number of application times of BW transform at which the compression rate is maximized.

A semiconductor integrated circuit automatic test system using the test pattern compressing apparatus and the test pattern expanding apparatus according to the present invention has a large capacity storage device (for example, a disk drive) for storing compressed test pattern data, a pattern generator for storing test pattern data and for generating test patterns, and test pattern expanding means for completely reconstructing the compressed test pattern data to the original test pattern without any information loss, whereby a test pattern down loading time can be reduced.

The semiconductor integrated circuit automatic test system comprises a large capacity storage device (for example, a disk drive) for storing compressed test pattern data, a pattern generator for storing the test pattern data and generating test patterns, and a plurality of test sequence expanding means each for completely reconstructing a test sequence data compressed in each pin basis to an original test pattern in parallel for respective pins without any information loss.

BRIEF DESCRIPTION OF THE DRAWINGS

FIG. 1 is a diagram showing an example of test patterns used in a first embodiment and a second embodiment of the present invention;

FIG. 8 is a diagram showing each example of test patterns, a threshold value of the number of data changes, the number of data changes for each pin, and blocks of division result;

FIG. 11 is a diagram showing each example of test patterns, a threshold value of entropy of input data, and blocks of division result in the processing procedure in FIG. 10;

BEST MODES FOR CARRYING OUT THE INVENTION

Figure 2:
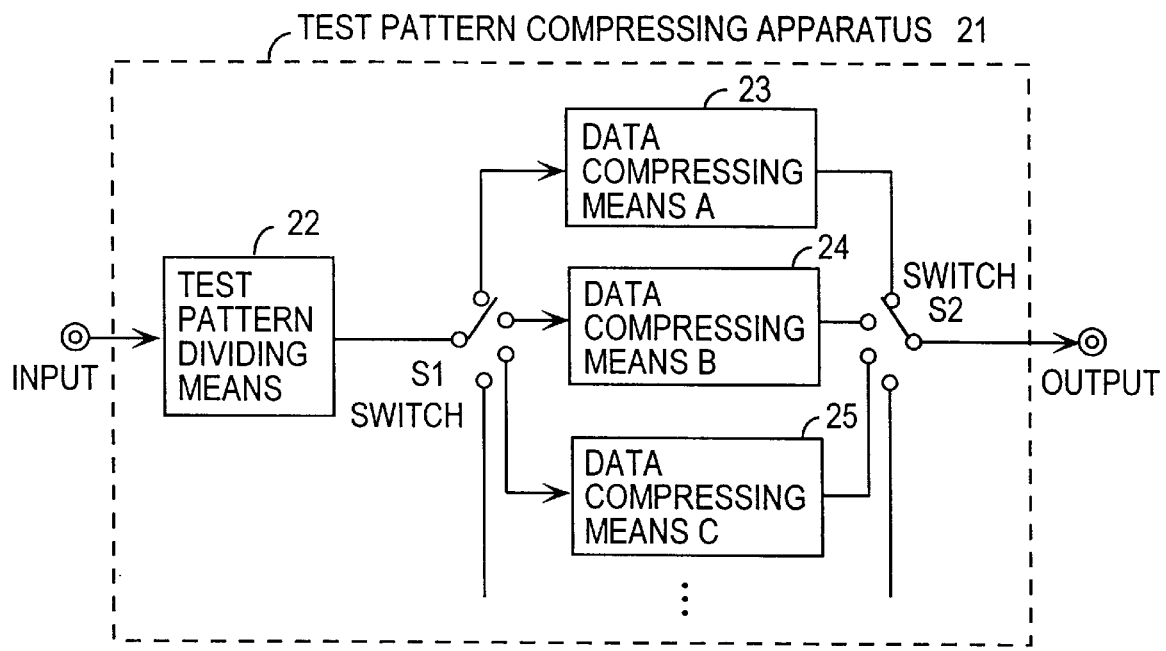
FIG. 2 is a block diagram showing an example of a functional construction of a test pattern compressing apparatus used in the first embodiment of the present invention.

Embodiments of the present invention will be explained in detail below with reference to the appended drawings.

Further, in order to simplify the explanation below, there will be explained examples in which the present invention is applied to the compression of a test pattern to be applied to an IC and to the expansion of the compressed test pattern to be applied to an IC for testing. However, it is needless to say that the present invention can be applied to the compression and the expansion of a data other than a test pattern to be applied to an IC.

A test pattern for testing a complex IC is usually generated in order to test certain specific modules within an IC. Therefore, there is a characteristic that only test patterns for specific pins of an IC corresponding to the specific modules frequently change and test patterns for most of the other pins change few.

Consequently, in a first aspect of the present invention, a test pattern is divided, by paying attention to the data structure or the statistical characteristic of data, such as the number of data changes and the like of an input test pattern, into test sequences, which are then distributed to respective blocks each having related characteristics. Then an appropriate compressing method is applied to each block so that an efficient compression rate can be obtained.

FIG. 1 shows an example of a test pattern to be applied to an IC. In FIG. 1, lateral direction (left to right direction) is a pin array direction of an IC and longitudinal direction (top to bottom-direction) is a sequence direction of test patterns. That is, in the example of FIG. 1, pattern 1 is first applied to pin 1 through pin 6 of an IC. Then test patterns are applied to the IC in the sequence of pattern 2, pattern 3, . . . . In addition, a test pattern is represented by three symbols 1, 0 and X wherein 1 indicates a high level signal, 0 indicates a low level signal and X indicates a "don't care" signal. That is, X may be either a high level signal or a low level signal and therefore indicates a signal which does not influence a test of an IC.

When a run length compressing method is used for a block division, a threshold value of the number of data changes of a test sequence is first calculated by estimating a compressed data size. Next, the number of data changes of a test sequence for each pin is counted. This actual number of data changes is compared with the threshold value. The test pattern is divided into a plurality of test sequences, some of which are delivered to a block having the number of data changes less than the threshold value and the other of which are delivered to the other block having the number of data changes greater than the threshold value. The run length compressing method is applied to the block having the number of data changes less than the threshold value and one of the other appropriate compressing methods is applied to the other block. Thus, an efficient compression can be performed.

For an estimating calculation of a threshold value $\phi_{max}$ of the number of data changes in the run length compressing method, a minimum value $\alpha$ of an allowable compression rate is given and a maximum value $\phi_{max}$ satisfying the following formula is obtained.

$$\|\log_2|A|\| \|M/\alpha \geq \phi_{max}\| \log_2\{(|A|-1) M\}\|+\| \log_2(\phi_{Max}+2)\| \quad (1)$$

In this formula, M is a sequence length of a test pattern in calculating the number of data changes and $|A|$ is size of a set of symbols appearing in a test pattern.

For example, in the case of a test pattern having 100 pins and 10000 sequences consisting of three signal kinds of "0" low level signal, "1" high level signal and "X" Don't care signal, M is M=10000 and $|A|$ is $|A|=3$. In addition, the symbol $\|x\|$ means a minimum integer equal to or greater than x.

By comparing the threshold value obtained as described above with the actual number of data changes, a plurality of test sequences each having different number of data changes can be obtained.

Further, when an attention is paid to an entropy of an input data, namely test sequence, an appearing probability $p_i$ (i=1, ..., N) of a symbol appearing in data is measured and an entropy H of the input data is obtained using the following formula.

$$H = -\Sigma_{i=1,N} P_i \log_2 p_i \quad (2)$$

Next, a threshold value of entropy is calculated by estimating a compression rate of the compressed data. For example, when Huffman's algorithm is used for a threshold value calculation, a threshold value of entropy $H_{max}$ is obtained, by giving a minimum allowable compression rate α, by the following formula.

$$H_{max} \leq \| \log_2 |A| \| / \alpha \quad (3)$$

By comparing this threshold value with an actual entropy, a test pattern is divided into test sequences each having an entropy less than the threshold value and test sequences each having an entropy larger than the threshold value. A Huffman compressing method or an arithmetic coding compressing method is applied to a block of the test sequences each having an entropy less than the threshold value and one of the other appropriate compressing methods is applied to the other block of the test sequences each having an entropy larger than the threshold value. Thus, an efficient compression can be obtained.

In a second aspect of the present invention, a test pattern is divided into test sequences each being for each pin, and an optimum compressing method is applied, by paying attention to the data structure or statistical characteristic of an input test pattern data such as the number of data changes, to each of the test sequences. Thus, an efficient compression rate can be obtained.

Further, in the test pattern shown in FIG. 1, a row of the test pattern is referred to as a test vector and a column of the test pattern is referred to as a test sequence for a certain pin.

When an optimum compressing method to be applied to a test sequence is determined, a test sequence is transformed by applying BW transform a predetermined number of times n=N to measure the number of data changes $\phi_i$ (i=0, 1, ..., N) for each of 0th BW transform through Nth BW transform. BW transform is described in a paper by Burrows M. and Wheeler D. entitled "A Block-sorting Lossless, Data Compression Algorithm, SRC Research Report 124" Digital Systems Research Center, Palo Alto, Calif., May, 1994.

In this case, the number of data changes represents the number of times that two adjacent data change in a data string like 0 to 1 or 1 to X. Then, a compression rate, when the data transformed by BW transform is compressed by a run length compressing method, is calculated from the number of data changes $\phi_i$, and the maximum value of the compression rate $R_{max}$ and the number of times for applying BW transform m by which the compression rate is maximized are acquired.

Then, the acquired maximum value $R_{max}$ of the compression rate is compared with a threshold value of the compression rate $R_{th}$ which is experimentally set. If the maximum value of the compression rate is equal to or grater than the threshold value, a test sequence is transformed m times by BW transform and thereafter the run length compressing method is applied to the test sequence for compression. In this case, if the number of application times of BW transform m is zero (0), BW transform is not applied to the test sequence and only the run length compressing method is applied thereto for compression. If the maximum value of the compression $R_{max}$ is less than the threshold value $R_{th}$, only the LZ compressing method is applied to the test sequence for compression. In such a way, an efficient compression can be performed by applying an optimum compressing method to the test sequence.

Further, in the present invention, since a test pattern is divided into test sequences each being for each pin, a compression of each test sequence is made possible. Therefore, a real time test pattern expansion can be performed by using an expanding apparatus for each pin.

In order to calculate a compression rate Ri when a data transformed i times by BW transform using the number of data changes is compressed by the run length compressing method, the compression rate Ri is obtained by the following formula using the number of data changes $\phi_i$ and the number of application times of BW transform.

$$R_i = \log_2 |A| L / [i(\log_2 L) + \phi_i \{\log_2\{(|A|-1) L)\}] + \log_2(L-1) + \log_2 |A|] \quad (4)$$

In this case, L is a length of a test sequence and |A| is a size of a set of symbols appearing in a test pattern.

For example, in the case of a test pattern having 100 pins and 10000 sequences consisting of three signal kinds of "0" low level signal, "1" high level signal and "X" Don't care signal, L is L=10000 and |A| is |A|=3. In addition, a symbol [x] means a minimum integer greater than x.

From the compression rate $R_i$ (i=0, 1, ..., N) obtained by a method as described above, the maximum compression rate $R_{max}$ and the number of application times m of BW transform by which the compression rate is maximized are acquired. By comparing the $R_{max}$ with the threshold value $R_{th}$, an optimum compressing method can be determined.

Since, as described above, each test sequence can be compressed by an optimum compressing method, an entire test pattern can be efficiently compressed. Therefore, by compressing data in a test pattern to a smaller data using the compressing method according to the present invention, data transmission time can be reduced. As a result, a reduction of a down loading time of a test pattern can be made possible.

Examples of applying the block dividing method to a test pattern will be explained in detail by showing specific examples.

FIG. 2 is a block diagram showing an example of a functional construction of the test pattern compressing apparatus used in a first embodiment of the present invention. This test pattern compressing apparatus 21 comprises test pattern dividing means 22 for dividing a test pattern into a plurality of blocks in accordance with a data structure or a statistical characteristic of an inputted test pattern and a plurality of data compressing means A23, B24, C25, ..., for compressing the divided data.

Next, the operations for compressing a test pattern using this test pattern compressing apparatus 21 will be explained.

Figure 3:
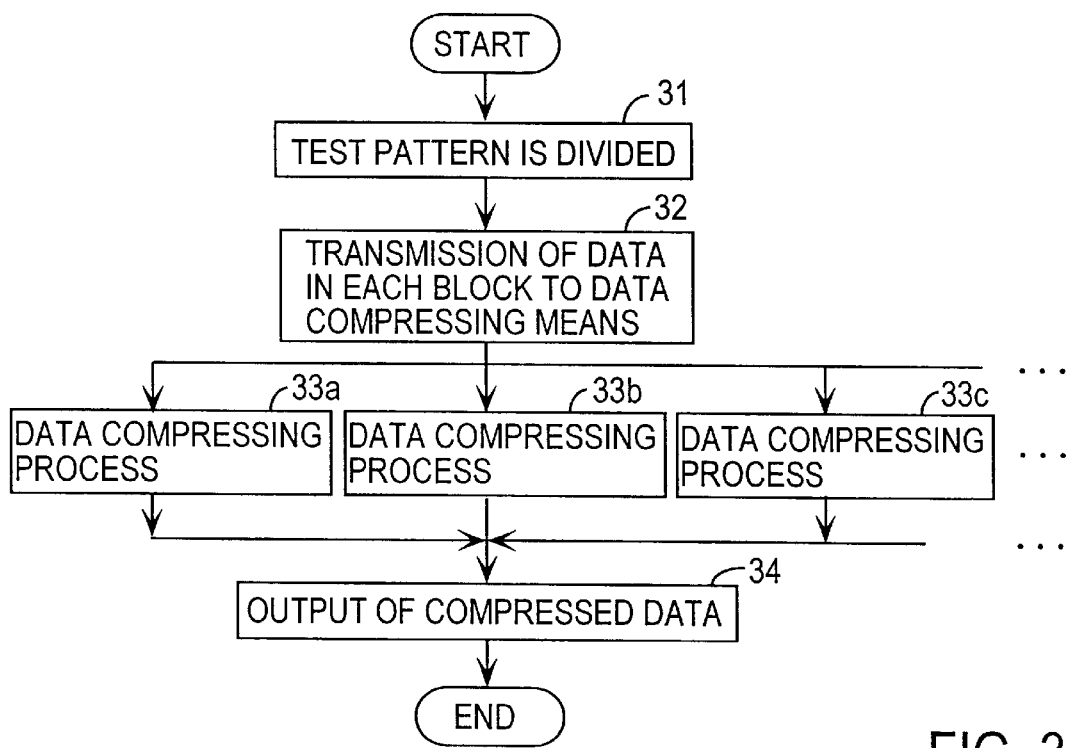
FIG. 3 is a flow chart for explaining a test pattern compressing method of the first embodiment of the present invention.

FIG. 3 is a flow chart for explaining the test pattern compressing method according to a first embodiment of the present invention. The test pattern dividing means 22 in the test pattern compressing apparatus 21 shown in FIG. 2 classifies, in step 31, a test sequence for each pin into one of a plurality of blocks in accordance with a data structure or a statistical characteristic of the data to divide the entire test pattern.

A data, namely a test sequence of each divided block is transmitted via a switch S1, in step 32, to one of a plurality of data compressing means A23, B24, C25, ... each having an optimum compression algorithm for corresponding one of the blocks. Then, in steps 33*a*, 33*b* and 33*c*, the data are compressed by the respective data compressing means. Finally, in step 34, each compressed data is outputted through a switch S2.

In this case, a flag 1 indicating the compressing method of the data compressing means A23 is affixed to the front portion of the compressed data from the data compressing means A23. Flags 2 and 3 indicating respective compressing methods of the data compressing means A23 and B24 are affixed to the front portions of the compressed data from the data compressing means A23 and B24, respectively. In addition, for example, a pin number indicating that a test pattern corresponds to which one of the pins is affixed to each test pattern.

Figure 4:
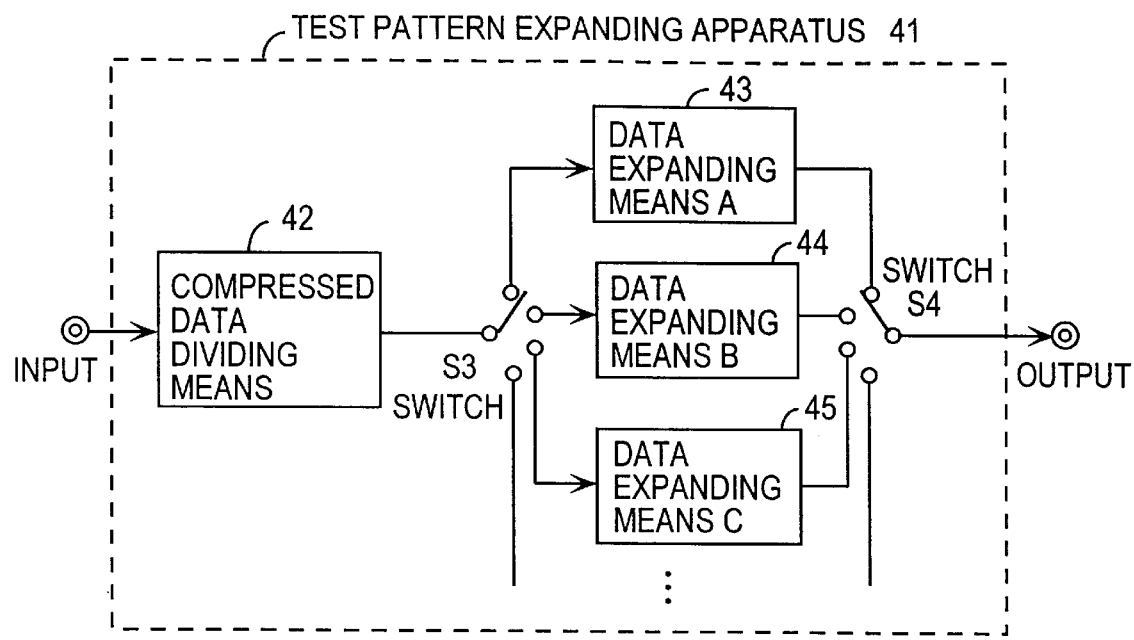
FIG. 4 is a block diagram showing an example of a functional construction of a test pattern expanding apparatus used in the first embodiment of the present invention.

FIG. 4 is a block diagram showing an example of a functional construction of the test pattern expanding apparatus used in the first embodiment of the present invention. The test pattern expanding apparatus 41 comprises compressed data dividing means 42 for classifying compressed data to be expanded into data groups each having been compressed by a different compressing method, and a plurality of data expanding means A43, B44, C45, . . . for expanding the classified compressed data to their original test patterns without any information loss. In this case, the data expanding means 43, 44, 45, . . . correspond to the compressing means 23, 24, 25, . . . in the test pattern compressing apparatus 21, respectively.

Figure 5:
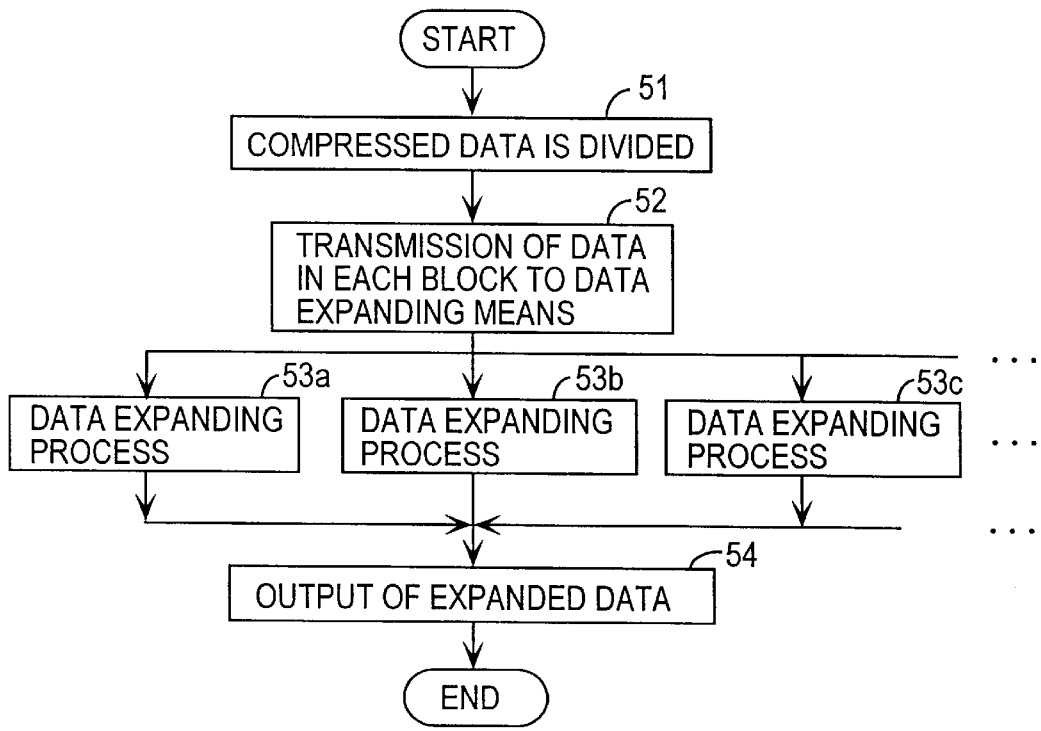
FIG. 5 is a flow chart for explaining a test pattern expanding method of the first embodiment of the present invention.

Next, the operations for expanding the compressed data using this test pattern expanding apparatus 41 will be explained. FIG. 5 is a flow chart for explaining a test pattern expanding method of the first embodiment of the present invention.

First, in step 51, the compressed data dividing means 42 divides the compressed data to be expanded into data groups each having been compressed by a different compressing method. This division is performed based on, for example, flags 1, 2 and 3 indicating the respective compressing methods. The divided compressed data are transmitted, in step 52, to the respective appropriate data expanding means A43, B44, C45, . . . via a switch S3. That is, a compressed data having a flag 1 is transmitted to the data expanding means 43, and compressed data having flags 2 and 3 are transmitted to the respective data expanding means 44 and 45. The transmitted data are, in step 53, expanded to their original blocks by the respective data expanding means without any information loss. Finally, in step 54, an expanded test pattern for each pin is outputted via a switch S4.

Figure 6:
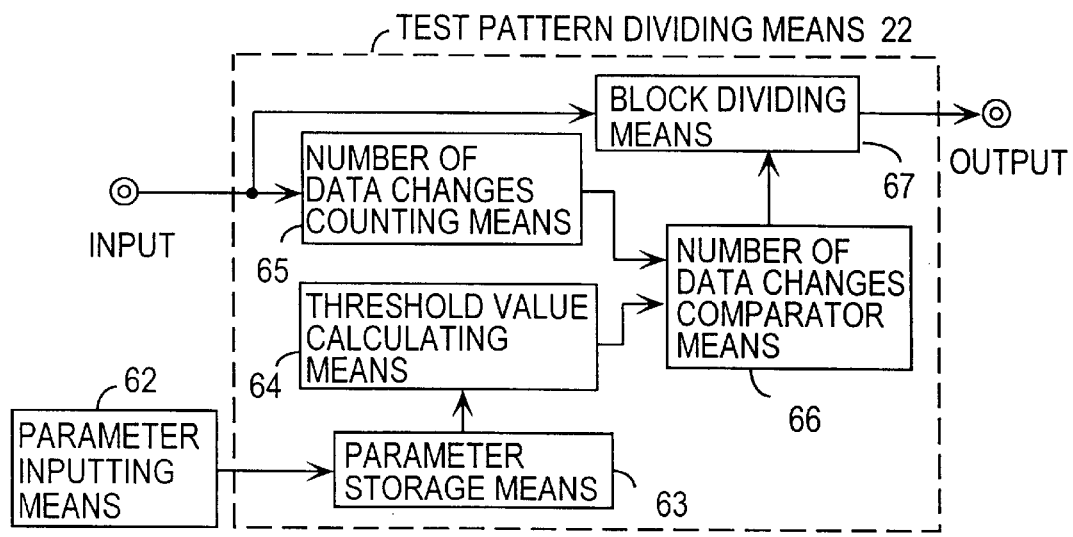
FIG. 6 is a block diagram showing an example of a functional construction of test pattern dividing means in the test pattern compressing apparatus shown in FIG. 2.

FIG. 6 is a block diagram showing an example of a specific functional construction of the test pattern dividing means 22 used in the first embodiment of the present invention. This test pattern dividing means 22 comprises parameter inputting means 62 for inputting environmental parameters for a block division, parameter storage means 63 for storing the inputted environmental parameters, threshold value calculating means 64 for calculating a threshold value of the number of data changes for dividing a test pattern into blocks using the environmental parameters stored in the parameter storage means 63, number of data changes counting means 65 for counting the number of data changes of the inputted test pattern, number of data changes comparator means 66 for comparing the threshold value of the number of data changes with the actual number of data changes, and block dividing means 67 for dividing an inputted test pattern into a plurality of blocks in accordance with the comparison results.

Next, the operations for dividing a test pattern into blocks using this test pattern dividing means 22 will be explained.

Figure 7:
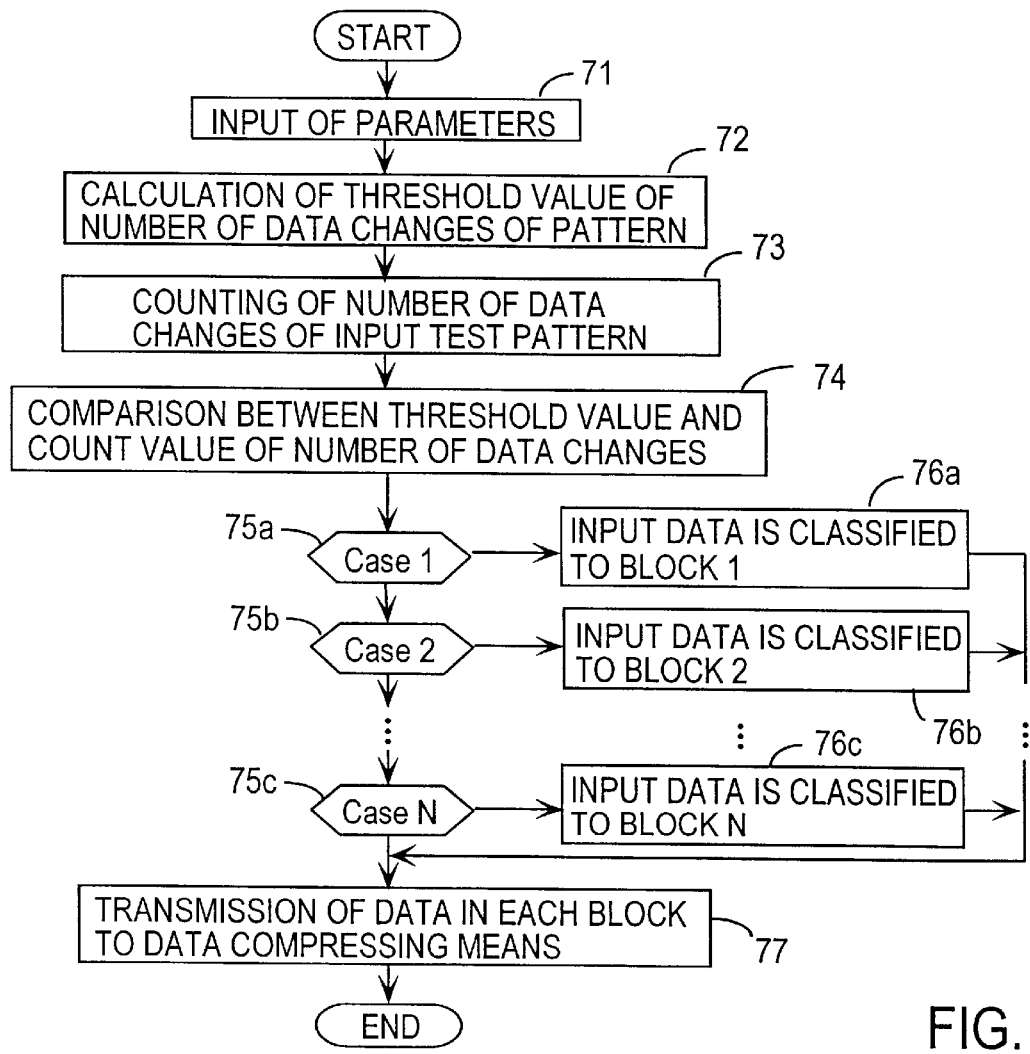
FIG. 7 is a flow chart for explaining a processing procedure of the test pattern dividing means shown in FIG. 6.

FIG. 7 is a flow chart for explaining a test pattern dividing method of the first embodiment of the present invention. In addition, FIG. 8 shows an example in which this test pattern dividing method is applied to a test pattern, wherein FIG. 8(*a*) is an example of an input test pattern to be used in the explanation below. In the test pattern shown in FIG. 8(*a*), a lateral direction (left to right direction in the figure) is a pin array direction of an integrated circuit and a longitudinal direction (top to bottom direction in the figure) is a pattern sequence direction.

First, using the parameter inputting means 62, environmental parameters for calculating a threshold value of block division, i.e., a length M of a test pattern sequence for calculation of the number of data changes, a size $|A|$ of a set of symbols appearing in a test pattern, and a lowest limit value $\alpha$ of allowable compression rate are inputted. Those inputted parameters are stored in the parameter storage means 63.

Next, using the parameters stored in the parameter storage means 63, in step 72, the threshold value calculating means 64 calculates a threshold value of the number of data changes in a pattern for dividing an inputted test pattern into a plurality of blocks. The formula (1) is used for this calculation. In the example shown in FIG. 8, if $\alpha=1$ is assumed, the threshold value $\phi_{max}$ is obtained, as shown in FIG. 8(*b*), because of $\phi_{max}=2$ from the parameters M=6 and $|A|=3$.

Next, in step 73, the number of data changes counting means 65 counts the number of data changes in a test pattern for each pin of the inputted test pattern. In the example shown in FIG. 8, the number of data changes, for example, in the pattern for pin 1 is zero (0) and the number of data changes in the pattern for pin 2 is 1, i.e. one change from 0 to X. In such a way, as shown in FIG. 8(*c*), the number of data changes $\phi$ can be obtained as $\phi=$"013205". The threshold value $\phi_{max}$ calculated by the threshold value calculating means 64 and the number of data changes $\phi$ obtained by the number of data changes counting means 65 are transmitted to the number of data changes comparator means 66 to be compared with each other. The comparison results are sent to the block dividing means 67.

Next, in steps 75 and 76, the block dividing means 67 classifies the test pattern data in pin basis into a plurality of blocks in accordance with the corresponding number of data changes, i.e., distributes the test pattern data for each pin into one of the plurality of blocks. In the example shown in FIG. 8, the test pattern data in pin basis are classified into a block in which a test pattern data has the number of data changes equal to or less than the threshold value $\phi_{max}$ and a block in which a test pattern data has the number of data changes greater than the threshold value $\phi_{max}$. Finally, the block dividing means 67 sends the data (patterns) in each block which have been classified (distributed) in step 77 to a plurality of corresponding compressing means.

Figure 9:
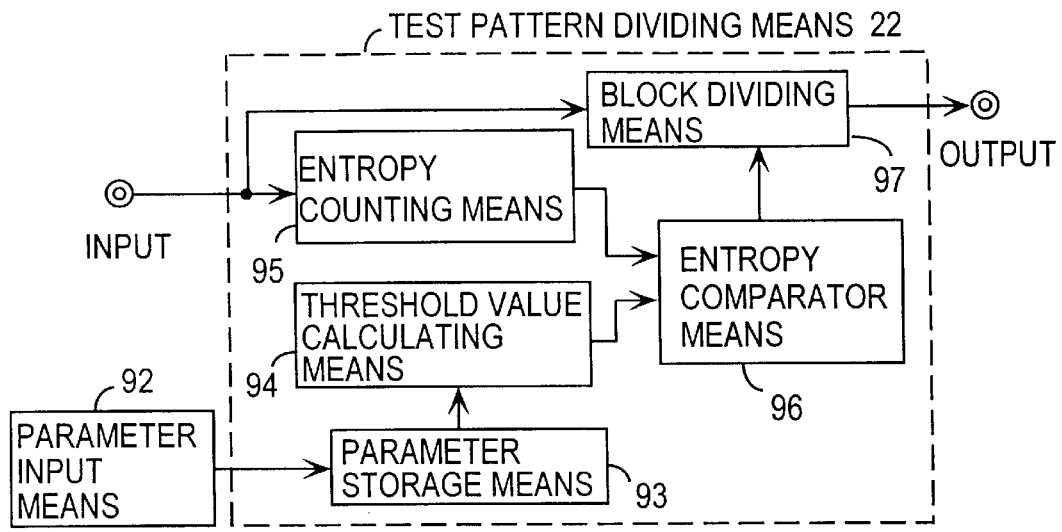
FIG. 9 is a block diagram showing an example of another functional construction of the test pattern dividing means in the test pattern compressing apparatus shown in FIG. 2.

FIG. 9 is a block diagram showing an example of another specific functional construction of the test pattern dividing means 22 used in the first embodiment of the present invention. This test pattern dividing means 22 comprises parameter inputting means 92 for inputting environmental parameters for a block division, parameter storage means 93 for storing the inputted environmental parameters, threshold value calculating means 94 for calculating a threshold value of entropy for dividing a test pattern using the environmental parameters stored in the parameter storage means 93, entropy measuring means 95 for measuring an appearing probability of each symbol appearing in a inputted data and for calculating an entropy of the data from the appearing probabilities of the symbols, entropy comparator means 96 for comparing the threshold value of entropy with an entropy of actual data, and block dividing means 97 for dividing an input test pattern in accordance with the comparison result of the comparator means 96.

Figure 10:
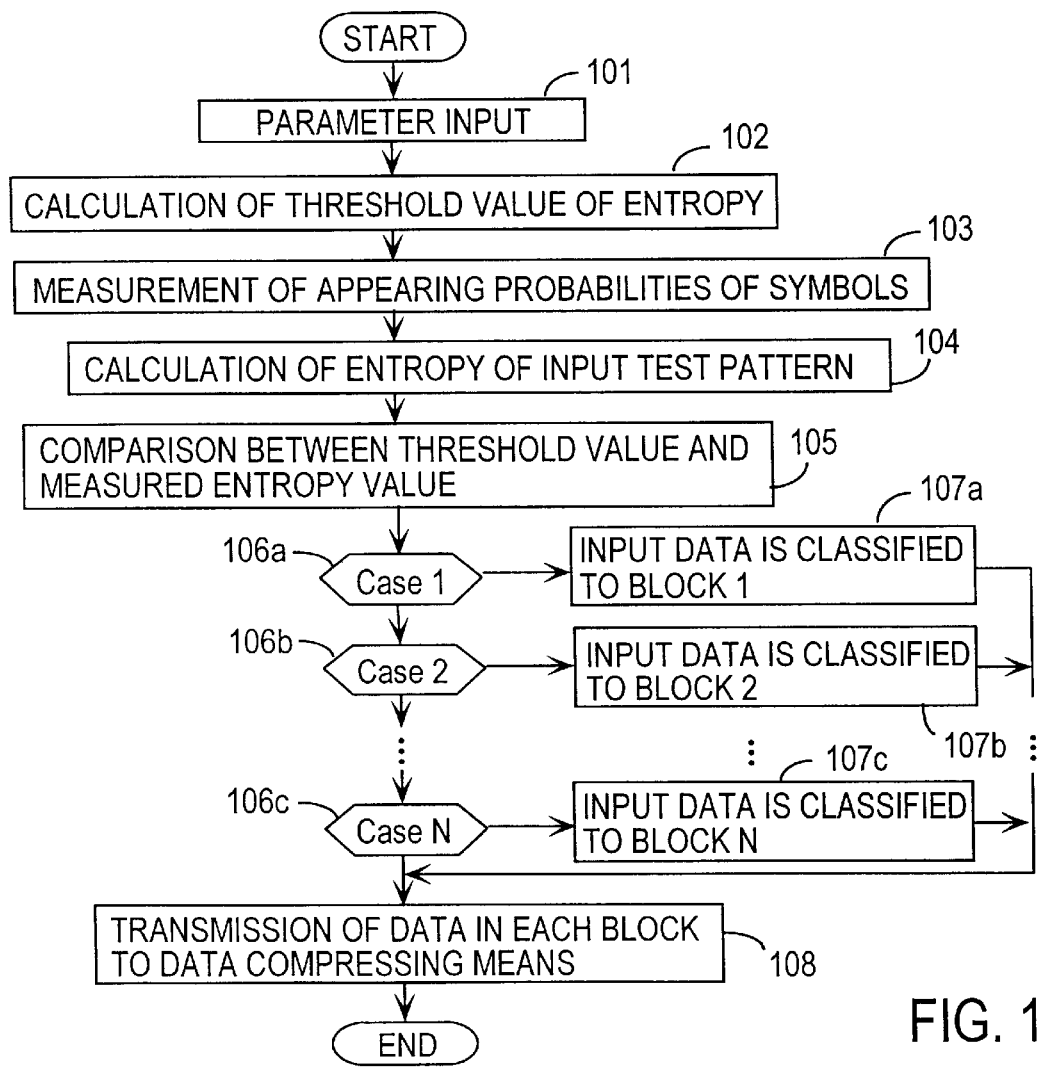
FIG. 10 is a flow chart for explaining a processing procedure of the test pattern dividing means shown in FIG. 9.

Next, the operations for dividing a test pattern into blocks using this test pattern dividing means 22 will be explained. FIG. 10 is a flow chart for explaining a test pattern dividing method of the first embodiment of the present invention. FIG. 11 shows an example in which this block dividing method is applied to a test pattern. FIG. 11(*a*) is an example of an input test pattern to be used in the explanation below. Here, in the test pattern shown in FIG. 11(*a*), a lateral direction (left to right direction in the figure) is a pin array direction of an IC and longitudinal direction (top to bottom direction in the figure) is a pattern sequence direction.

First, in step 101, parameters for calculating a threshold value for a block division are inputted using the parameter inputting means 92 to be stored in the parameter storage means 93. Next, in step 102, the threshold value calculating means 94 calculates a threshold value of entropy for dividing an inputted test pattern into a plurality of blocks. The formula (3) is used for calculation of the threshold value. In the example shown in FIG. 11, assuming that α is α=2, the threshold value $H_{max}$ is obtained, as shown in FIG. 8(*b*), because of $H_{max}$=1 since |A| is |A|=3.

Next, in step 103, symbol appearing probabilities in an inputted test pattern are measured. In addition, in step 104, an entropy of the inputted test pattern is calculated using the formula (2) from the probabilities obtained in step 103. Those steps 103 and 104 are performed in the entropy counting means 95. In the example shown in FIG. 11, the symbol appearing probabilities p for pin 1 are obtained as 0 from the formula (2) because of p(0)=1, p(1)=0 and p(X)=0. Further, for pin 2, p(0)=⅓, p(1)=0 and p(X)=⅔, and hence the entropy is obtained as 0.92.

Similarly, the entropy H for the respective pins can be calculated to obtain H=[0.0 0.92 1.46 0.92 0.0 1.46]. The threshold value $H_{max}$ calculated by the threshold value calculating means 94 and the entropy H obtained by the entropy counting means 95 are sent to the entropy comparator means 96 to be compared with each other in step 105.

The comparison result is transmitted to the block dividing means 97. Then in steps 106 and 107, the block dividing means 97 divides each test pattern data for each pin into a plurality of blocks in accordance with the corresponding entropy. In the example shown in FIG. 11, an inputted test pattern is divided into a block in which a test pattern for a pin has, as shown in FIG. 11(*d*), an entropy equal to or less than the threshold value $H_{max}$ and a block in which a test pattern for a pin has an entropy greater than the threshold value $H_{max}$. Finally, the block dividing means 97 sends, in step 108, the data in each divided block to corresponding one of the plurality of compressing means.

Next, variation examples of the test pattern compressing apparatus, the test pattern expanding apparatus and the test pattern dividing means 22 will be explained.

Figure 12:
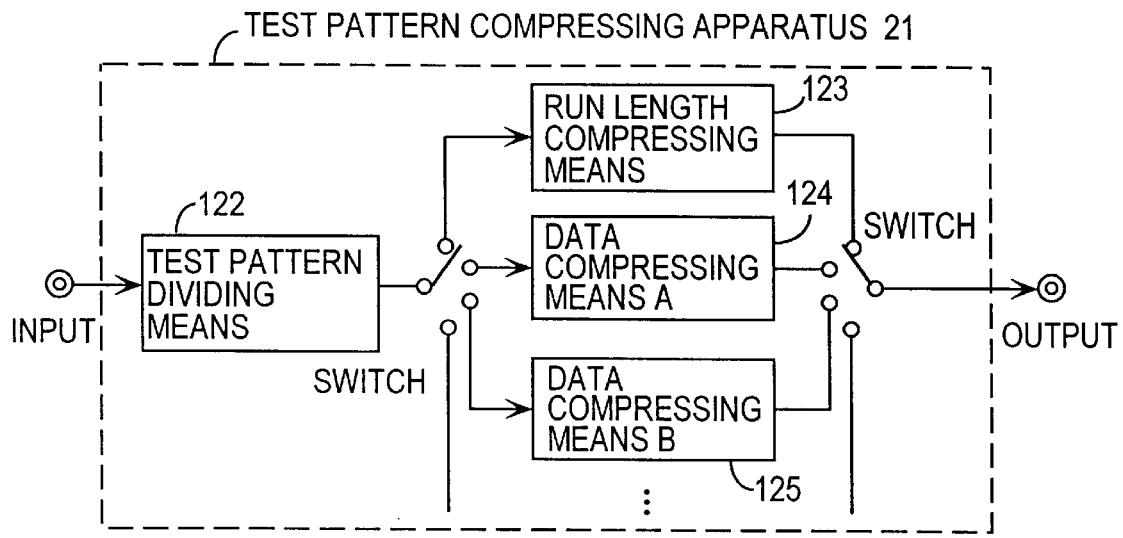
FIG. 12 is a block diagram showing an example of a specific functional construction of the test pattern compressing apparatus.

FIG. 12 is, in the first embodiment of the present invention, a block diagram showing an example of a functional construction of the test pattern compressing apparatus 21 in the case where one of the data compressing means of the test pattern compressing apparatus shown in FIG. 2 is run length compressing means. This test pattern compressing apparatus 21 comprises test pattern dividing means 122 for counting the number of data changes of an inputted test pattern and for performing a block division of an inputted data in accordance with the number of data changes, run length compressing means 123 for applying a run length compressing method to a block having a small number of data changes, i.e., a block having the number of data changes equal to or less than the threshold value, and at least one of the data compressing means 124, 125, . . . for applying another method such as, for example, an LZ compressing method, a Huffman compressing method or the like to the other blocks.

A flag indicating the compressing method is affixed to the front portion of each data compressed by one of the compressing means 123, 124, . . . .

Figure 13:
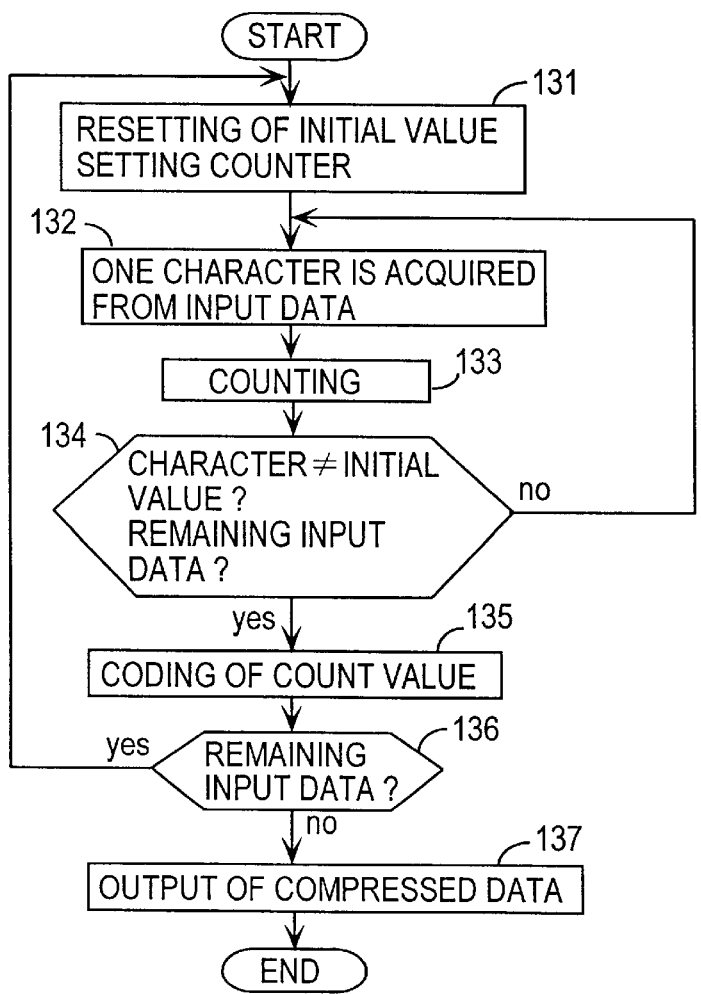
FIG. 13 is a flow chart for explaining a processing procedure of a run length compressing method.

Next, the operations for compressing data using the run length compressing means 123 will be explained. FIG. 13 is a flow chart for explaining a processing procedure of the run length compressing method and shows the run length compressing method of a variation example 1.

First, in step 131, an initial value and a counter value for generating run length codes are set. Next, in step 132, one character is acquired from the input data, and in step 133, the number of characters is counted. In step 134, the acquired character is compared with the initial value. If the character is equal to the initial value, the steps 132 and 133 are repeated. If the character is different from the initial value, the count value up to then is coded, in step 135, as a length that the initial value has continued. In step 136, a check is made to see if there are remaining input data. If there are remaining input data, the steps up to then are repeated. If there is no remaining input data, compressed data are outputted in step 137 and the process ends.

Figure 14:
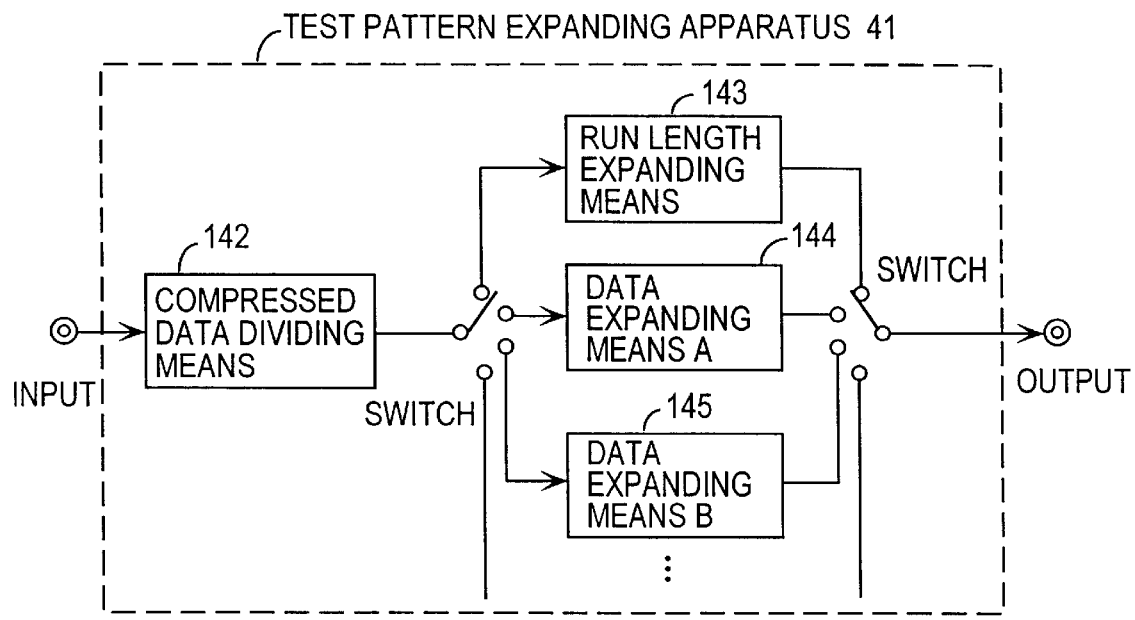
FIG. 14 is a block diagram showing an example of a functional construction of a test pattern expanding apparatus corresponding to the test pattern compressing apparatus shown in FIG. 12.

FIG. 14 is, in the first embodiment of the present invention, a block diagram showing an example of a construction of the test pattern expanding apparatus 41 in the case where one of the data expanding means is the run length expanding means. This test pattern expanding apparatus 41 comprises compressed data dividing means 142 for dividing a compressed data to be expanded into data which have been compressed by the run length compressing method and data which have been compressed by the other plurality of compressing methods using flags each indicating a compressing method, run length expanding means 143 for expanding each of the divided compressed data to the original test pattern without any information loss, and data expanding means 144, 145, . . . according to at least one of the other compressing methods such as, for example, an LZ expanding method, a Huffman expanding method or the like.

Next, the operations for performing a data expansion using the run length expanding means 143 will be explained.

Figure 15:
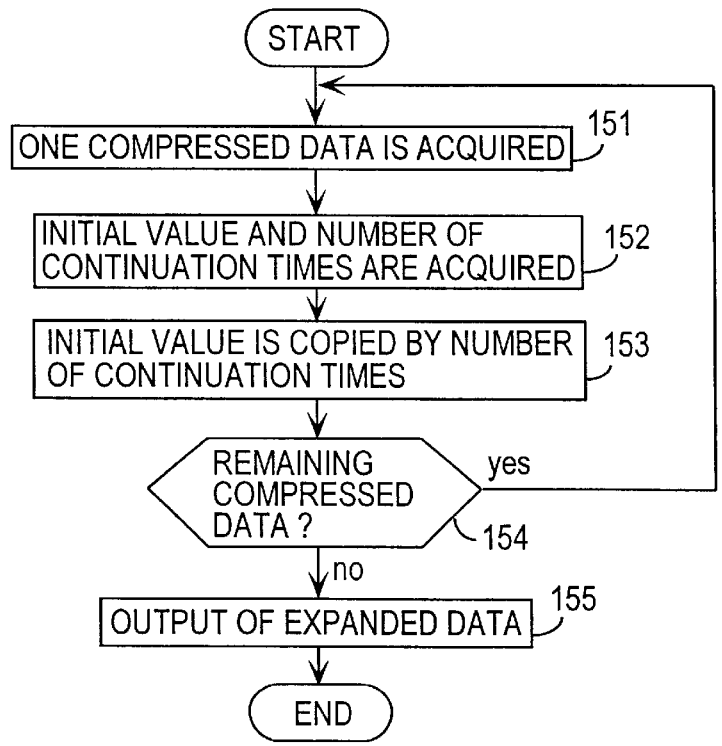
FIG. 15 is a flow chart for explaining a processing procedure of a run length expanding method.

FIG. 15 is a flow chart for explaining a processing procedure of the run length expanding method and shows the run length expanding method of a variation example 1 of the present invention.

First, in step 151, a compressed data is acquired and in step 152, an initial value and the number of continued characters are acquired from the compressed data. Then, in step 153, the initial value is copied by the number of times equal to the number of continued characters. In step 154, a check is made to see if there are remaining compressed data. If there are remaining compressed data, the steps 151, 152 and 153 are repeated. If there is no remaining compressed data, expanded data are outputted in step 155 and the process ends.

Figure 16:
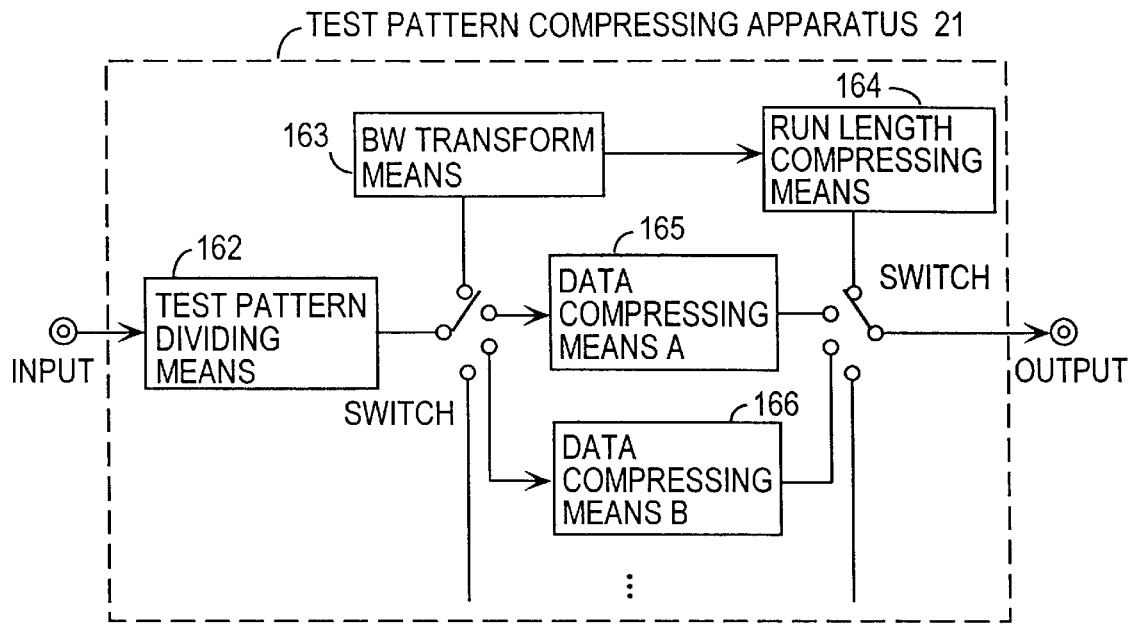
FIG. 16 is a block diagram showing an example of another specific functional construction of the test pattern compressing apparatus.

FIG. 16 is, in the first embodiment of the present invention, a block diagram showing an example of a construction of the test pattern compressing apparatus 21 in the case where one of the data compressing means is the run length compressing means and BW transform means is provided in the front stage of the run length compressing means. This test pattern compressing apparatus 21 comprises test pattern dividing means 162 for dividing an input data into blocks in accordance with a structure or a statistical characteristic of the inputted test pattern data, BW transform means 163 for applying BW transform to a block having a large data periodicity, i.e., a block having the number of data changes greater than the threshold value and having an entropy equal to or less than the threshold value, run length compressing means 164 for applying the run length compressing method to a data to which BW transform has been applied, and at least one of the data compressing means 165 and 166 for applying other data compressing methods to the other blocks.

Figure 17:
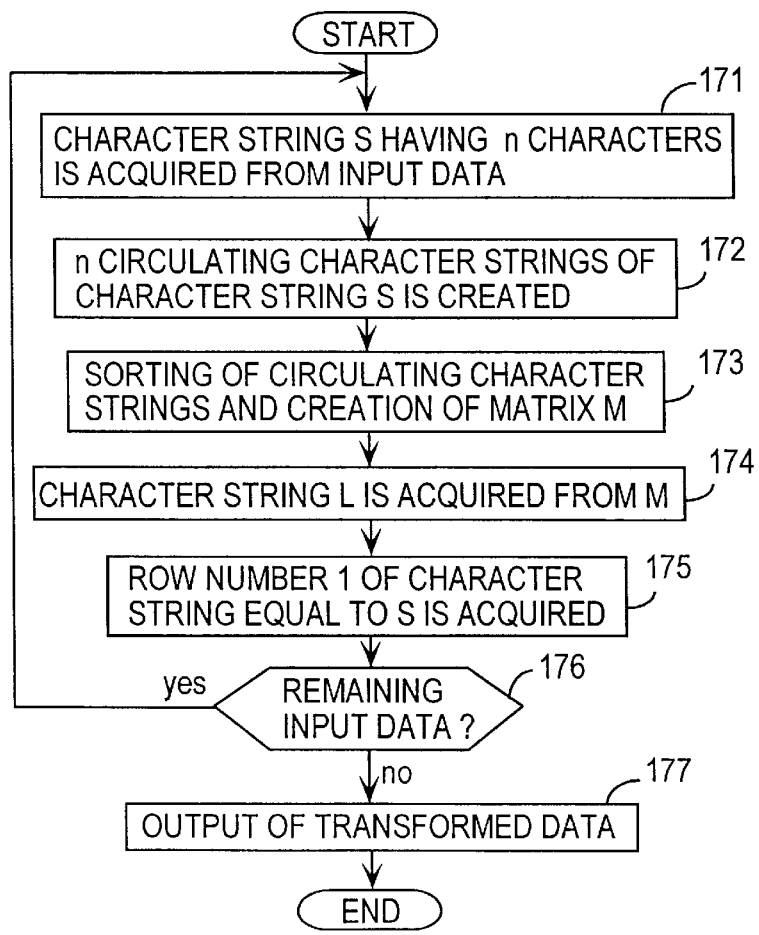
FIG. 17 is a flow chart for explaining a processing procedure of a BW transform method.

Next, the operations for performing a transform using the BW transform means 163 will be explained. FIG. 17 is a flow chart for explaining a processing procedure of a BW transform method and shows the BW transform method of a variation example 2 of the first embodiment of the present invention.

First, in step 171, a character string S having n characters is acquired. Then in step 172, n circulating character strings (character strings cyclically shifted) of the acquired character string S are generated. Then in step 173, those circulating character strings are sorted to create a matrix M. In steps 174 and 175, a character string L obtained from the last column of the matrix M and a number I of a row having the same character string as the input character string S are acquired from the created matrix M. Finally, in step 176, a check is made to see if there are remaining input data. If there are remaining input data, those steps 171, 172, 173, 174 and 175 are repeated. If there is no remaining input data, compressed data are outputted in step 177 and the process ends.

Figure 18:
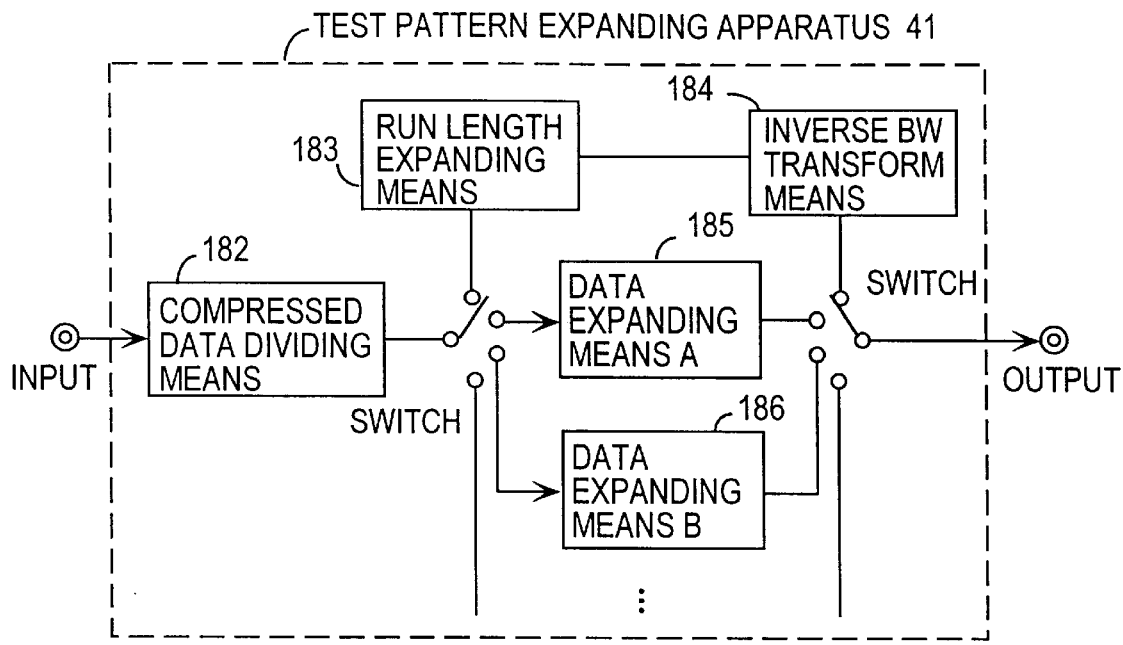
FIG. 18 is a block diagram showing an example of a functional construction of a test pattern expanding apparatus corresponding to the test pattern compressing apparatus shown in FIG. 16.

FIG. 18 is, in the first embodiment of the present invention, a block diagram showing an example of a construction of the test pattern expanding apparatus in the case where one of the data expanding means is the run length expanding means and the BW transform means is provided at the rear stage of the run length compressing means. This test pattern expanding apparatus 41 comprises compressed data dividing means 182 for dividing a compressed data to be expanded into data which have been compressed by the run length compressing method after BW transform is applied and data which have been compressed by the other plurality of compressing methods, run length expanding means 183 for expanding the divided compressed data to the original test pattern without any information loss, inverse BW transform means 184 for applying inverse BW transform to the data expanded by the run length expanding means, and at least one of the data expanding means 185 and 186 for applying other compressing methods to the other data.

Figure 19:
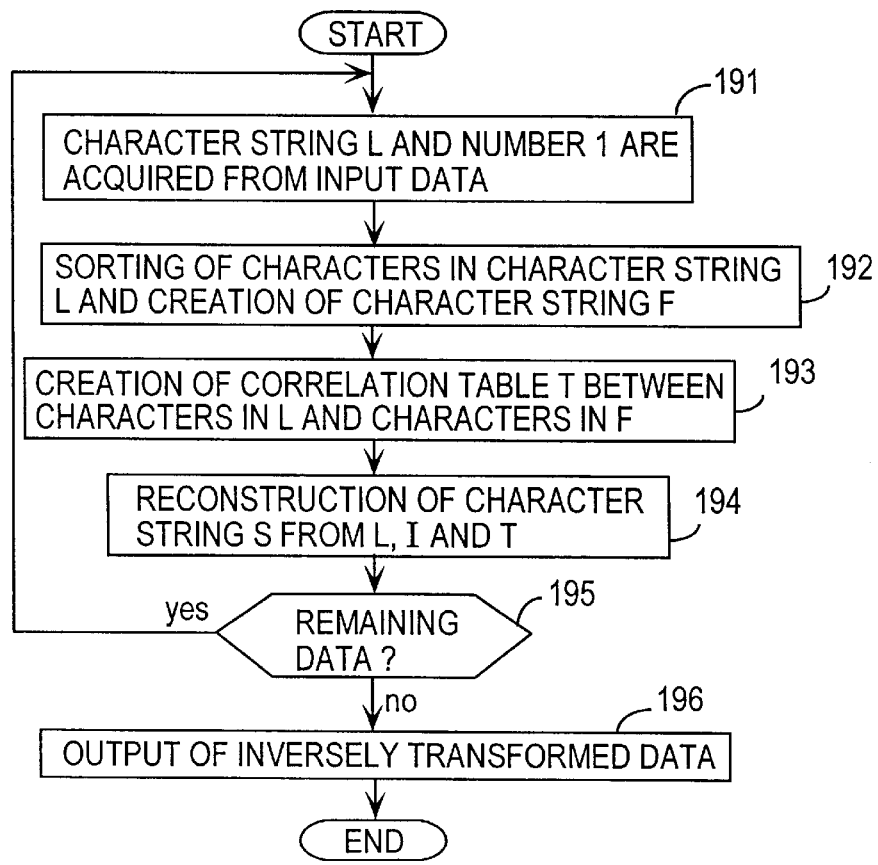
FIG. 19 is a flow chart for explaining a processing procedure of an inverse BW transform method.

Next, the operations for performing the inverse transform using the inverse BW transform means will be explained. FIG. 19 is a flow chart for explaining a processing procedure of an inverse BW transform method and shows the inverse BW transform method of the variation example 2 of the first embodiment of the present invention.

First, in step 191, a character string L having n characters and a number I are acquired. Then in step 192, characters in the acquired character string L are sorted to generate a character string F. In step 193, a matrix T indicating correlations between characters in the character string L and characters in the character string F is created. Then in step 194, the original character string S is reconstructed from the character string L, the number I and the matrix T. Finally in step 195, a check is made to see if there are remaining data. If there are remaining data, those steps 191, 192, 193 and 194 are repeated. If there is no remaining input data, inversely transformed data are outputted in step 196 and the process ends.

Figure 20:
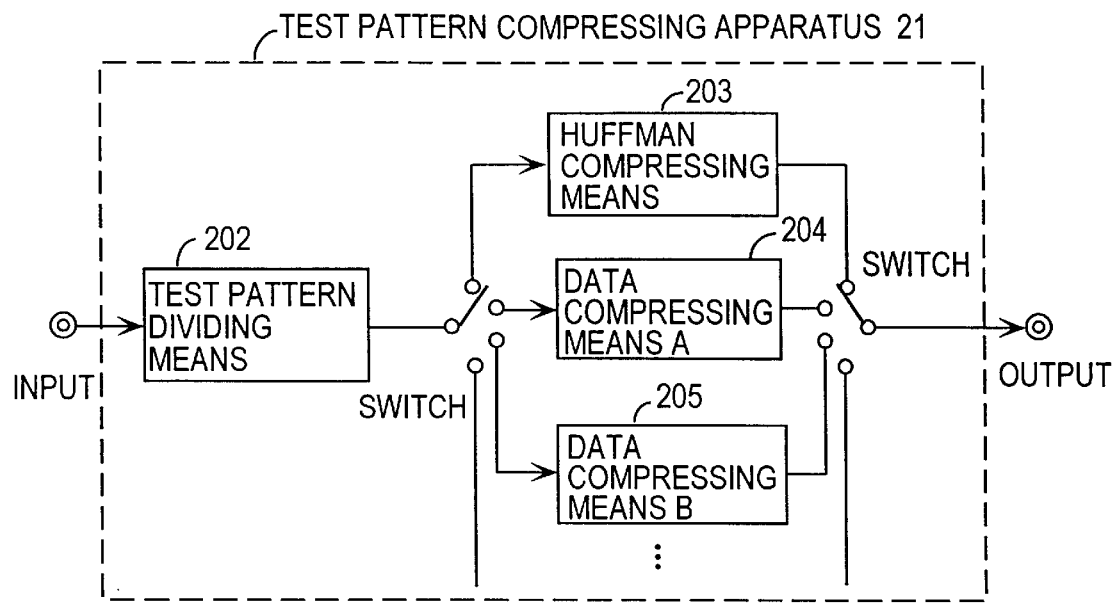
FIG. 20 is a block diagram showing an example of further another specific functional construction of the test pattern compressing apparatus.

FIG. 20 is, in the first embodiment of the present invention, a block diagram showing an example of a construction of the test pattern compressing apparatus 21 in the case where one of the data compressing means is Huffman compressing means. This test pattern compressing apparatus 21 comprises test pattern dividing means 202 for dividing an input data into blocks in accordance with a statistical characteristic of the inputted test pattern data, Huffman compressing means 203 for applying a Huffman compressing method to a block having a small entropy, i.e., a block having an entropy equal to or less than the threshold value, and at least one of the data compressing means 204 and 205 for compressing data of the other blocks by other methods such as, for example, an LZ compressing method, an arithmetic coding compressing method or the like.

Figure 21:
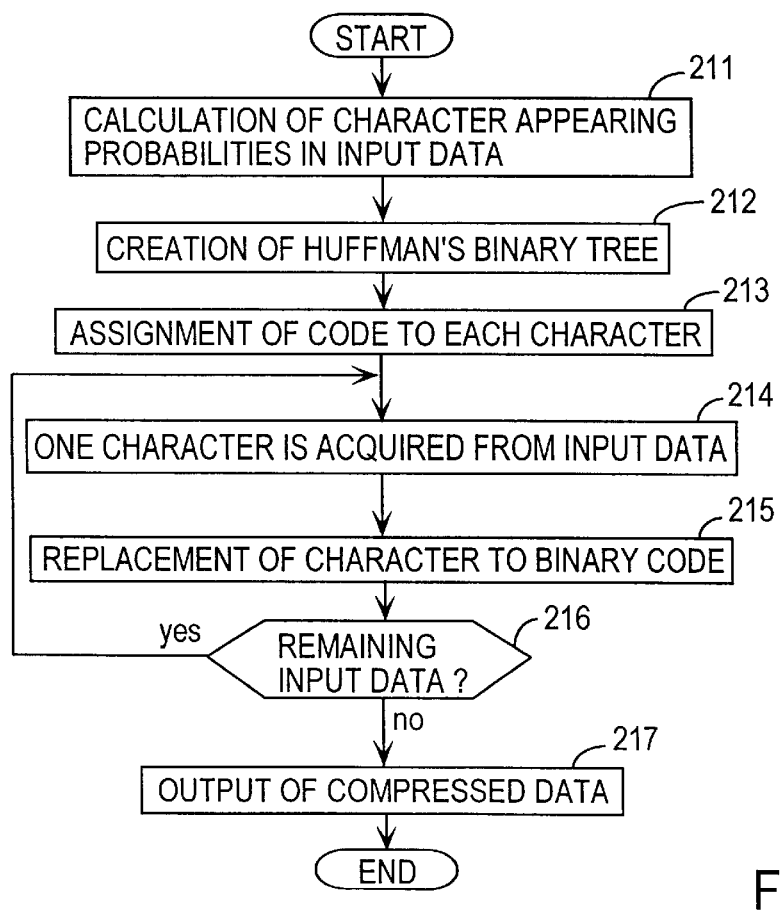
FIG. 21 is a flow chart for explaining a processing procedure of a Huffman compressing method.

Next, the operations for performing a data compression using the Huffman compressing means 203 will be explained. FIG. 21 is a flow chart for explaining a processing procedure of the Huffman compressing method and shows the Huffman compressing method of a variation example 3 of the first embodiment of the present invention.

First, in step 211, an appearing probability of each character appearing in an input data is measured. Then in step 212, a binary tree for creating Huffman codes is created from the acquired appearing probabilities. In step 213, a code is assigned to each character based on the Huffman's binary tree. Then, in step 214, one character is acquired from the input data. In step 215, the acquired character is converted to the assigned code. Finally, in step 216, a check is made to see if there are remaining input data. If there are remaining input data, the steps 214 and 215 are repeated. If there is no remaining input data, compressed data are outputted in step 217 and the process ends.

Figure 22:
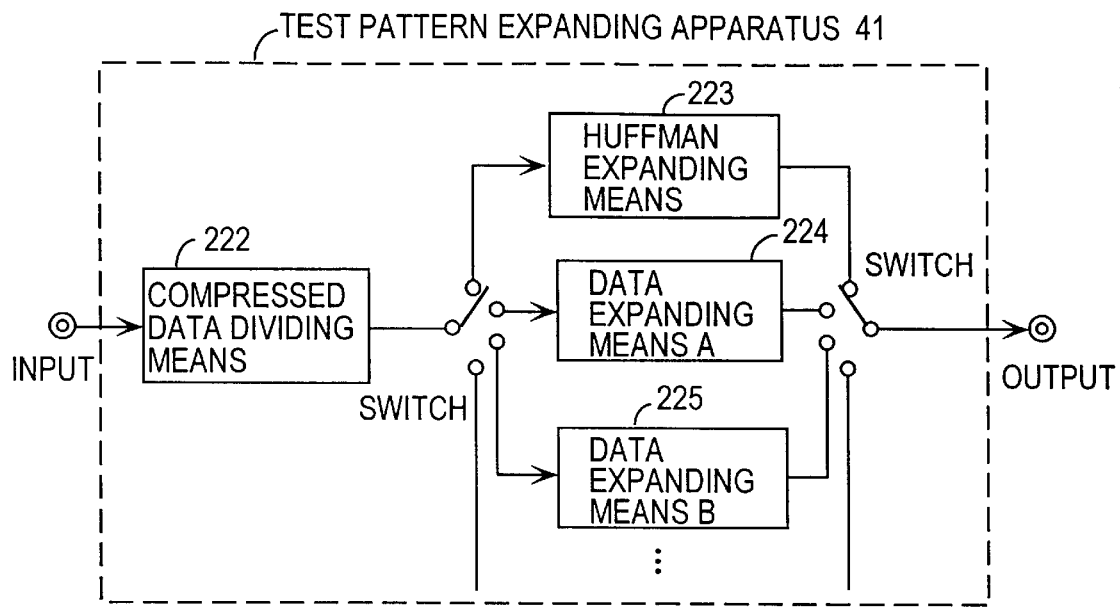
FIG. 22 is a block diagram showing an example of a functional construction of a test pattern expanding apparatus corresponding to the test pattern compressing apparatus shown in FIG. 20.

FIG. 22 is, in the first embodiment of the present invention, a block diagram showing an example of a construction of the test pattern expanding apparatus 41 in the case where one of the data expanding means is the Huffman expanding means. This test pattern expanding apparatus 41 comprises compressed data dividing means 222 for dividing a compressed data to be expanded into data compressed by the Huffman compressing method and data compressed by the other plurality of compressing methods, Huffman expanding means 223 for expanding the divided compressed data to the original test pattern without any information loss, and at least one of the data expanding means 224 and 225.

Next, the operations for performing a data expansion using the Huffman expanding means 223 will be explained.

Figure 23:
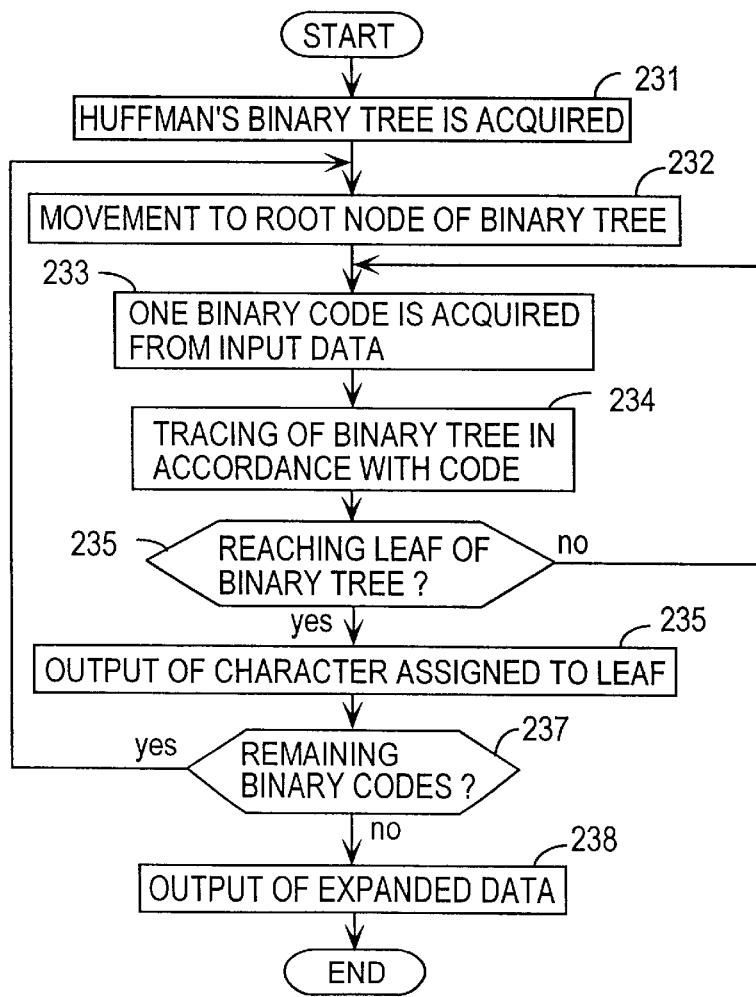
FIG. 23 is a flow chart for explaining a processing procedure of a Huffman expanding method.

FIG. 23 is a flow chart for explaining a processing procedure of a Huffman expanding method and shows the Huffman expanding method of a variation example 3 of the first embodiment of the present invention.

First, in step 231, the binary tree used in the compression is acquired from the compressed data. Since Huffman's binary tree must be traced in order to obtain an original character from a code, the process moves, in step 232, to a root node of the binary tree. Then in step 233, a binary code is acquired from the compressed data and in step 234, the Huffman's binary tree is traced based on the acquired binary code. After that in step 235, a check is made to see if the current node is a leaf node of the binary tree. If the current node is not a leaf node, the steps 233 and 234 are repeated until the process reaches a leaf node. If the current node is a leaf node, a character assigned to the leaf node is outputted in step 236. Finally in step 237, a check is made to see if there are remaining binary codes. If there are remaining binary codes, those steps 231, 232, 233, 234, 235 and 236 are repeated. If there is no remaining input data, expanded data are outputted in step 238 and the process ends.

Figure 24:
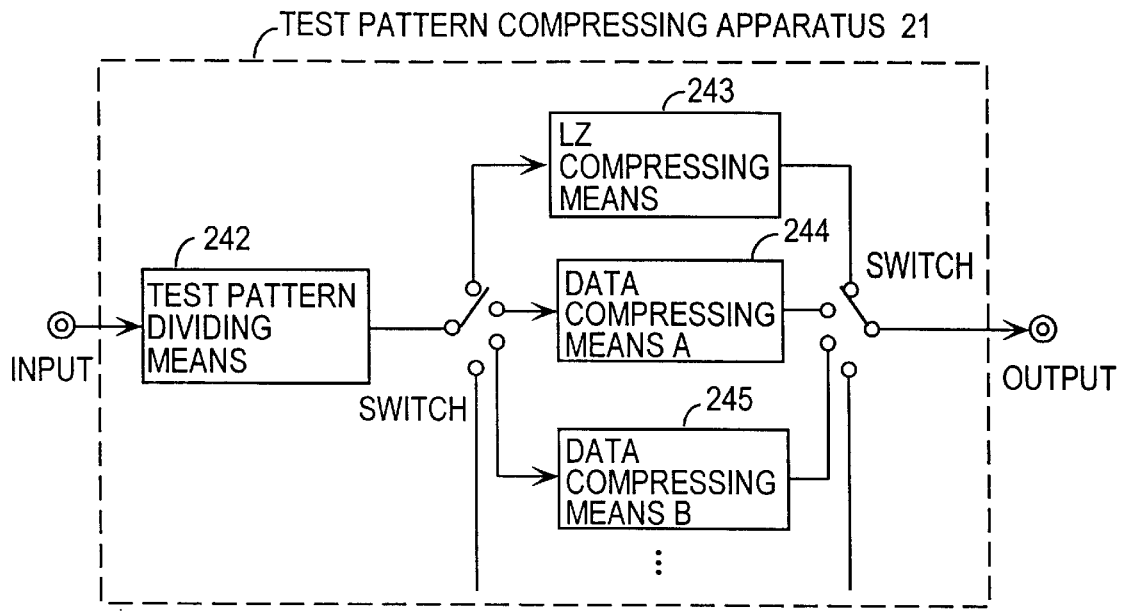
FIG. 24 is a block diagram showing an example of still another specific functional construction of the test pattern compressing apparatus.

FIG. 24 is, in the first embodiment of the present invention, a block diagram showing an example of a construction of the test pattern compressing apparatus 21 in the case where one of the data compressing means is LZ compressing means. This test pattern compressing apparatus 21 comprises test pattern dividing means 242 for dividing an input data into blocks in accordance with a statistical characteristic of the input test pattern data, LZ compressing means 243 for applying an LZ compressing method to a block having a small entropy, i.e., a block having an entropy equal to or less than the threshold value, and at least one of the other data compressing means 244 and 245 for compressing data of the other blocks by other methods such as, for example, a Huffman compressing method, an arithmetic coding compressing method or the like.

Figure 25:
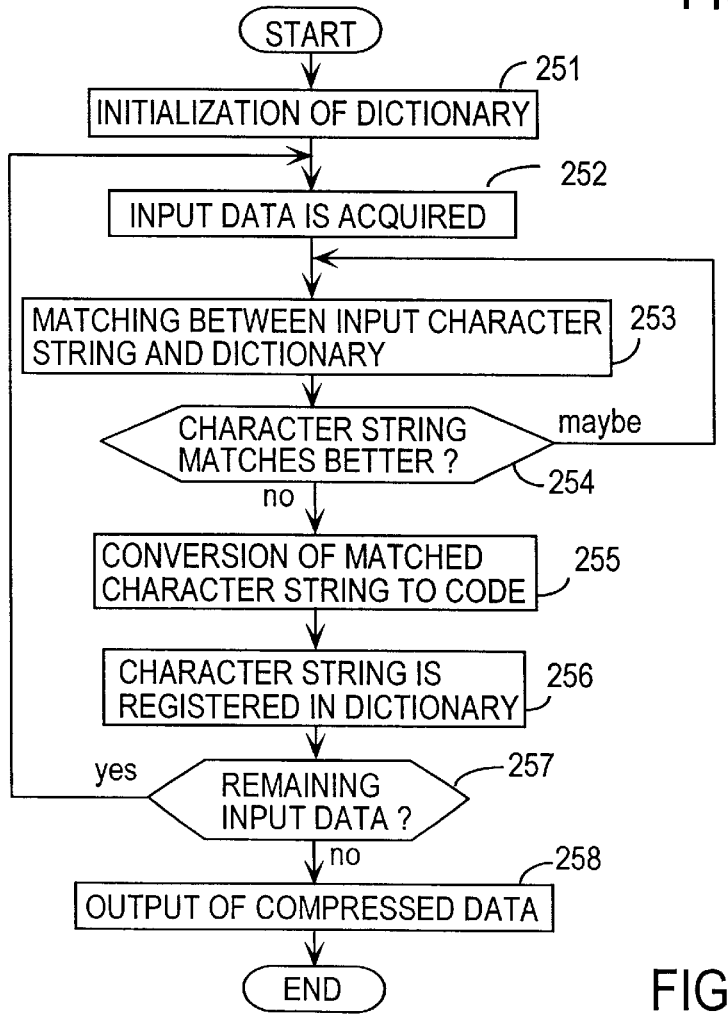
FIG. 25 is a flow chart for explaining a processing procedure of an LZ compressing method.

Next, the operations for performing a data compression using the LZ compressing means 243 will be explained. FIG. 25 is a flow chart for explaining a processing procedure of the LZ compressing method and shows the LZ compressing method of a variation example 4 of the first embodiment of the present invention.

First, in step 251, a dictionary to be used in the data compression is initialized. Then in step 252, an input data is acquired and in step 253, a matching between the acquired character string and the dictionary is performed. In step 254, a check is made to see if there is a character string that matches better with the dictionary. If there is a possibility that there may be a character string matching better with the dictionary, the matching in step 253 is repeated. If there is no character string that matches better with the dictionary, characters matched with the dictionary and the first character which did not match with the dictionary are coded in step 255. Then the new character string is registered in the dictionary in step 256. Finally in step 257, a check is made to see if there are remaining input data. If there remaining input data, the steps 252, 253, 254, 255 and 256 are repeated. If there is no remaining input data, compressed data are outputted in step 258 and the precess ends.

Figure 26:
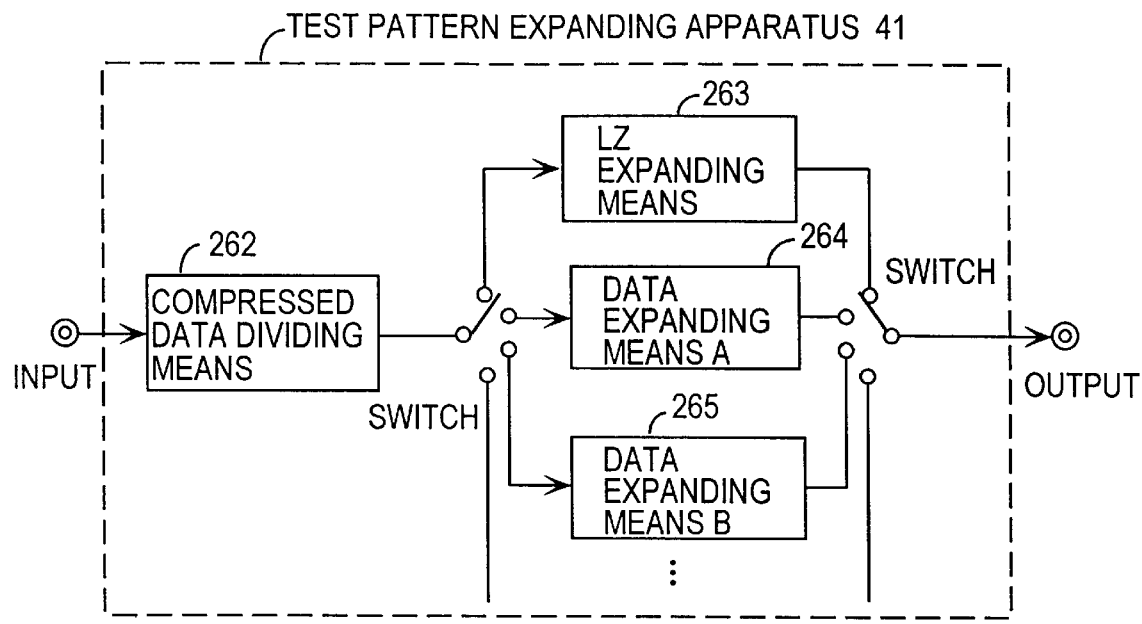
FIG. 26 is a block diagram showing an example of a functional construction of a test pattern expanding apparatus corresponding to the test pattern compressing apparatus shown in FIG. 24.

FIG. 26 is, in the first embodiment of the present invention, a block diagram showing an example of a construction of the test pattern expanding apparatus 41 in the case where one of the data expanding means is the LZ expanding means. This test pattern expanding apparatus 41 comprises compressed data dividing means 262 for dividing a compressed data to be expanded into data which have been compressed by the LZ compressing method and data which have been compressed by the other plurality of compressing methods, LZ expanding means 263 for expanding the compressed data to the original test pattern without any information loss, and at least one of the other data expanding means 264 and 265 having other expanding methods.

Figure 27:
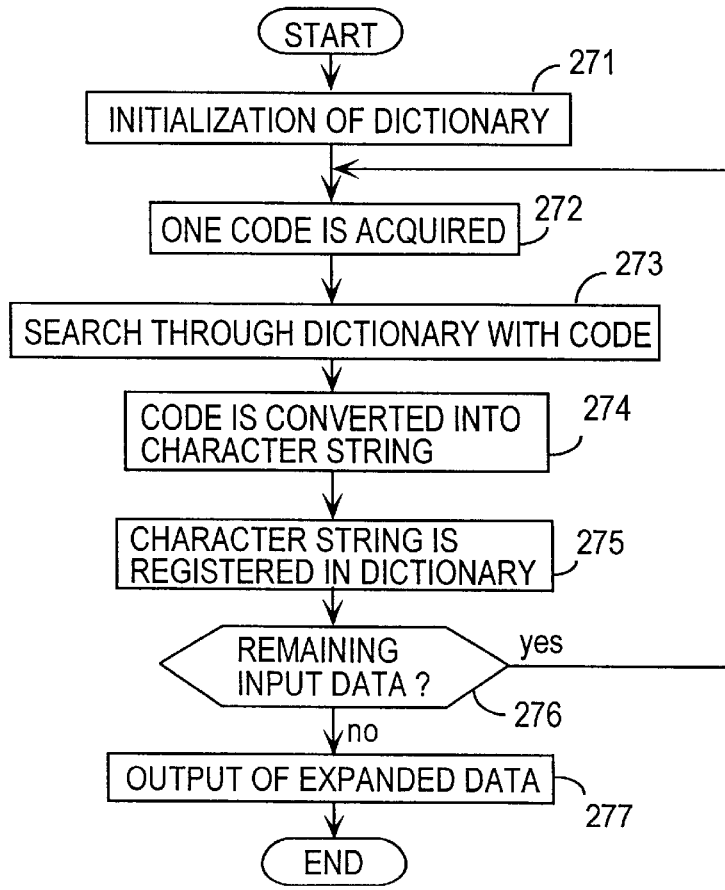
FIG. 27 is a flow chart for explaining a processing procedure of an LZ expanding method.

Next, the operations for performing a data expansion using the LZ expanding means 263 will be explained. FIG. 27 is a flow chart for explaining a processing procedure of an LZ expanding method and shows the LZ expanding method of a variation example 4 of the first embodiment of the present invention.

First, in step 271, a dictionary to be used in the data expansion is initialized. Then in step 272, a code is acquired from an input compressed data and in step 273, a search in the dictionary is performed using the acquired code. Further in step 274, the code is converted to a character string and then in step 275, the newly generated character string is registered in the dictionary. Finally in step 276, a check is mode to see if there are remaining compressed data. If there are remaining compressed data, the steps 272, 273, 274, 275 are repeated. If there is no remaining compressed data, expanded data are outputted in step 277 and the process ends.

Figure 28:
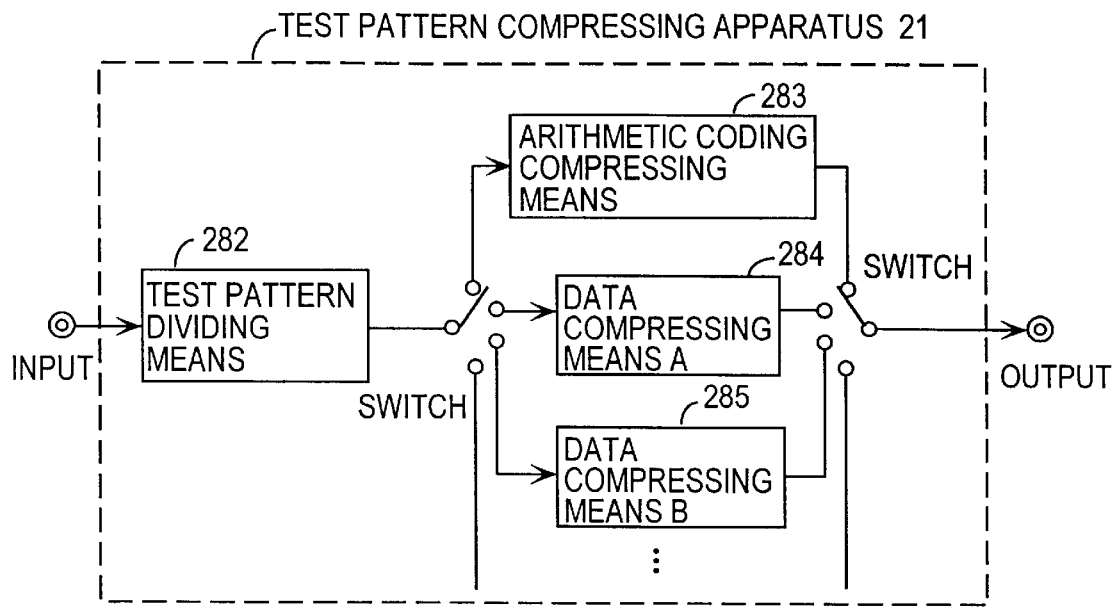
FIG. 28 is a block diagram showing an example of still another specific functional construction of the test pattern compressing apparatus.

FIG. 28 is, in the first embodiment of the present invention, a block diagram showing an example of a construction of the test pattern compressing apparatus 21 in the case where one of the data compressing means is arithmetic coding compressing means. This test pattern compressing apparatus 21 comprises test pattern dividing means 282 for dividing an input data into blocks in accordance with a statistical characteristic of the inputted test pattern data, arithmetic coding compressing means 283 for applying an arithmetic coding to a block having a small entropy, i.e., a block having an entropy equal to or less than the threshold value, and at least one of the data compressing means 284 and 285 for compressing data of the other blocks by other methods such as, for example, the LZ compressing method, the Huffman compressing method, or the like.

Figure 29:
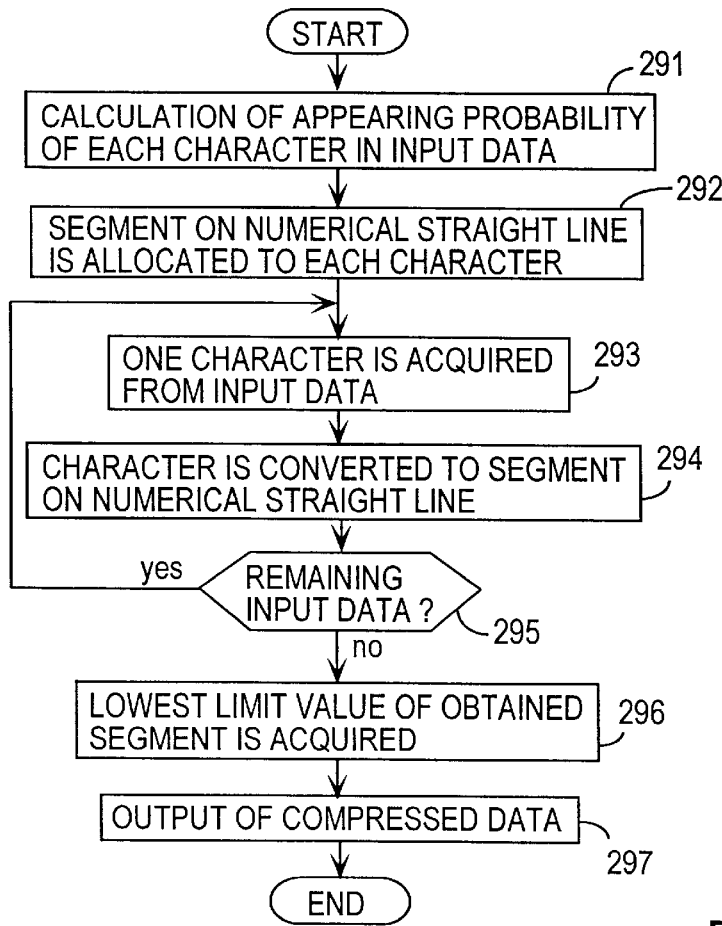
FIG. 29 is a flow chart for explaining a processing procedure of an arithmetic coding compressing method.

Next, the operations for performing a data compression using the arithmetic coding compressing means 283 will be explained. FIG. 29 is a flow chart for explaining a processing procedure of the arithmetic coding compressing method and shows an arithmetic coding compressing method of a variation example 5 of the first embodiment of the present invention.

First, in step 291, an appearing probability of each character in an input data is measured and then in step 292, a segment on a numerical straight line starting from 0 to 1 is allocated to each character. Then in step 293, a character is acquired from the input data and in step 294, the acquired character is converted to the segment on the numerical straight is line. Finally in step 295, a check is made to see if there are remaining input data. If there are remaining input data, the steps 293 and 294 are repeated to further narrow the range of the segment on the numerical straight line. If there is no remaining input data, the lowest limit value of the segment obtained is acquired in step 296. Then in step 297, compressed data are outputted and the process ends.

Figure 30:
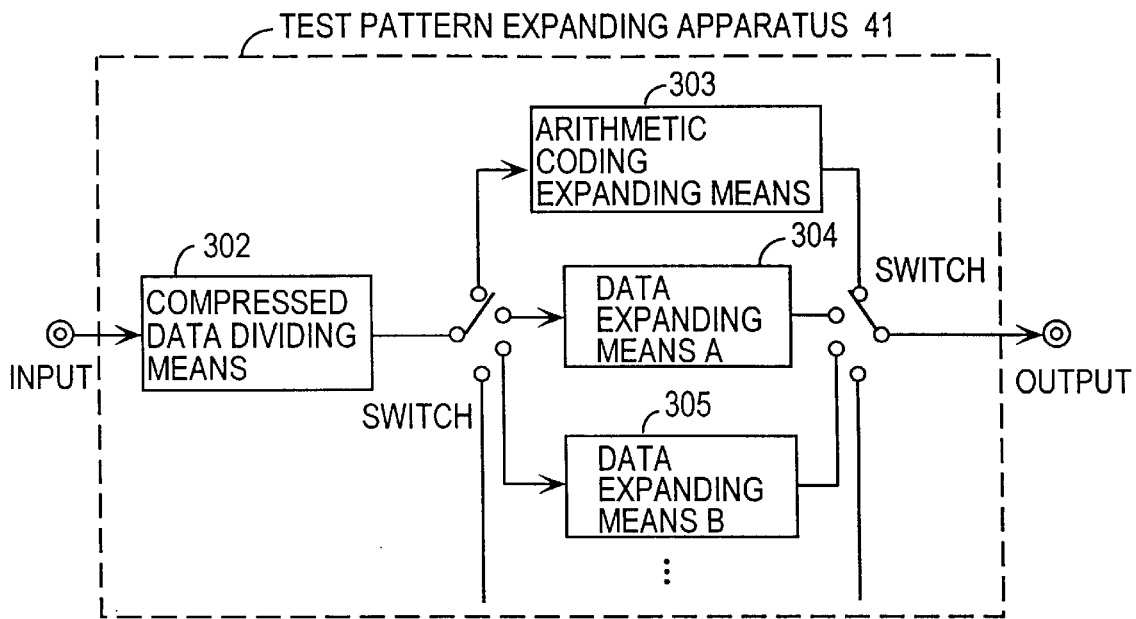
FIG. 30 is a block diagram showing an example of a functional construction of a test pattern expanding apparatus corresponding to the test pattern compressing apparatus shown in FIG. 28.

FIG. 30 is, in the first embodiment of the present invention, a block diagram showing an example of a construction of the test pattern expanding apparatus 41 in the case where one of the data expanding means is the arithmetic coding expanding means. This test pattern expanding apparatus 41 comprises compressed data dividing means 302 for dividing a compressed data to be expanded into data compressed by the arithmetic coding compressing method and data compressed by the other plurality of compressing methods, arithmetic coding expanding means 303 for expanding each compressed data to the original test pattern without information loss, and at least one of the other data expanding means 304 and 305 using the other expanding methods.

Figure 31:
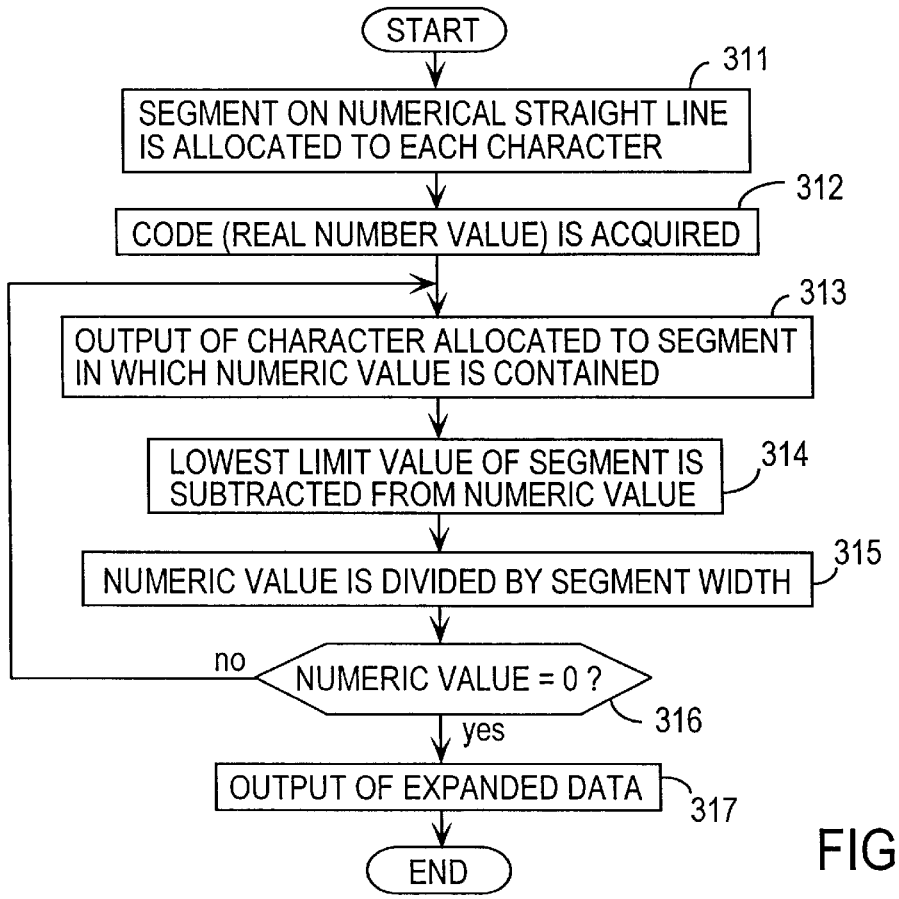
FIG. 31 is a flow chart for explaining a processing procedure of an arithmetic coding expanding method.

Next, the operations for performing a data expansion using the arithmetic coding expanding means 303 will be explained. FIG. 31 is a flow chart for explaining a processing procedure of the arithmetic coding expanding method and shows the arithmetic coding expanding method of the variation example 5 of the first embodiment of the present invention.

First, in step 311, information on an appearing probability of each character is acquired from a compressed data and a segment on a numerical straight line is allocated, quite similarly to the case of data compression, to each character. Then in step 312, a real number value code is acquired from the compressed data and in step 313, a character allocated to a segment in which a real number is included is outputted. Further, in steps 314 and 315, the lowest limit value of the segment is subtracted from the real number value. In addition, the real number value is divided by the segment width. Finally, in step 316, a check is made to see if the real number value is equal to zero. If the real number value is not zero, the steps 313, 314, 315 are repeated until the real number value becomes zero. If the real number value becomes zero, expanded data are outputted in step 317 and the process ends.

Figure 32:
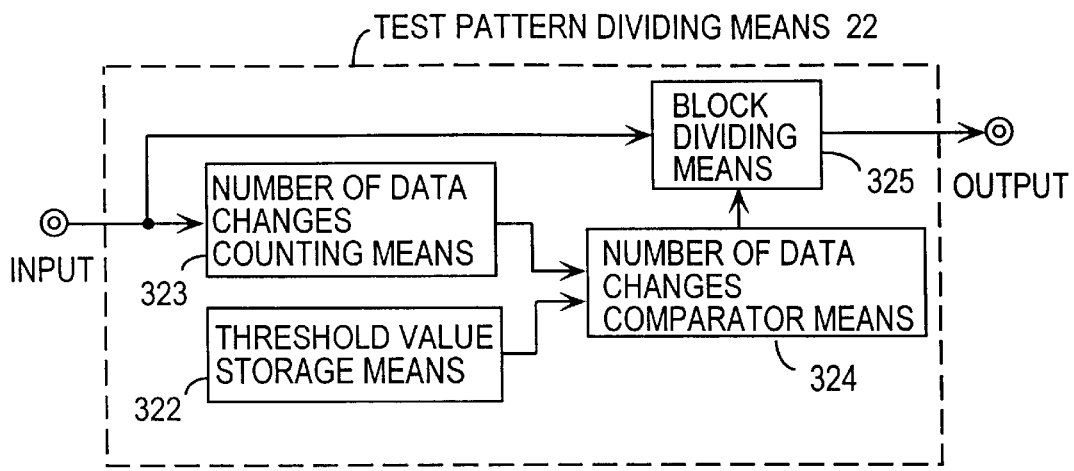
FIG. 32 is a block diagram showing an example of further another specific functional construction of the test pattern dividing means in the test pattern compressing apparatus shown in FIG. 2.

FIG. 32 is a block diagram showing an example of an internal construction of the test pattern dividing means 22 used in the first embodiment of the present invention. This test pattern dividing means 22 comprises threshold value storage means 322 for storing a predetermined threshold value, number of data changes counting means 322 for counting the number of data changes of an input data, number of data changes comparator means 324 for comparing the threshold value with the actual number of data changes, and block dividing means 325 for dividing the input data into a plurality of blocks in accordance with the comparison result.

Figure 33:
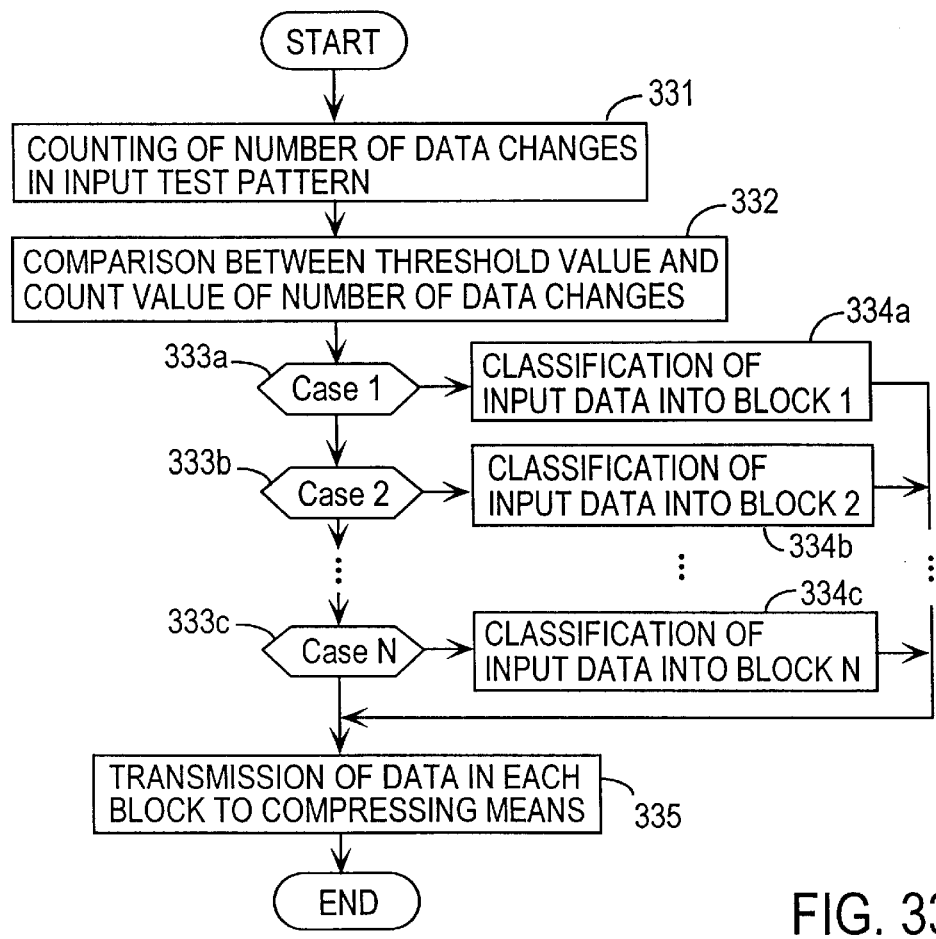
FIG. 33 is a flow chart for explaining a processing procedure of the test pattern dividing means shown in FIG. 32.

Next, the operations for dividing a test pattern into blocks using the test pattern dividing means 22 will be explained. FIG. 33 is a flow chart for explaining a processing procedure of the test pattern dividing means 22 shown in FIG. 32 and shows a test pattern dividing method of the first embodiment of the present invention.

First, in step 331, the number of data changes counting means 323 counts the number of data changes of a test pattern for each pin of an inputted test pattern. A threshold value stored in the threshold value storage means 322 and the number of data changes obtained by the number of data changes counting means 325 are transmitted to the number of data changes comparator means 324 where, in step 332, the both data are compared with each other. The comparison result is transmitted to the block dividing means 325. Then in steps 333 and 334, the block dividing means 325 divides the test pattern data into a plurality of blocks in accordance with the number of data changes of each test pattern data. Finally, the block dividing means 325 sends the data of each divided block to a corresponding one of the plurality of the data compressing methods.

Figure 34:
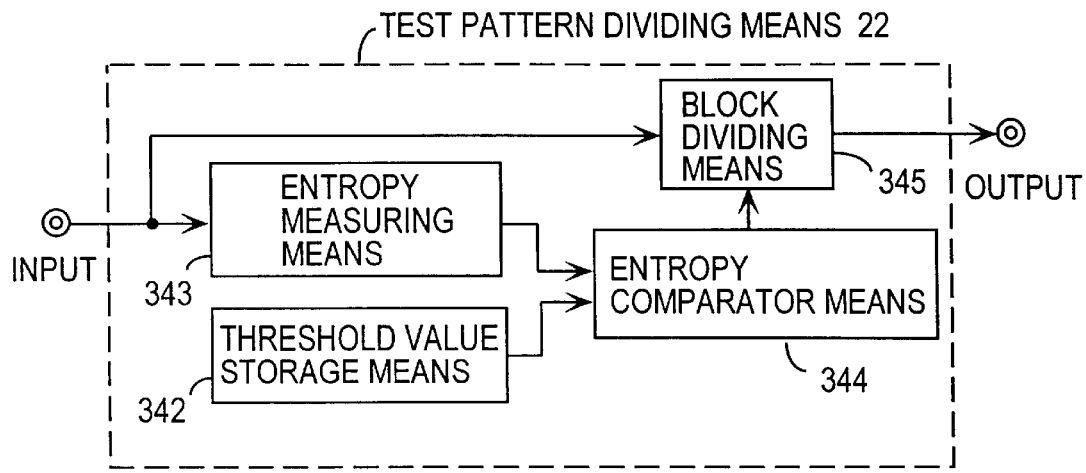
FIG. 34 is a block diagram showing an example of still another specific functional construction of the test pattern dividing means in the test pattern compressing apparatus shown in FIG. 2.

FIG. 34 is a block diagram showing another example of an internal construction of the test pattern dividing means 22 used in the first embodiment of the present invention. This test pattern dividing means 22 comprises threshold value storage means 342 for storing a predetermined threshold value, entropy measuring means 343 for measuring an appearing probability of each of symbol in an input data and for calculating an entropy of the data from the appearing probabilities of the symbols, entropy comparator means 344 for comparing the threshold value with an entropy of an actual data, and block dividing means 345 for dividing the input data into a plurality of blocks in accordance with the comparison results.

Figure 35:
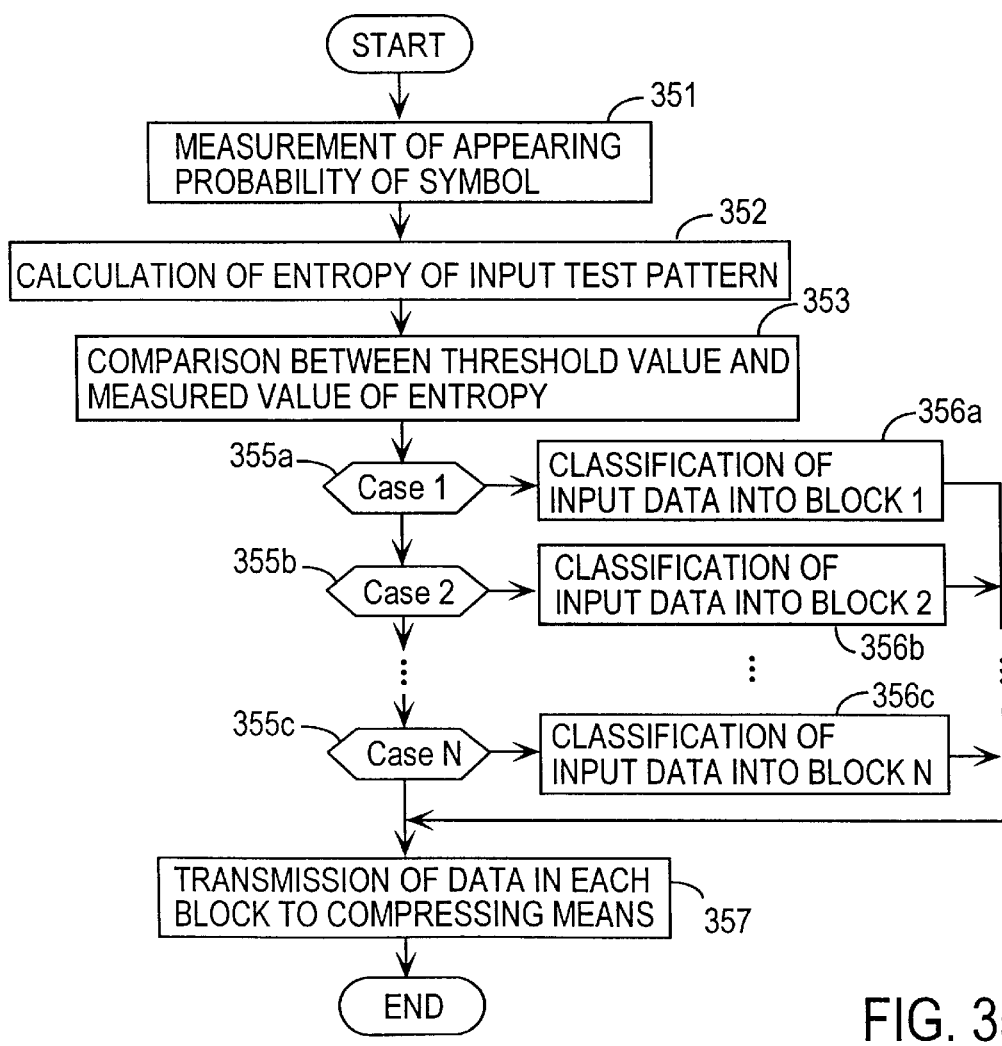
FIG. 35 is a flow chart for explaining a processing procedure of the test pattern dividing means shown in FIG. 34.

Next, the operations for dividing a test pattern into blocks using this test pattern dividing means 22 will be explained. FIG. 35 is a flow chart for explaining a processing procedure of the test pattern dividing means 22 shown in FIG. 34 and shows a test pattern dividing method of the first embodiment of the present invention.

First, in step 351, an appearing probability of each symbol in the inputted test pattern is measured. In addition, in step 352, an entropy of the input data is calculated from the probabilities obtained in step 351. The above steps 351 and 352 are performed by the entropy measuring means 343.

The threshold value stored in the threshold value storage means 342 and the entropy obtained by the entropy measuring means 343 are sent to the entropy comparator means 344 where those data are compared with each other in step 353. The comparison result is sent to the block dividing means 345. Next, in steps 354 and 355, the block dividing means 345 divides the test pattern data into a plurality of blocks in accordance with the respective entropies. Finally, the block dividing means 345 transmits, in step 356, the data of each divided block to corresponding one of the plurality of data compressing means.

Figure 36:
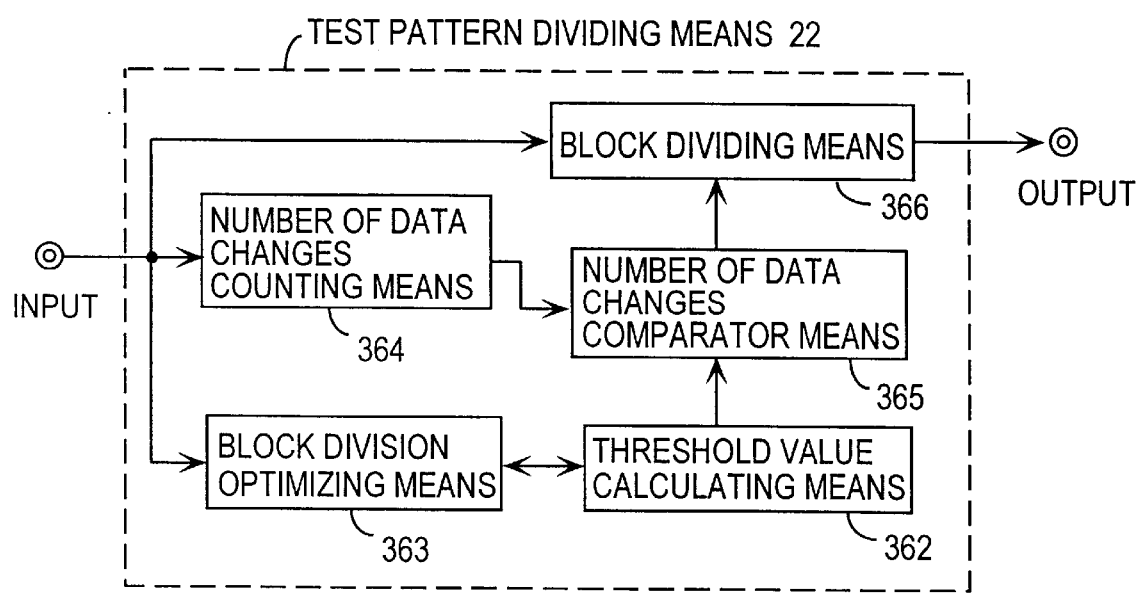
FIG. 36 is a block diagram showing an example of still another specific functional construction of the test pattern dividing means in the test pattern compressing apparatus shown in FIG. 2.

FIG. 36 is a block diagram showing another example of an internal construction of the test pattern dividing means 22 used in the first embodiment of the present invention. This test pattern dividing means 22 comprises threshold value calculating means 362 for calculating a threshold value of the number of data changes for a block division, optimizing means 363 for estimating a compression rate using the threshold value calculated by the threshold value calculating means 362 and for optimizing the threshold value so as to maximize the compression rate, number of data changes counting means 364 for counting the number of data changes, number of data changes comparator means 365 for comparing the optimized threshold value with the actual number of data changes, block dividing means 366 for dividing the test pattern into a plurality of blocks in accordance with the comparison results.

Figure 37:
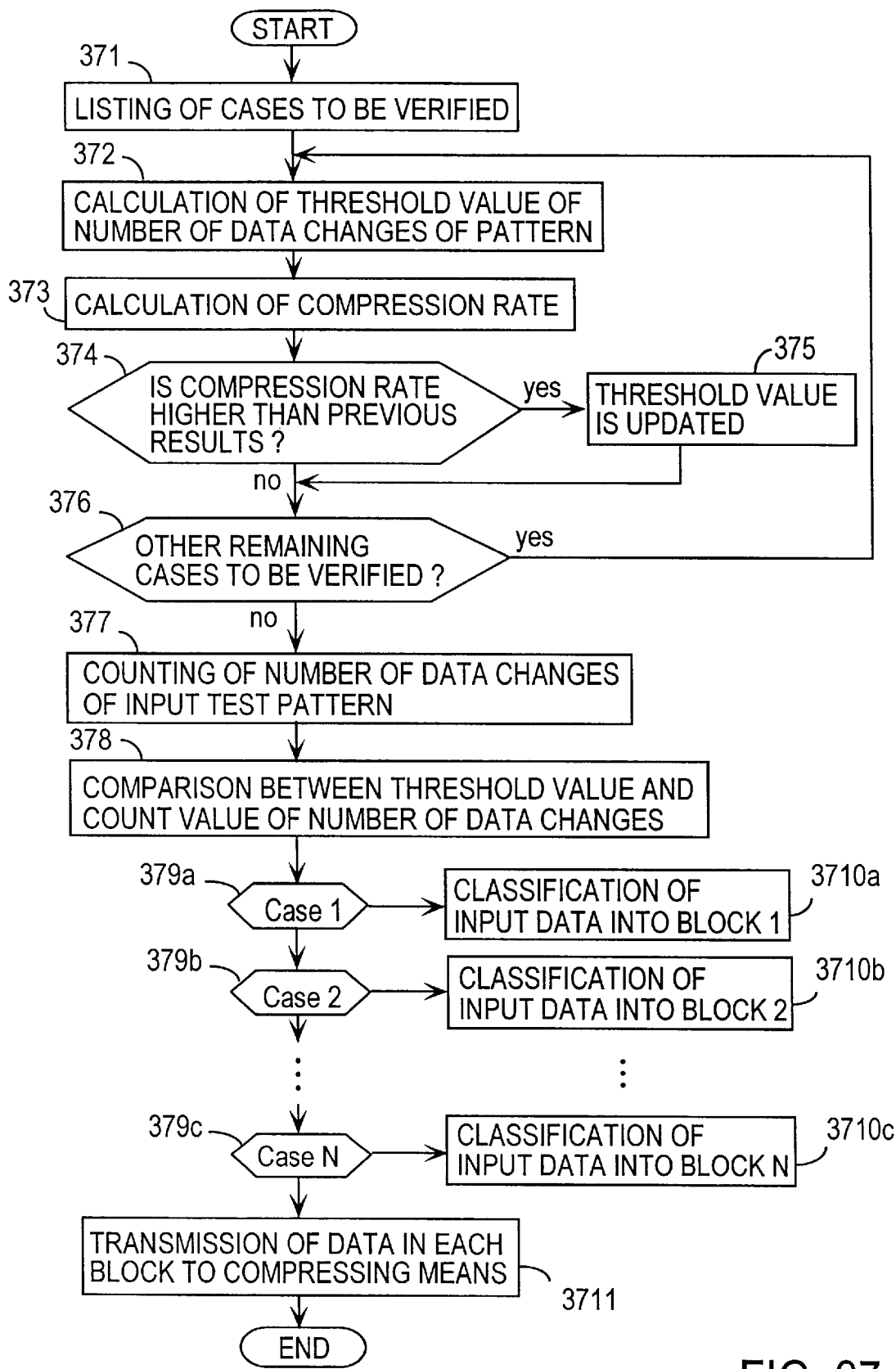
FIG. 37 is a flow chart for explaining a processing procedure of the test pattern dividing means shown in FIG. 36.

Next, the operations for dividing a test pattern into blocks using this test pattern dividing means 22 will be explained. FIG. 37 is a flow chart for explaining a processing procedure of the test pattern dividing means 22 shown in FIG. 36 and shows a test pattern dividing method of the first embodiment of the present invention.

First, in step 371, all the cases that are possible to occur are listed. Then in step 372, the threshold value calculating means 362 selects one of the cases listed in the step 371 to calculate a threshold value of the number of data changes of the pattern for dividing an input test pattern into a plurality of blocks. Then in step 373, the block division optimizing means 363 performs a block division and a data compression using the threshold value obtained in the step 372 and calculates a compression rate.

Next, in step 374, the compression rate is compared with the previous result. If the compression rate is higher than the previous result, the threshold value is updated to a new value in step 375. If the compression rate is lower than the previous result, the process proceeds to next step 376. In the step 376, a check is mate to see if there are the other cases not verified yet. If there are the other cases not verified yet, the steps 372, 373, 374 and 375 are repeated. If there is no case to be verified, the process moves to step 377. In the step 377, the number of data changes counting means 364 counts the number of data changes of a test pattern for each pin of the input test pattern. The optimized threshold value and the number of data changes obtained by the number of data changes counting means 364 are sent to the number of data changes comparator means 365 where the both data are compared with each other. The comparison result is sent to the block dividing means 366.

Next, in steps 379 and 3710, the block dividing means 366 divides the test pattern data into a plurality of blocks in accordance with the respective number of data changes. Finally, in step 3711, the block dividing means 366 transmits the data of each divided block to corresponding one of the plurality of data compressing means.

Figure 38:
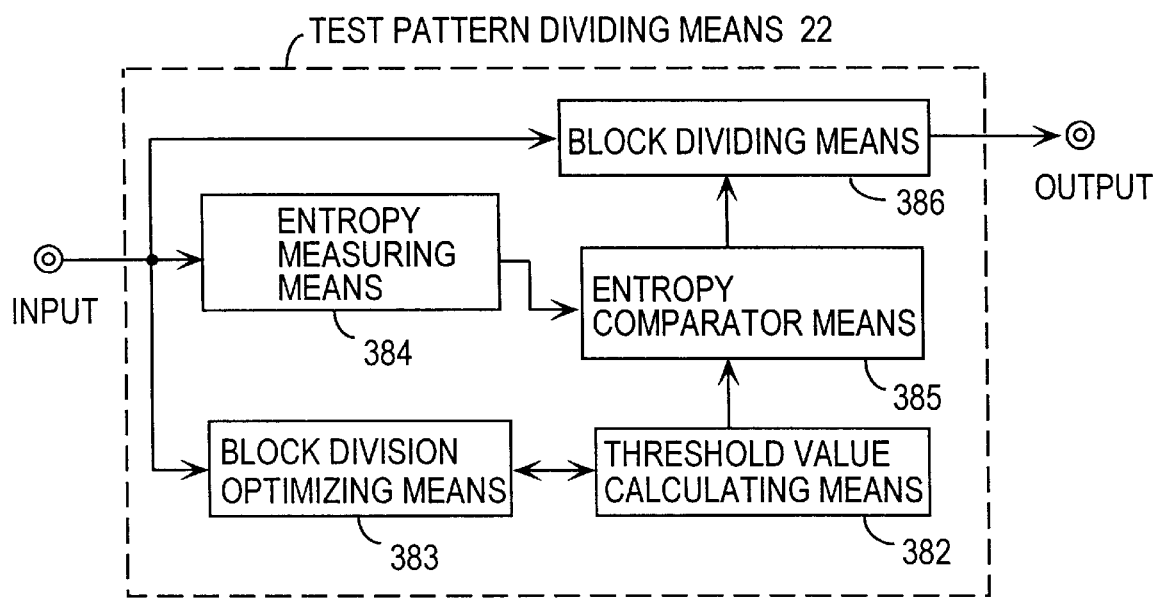
FIG. 38 is a block diagram showing an example of still another specific functional construction of the test pattern dividing means in the test pattern compressing apparatus shown in FIG. 2.

FIG. 38 is a block diagram showing further another example of an internal construction of the test pattern dividing means 22 used in the first embodiment of the present invention. This test pattern dividing means 22 comprises threshold value calculating means 382 for calculating a threshold value of entropy for a block division, optimizing means 383 for estimating a compression rate using the threshold value calculated by the threshold value calculating means 382 and for optimizing the threshold value so as to maximize the compression rate, entropy measuring means 384 for measuring an appearing probability of each symbol in an input data and for calculating an entropy of the data from those probabilities of the symbols, entropy comparator means 385 for comparing the optimized threshold value with an entropy of the actual data, and block dividing means 386 for dividing the input data into a plurality of blocks in accordance with the comparison results.

Figure 39:
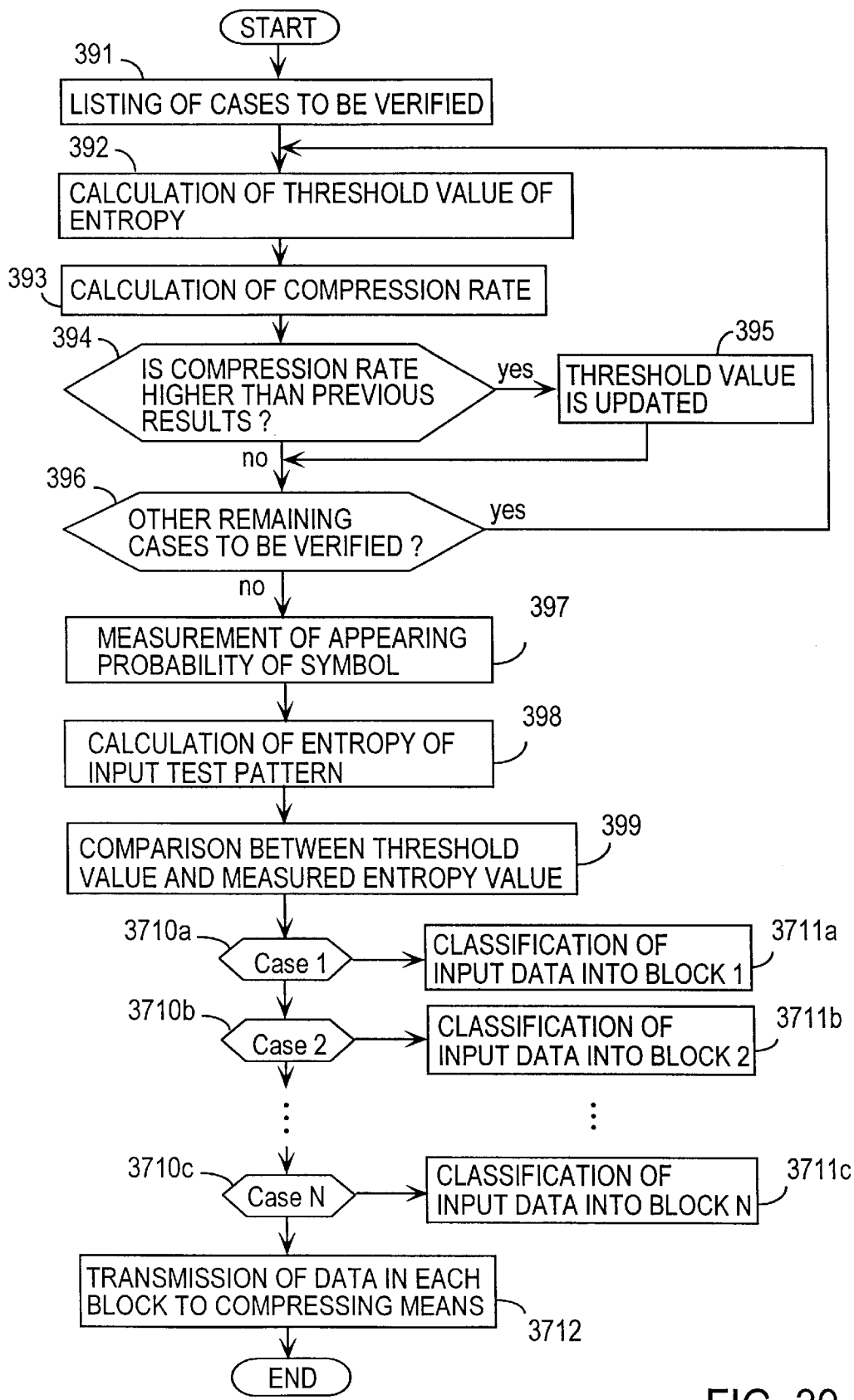
FIG. 39 is a flow chart for explaining a processing procedure of the test pattern dividing means shown in FIG. 38.

Next, the operations for dividing a test pattern into blocks using this test pattern dividing means 22 will be explained. FIG. 39 is a flow chart for explaining a processing procedure of the test pattern dividing means shown in FIG. 38 and shows a test pattern dividing method of the first embodiment of the present invention.

First, in step 391, all the cases that are possible to occur are listed. Then in step 392, the threshold value calculating means 382 selects one of the cases listed in the step 391 to calculate a threshold value of entropy for dividing an input test pattern into a plurality of blocks. Then in step 393, the block division optimizing means 383 performs a block division and a data compression using the threshold value obtained in the step 392 and calculates a compression rate. Then in step 394, the compression rate is compared with a previous result. If the compression rate is higher than the previous result, the threshold value is updated to a new value in step 395. If the compression rate is lower than the previous result, the process proceeds to next step 396.

In the step 396, a check is made to see if there are the other cases not verified yet. If there are the other cases not verified yet, the steps 392, 393, 394 and 395 are repeated. If there is no case to be verified, the process moves to step 397. In the step 397, an appearing probability of each symbol in the inputted test pattern is measured. In addition, in step 398, an entropy of the input data is calculated from the probabilities obtained in the step 397. The above steps 397 and 398 are performed by the entropy measuring means 384. The optimized threshold value and the entropy obtained by the entropy measuring means 384 are sent to the entropy comparator means 385 where those data are compared with each other in step 399. The comparison result is transmitted to the block dividing means 386.

Next, in steps 3910 and 3911, the block dividing means 386 divides the test pattern data into a plurality of blocks in accordance with the respective entropies. Finally, the block dividing means 386 transmits, in step 399, the data of each divided block to corresponding one of the plurality of data compressing method.

Figure 40:
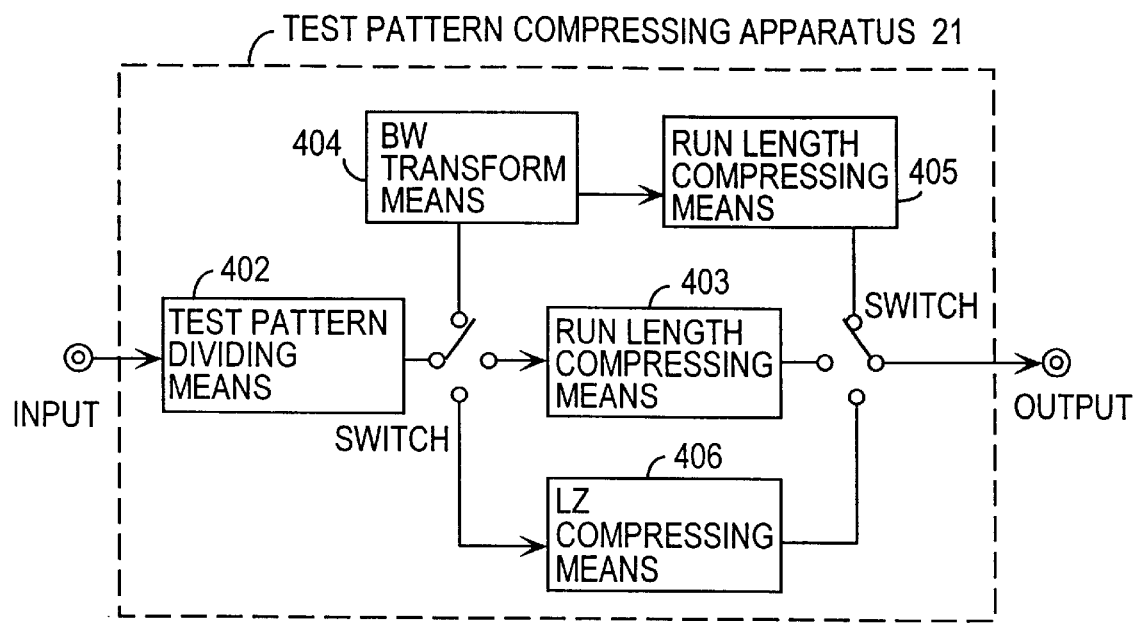
FIG. 40 is a block diagram showing an example of still another specific functional construction of the test pattern compressing apparatus.

FIG. 40 is, in the first embodiment of the present invention, a block diagram showing an example of a construction of the test pattern compressing apparatus in the case where the test pattern compressing apparatus has run length compressing means, BW transform means and LZ compressing means. This test pattern compressing apparatus 21 comprises test pattern dividing means 402 for dividing an input data into blocks in accordance with a data structure or a statistical characteristic of the input data, run length compressing means 403 for applying a run length compression to a block having the number of data changes equal to or less than a threshold value, BW transform means 404 for applying BW transform to a block having the number of data changes greater than the threshold value and a data entropy equal to or less than a threshold value, another run length compressing means 405 for applying the run length compressing method to a data transformed by the BW transform means, and LZ compressing means 406 for applying an LZ compression to a block having the number of data changes greater than the threshold value and a data entropy greater than the threshold value.

Figure 41:
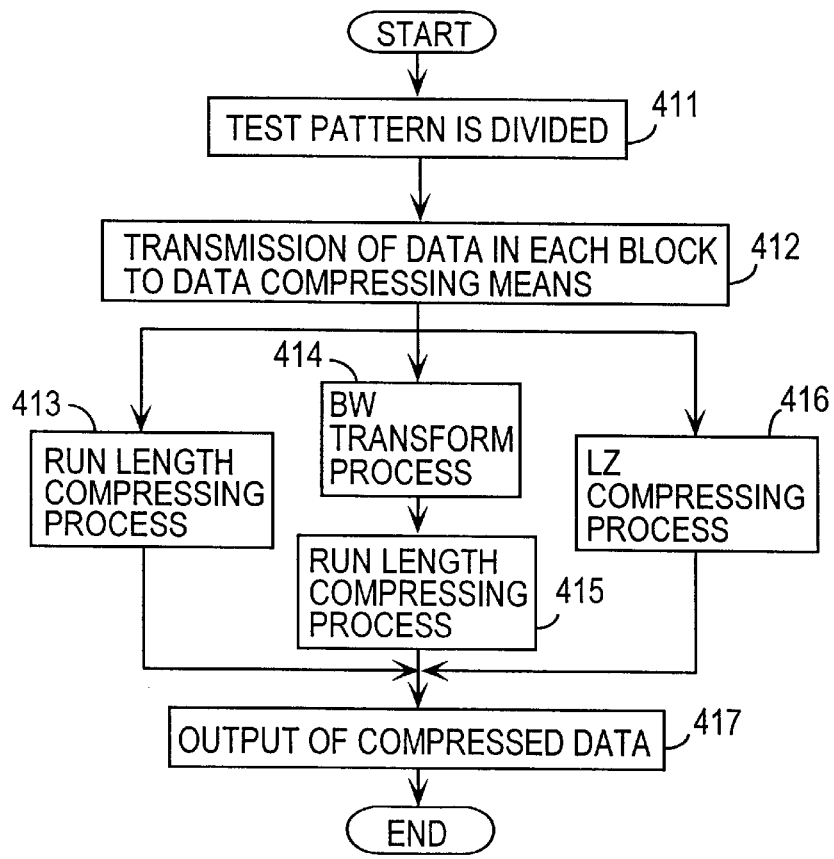
FIG. 41 is a flow chart for explaining a processing procedure of the test pattern compressing apparatus shown in FIG. 40.

Next, the operations for compressing a test pattern using this test pattern compressing apparatus 21 will be explained. FIG. 41 is a flow chart for explaining a processing procedure of the test pattern compressing apparatus 21 shown in FIG. 40 and shows a test pattern compressing method of the first embodiment of the present invention.

The test pattern dividing means 402 divides, in step 411, a test pattern data into a plurality of blocks in accordance with a data structure or a statistical characteristic of the test pattern data. The data of each block are transmitted via a switch to corresponding one of the run length compressing means 403, the BW transform means 404 and the LZ compressing means 406 each having an optimum compression algorithm for the corresponding block. Then those data are compressed, in steps 413, 414, 415 and 416 by the run length compressing means 403, the BW transform means 404, the run length compressing means 405 and the LZ compressing means 406, respectively. Finally, in step 417, the compressed data are outputted via a switch.

Figure 42:
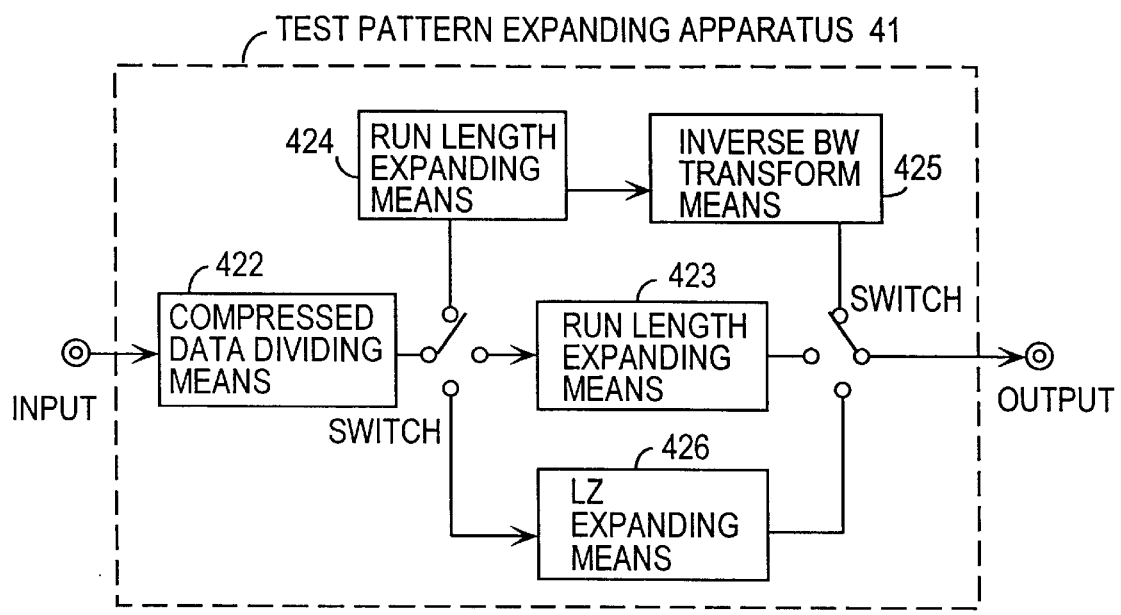
FIG. 42 is a block diagram showing an example of a functional construction of a test pattern expanding apparatus corresponding to the test pattern compressing apparatus shown in FIG. 40.

FIG. 42 is, in the first embodiment of the present invention, a block diagram showing an example of a construction of the test pattern expanding apparatus in the case where the test pattern expanding apparatus has run length expanding means, inverse BW transform means and LZ expanding means. This test pattern expanding apparatus 41 comprises compressed data dividing means 422 for dividing a compressed data to be expanded into data compressed by the run length compressing method, data compressed by the run length compressing method after application of BW transform, and data compressed by the LZ compressing method by, for example, a flag affixed to each compressed data; run length expanding means 423 and 424, and LZ expanding means 426 for expanding respective compressed data to the original test patterns without any information loss; and inverse BW transform means 425 for applying inverse BW transform to test pattern data to which BW transform has been applied.

Figure 43:
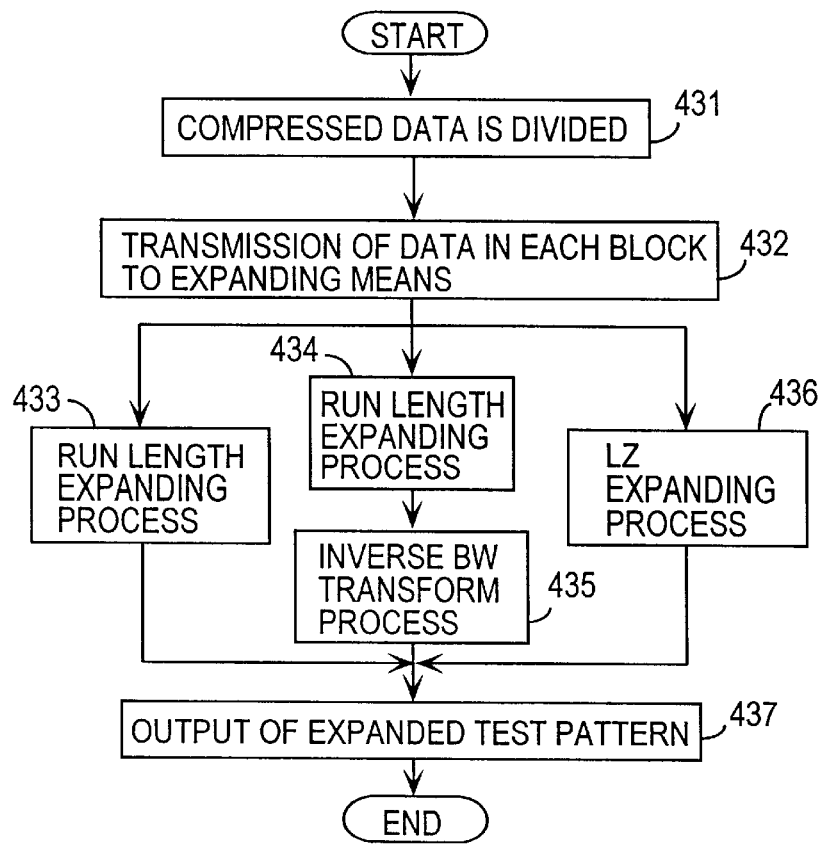
FIG. 43 is a flow chart for explaining a processing procedure of the test pattern expanding apparatus shown in FIG. 42.

Next, the operations for expanding a compressed data using this test pattern expanding apparatus 41 will be explained. FIG. 43 is a flow chart for explaining a processing procedure of the test pattern expanding apparatus shown in FIG. 42 and shows a test pattern expanding method of the first embodiment of the present invention.

First, in step 431, the compressed data dividing means 422 divides a compressed data to be expanded into data compressed by the run length compressing method, data compressed by the run length compressing method after application of BW transform, and data compressed by the LZ compressing method. The compressed data are transmitted, in step 432, to the run length expanding means 423 and 424, and the LZ expanding means 426 respectively via a switch. The transmitted data are expanded, in steps 433, 434 and 436, by the respective data expanding means to the original data without any information loss. Further, the data to which BW transform has been applied is inversely transformed, in step 435 to the original data by inverse BW transform. Finally, in step 437, the expanded test patterns are outputted via a switch.

Figure 44:
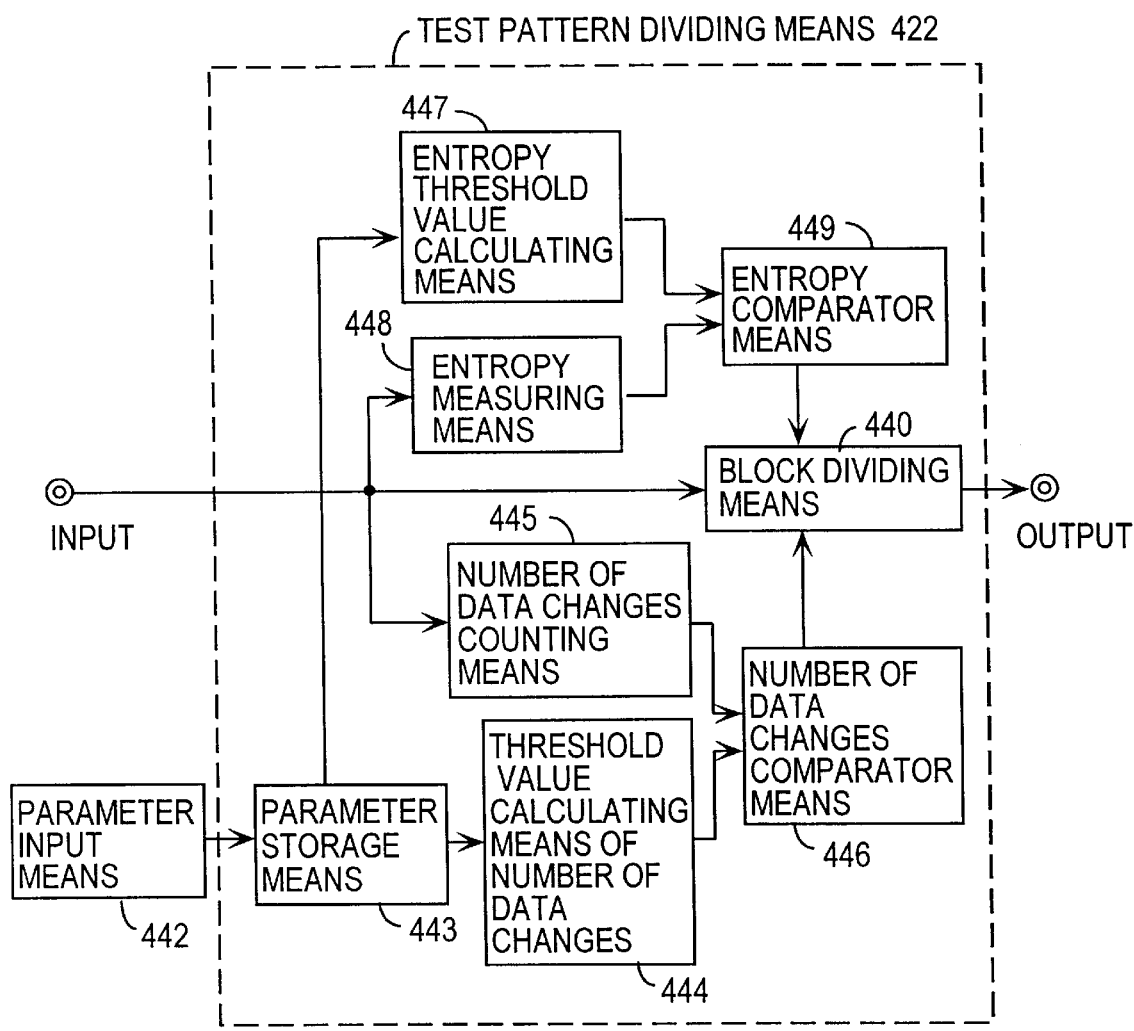
FIG. 44 is a block diagram showing an example of a specific functional construction of the test pattern dividing means in the test pattern compressing apparatus shown in FIG. 40.

FIG. 44 is a block diagram showing an example of a functional construction of the test pattern dividing means 422 used in the first embodiment of the present invention. This test pattern dividing means 422 comprises parameter input means 442 for inputting environmental parameters for a block division, parameter storage means 443 for storing inputted environmental parameters, threshold value calculating means of the number of data changes 444 for calculating a threshold value of the number of data changes for performing a block division using the environmental parameters stored in the parameter storage means 443, number of data changes counting means 445 for counting the number of data changes of an inputted data, number of data changes comparator means 446 for comparing the threshold value of the number of data changes with the number of data changes of an actual data, entropy threshold value calculating means 447 for calculating a threshold value of entropy for performing a block division using the environmental parameters stored in the parameter storage means 443, entropy measuring means 448 for measuring an entropy of an inputted data, entropy comparator means 449 for comparing the entropy threshold value with an entropy of an actual data, and block dividing means 440 for dividing a data into a plurality of blocks in accordance with the comparison results obtained by the number of data changes comparator means 446 and the entropy comparator means 449.

Figure 45:
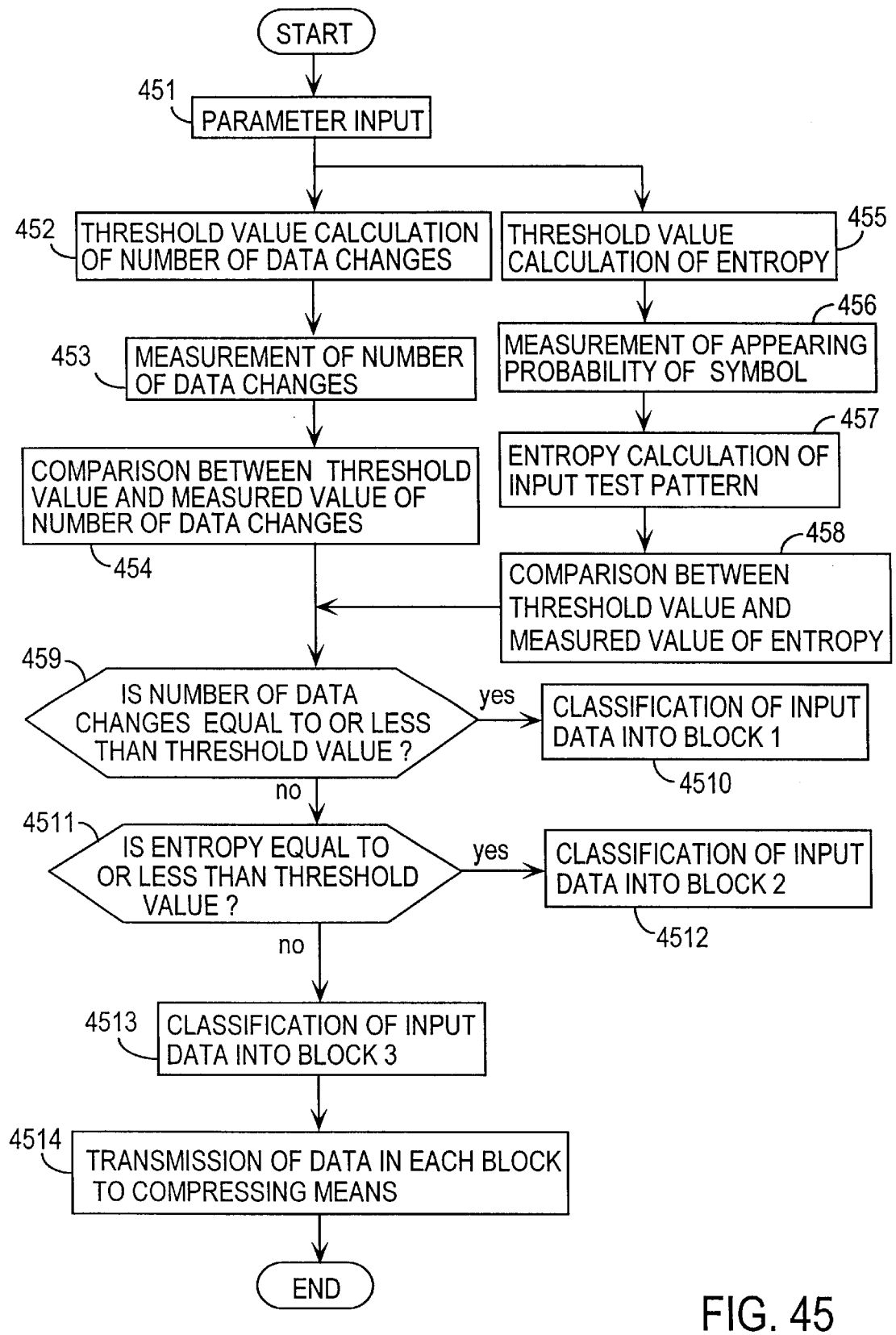
FIG. 45 is a flow chart for explaining a processing procedure of the test pattern dividing means shown in FIG. 44.

Next, the operations for dividing a test pattern into blocks using this test pattern dividing means 422 will be explained. FIG. 45 is a flow chart for explaining a processing procedure of the test pattern dividing means 422 shown in FIG. 44 and shows a test pattern dividing method of the first embodiment of the present invention.

First, in step 451, parameters for calculating a threshold value for a block division are inputted using the parameter input means 442. The inputted parameters are stored in the parameter storage means 443. Then in step 452, the threshold value calculating means of the number of data changes 444 calculates a threshold value of the number of data changes of a pattern for dividing an input test pattern into a plurality of blocks. Then in step 453, the number of data changes counting means 445 counts the number of data changes of a test pattern for each pin of the inputted test pattern.

The threshold value of the number of data changes calculated by the threshold value calculating means of the number of data changes 444 and the number of data changes obtained by the number of data changes counting means 445 are sent to the number of data changes comparator means 446 where the both data are compared with each other in step 454. At the same time, in step 455, the entropy threshold value calculating means 447 calculates an entropy threshold value for dividing the input test pattern into a plurality of blocks. Then in step 456, an appearing probability of each symbol in the input test pattern is measured. In addition, in step 457, an entropy of the input data is calculated from the probabilities obtained in the step 456. The above steps 456 and 457 are performed by the entropy measuring means 448. The threshold value calculated by the entropy threshold value calculating means 447 and an entropy obtained by the entropy measuring means 448 are sent to the entropy comparator means 449 where the both data are compared with each other in step 458. Here, the steps from the step 452 through the step 454 and the steps from the step 455 through the step 458 can be processed in parallel.

The comparison results obtained in the steps 454 and 458 are transmitted to the block dividing means 440. The block dividing means 440 first determines, in step 459, if the number of data change of a test pattern for each pin is equal to or less than the threshold value to classify, in step 4510, a test pattern having the number of data changes equal to or less than the threshold value to block 1. Further, regarding a test pattern having the number of data changes greater than the threshold value, a check is made, in step 4511 to see if its entropy is equal to or less than the threshold value. If the entropy of the test pattern is equal to or less than the threshold value, the test pattern is classified to block 2 in step 4512. A test pattern having an entropy greater than the threshold value is classified to block 3 in step 4513. Finally, the block dividing means 440 transmits the data of each divided block to corresponding one of the plurality of data compressing means.

Figure 46:
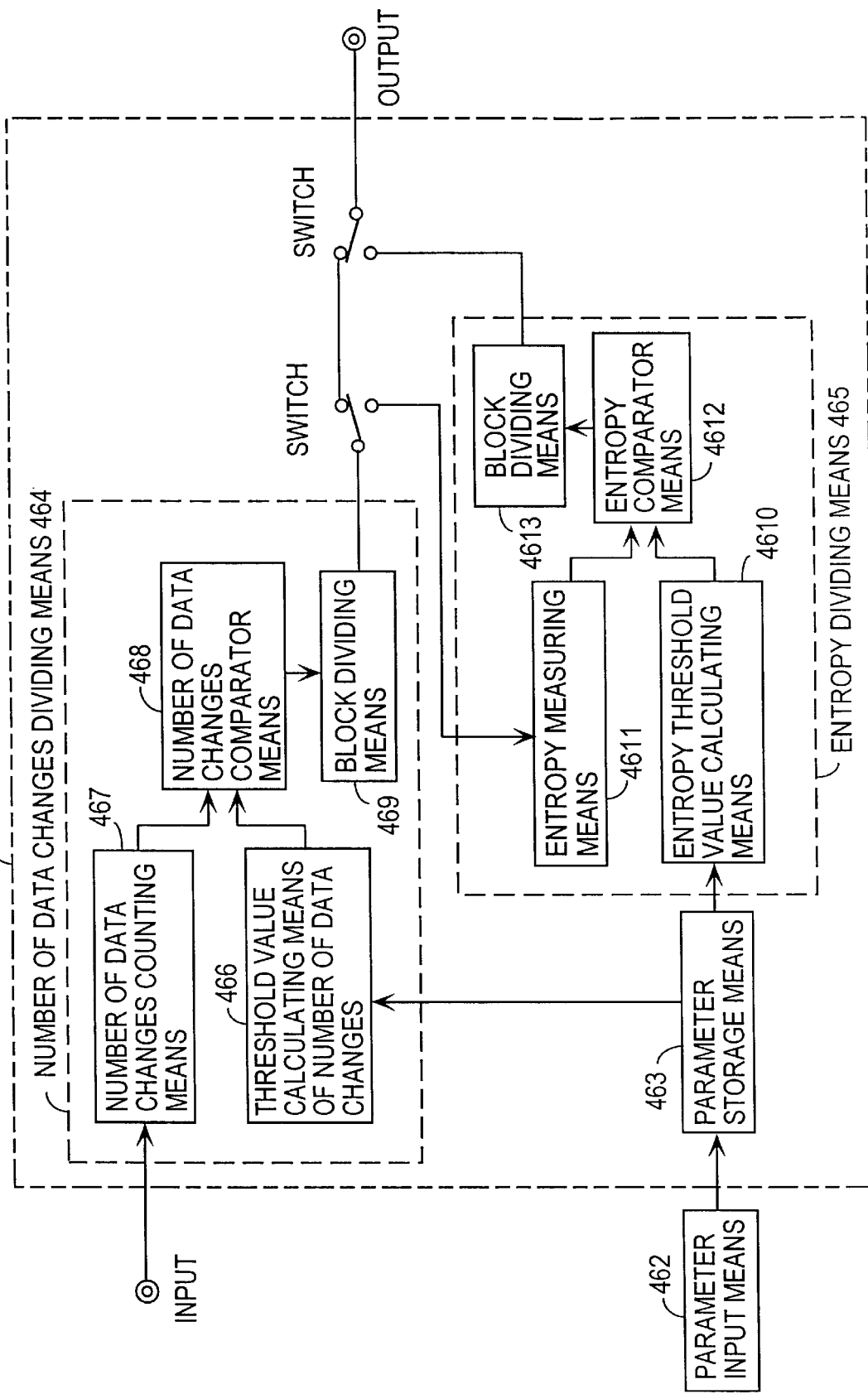
FIG. 46 is a block diagram showing an example of another specific functional construction of the test pattern dividing means in the test pattern compressing apparatus shown in FIG. 40.

FIG. 46 is a block diagram showing another example of a functional construction of a test pattern dividing means 422 used in the first embodiment of the present invention. This test pattern dividing means 422 comprises parameter input means 462 for inputting environmental parameters for a block division, parameter storage means 463 for storing inputted environmental parameters, number of data changes dividing means 464 for performing a block division in accordance with the number of data changes, and entropy dividing means 465 for performing a block division in accordance with an entropy.

Further, the number of data changes dividing means 464 comprises threshold value calculating means of the number of data changes 466, number of data changes counting means 467 for counting the number of data changes of an inputted data, number of data changes comparator means 468 for comparing the threshold value of the number of data changes with the number of data changes of an actual data, and block dividing means 469 for dividing an input data into a plurality of blocks in accordance with the comparison results obtained by the number of data changes comparator means 468. The entropy dividing means 465 comprises entropy threshold value calculating means 4610 for calculating an entropy threshold value for performing a block division using the environmental parameters stored in the parameter storage means 463, entropy measuring means 4611 for measuring an entropy of an inputted data, entropy comparator means 4612 for comparing the entropy threshold value with an entropy of an actual data, and block dividing means 4613 for dividing a data into a plurality of blocks in accordance with the comparison results obtained by the entropy comparator means 4612.

Figure 47:
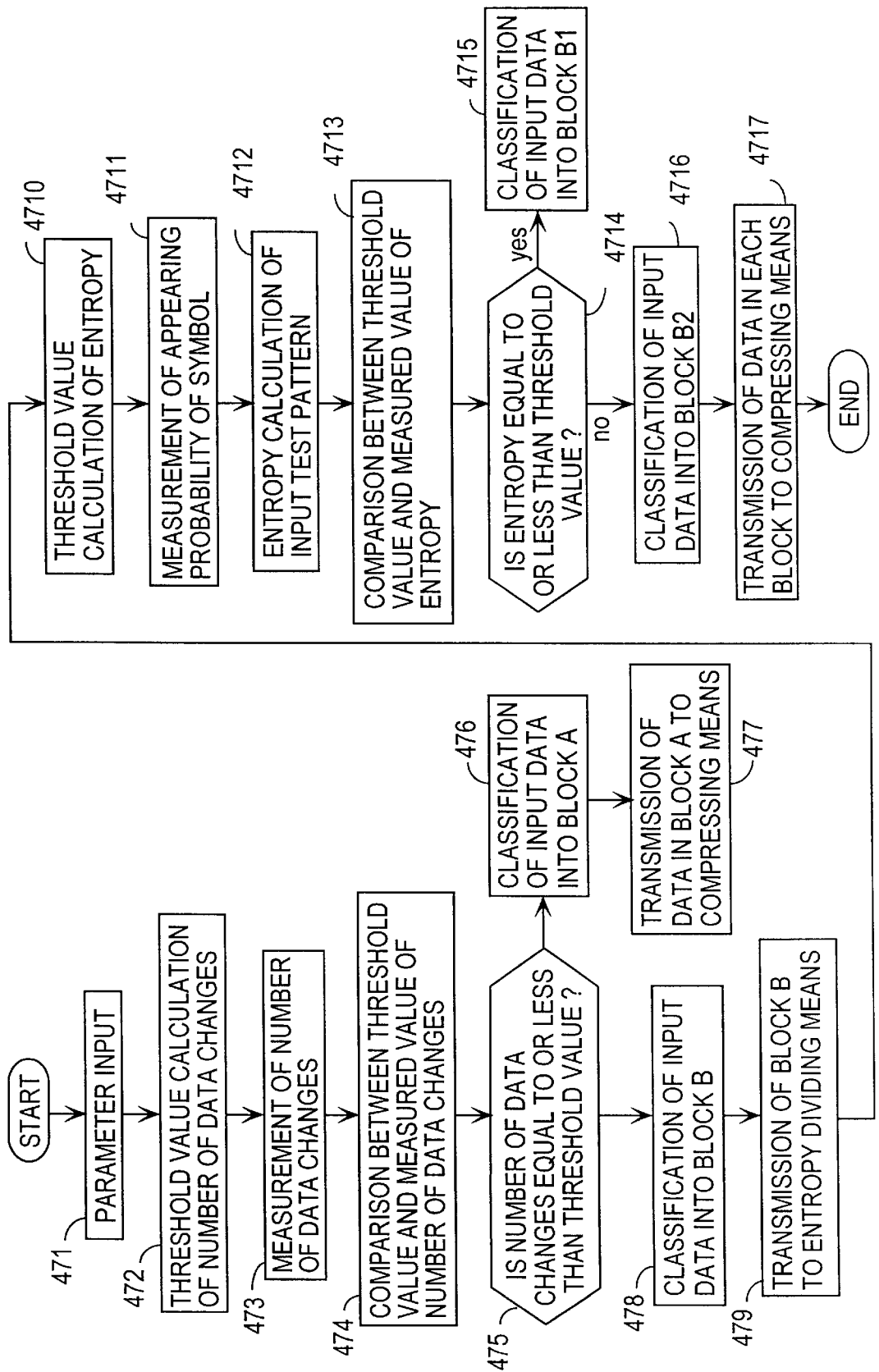
FIG. 47 is a flow chart for explaining a processing procedure of the test pattern dividing means shown in FIG. 46.

Next, the operations for dividing a test pattern into blocks using the test pattern dividing means 461 will be explained. FIG. 47 is a flow chart for explaining a processing procedure of the test pattern dividing means shown in FIG. 46 and shows a test pattern dividing method of the first embodiment of the present invention.

First, in step 471, parameters for calculating a threshold value for a block division are inputted using the parameter input means 462. The inputted parameters are stored in the parameter storage means 463. Then in step 472, the threshold value calculating means of the number of data changes 466 in the number of data changes dividing means 464 calculates, using the parameters stored in the parameter storage means 463, a threshold value of the number of data changes of a pattern for dividing an input test pattern into a plurality of blocks. Then in step 473, the number of data changes counting means 467 counts the number of data changes of a test pattern for each pin of the inputted test pattern.

The threshold value of the number of data changes calculated by the threshold value calculating means of the number of data changes 466 and the number of data changes obtained by the number of data changes counting means 467 are sent to the number of data changes comparator means 468, where the both data are compared with each other in step 474. The comparison result obtained in the step 474 is transmitted to the block dividing means 469. Then in step 475, the block dividing means 469 determines if the number of data changes of a test pattern for each pin is equal to or less than the threshold value to classify, in step 476, a test pattern having the number of data changes equal to or less than the threshold value to block A. The divided block A is outputted, in step 477, via a switch. A test pattern having the number of data changes greater than the threshold value is classified, in step 478, to block B and the divided block B is transmitted to the entropy dividing means 465 in step 479. Then in step 4710, the entropy threshold value calculating means 4610 calculates an entropy threshold value for dividing an input test pattern into a plurality of blocks. In step 4711, an appearing probability of each symbol in the inputted test pattern is measured. In addition, in step 4712, an entropy of the input data is calculated from the probabilities obtained in the step 4711. The above steps 4711 and 4712 are performed by the entropy measuring means 4611.

The threshold value calculated by the entropy threshold value calculating means 4610 and the entropy obtained by the entropy measuring means 4611 are sent to the entropy comparator means 4612, where the both data are compared with each other in step 4713. Here, each of the steps 472 and 4710 is independent and can be processed in parallel with each other.

The comparison result obtained in the step 4713 is transmitted to the block dividing means 4613. In the block dividing means 4613, a check is made in step 4714 to see if an entropy of a test pattern for each pin is equal to or less than the threshold value. If an entropy of a test pattern is equal to or less than the threshold value, the test pattern is classified to block B1 in step 4715. A test pattern determined to have an entropy greater than the threshold value in the step 4714 is classified, in step 4716, to block B2. Finally, the block dividing means 4613 outputs in step 4717 the data of each block divided by the entropy dividing means 465 via a switch.

Figure 48:
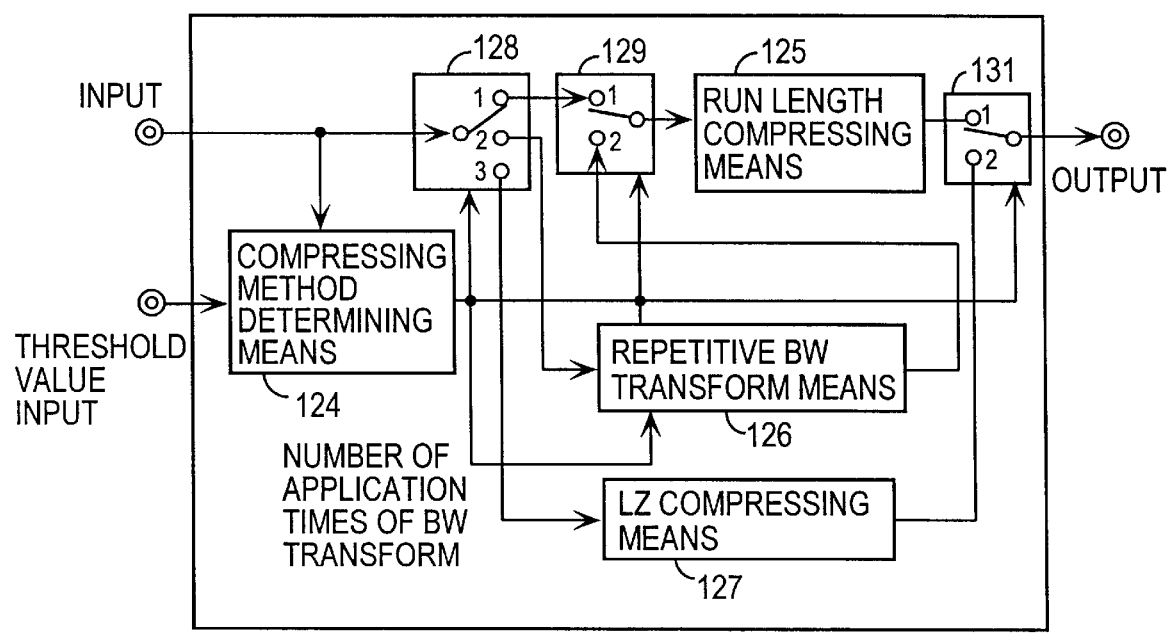
FIG. 48 is a block diagram showing an example of further another functional construction of the test pattern compressing apparatus.

FIG. 48 is a block diagram showing further another example of a functional construction of a test pattern compressing apparatus 21 used in the first embodiment of the present invention. This test pattern compressing apparatus 21 comprises compressing method determining means 124 for determining an optimum compressing method adapted to an inputted test pattern, run length compressing means 125 for performing a data compression by applying a run length compressing method to an input test pattern, repetitive BW transform means 126 for applying BW transform at least one time to an input test pattern, LZ compressing means 127 for performing a data compression by applying an LZ compressing method to an input test pattern, and three switches 128, 129 and 131 for selecting a rout of a test pattern in accordance with the compressing method obtained by the compressing method determining means 124.

Figure 49:
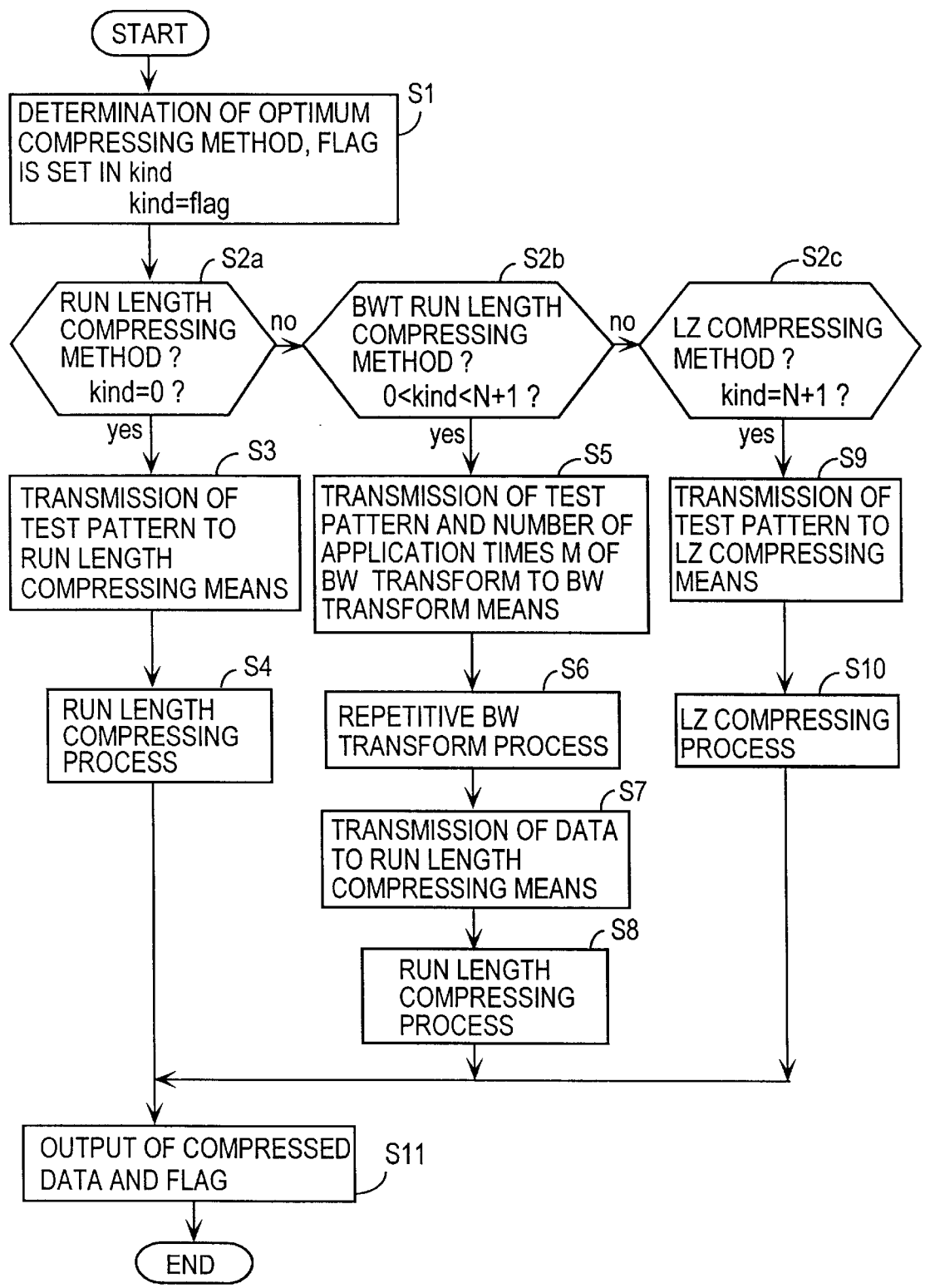
FIG. 49 is a flow chart for explaining a processing procedure of the test pattern compressing apparatus shown in FIG. 48.

Next, the operations for compressing a test pattern using this test pattern compressing apparatus will be explained. FIG. 49 is a flow chart for explaining a processing procedure of the test pattern compressing apparatus shown in FIG. 48 and shows a test pattern compressing method of the first embodiment of the present invention.

First, in step S1, the compressing method determining means 124 determines an optimum compressing method adapted to an inputted test pattern and sets a flag that can unitarily determine a compressing method is in "kind". Here, the flag takes a value 0 for the run length compressing method, a value m (m=1, 2, . . . , N, where N is a fixed value indicating the maximum number of application times of BW transform, for example, N=5) which is equal to the number of application times of BW transform for the BWT run length compressing method, and a value N+1 for the LZ compressing method. Further, in order to determine an optimum compressing method to be applied to a test pattern, an experientially determined threshold value input is used.

Next, in steps S2a, S2b and S2c, when the determined compressing method is the run length compressing method (i.e., kind=0), switches 128, 129 and 131 are connected to their terminals 1, 1 and 1, respectively to transmit, in step S3, the test pattern to the run length compressing means 125. Then in step S4, the run length compressing means 125 compresses the test pattern using the run length compressing method.

In step S2b, when the determined compressing method is the BWT run length compressing method (i.e., 0<kind<N+1), the switches 128, 129 and 131 in the test pattern compressing apparatus are connected to their terminals 2, 2 and 1, respectively to transmit, in step S5, the test pattern and the number of application times of BW transform M (=kind) to the repetitive BW transform means 126. Then, in step S6, the repetitive BW transform means 126 applies BW transform to the test pattern M times. Further in step S7, the data transformed by BW transform is transmitted to the rum length compressing means 125, and then in step S8, the run length compressing means 125 compresses the data.

In step S2c, when the determined compressing method is the LZ compressing method (i.e., kind=N+1), the switches 128 and 131 in the test pattern compressing apparatus are connected to their terminals 3 and 2 respectively to transmit, in step S9, the test pattern to the LZ compressing means 127. Then in step S10, the LZ compressing means 127 compresses the test pattern using the LZ compressing method. Finally in step S11, the compressed data and the flag "kind" which unitarily indicates the method used for the compression are outputted and the process ends.

Figure 50:
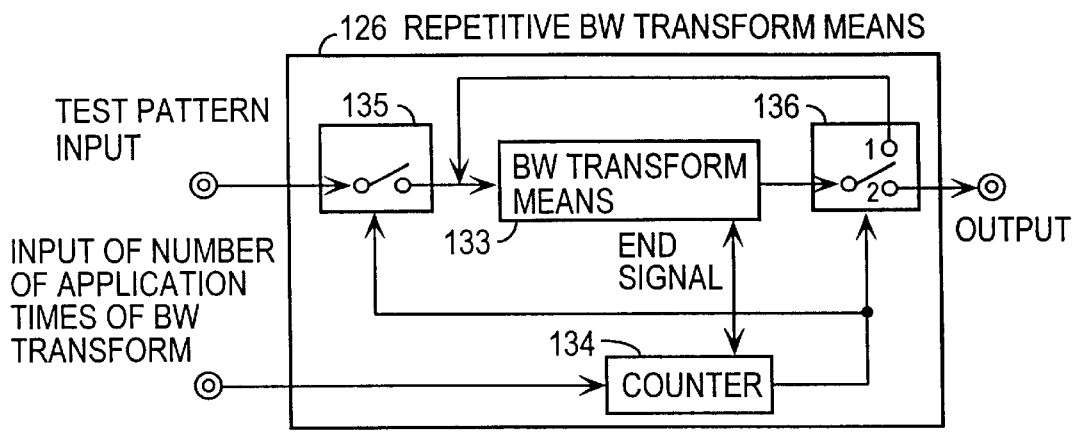
FIG. 50 is a block diagram showing an example of a functional construction of a repetitive BW transform means in the test pattern compressing apparatus shown in FIG. 48.

FIG. 50 is a block diagram showing an example of a functional construction of the repetitive BW transform means 126 in the test pattern compressing apparatus shown in FIG. 48. This repetitive BW transform means comprises BW transform means 133 for applying BW transform to an inputted test pattern, a counter 134 for counting the number of application times of BW transform, and two switches 135 and 136 for selecting the data path.

Figure 51:
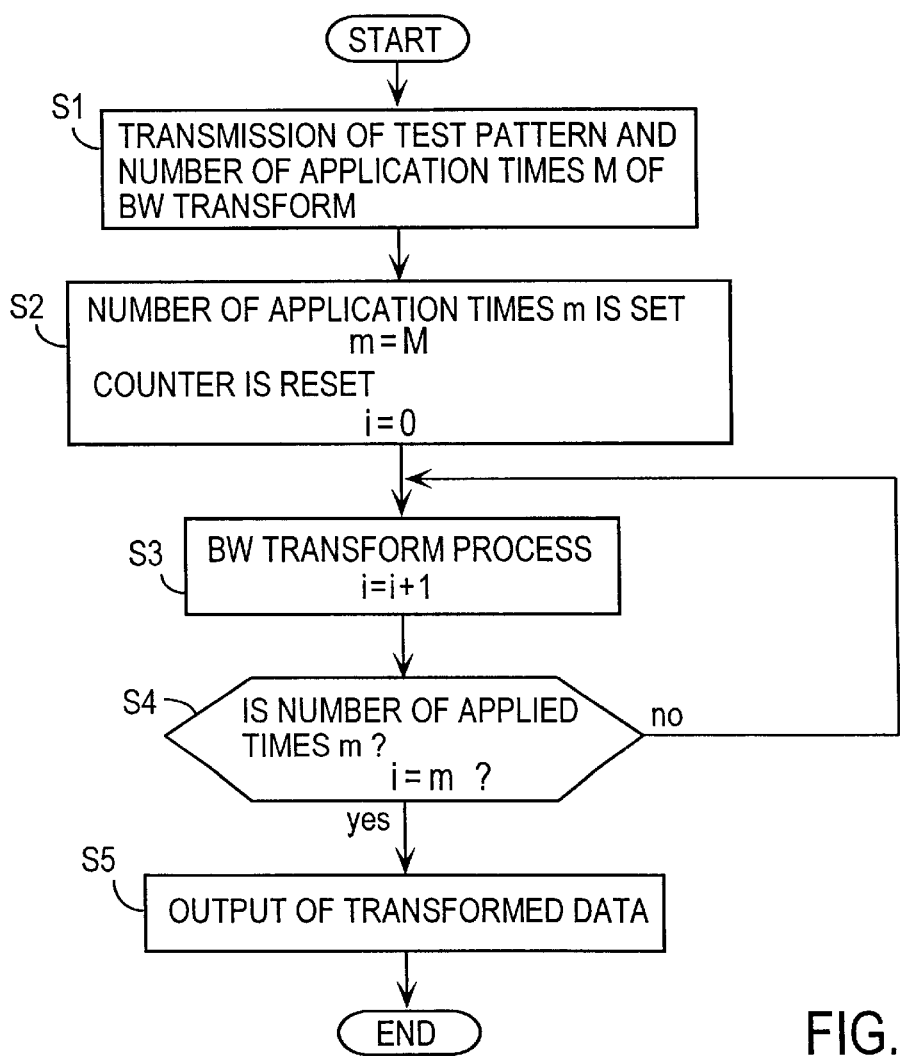
FIG. 51 is a flow chart for explaining a processing procedure of the repetitive BW transform means shown in FIG. 50.

Next, the operations for performing BW transform of a data using this repetitive BW transform means 126 will be explained. FIG. 51 is a flow chart for explaining a processing procedure of the repetitive BW transform means 126 shown in FIG. 50.

First in step S1, an inputted test pattern is transmitted to the BW transform means 133 and the number of application times M of BW transform is transmitted to the counter 134. Then in step S2, the number of application times m of BW transform is set to m=M and a counter value i is reset to i=0. In step S3, BW transform is applied to the test pattern and the counter 134 adds 1 to i based on an end signal of BW transform. In step S4, a check is made to see if BW transform is performed m times, i.e., i=m. If the counter value of the number of applied times i of BW is transform is not i=m, the switch 135 is opened and the switch 136 is connected to its terminal 1 to repeat BW transform in the step S3.

If the counter value of the number of applied times i of BW transform is i=m, the switch 135 is closed and the switch 136 is connected to its terminal 2 to output the data transformed by BW transform in next step S5, and the process ends.

Figure 52:
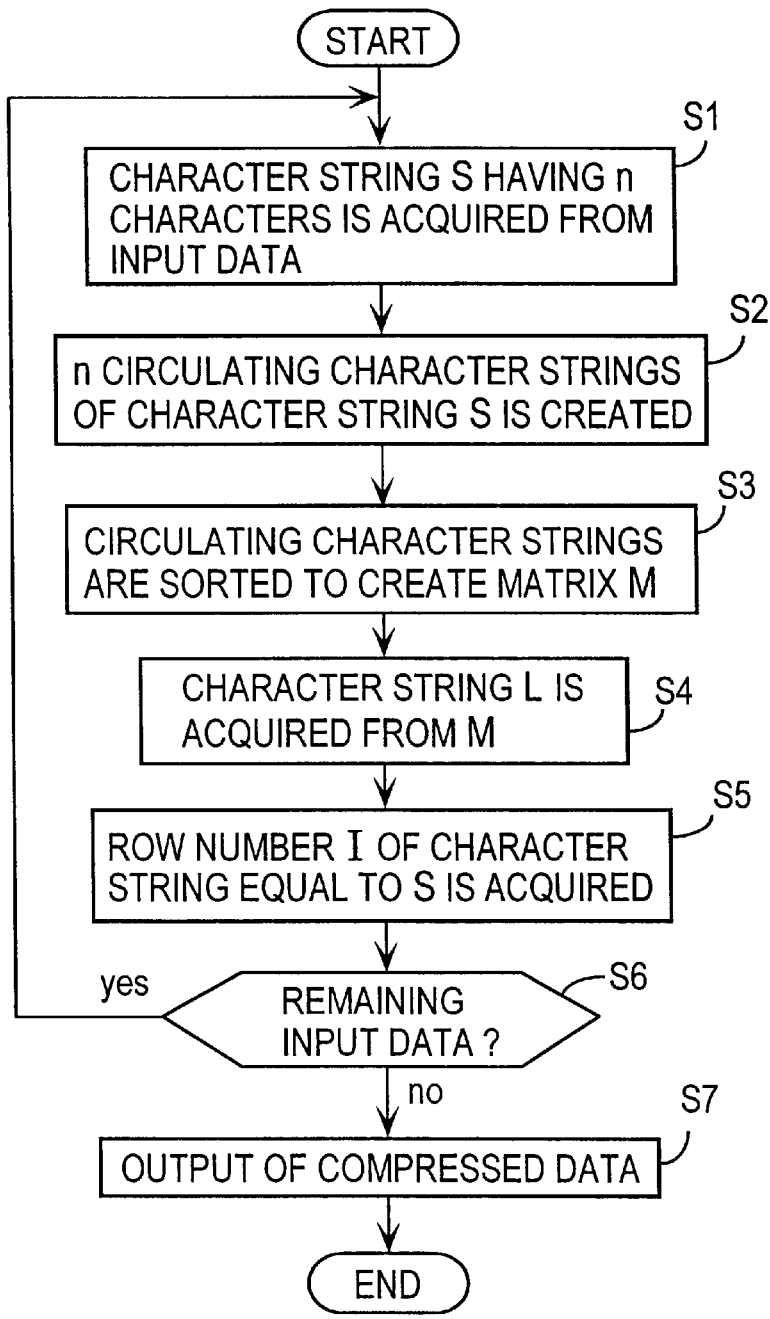
FIG. 52 is a flow chart for explaining a processing procedure of the BW transform means in the test pattern compressing apparatus shown in FIG. 48.

Next, the operations for performing BW transform using the BW transform means 133 will be explained. FIG. 52 is a flow chart for explaining a processing procedure of the repetitive BW transform means shown in FIG. 50 and shows a BW transform method.

Figure 53:
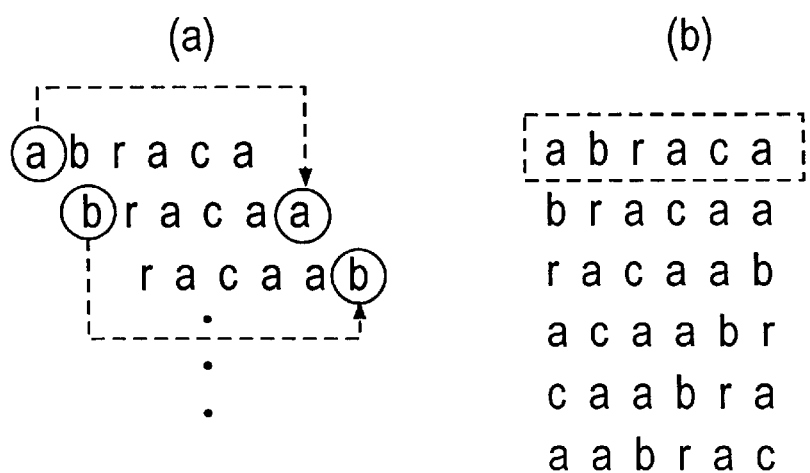
FIG. 53 is a diagram showing an example of a circulating character string used in BW transform.

First, in step S1, a character string S having n characters is acquired. Here, an explanation will be made using, as an example, a character string S="abraca" having 6 characters (n=6). Then in step S2, n circulating character strings (cyclically shifted character strings) of the acquired character string S are generated. The circulating character strings are character strings wherein a first character of a character string is cyclically moved to the last position of the character string (shown in FIG. 53(a)). In the example S="abraca" used here, 6 circulating character strings are obtained as shown in FIG. 53(b).

Figure 54:
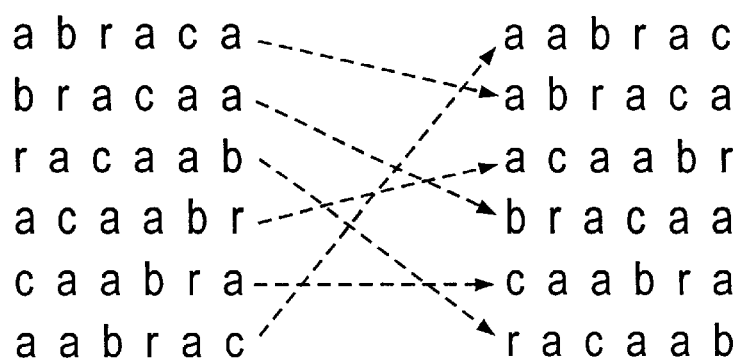
FIG. 54 is a diagram showing a sorting example of the circulating character strings used in BW transform.
Figure 55:
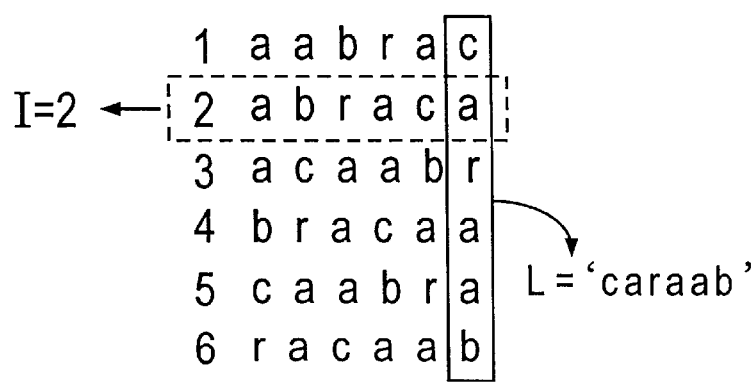
FIG. 55 is a diagram showing an example of an output data in BW transform.

Next, in step S3, the circulating character strings obtained in the step S2 are sorted in the order of registration into a dictionary to create a matrix M. In the example of S="abraca", the sorting is performed in this example, in alphabetical order like aa in first order, ab in second order, and ac in third order as shown in FIG. 54. In steps S4 and S5, a character string L obtained from the last column of the matrix M and a number I assigned to a row having the same character string as the input character string S are acquired. In the example of S="abraca", as shown in FIG. 55, L="caraab" and I=2 are obtained.

As explained above, the character string S="abraca" is transformed to a data containing a character string L="caraab" and a row number I=2. Finally, in step S6, a check is made to see if there are remaining input data. If there are remaining input data, the steps S1–S5 are repeated. If there is no remaining input data, the data transformed by BW transform are outputted and the process ends.

Figure 56:
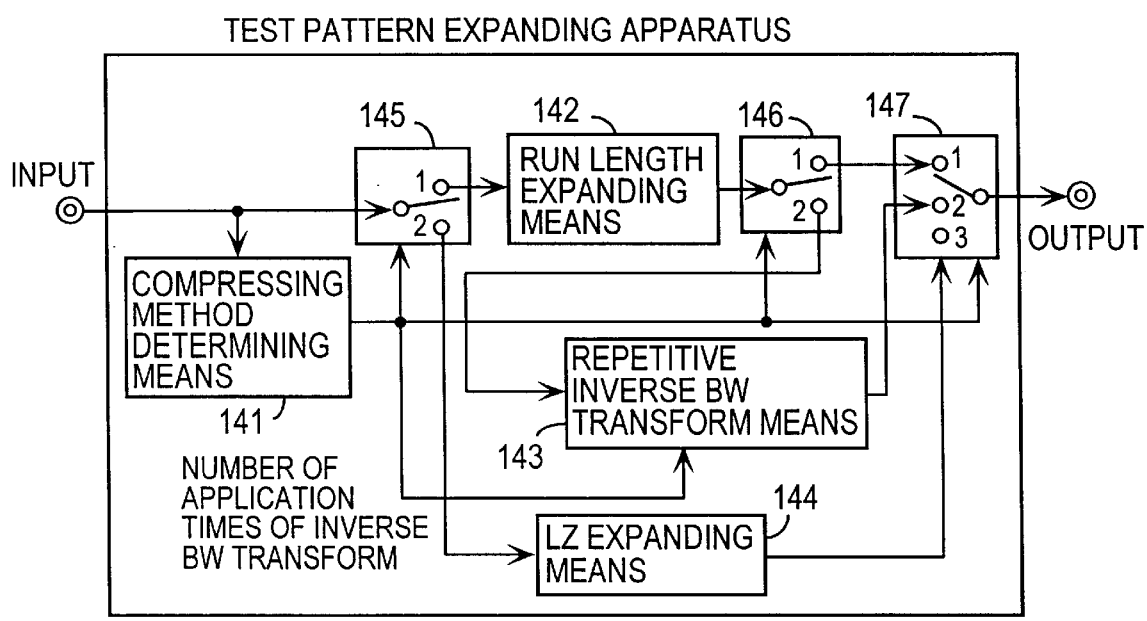
FIG. 56 is a block diagram showing an example of further another functional construction of the test pattern expanding apparatus.

FIG. 56 is a block diagram showing an example of a processing procedure of a test pattern expanding apparatus used in the first embodiment of the present invention. This test pattern expanding apparatus comprises compressing method determining means 147 for determining whether a compressed data is a data compressed by a run length compressing method, or a data compressed by a BWT run length compressing method, or a data compressed by an LZ compressing method; run length expanding means 142 for expanding a compressed data using the run length expanding method; repetitive inverse BW transform means 43 for applying inverse BW transform at least one time to a data expanded by the run length expanding method; LZ expanding means 144 for expanding a compressed data using an LZ expanding method; and three switches 145, 146 and 147 for selecting a compressed data path in accordance with a compressing method obtained by the compressing method determining means 41.

Figure 57:
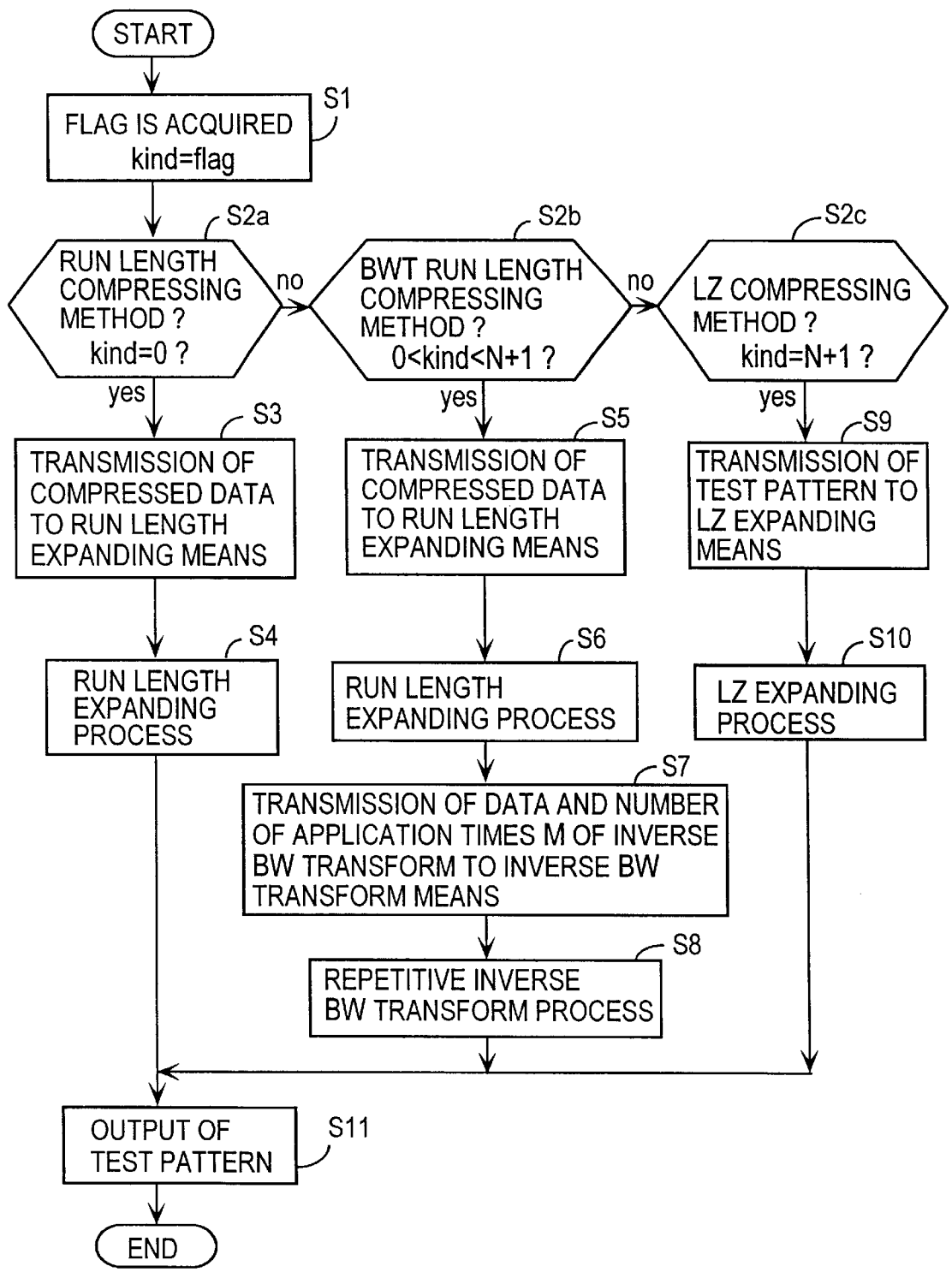
FIG. 57 is a flow chart for explaining a processing procedure of the test pattern expanding apparatus shown in FIG. 56.

Next, the operations for expanding a test pattern using this test pattern expanding apparatus will be explained. FIG. 57 is a flow chart for explaining a processing procedure of the test pattern expanding apparatus shown in FIG. 56 and shows a first embodiment of the test pattern expanding method of the present invention.

First, in step S1, the compressing method determining means 141 acquires a flag which is outputted from the test pattern compressing means together with a compressed data and unitarily indicates a compressing method, and sets this flag in "kind" as kind=flag. Here, the flag is determined to take a value 0 for the run length compressing method, a value m (m=1, 2, ..., N, where N is a fixed value indicating the maximum number of application times of BW transform, for example, N=5) which is equal to the number of application times of BW transform for the BWT run length compressing method, and a value N+1 for the LZ compressing method.

Next, in steps S2a–S2c, the processing procedure is split into cases. When the determined compressing method is the run length compressing method (kind=0), the switches 145, 146 and 147 in the test pattern expanding apparatus are connected to their terminals 1, 1 and 1, respectively to transmit, in step 153, the compressed data to the run length expanding means 142, and then the compressed data is expanded, in step S4, by the run length expanding means 142 using the run length expanding method. In the step S2, when the determined compressing method is the BWT run length expanding method (0<kind<N+1), the switches 145, 146 and 147 in the test pattern expanding apparatus are connected to their terminals 1, 2 and 2, respectively, to transmit, in step S5, the compressed data to the run length expanding means 142, and then in step S6, the compressed data is expanded by the run length expanding means 142.

Next, in step S7, the expanded data and the number of application times M of inverse BW transform (=kind) are transmitted to the repetitive inverse BW transform means 143 and in step S8, the repetitive inverse BW transform means 143 applies inverse BW transform M times to the data. In the step S2, when the determined compressing method is the LZ compressing method (kind=N+1), the switches 145 and 147 in the test pattern expanding apparatus are connected to their terminal 2 and 3, respectively to transmit, in step S9, the compressed data to the LZ expanding means 144, and then in step S10, the compressed data is expanded by the LZ expanding means 144 using the LZ expanding method. Finally, in step S11, the expanded test pattern is outputted and the process ends.

Figure 58:
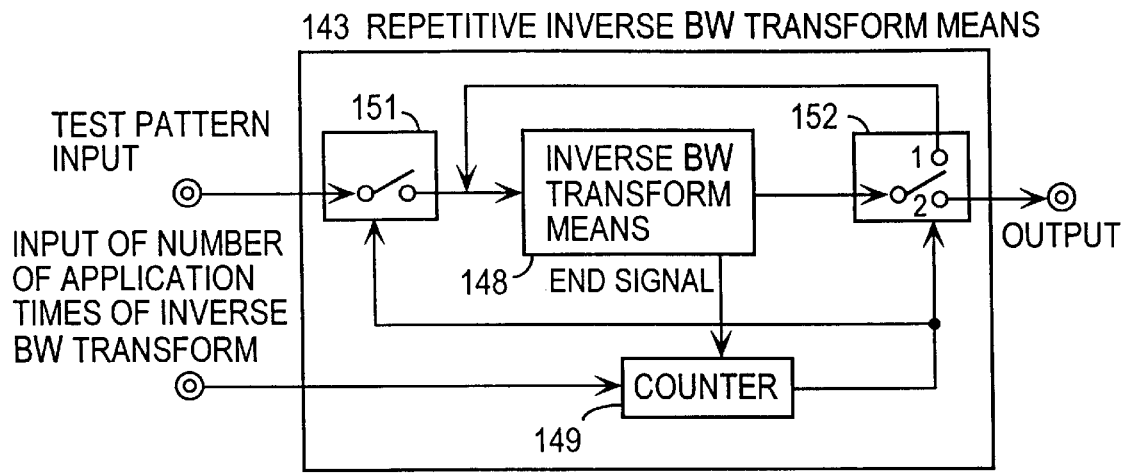
FIG. 58 is a block diagram showing an example of a functional construction of the repetitive inverse BW transform means in the test pattern expanding apparatus shown in FIG. 56.

FIG. 58 is a block diagram showing an example of a construction of the repetitive inverse BW transform means 143 in the test pattern expanding apparatus shown in FIG. 56. This repetitive inverse BW transform means 143 comprises inverse BW transform means 148 for applying inverse BW transform to an input data, a counter 149 for counting the number of application times of inverse BW transform, and two switches 151 and 152 for selecting a data path.

Figure 59:
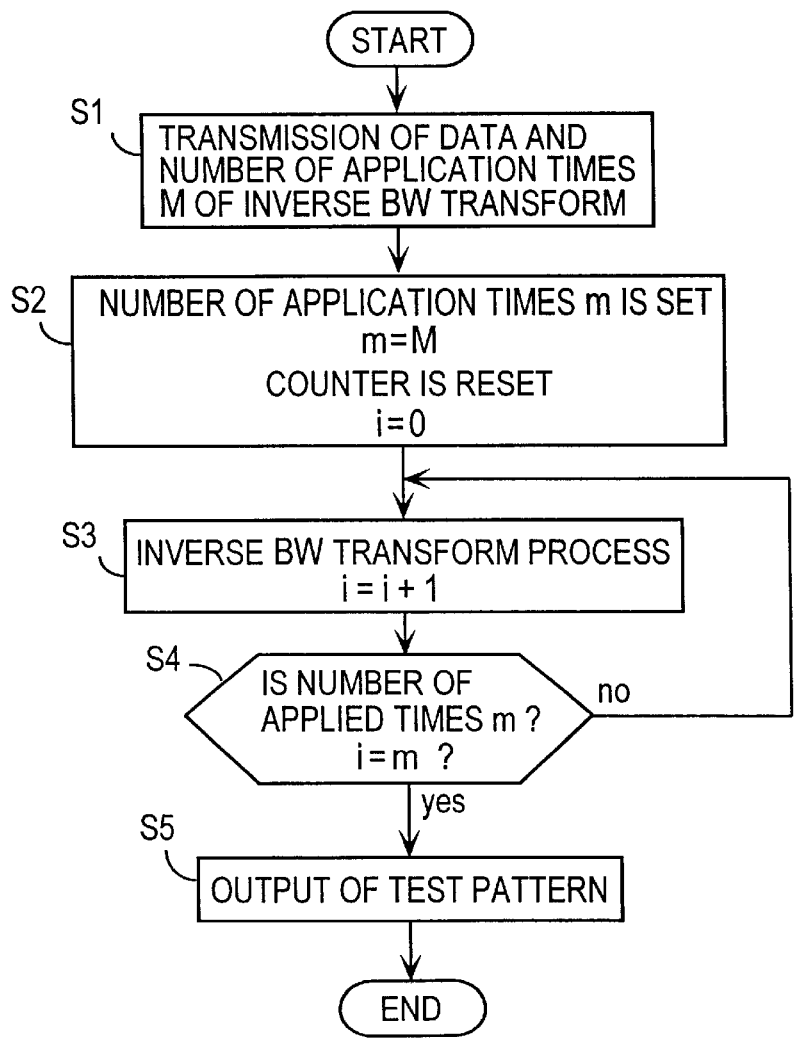
FIG. 59 is a flow chart for explaining a processing procedure of the repetitive inverse BW transform means shown in FIG. 58.

Next, the operations for performing inverse BW transform of a data using this repetitive inverse BW transform means 143 will be explained. FIG. 59 is a flow chart for explaining a processing procedure of the repetitive inverse BW transform means 143 shown in FIG. 58 and shows the operations for performing inverse BW transform of a data using the repetitive inverse BW transform means 143.

First in step S1, an inputted data is transmitted to the inverse BW is transform means 148 and the number of application times M of inverse BW transform is transmitted to the counter 149. Then in step S2, the number of application times m of inverse BW transform is set to m=M and the counter 149 is reset to i=0. In step S3, inverse BW transform is applied to a test pattern and in response to an end signal of the inverse BW transform operation, the counter 149 adds one (1) to i. In step S4, a check is made to see if inverse BW transform is performed m times, i.e., i=m. If the number of application times i is not i=m, the switch 51 is opened and the switch 152 is connected to its terminal 1 to repeat inverse BW transform of the step S3. If the number of applied times i is i=m, the switch 151 is closed and the switch 152 is connected to its terminal 2. In next step S5, the transformed data by inverse BW transform is outputted and the process ends.

Figure 60:
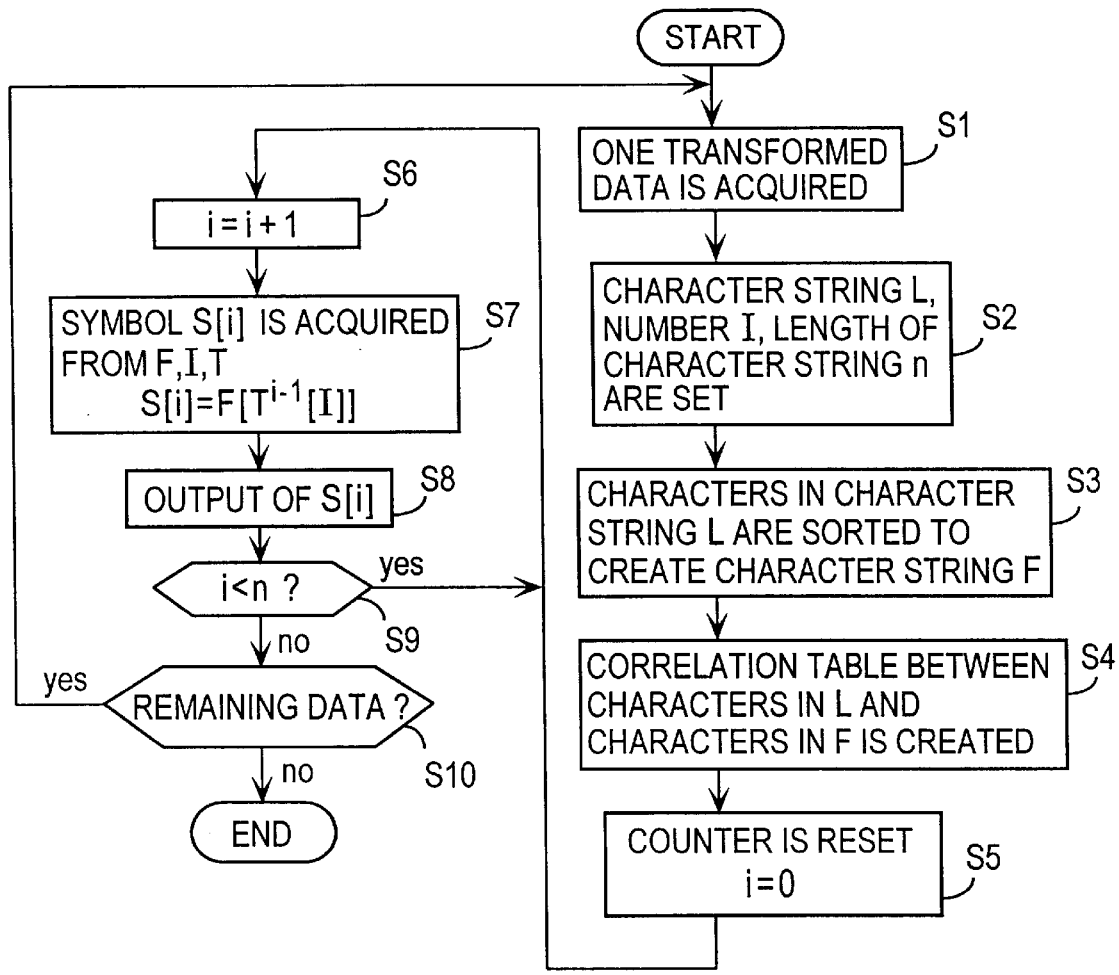
FIG. 60 is a flow chart for explaining a processing procedure of the repetitive inverse BW transform means in the test pattern expanding apparatus shown in FIG. 56.

The other operations for performing inverse transform using the inverse BW transform means 143 will be further explained. FIG. 60 is a flow chart for explaining a processing procedure of the inverse BW transform means in the test pattern expanding apparatus shown in FIG. 56 and shows a method of inverse BW transform. Here, the explanation will be made using the case of L='caraab' and I=2 used in the explanation of BW transform.

First, in step S1, a transformed data is acquired. In step S2, a character string L, a number I and a length of the character string n obtained from the transformed data are set. In this example, those data are L='caraab', I=2 and n=6.

Figures 61, 62:
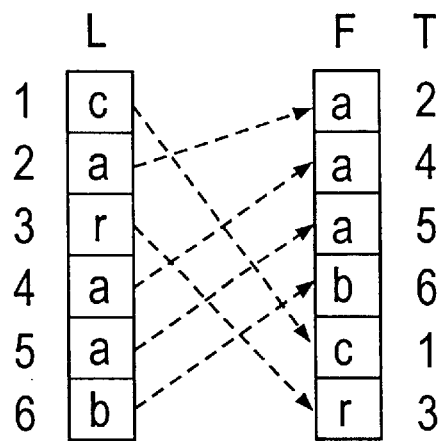
FIG. 61 is a diagram showing an example of correlations between a character string L and a character string F in inverse BW transform.
FIG. 62 is a diagram showing a reconstruction example of a character string S in inverse BW transform.

Next, in step S3, the characters in the acquired character string L are sorted in alphabetical order to generate a character string F. In the example of the character string L='caraab', F is F='aaabcr' as shown in FIG. 61. In step S4, a matrix T showing the correlations between a character L[i] of the character string L and a character F[i] of the character string F is created. Here, T is a matrix that satisfies L[[i]]=F[i]. In addition, if the same characters ch are used in the character string L, those characters are correlated between the character string L and the character string F such that the characters ch in the character string L are in the same order as in the character string F. Therefore, in the example of L='caraab' and F='aaabcr', as shown in FIG. 61, T=[245613] is obtained.

Next, in step S5, the counter 149 is reset to i=0. In step S6, the counter is incremented by one (1). In step S7, an ith character S[i] in the original character string S is restored from the character string F, the number I and the matrix T. Here, S[i] is represented by $S[i]=F[T^{i-1}[I]]$, $T^0[I]=I$ and $T^{i+1}[I]=T[T^i[I]]$. In step S8, a character S[i] is outputted. That is, when i is i=1 first, S[1] is $F[T^0[I]]$. As mentioned above, since $T^0[I]$ is $T^0[I]=I$ and I=2 in this example, S[1] is F[2]. Since second character in F is a, S[1]=a is obtained. Then, when i is i=2, S[2] is $F[T^1[I]]=T[T^0[I]]=T[2]$. Since second number in T is T=4, S[2] is F[4]. Since fourth character in F is b, S[2]=b is obtained. When i is i=3, S[3] is $F[T^2[I]]=T[T^1[I]]=T[4]$. Since fourth number in T is T=6, S[3] is F[6]. Since sixth character in F is r, S[3]=r is obtained. In similar manner, inverse BW transform operations are performed hereinafter.

Next, in step S9, a check is made to see if there are characters not restored yet, i.e., i<n. If characters not restored are remaining (if i<n), the steps S6–S8 are repeated. If there is no character not restored (if i=n), the process proceeds to step S10.

In the example used here, as shown in FIG. 62, S[1]=a, S[2]=b, S[3]=r, S[4]=a, S[5]=c and S[6]=a are obtained. Therefore, the original character string S='abraca' is reconstructed. Finally, in step S10, a check is made to see if there are remaining data. If there are remaining data, the steps S1–S9 are repeated. If there is no remaining input data, the process ends.

Figure 63:
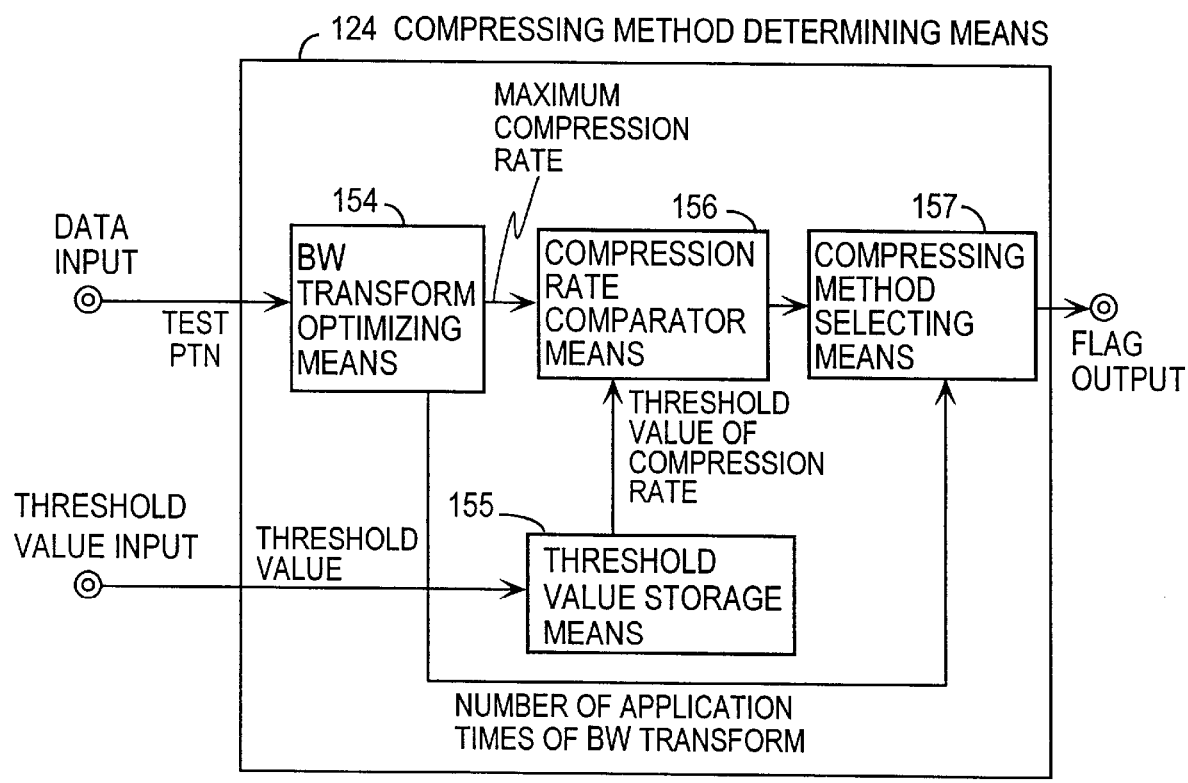
FIG. 63 is a block diagram showing an example of a functional construction of compressing method determining means in the test pattern compressing apparatus shown in FIG. 48.

FIG. 63 is a block diagram showing an example of a functional construction of the compressing method determining means 124 in the test pattern compressing apparatus shown in FIG. 48. This compressing method determining means comprises BW transform optimizing means 154 for calculating the optimum number of application times of BW transform for applying BW transform to a test pattern, threshold value storage means 155 for storing a threshold value of compression rate, compression rate comparator means 156 for comparing the maximum compression rate value obtained from the BW transform optimizing means 154 with the threshold value stored in the threshold value storage means 155, and compressing method selecting means 157 for selecting a compressing method out of the run length compressing method, the BWT run length compressing method and the LZ compressing method in accordance with the comparison result obtained from the compression rate comparator means 156 and the optimum number of application times of BW transform obtained from the BW transform optimizing means 154.

Figure 64:
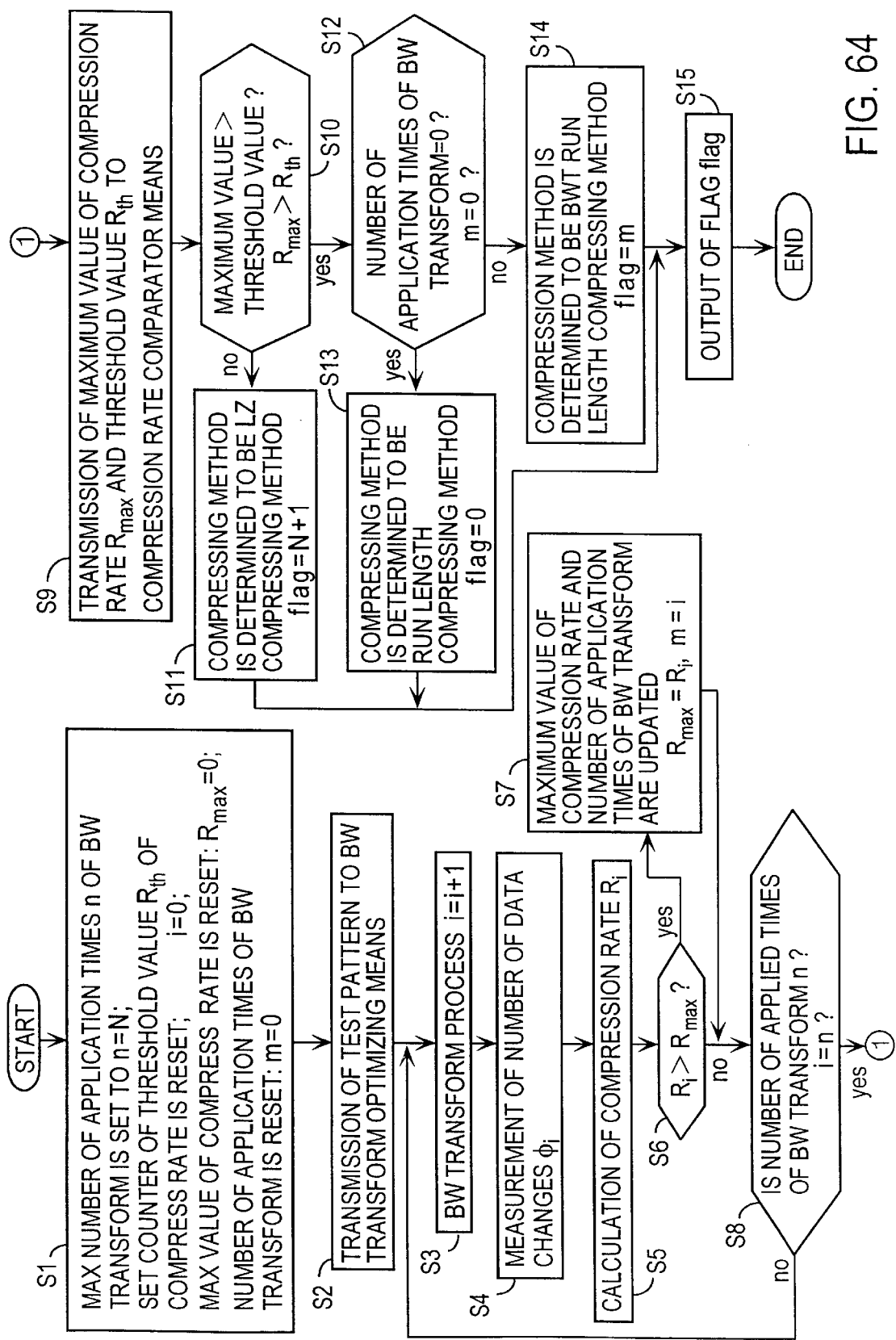
FIG. 64 is a flow chart for explaining a processing procedure of the compressing method determining means shown in FIG. 63.

Next, the operations for determining the optimum compressing method to be applied to a test pattern using this compressing method determining means 124 will be explained. FIG. 64 is a flow chart for explaining a processing procedure of the compressing method determining means 124 shown in FIG. 63 and shows the operations of the compressing method determining method.

First, in step S1, the maximum application number n of an initialized BW transform is set to n=N (for example, N=5), a threshold value $R_{th}$ of a compression rate is externally set to a certain value (for example $R_{th}$=10), and a counter i, the maximum value of the compression rate $R_{max}$ and the number of application times n of BW transform are reset to all zeros to initialize environmental variables. In step S2, an inputted test pattern is transmitted to the BW transform optimizing means 154. Then in step S3, the test pattern is transformed once by BW transform and one (1) is added to the counter i. In step S4, the number of data changes $\phi_i$ of the data transformed by BW transform is measured.

Next, in step S5, a compression rate $R_i$ is calculated from the obtained number of data changes $\phi_i$ and the number of applied times i of BW transform using the formula (1).

$$R_i = \log_2 |A|/[i[\log_2 L] + \phi_i[\log_2\{(|A|-1)L\} + \log_2(L-1) + \log_2|A|]] \quad (5)$$

Here, L length of the test pattern, |A|: size of a set of symbols appearing in the test pattern, in this example, |A|=3 since the symbols are 0, 1 and X, [X]: the minimum integer equal to or greater than X.

In step S6, the maximum value of the compression rate $R_{max}$ obtained by that time is compared with a newly calculated compression rate $R_i$. If the newly calculated compression rate $R_i$ is greater than the obtained maximum value $R_{max}$ ($R_i$>$R_{max}$), the maximum value of the compression rate $R_{max}$ is updated to $R_{max}$=$R_i$ and the number of application times m of BW transform is updated to m=i at that time.

Next, in step S8, a check is made to see if the number of applied times of BW transform has become the number of times n specified in the step S1, i.e., i<n. If the number of applied times i is less than the specified number of times n, the steps S3–S7 are repeated. If the number of applied times i has become the specified number of times n, the process proceeds to step S9.

The steps S3–S8 are performed by the BW transform optimizing means 154. That is, the BW transform optimizing means 154 obtains, by repeating the steps S3–S8 by the specified number of times n, the maximum value of the compression rate $R_{max}$ and the number of application times m of BW transform at that time. Then in step S9, the maximum value of the compression rate $R_{max}$ obtained by the BW transform optimizing means 154 and the experimentally obtained threshold value $R_{th}$ stored in the threshold value storage means 155 are transmitted to the compression rate comparator means 156 to compare them with each other. In step S10, if the maximum value of the compression rate $R_{max}$ is equal to or less than the threshold value $R_{th}$, a compressing method to be applied is determined, in step 11, to be the LZ compressing method and a flag is set to flag=N+1. If the threshold value $R_{th}$ is less than the maximum value of the compression rate $R_{max}$ in the step S10, a check is made in next step 12 to see if the number of application times m of BW transform is zero.

In the step 12, if the number of application times m of BW transform is zero, a compressing method to be applied is determined, in step 13, to be the run length compressing method and the flag is set to flag=0. If the number of application times m of BW transform is not zero, a compressing method to be applied to the test pattern is determined, in step 14, to be the BWT run length compressing method and the flag is set to flag=m. The steps S11–S14 are performed by the compressing method selecting means 157. Finally, in step S15, the compressing method selecting means 157 outputs a flag for unitarily determining the compressing method and the process ends.

In the above operations, the threshold value of the compression can be set either externally or to a predetermined fixed value. In the case of setting the threshold value externally, the threshold value storage means 155 operates as a RAM. On the other hand, in the case of setting the threshold value to the predetermined fixed value, the threshold value storage means 155 operates as a ROM and at this time, a threshold value input is not necessary.

The combination of the compressing methods which provides the most efficient results at present is the case in which three methods of the run length compressing method, the BW transform method plus the run length compressing method and the LZ compressing method are combined. A test pattern can be divided into three portions of a portion in which pattern changes are very few, a portion in which the pattern changes periodically, and a portion in which the pattern changes at random. An efficient compression can be obtained by applying the run length compressing method, the BW transform method plus the run length compressing method and the LZ compressing method to those three portions, respectively. Here, although the LZ compressing method is used for the portion in which the pattern changes at random, the Huffman compressing method or the like may also be used. Since compressing methods which can be used by anybody are mostly based on the LZ compressing method and the LZ compressing method provides a better compression rate, the LZ compressing method is used in the above example.

As mentioned above, the present invention is applied to a compression and to an expansion of a test pattern to be applied to an LSI for a test thereof. However, by dividing a document file (data) composed of, for example, text information, image information, layout information and the like into several data portions each having a different characteristic from each other, the compression rate can be improved. For example, a text compression technology such as the LZ compressing method is applied to a text data portion, an image compression technology such as JBIG or JPEG is applied to an image data portion, and the Huffman compressing method or the like is applied to a layout information portion.

Next a second embodiment of the present invention will be explained in detail.

Figure 65:
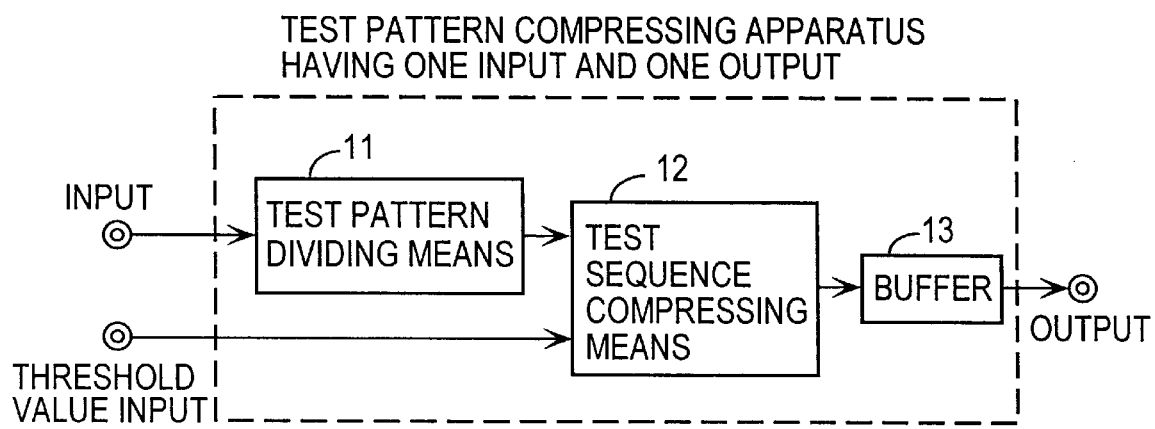
FIG. 65 is a block diagram showing an example of a functional construction of the test pattern compressing apparatus having one input and one output in a second embodiment of the present invention.

FIG. 65 is a block diagram showing an example of a functional construction of a test pattern compressing apparatus used in the second embodiment of the present invention. This test pattern compressing apparatus is a test pattern compressing apparatus having one input and one output and comprises test pattern dividing means 11 for dividing an inputted test pattern data into test sequences each being for each pin, test sequence compressing means 12 for compressing a divided test sequence using an optimum compressing method, and a buffer 13 for temporarily storing a compressed data.

Figure 66:
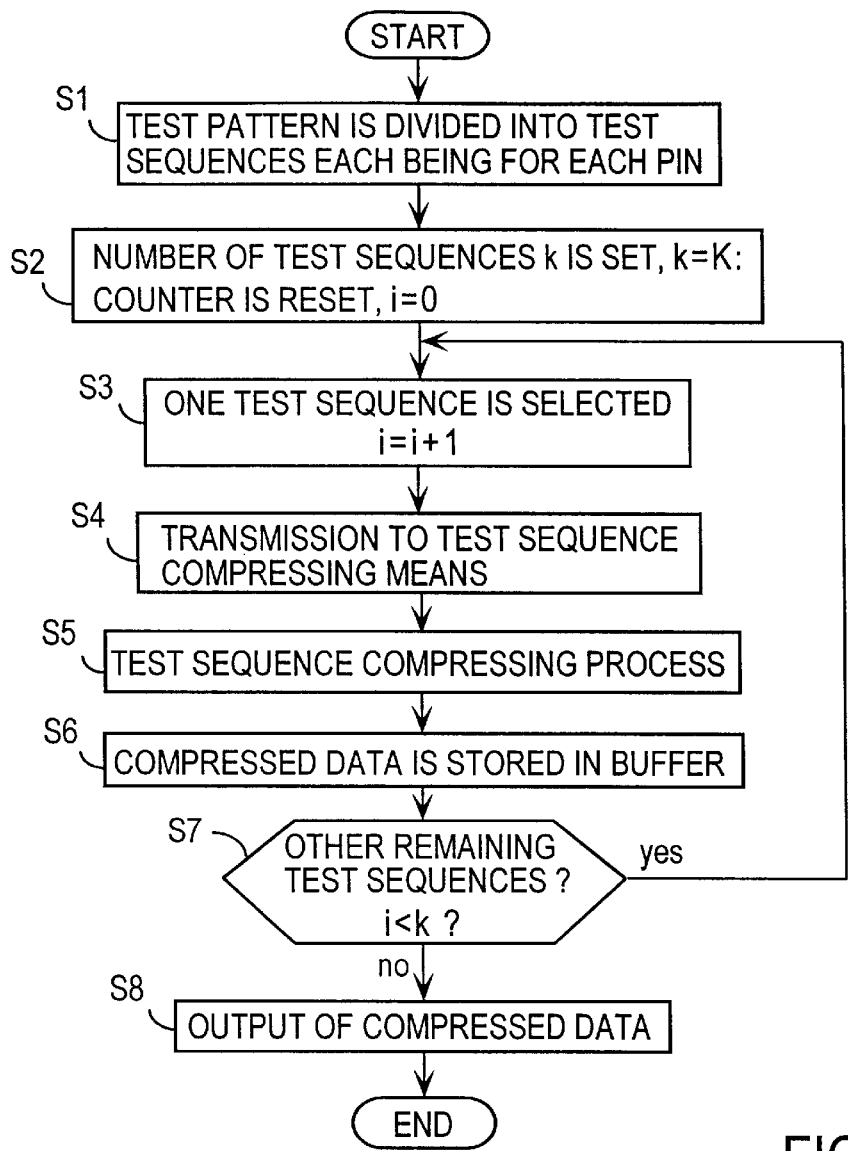
FIG. 66 is a flow chart for explaining the test pattern compressing is method of the second embodiment of the present invention.

Next, the operations for performing a test pattern compression using this test pattern compressing apparatus will be explained. FIG. 66 shows a test pattern compressing method of the second embodiment of the present invention. The test pattern dividing means 11 divides, in step S1, an inputted test pattern into test sequences each being for each pin. Then in step S2, the number of divisions k of the test sequences is set to k=K and a counter i is reset to i=0. Here, K is, for example, the number of pins of an integrated circuit. In step S3, one test sequence is selected out of the divided test sequences and the counter i is incremented by one. Then in step S4, the selected test sequence is transmitted to test sequence compressing means 12. The test sequence compressing means 12 compresses, in step S5, the test sequence using an optimum method.

Here, in order to determine the optimum compressing method to be applied to each test sequence, a threshold value input is used. The compressed data are temporarily stored, in step S6, in a buffer 13 in order. Then in step S7, a check is made to see if there are remaining test sequences, i.e., if i is i<k. If there are remaining test sequences (if i is i<k) the steps S3–S6 are repeated. If there is no remaining test sequence (if i is i=k), the process moves to step S8. Finally, in step S8, the compressed data are collectively outputted and the process ends.

Figure 67:
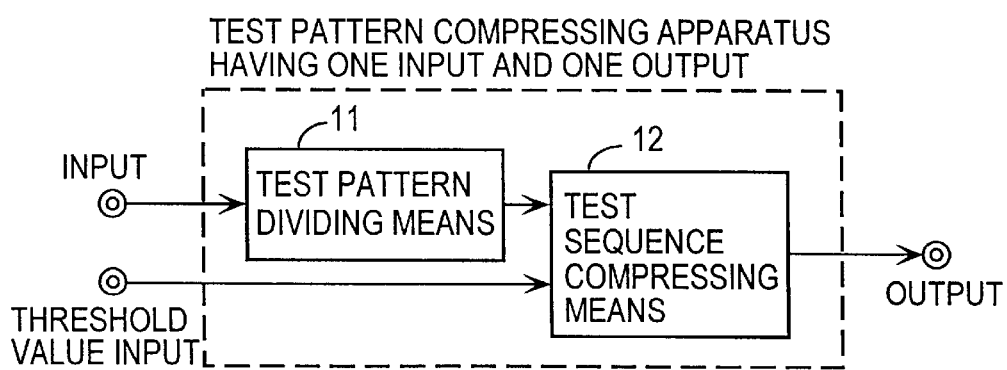
FIG. 67 is a block diagram showing a variation example of a functional construction of the test pattern compressing apparatus having one input and one output in the second embodiment of the present invention.

FIG. 67 is a block diagram showing a variation example of a construction of the test pattern compressing apparatus used in the second embodiment of the present invention. This test pattern compressing apparatus is a test pattern compressing apparatus having one input and one output, and comprises test pattern dividing means 11 for dividing an inputted test pattern data into test sequences each being for each pin and test sequence compressing means 12 for compressing a divided test sequence using an optimum compressing method.

Figure 68:
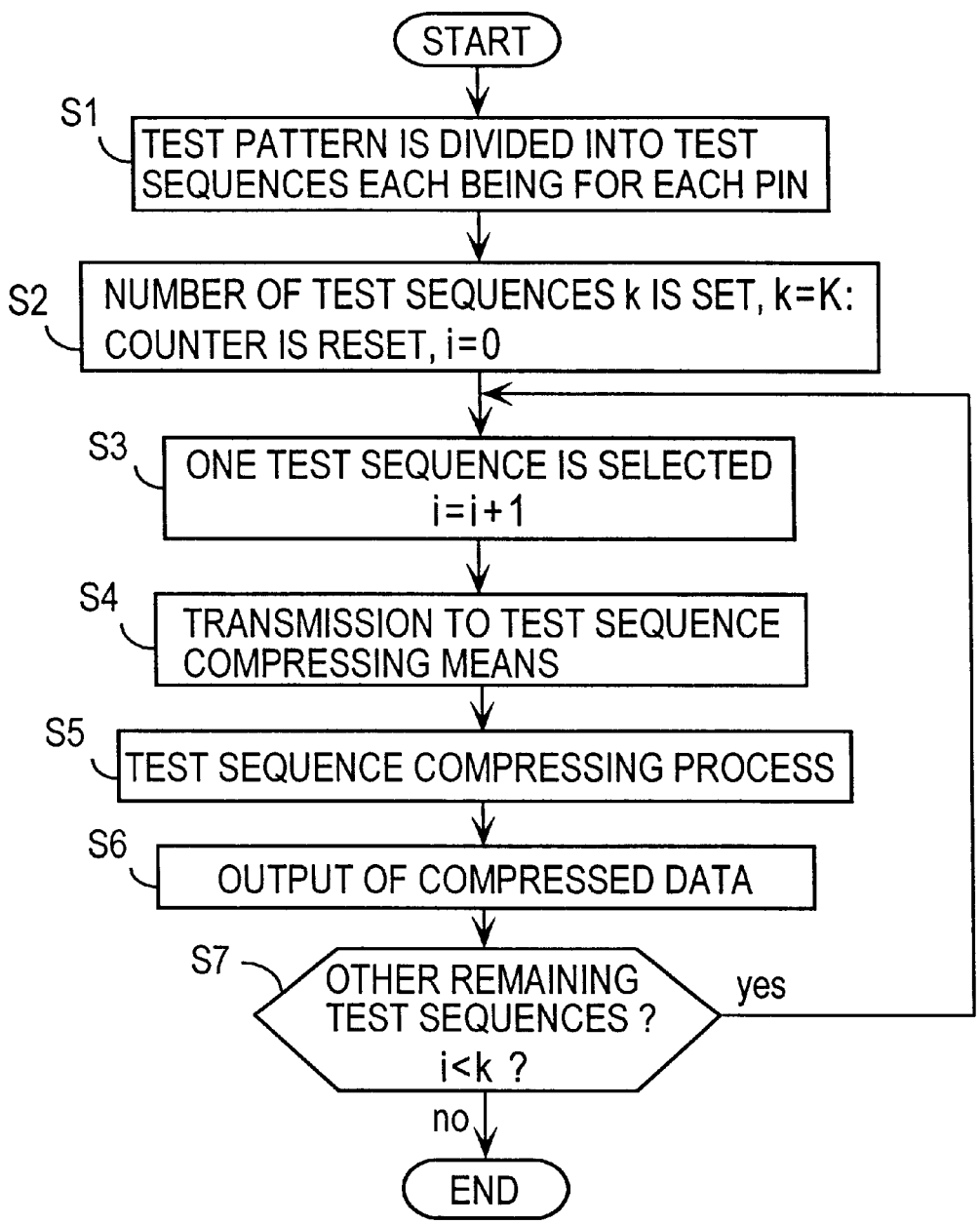
FIG. 68 is a flow chart for explaining a variation example of the test pattern compressing method of the second embodiment of the present invention.

Next, the operations for compressing a test pattern using this test pattern compressing apparatus will be explained. FIG. 68 shows a variation example of the test pattern compressing method of the second embodiment of the present invention. The test pattern dividing means 11 divides, in step S1, an inputted test pattern into test sequences each being for each pin. Then in step S2, the number of divisions k of the test sequences is set to k=K and a counter i is reset to i=0. Here, K is, for example, the number of pins of an integrated circuit. In step S3, a test sequence is selected out of the divided test sequences and the counter i is incremented by one. Then in step S4, the selected test sequence is transmitted to the test sequence compressing means 12. The test sequence compressing means 12 compresses, in step S5, the test sequence using an optimum method.

Here, in order to determine the optimum compressing method to be applied to each test sequence, a threshold value input is used. Then in step S7, the compressed data is outputted in the unit of test sequence. Finally, in step S7, a check is made to see if there are remaining test sequences, i.e., if i is i<k. If there are remaining test sequences (if i is i<k), the steps S3–S6 are repeated. If there is no remaining test sequence (if i is i=k), the process ends.

Figure 69:
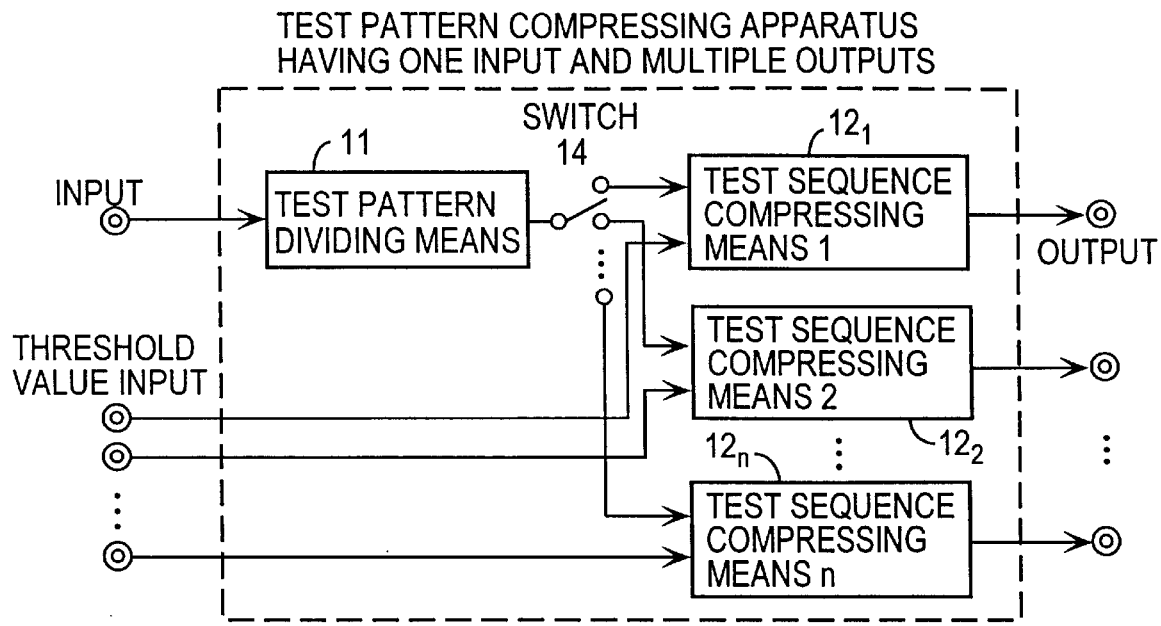
FIG. 69 is a block diagram showing an example of a functional construction of the test pattern compressing apparatus having one input and multiple outputs of the second embodiment of the present invention.

FIG. 69 is a block diagram showing an example of another functional 1o construction of the test pattern compressing apparatus used in the second embodiment of the present invention. This test pattern compressing apparatus is a test pattern compressing apparatus having one input and multiple outputs, and comprises the test pattern dividing means 11 for dividing an inputted test pattern data into test sequences each being for is each pin, a plurality of test pattern compressing means $12_1$–$12_n$ for compressing in parallel the divided test sequences using respective optimum compressing methods, and a switch 14 for selecting those test sequence compressing means 12$_1$–12$_n$.

Figure 70:
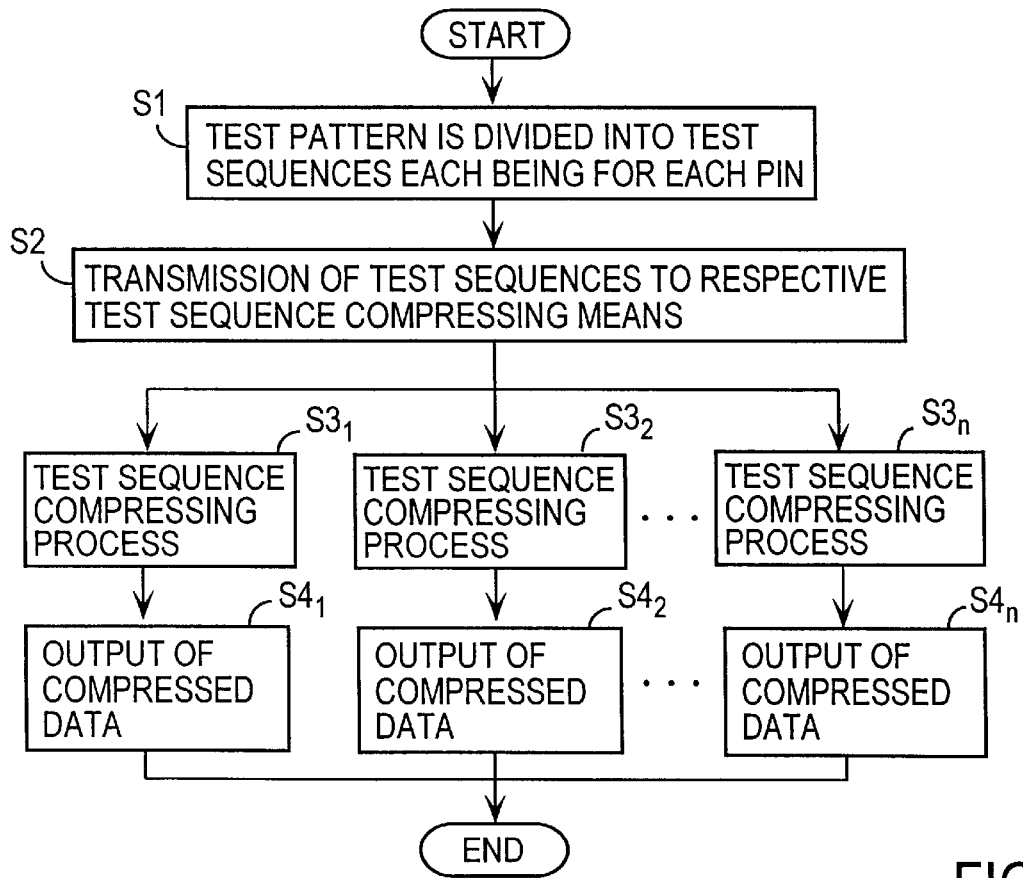
FIG. 70 is a flow chart for explaining the test pattern compressing method of the second embodiment of the present invention.

Next, the operations for compressing a test pattern using this test pattern compressing apparatus will be explained. FIG. 70 shows another example of the test pattern compressing method of the second embodiment of the present invention. The test pattern dividing means 11 divides, in step S1, an inputted test pattern into test sequences each being for each pin. Then in step S2, the test pattern dividing means 11 transmits in order the divided test sequences to the plurality of test sequence compressing means 12$_1$–12$_n$ respectively via the switch 14 and activates the test sequence compressing means 12$_1$–12$_n$.

Each of the test sequence compressing means 12$_1$–12$_n$ compresses, in steps S3$_1$–S3$_n$, the corresponding test sequence using the optimum method. Here, in order to determine the optimum compressing method to be applied to each test sequence, a threshold value input is used. Finally, in steps S4$_1$–S4$_n$, the compressed data are outputted in parallel and the process ends. Since it takes a relatively long time to compress a test sequence, this parallel processing allows a high speed process.

Figure 71:
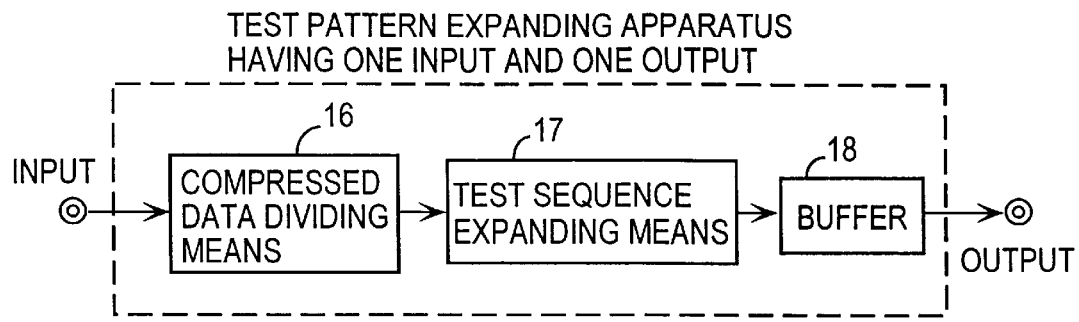
FIG. 71 is a block diagram showing an example of a functional construction of the test pattern expanding apparatus having one input and one output of the second embodiment of the present invention.

FIG. 71 shows an example of a construction of a test pattern expanding apparatus used in the second embodiment of the present invention. This test pattern expanding apparatus is a test pattern expanding apparatus having one input and one output and comprises compressed data dividing means 16 for dividing a compressed data to be expanded into compressed data each being for each pin, test sequence expanding means 17 for expanding a divided compressed data to the original test sequence without any information loss, and a buffer 18 for temporarily storing an expanded test sequence.

Figure 72:
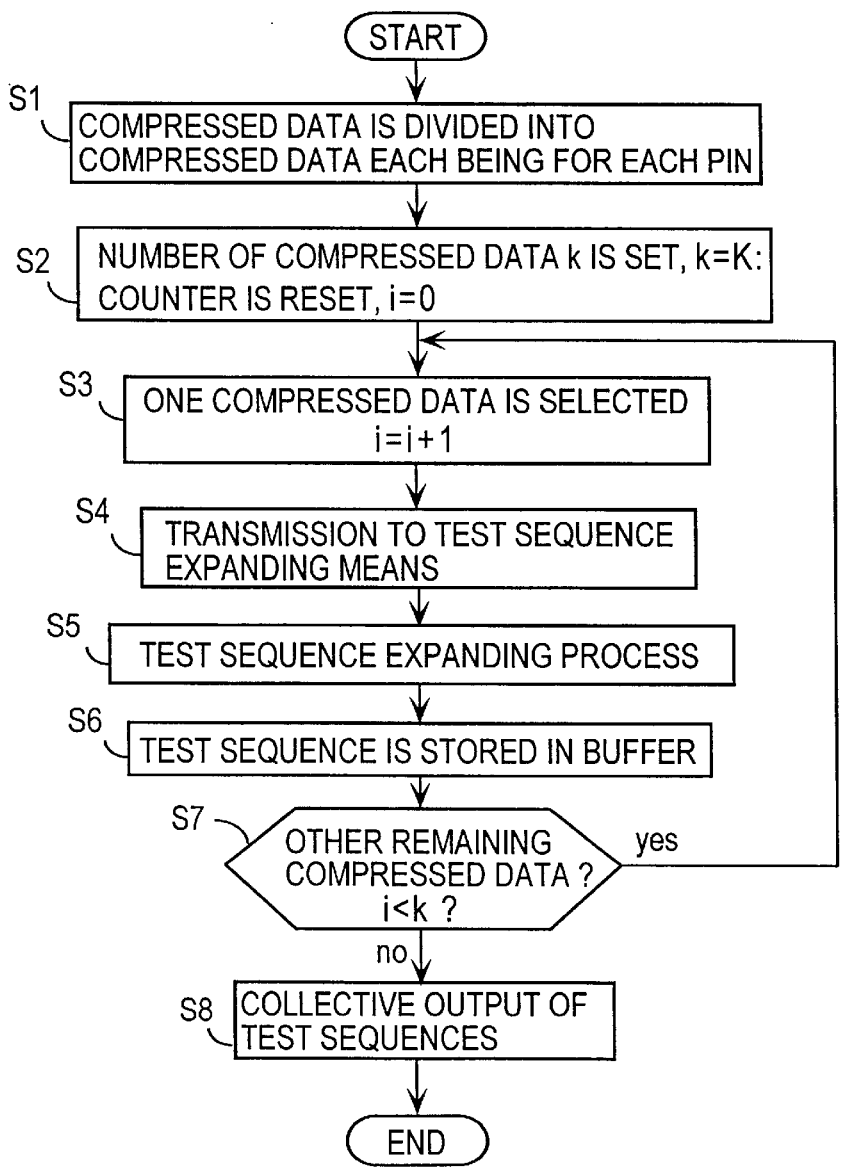
FIG. 72 is a flow chart for explaining the test pattern expanding method of the second embodiment of the present invention.

Next, the operations for expanding a compressed data using this test pattern expanding apparatus will be explained. FIG. 72 is a flow chart for explaining a processing procedure of a test pattern expanding method of the second embodiment of the present invention.

First, in step S1, the compressed data dividing means 16 divides a compressed data to be expanded into compressed data each being for each pin. Then in step S2, the number of divisions k of the compressed data is set to k=K and a counter i is reset to i=0. Here, K is, for example, the number of pins of an integrated circuit. In step S3, a compressed data is selected out of the divided compressed data and the counter i is incremented by one. In step S4, the selected compressed data is transmitted to the test sequence expanding means 17. The test sequence expanding means 17 completely expands, in step S5, the compressed data to the original test sequence. The expanded data are stored, in step S6, in the buffer 18 in order. Then a check is made, in step S7, to see if there are remaining compressed data, i.e., if i is i<k. If there are remaining compressed data (if i is i<k), the steps S3–S6 are repeated. If there is no remaining compressed data (if i is i=k), the process moves to step S8. Finally, in step S8, the expanded test sequences are collectively outputted and the process ends.

Figure 73:
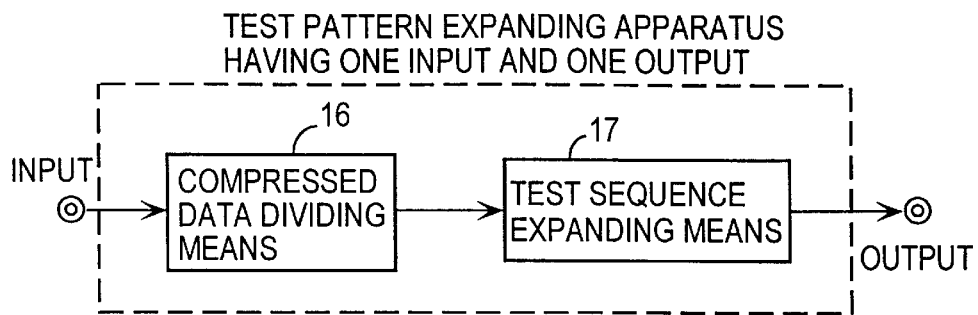
FIG. 73 is a block diagram showing a variation example of a functional construction of the test pattern expanding apparatus having one input and one output of the second embodiment of the present invention.

FIG. 73 is a block diagram showing a variation example of a construction of the test pattern expanding apparatus used in the second embodiment of the present invention. This test pattern expanding apparatus is a test pattern expanding apparatus having one input and one output and comprises compressed data dividing means 16 for dividing a compressed data to be expanded into compressed data each being for each pin and test sequence expanding means 17 for expanding a compressed data to the original test sequence without any information loss.

Figure 74:
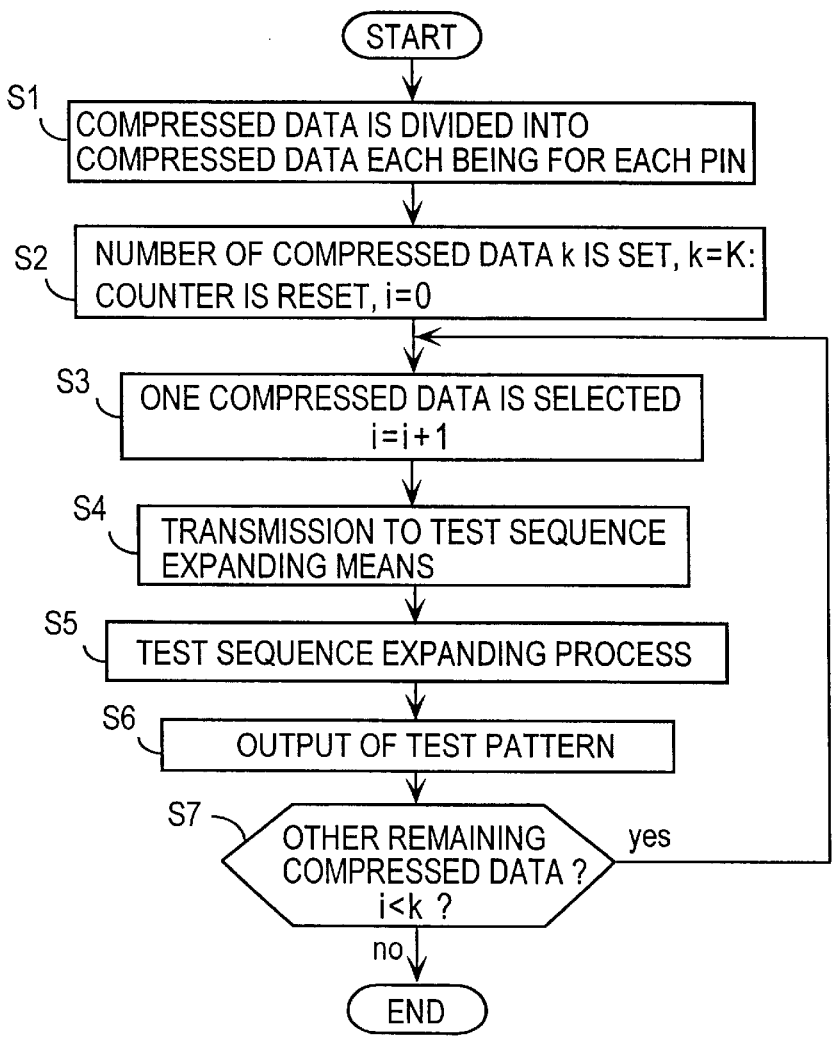
FIG. 74 is a flow chart for explaining a variation example of the test pattern expanding, method of the second embodiment of the present invention.

Next, the operations for expanding a compressed data using this test pattern expanding apparatus will be explained. FIG. 74 shows a variation example of the test pattern expanding method of the second embodiment of the present invention.

First, in step S1, the compressed data dividing means 16 divides a compressed data to be expanded into compressed data each being for each pin. Then in step S2, the number of divisions k of the compressed data is set to k=K and a counter i is reset to i=0. Here, K is, for example, the number of pins of an integrated circuit. In step S3, one compressed data is selected out of the divided compressed data and the counter i is incremented by one. Then in step S4, the selected compressed data is transmitted to the test sequence expanding means 17. The test sequence expanding means 17 completely expands, in step S5, the compressed data to the original test sequence. Then in step S6, the expanded test sequence is outputted in each pin basis. Finally, in step S7, a check is made to see if there are remaining compressed data, i.e., if i is i<k. If there are remaining compressed data (if i is i<k), the steps S3–S6 are repeated. If there is no remaining compressed data (if i is i=k), the process ends.

Figure 75:
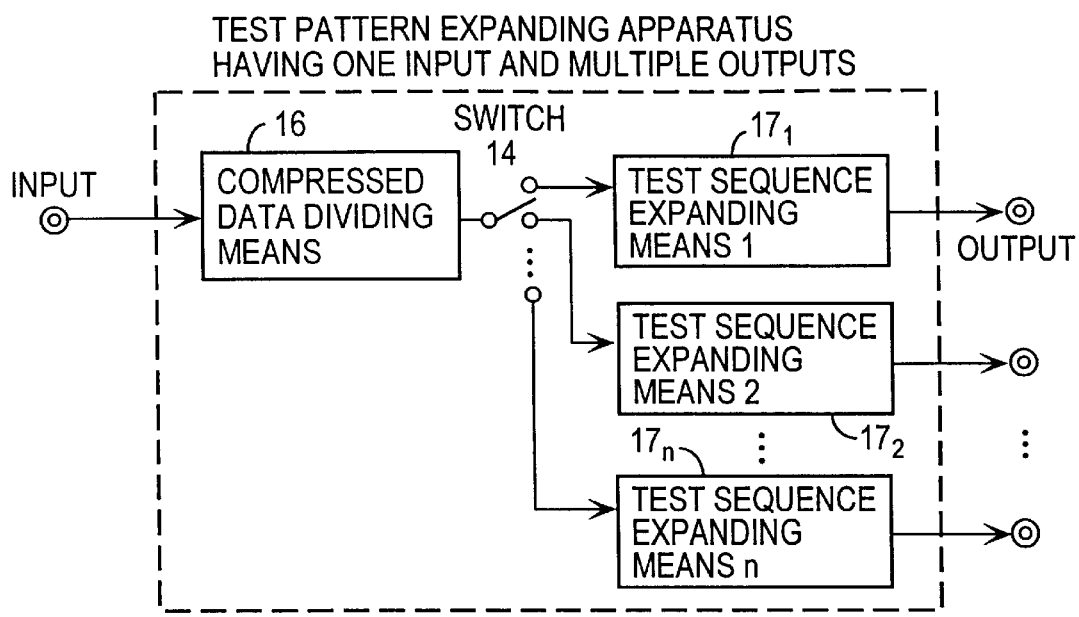
FIG. 75 is a block diagram showing an example of a functional construction of the test pattern expanding apparatus having one input and multiple outputs of the second embodiment of the present invention.

FIG. 75 is a block diagram showing another functional construction example of the test pattern expanding apparatus used in the second embodiment of the present invention. This test pattern expanding apparatus is a test pattern expanding apparatus having one input and multiple outputs and comprises compressed data dividing means 16 for dividing a compressed data to be expanded into compressed data each being for each pin, a plurality of test sequence expanding means 17$_1$–17$_n$ for expanding the respective divided compressed data in parallel to the original test sequences without any information loss, and a switch 19 for selecting the test sequence expanding means.

Figure 76:
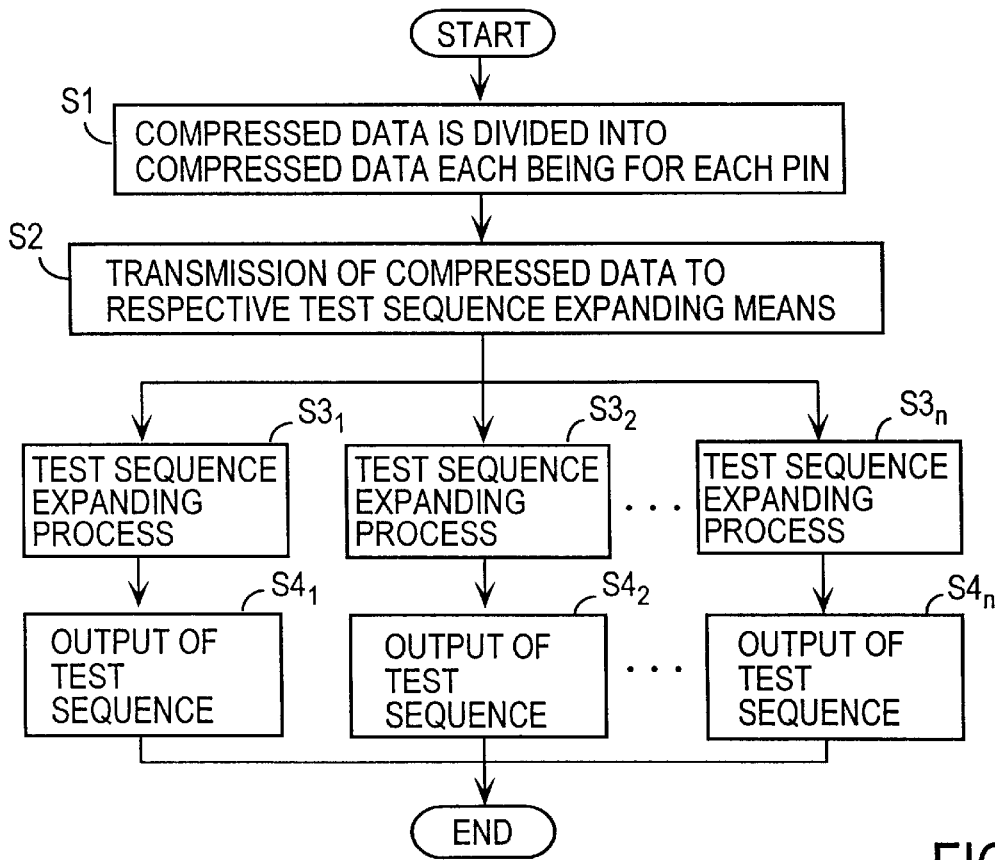
FIG. 76 is a flow chart for explaining the test pattern expanding method of the second embodiment of the present invention.

Next, the operations for expanding a compressed data using this test pattern expanding apparatus will be explained. FIG. 76 shows a test pattern expanding method of the second embodiment of the present invention.

First, in step S1, the compressed data dividing means 16 divides a compressed data to be expanded into compressed data each being for each pin. Then in step S2, the divided compressed data are transmitted to the plurality of test sequence expanding means 17$_1$–17$_n$ respectively and activates those test sequence expanding means 17$_1$–17$_n$. Each of the test sequence expanding means 17$_1$–17$_n$ completely expands the corresponding one of the compressed data to the original test sequence in steps S3$_1$–S3$_n$. Finally, in steps S4$_1$–S4$_n$, the expanded test sequences are outputted in parallel and the process ends. A data expansion can be performed in a short time period compared with a data compression but requires a high speed processing. By processing in parallel in pin basis in this manner, the expanding means each having low processing speed can be used.

Figure 77:
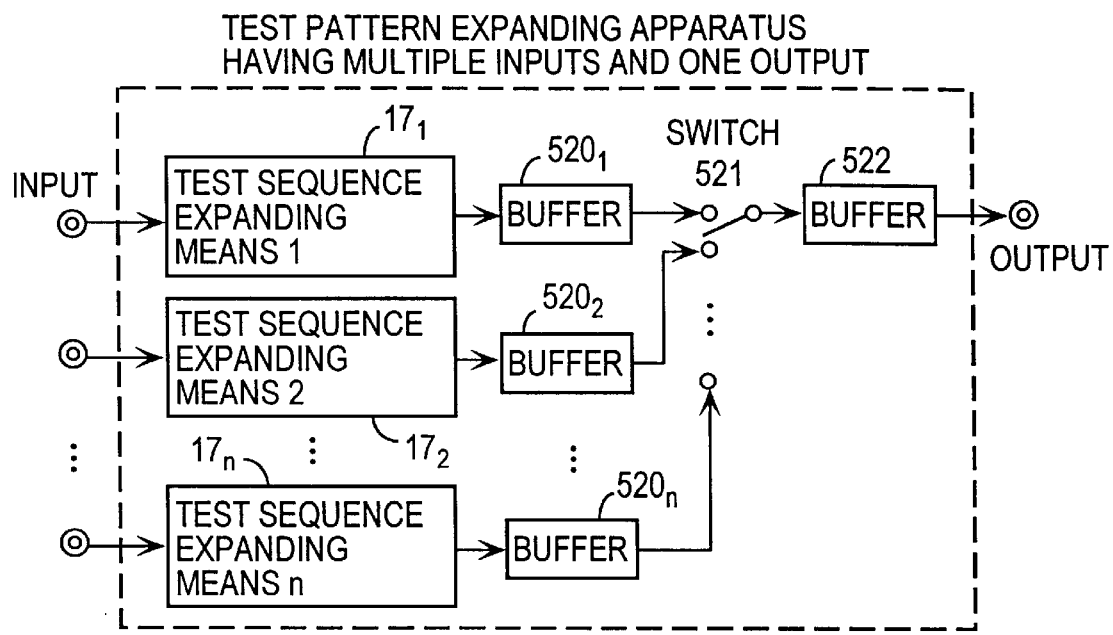
FIG. 77 is a block diagram showing an example of a functional construction of the test pattern expanding apparatus having multiple inputs and one output of the second embodiment of the present invention.

FIG. 77 is a block diagram showing an example of a construction of a test pattern expanding apparatus used in the second embodiment of the present invention. This test pattern expanding apparatus is a test pattern expanding apparatus having multiple inputs and one output and comprises a plurality of test sequence expanding means 17$_1$–17$_n$ connected in parallel for expanding compressed data each being for each pin inputted in parallel to the original test sequences respectively without any information loss, test sequence buffers 520$_1$–520$_n$ for temporarily storing therein the expanded test sequences respectively, a switch 521 for selecting one of those test sequence buffers 520$_1$–520$_n$ to output corresponding one of the expanded test sequences, and a buffer 522 for temporarily storing therein all the expanded test sequences.

Figure 78:
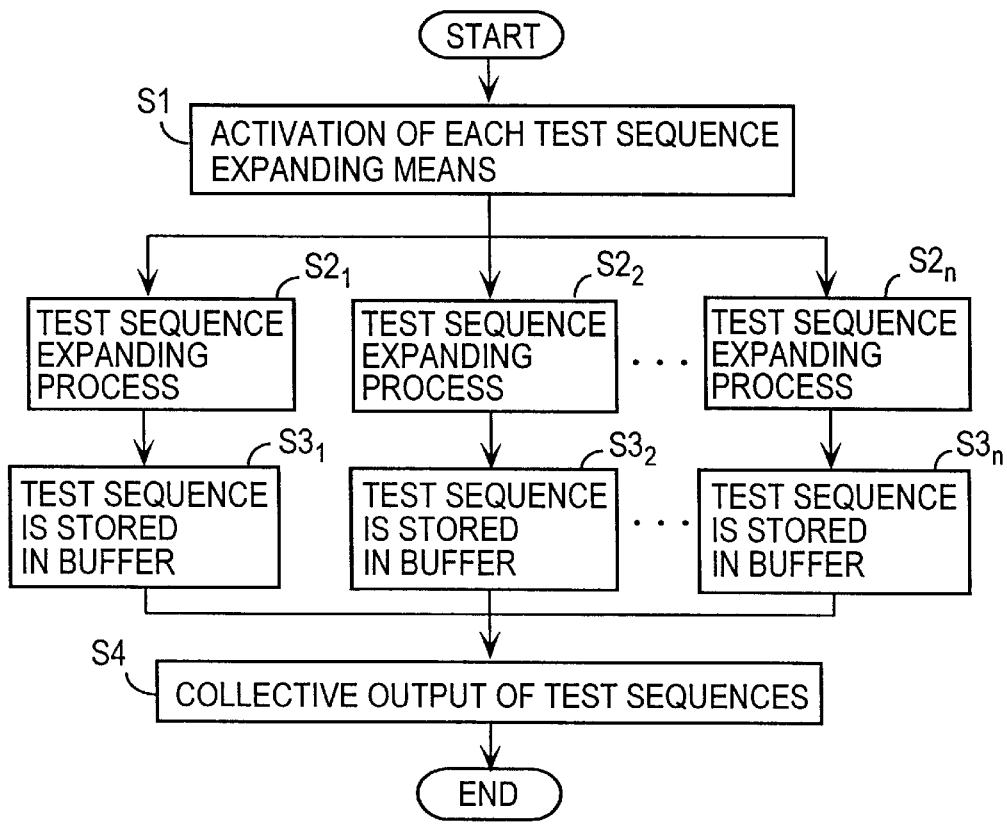
FIG. 78 is a flow chart for explaining the test pattern expanding method of the second embodiment of the present invention.

Next, the operations for expanding a compressed data using this test pattern expanding apparatus will be explained. FIG. 78 shows a test pattern expanding method of the second embodiment of the present invention.

Compressed data each being for each pin inputted in parallel are transmitted to the plurality of test sequence expanding apparatus, respectively. First, in step S1, each of the test sequence expanding means $17_1$–$17_n$ is activated. Then in step S2, each of the test sequence expanding means $17_1$–$17_n$ completely expands corresponding one of the compressed data to the original test sequence and temporarily stores it in corresponding one of the test sequence buffers $520_1$–$520_n$. The expanded test sequences are stored, in step S3, in the buffer 522. Here, those test sequences can be stored, in response to expansion end signals from the test sequence expanding means $17_1$–$17_n$, in the buffer 522 in fixed order after all the expansions of the test sequences are completed, or can be stored in the buffer 522 in the sequence of the expansion completion. Finally, in step S4, a test pattern is composed of the expanded test sequences from the buffer 522 and is outputted. Then the process ends.

Figure 79:
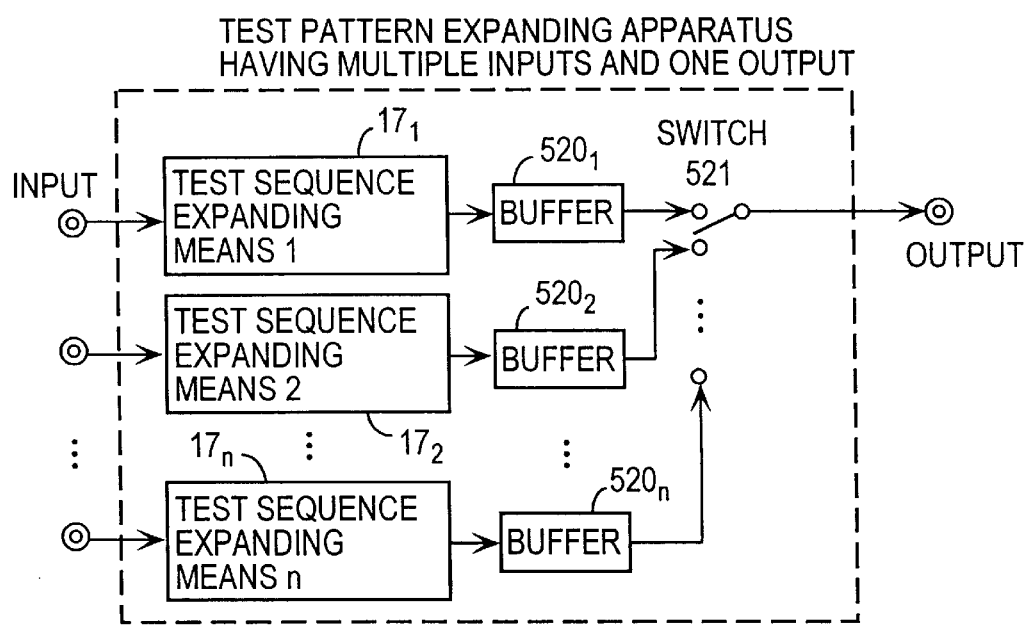
FIG. 79 is a block diagram showing a variation example of a functional construction of the test pattern expanding apparatus having multiple inputs and one output of the second embodiment of the present invention.

FIG. 79 shows a variation example of a construction of the test pattern expanding apparatus used in the second embodiment of the present invention. This test pattern expanding apparatus is a test pattern expanding apparatus having multiple inputs and one output and comprises a plurality of test sequence expanding means $17_1$–$17_n$ connected in parallel for expanding compressed data each being for each pin inputted in parallel to the original test sequences respectively without any information loss, test sequence buffers $520_1$–$520_n$ for temporarily storing therein the expanded test sequences respectively, and a switch 521 for selecting one of those test sequence buffers $520_1$–$520_n$ to output corresponding one of the expanded test sequences.

Figure 80:
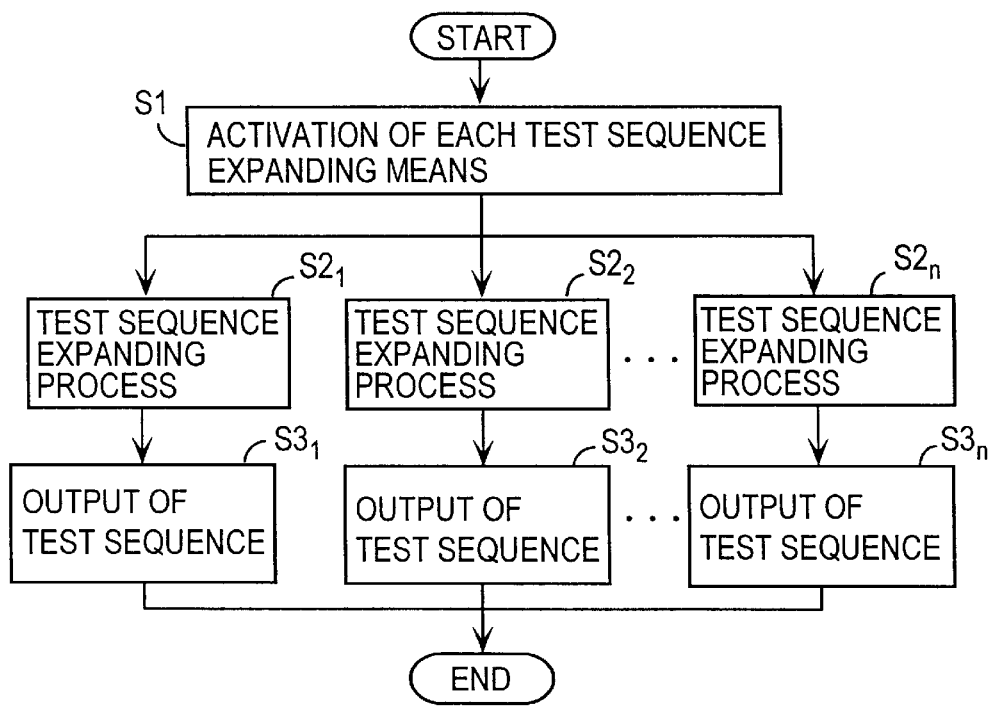
FIG. 80 is a flow chart for explaining a variation example of the test pattern expanding method of the second embodiment of the present invention.

Next, the operation for expanding a compressed data using this test pattern expanding apparatus will be explained. FIG. 80 shows a variation example of the test pattern expanding method of the second embodiment of the present invention.

Compressed data each being for each pin inputted in parallel are transmitted to the plurality of test sequence expanding apparatus, respectively. First, in step S1, each of the test sequence expanding means $17_1$–$17_n$ is activated. Then in steps $S2_1$–$S2_n$, each of the test sequence expanding means $17_1$–$17_n$ completely expands corresponding one of the compressed data to the original test sequence and stores it in corresponding one of the test sequence buffers $520_1$–$520_n$. Finally, in steps $S3_1$–$S3_n$, the expanded test sequences are outputted in respective pin basis and the process ends.

Here, those test sequences can be outputted, in response to expansion end signals from the test sequence expanding means $17_1$–$17_n$, in fixed order after all the expansions of the test sequences are completed, or can be outputted in the sequence of the expansion completion. In either of the constructions shown in FIGS. 77 and 79, by making the outputted expanded test sequences same as the test pattern before compression, those test sequences can be supplied to a pattern generator conventionally used in an IC tester.

Figure 81:
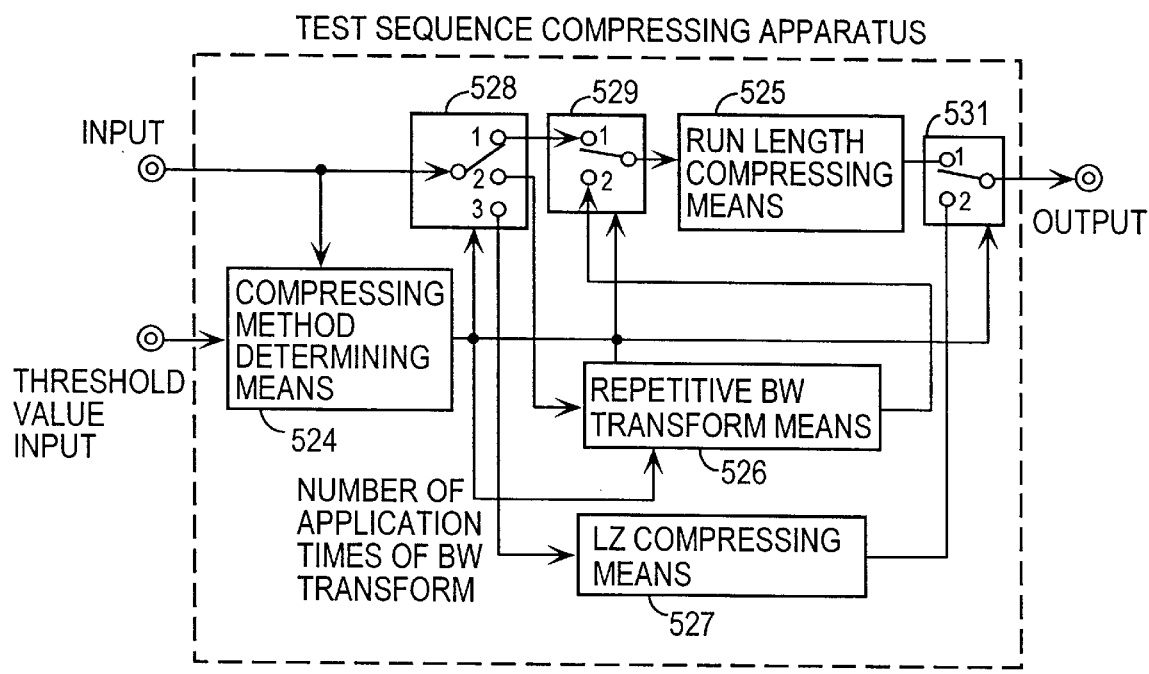
FIG. 81 is a block diagram showing an example of a functional construction of the test sequence compressing means in the test pattern compressing apparatus shown in FIGS. 65, 67 and 69.

FIG. 81 shows an example of a functional construction of a test sequence compressing apparatus used in the second embodiment of the present invention. This test sequence compressing apparatus comprises compressing method determining means 524 for determining an optimum compressing method adaptive to an inputted test sequence, run length compressing means 525 for compressing a test sequence using the run length compressing method, repetitive BW transform means 526 for applying BW transform one or more times to a test sequence, LZ compressing means 527 for compressing a test sequence using a LZ compressing method, and three switches 528, 529 and 531 for selecting a test sequence path in accordance with the compressing method obtained by the compressing method determining means 524.

Figure 82:
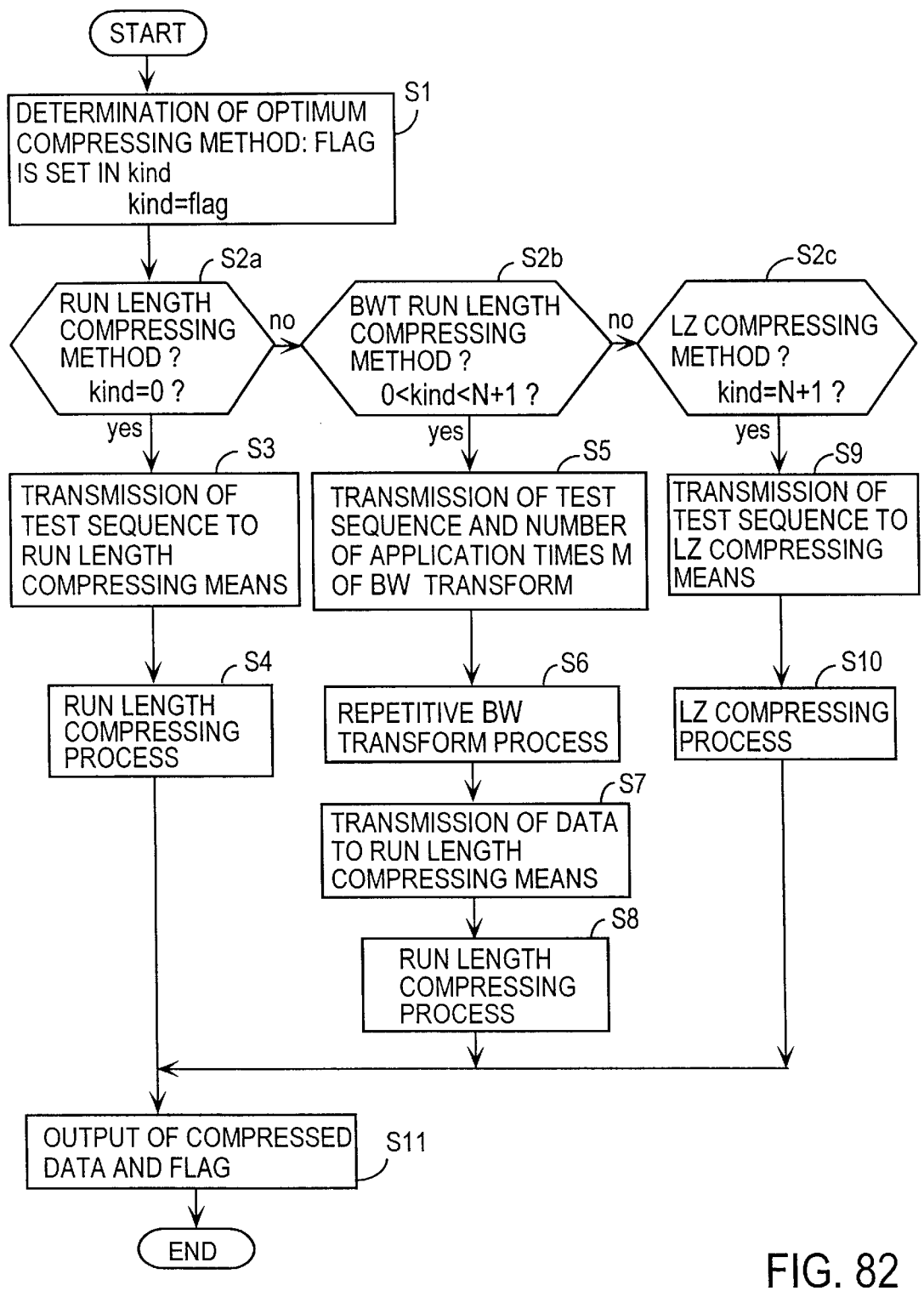
FIG. 82 is a flow chart for explaining a processing procedure of the test sequence compressing means shown in FIG. 81.

Next, the operations for compressing a test sequence using this test sequence compressing apparatus will be explained. FIG. 82 shows a test sequence compressing method of the second embodiment of the present invention.

First, in step S1, the compressing method determining means 524 determines an optimum compressing method adaptive to an inputted test sequence and sets a flag for unitarily determining the compressing method in "kind". Here, the flag takes a value of 0 for the run length compressing method, a value of m (m=1, 2, . . . , N where N is a fixed value indicating the maximum number of application times of BW transform: for example, N=5) for the BWT run length compressing method, and a value of N+1 for the LZ compressing method. In addition, in order to determine an optimum compressing method to be applied to a test sequence, an input of a threshold value which is experimentally determined is used.

Next, in steps S2a, S2b and S2c, if the determined compressing method is the run length compressing method (i.e., kind=0), the switches 528, 529 and 531 of the test sequence compressing apparatus are connected to terminals 1, 1, 1, respectively, and in step S3, the test sequence is transmitted to the run length compressing method 525. Then in step S4, the run length compressing means 525 compresses the test sequence using the run length compressing method. If, in the step S2b, the determined compressing method is the BWT run length compressing method (i.e., 0<kind<N+1), the switches 528, 529 and 531 are connected to terminals 2, 2 and 1, respectively, and in step S5, the test sequence and the number of application times M (=kind) of BW transform are transmitted to the repetitive BW transform means 526. Then in step S6, the repetitive BW transform means 526 applies BW transform M times to the test sequence. Further, in step S7, the data transformed by BW transform is transmitted to the run length compressing means 525 where, in step S8, the data is compressed. If, in the step S2c, the determined compressing method is the LZ compressing method (i.e., kind=N+1), the switches 528 and 531 of the test sequence compressing apparatus are connected to terminals 3 and 2, respectively and the test sequence is transmitted, in step S9, to the LZ compressing means 527. Then in step S10, the LZ compressing means 527 compresses the test sequence using the LZ compressing method. Finally, in step S11, the compressed data and the flag "kind" unitarily indicating the method used in the compression are outputted and the process ends.

Figure 83:
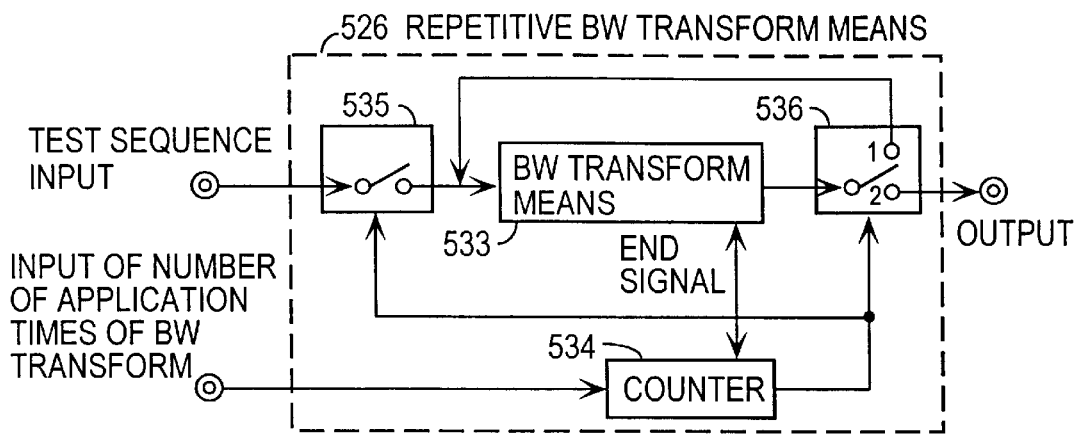
FIG. 83 is a block diagram showing an example of a functional construction of the repetitive BW transform means in the test sequence compressing means shown in FIG. 81.

FIG. 83 shows an example of a functional construction of the repetitive BW transform means 526 in the test sequence compressing means shows in FIG. 81. This repetitive BW transform means comprises BW transform means 533 for applying BW transform to an inputted test sequence, a counter 534 for counting the number of application times of BW transform, and two switches 535 and 536 for selecting a data path.

Figure 84:
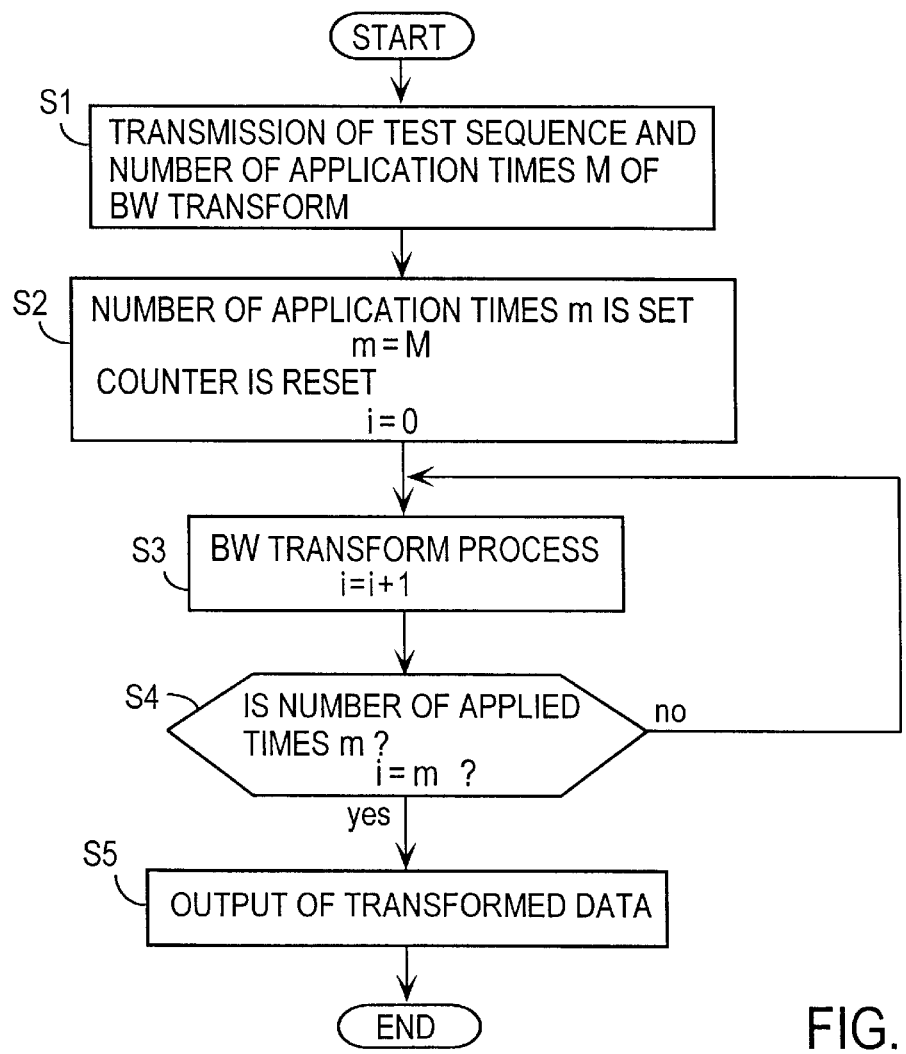
FIG. 84 is a flow chart for explaining a processing procedure of the repetitive BW transform means shown in FIG. 83.

Next, the operations for performing BW transform of a data using this repetitive BW transform means 526 will be explained. FIG. 84 is a flow chart showing the operations of BW transform of a data performed by the repetitive BW transform means.

First, in step S1, an inputted test sequence is transmitted to the BW transform means 533 and the number of application times M of BW transform is transmitted to the counter 534. Then in step S2, the number of application times m of BW transform is set to m=M and the counter i is reset to i=0. In step S3, the test sequence is transformed by BW transform and the counter 534 adds one to the counter value i in response to an end signal of BW transform. In step S4, a check is made to see if BW transform is performed m times, i.e., if i is i=m. If the number of applied times i of BW transform is not i=m, the switch 535 is opened and the switch 536 is connected to terminal 1 to repeat BW transform of the step S3. If the number of applied times i is i=m, the switch 535 is closed and the switch 536 is connected to terminal 2. In next step S5, the data transformed by BW transform is outputted and the process ends.

Here, the run length compression, the BW transform and the LZ compression will be explained.

Figure 85:
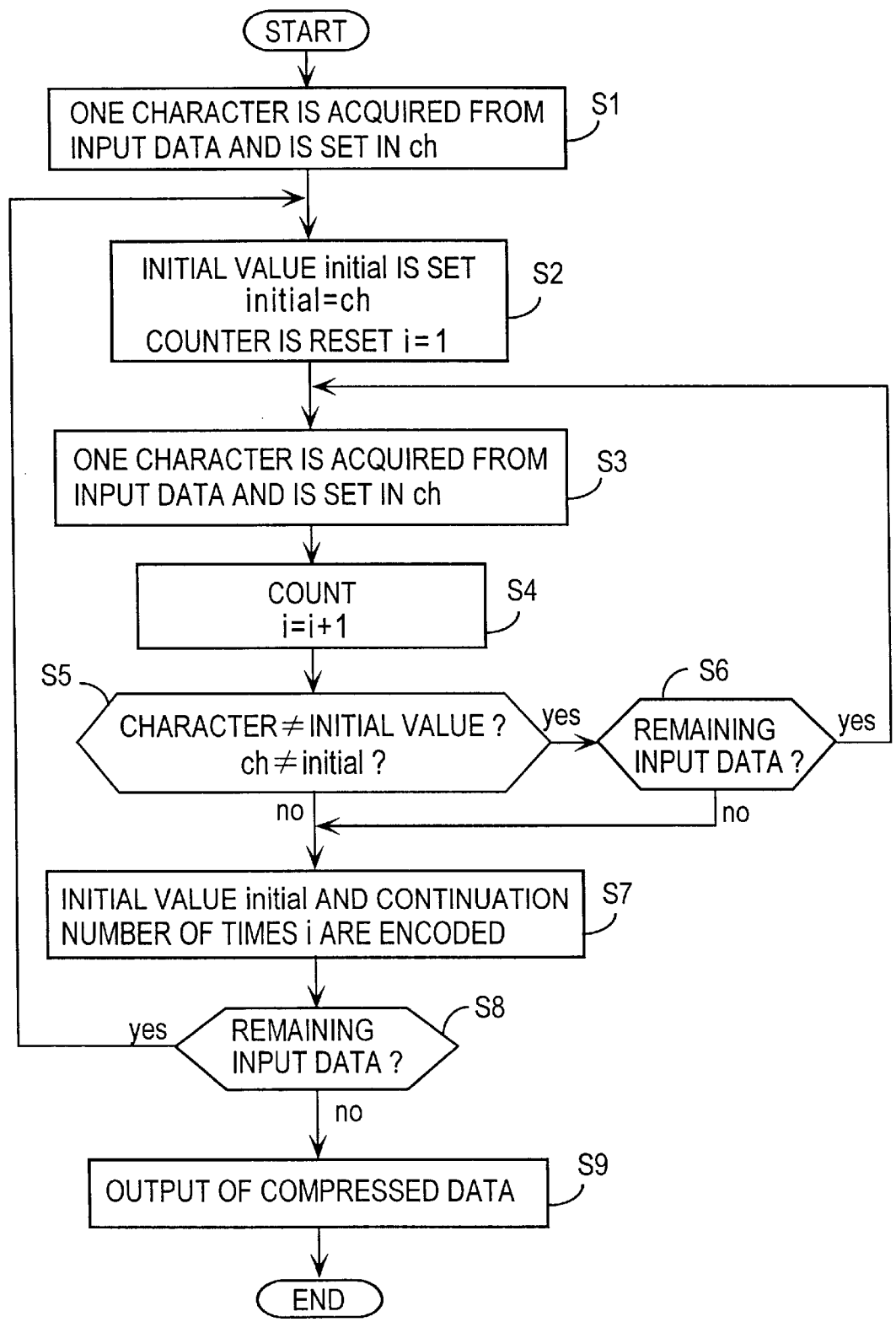
FIG. 85 is a flow chart for explaining a processing procedure of the run length compressing means in the test sequence compressing means shown in FIG. 81.

First, the operations for compressing a data using the run length compressing means 525 will be explained. FIG. 85 is a flow chart showing the run length compressing method. First, in step S1, one character data is acquired from an input character string and is set in ch. Then in step S2, the acquired character ch is set to an initial value of symbol "initial" for generating run length codes and a counter i is initialized to one (1). Then in step S3, one character is acquired from the input data and is set in ch and then in step S4, one (1) is added to the counter i to count the number of characters. In step S5, the acquired character ch is compared with the initial value "initial". If the character ch is equal to the initial value "initial" (ch=initial), the process proceeds to step S6. If the character ch is different from the initial value "initial" (ch LINESPACE 150 initial), the process proceeds to step S7.

In step S6, a check is made to see if there are remaining input data. If there are remaining input data, the steps S3, S4 and S5 are repeated. If there is no remaining input data, the process proceeds to step S7. In step S7, an encoding is performed using the initial value "initial" and the count value i. Then in step S8, a check is made to see if there are remaining input data. If there are remaining input data, the steps S2–S7 are repeated. If there is no remaining input data, the compressed data are outputted in step S9, and the process ends.

Figure 86:
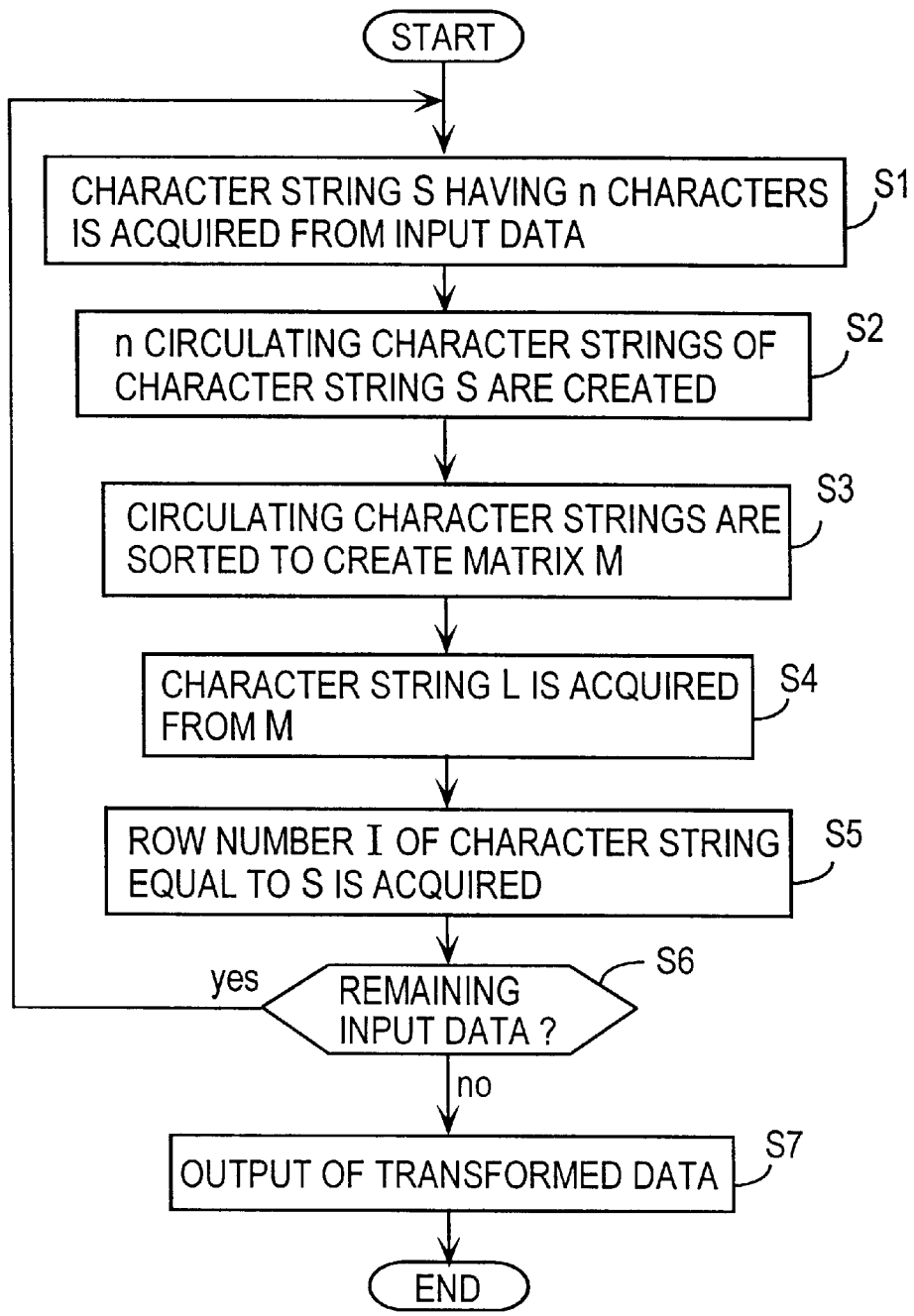
FIG. 86 is a flow chart for explaining a functional construction of the BW transform means in the test sequence compressing means shown in FIG. 81.
Figure 87:
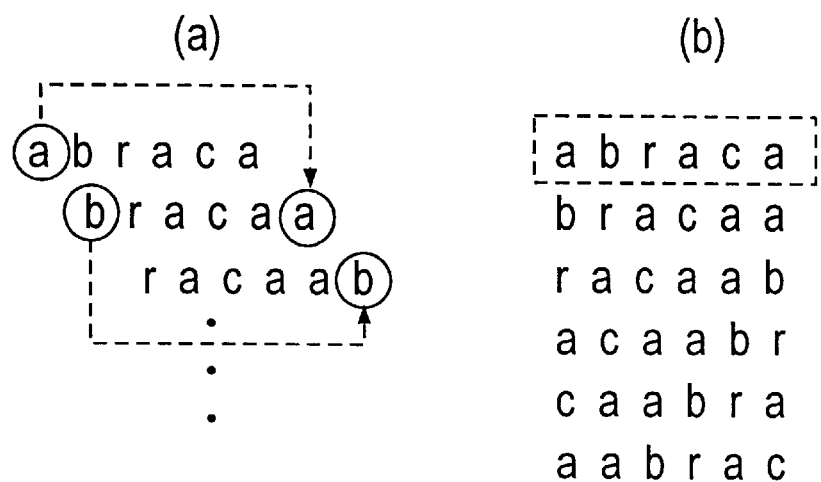
FIG. 87 is a diagram showing an example of a circulating character string used in BW transform.
Figure 88:
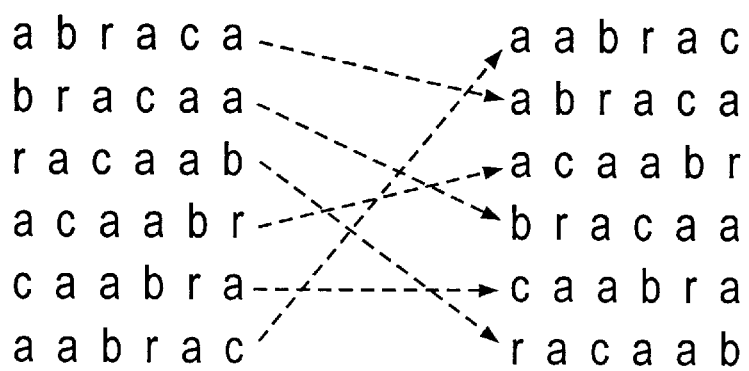
FIG. 88 is a diagram showing a sorting example of circulating character strings used in BW transform.

Next, the operations for transforming a data using the BW transform means 533 will be explained. FIG. 86 is a flow chart showing the BW transform method. First, in step S1, a character string S having n characters is acquired. In this case, an explanation is made using, as an example, a character string S='abraca' having n=6 characters. Then in step S2, n cyclic character strings (cyclically shifted character strings) of the acquired character string S are generated. The cyclic character strings are character strings in which the first character of a character string is cyclically moved to the last character position of the character string (shown in FIG. 87($a$)). In the example of S='abraca' used in this case, six cyclic character strings are obtained as shown in FIG. 87($b$). Then in step S3, the cyclic character strings obtained in the step S2 are sorted in the order of registration into a dictionary to create a matrix M. In the example of S='abraca', the character strings are sorted in the alphabetic order as shown in FIG. 88 in such a manner as aa first, ab next and ac next.

Figure 89:
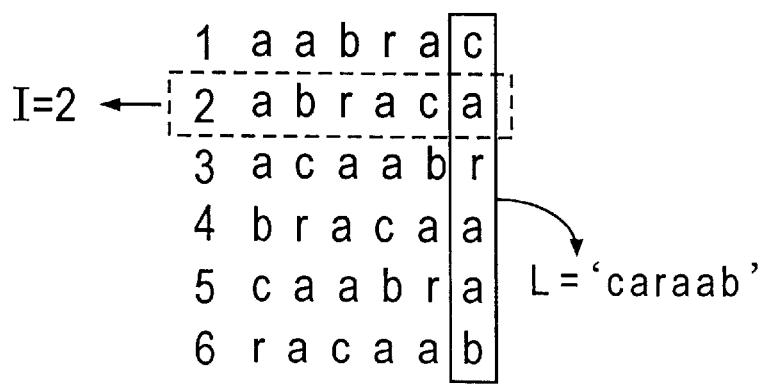
FIG. 89 is a diagram showing an example of an output data in BW transform.

In steps S4 and S5, a character string L obtained from the last column of the matrix M and a row number I of a row having the same character string as the input character string S are acquired from the created matrix M. In the example of S="abraca", as shown in FIG. 89, L='caraab' and I=2 are obtained. As mentioned above, the character string S='abraca' is transformed to a data containing a character string L='caraab' and a row number I=2. Finally, in step S6, a check is made to see if there are remaining input data. If there are remaining input data, the steps S1–S5 are repeated. If there is no remaining input data, the data transformed by BW transform are outputted, in step S7, and the process ends.

Figure 90:
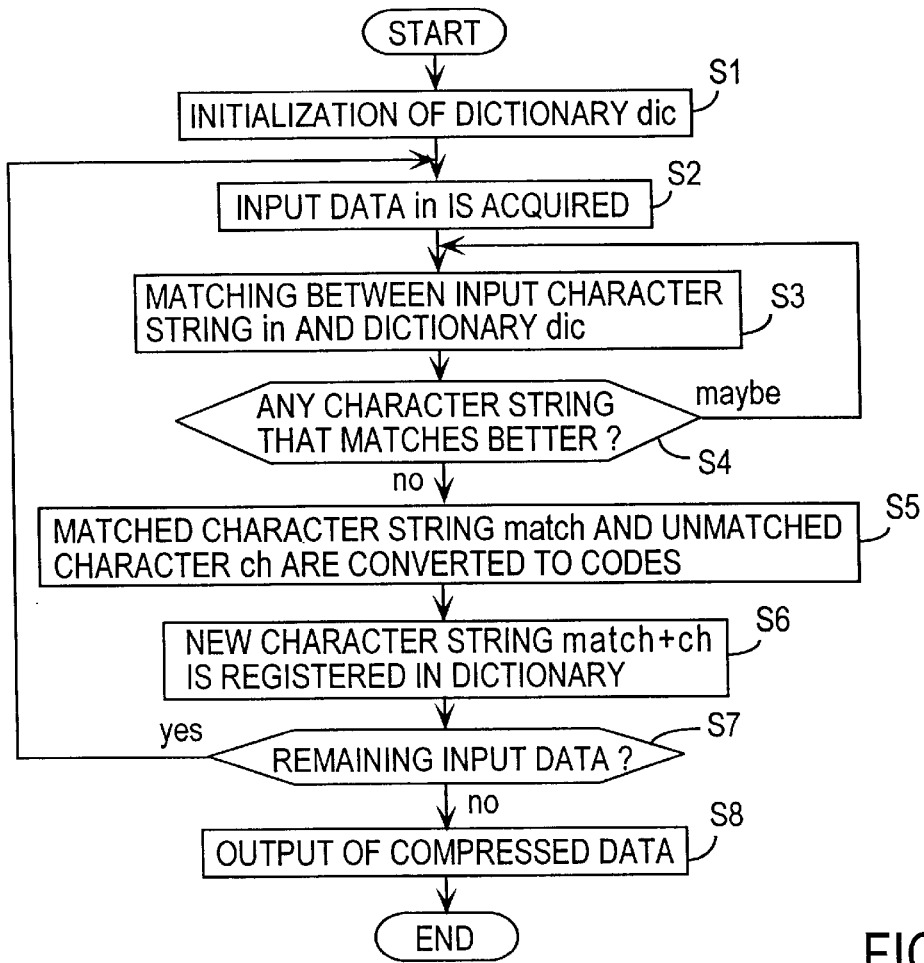
FIG. 90 is a flow chart for explaining a processing procedure of the LZ compressing means in the test sequence compressing means shown in FIG. 81.

Finally, the operations for compressing a data using the LZ compressing means 527 will be explained. FIG. 90 is a flow chart showing the LZ compressing method. First, in step S1, an initialization of a dictionary dic to be used in a data compression is performed. Then in step S2, an input data "in" is acquired and in step S3, a matching between the acquired character string "in" and the dictionary dic is performed. In step S4, a check is made to see if there is a character string that matches better with the dictionary dic. If there is a possibility that there may be a character string matching better with the dictionary dic, the matching operation in the step S3 is repeated. If there is no character string that matches better with the dictionary dic in step S4, the character string "match" matched with the dictionary dic and the first character ch which did not match with the dictionary dic are coded in step S5. In step S6, this new character string match+ch are registered in the dictionary. Finally, in step S7, a check is made to see if there are remaining input data. If there are remaining input data, the steps S2–S6 are repeated. If there is no remaining input data, the compressed data are outputted in step S8 and the process ends.

Figure 91:
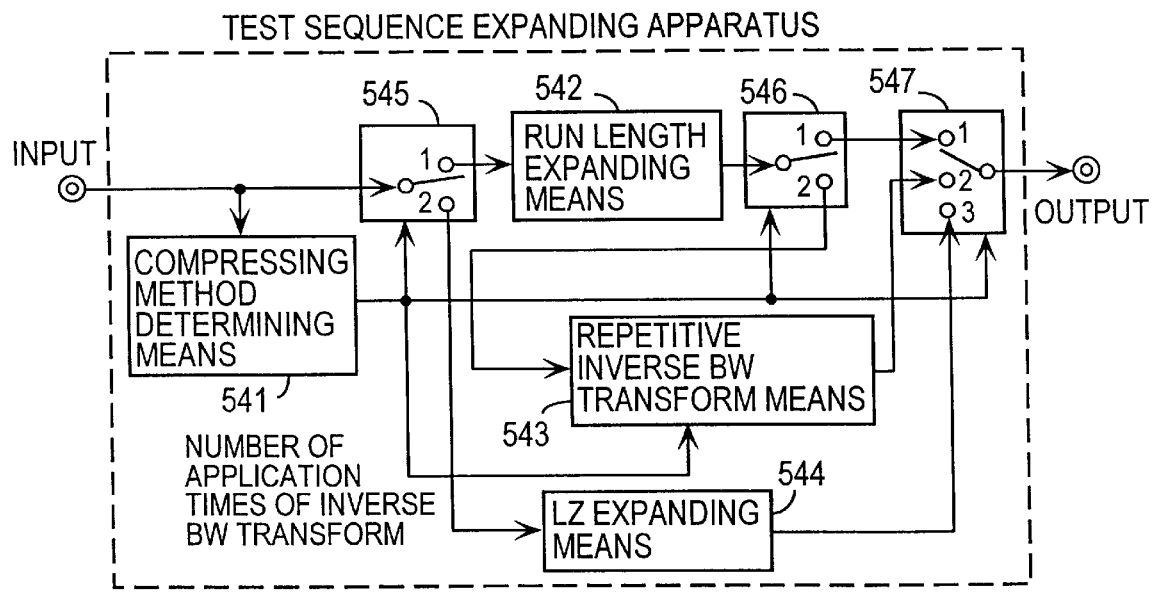
FIG. 91 is a block diagram showing an example of a functional construction of the test sequence expanding means in the test pattern expanding apparatus shown in FIGS. 71, 73, 75 and 77.

FIG. 91 is a block diagram showing an example of a functional construction of the test sequence expanding means used in the second embodiment of the present invention. This test sequence expanding means comprises compressing method determining means 541 for determining whether a compressed data has been compressed by the run length compressing method, by the BWT run length compressing method, or by the LZ compressing method; run length expanding means 542 for expanding a compressed data using the run length expanding method; repetitive inverse BW transform means 543 for applying inverse BW transform to a data expanded by the run length expanding means one or more times; LZ expanding means 544 for expanding a compressed data using the LZ expanding method; and three switches 545, 546 and 547 for selecting a compressed data path in accordance with the compressing method obtained by the compressing method determining means 541.

Figure 92:
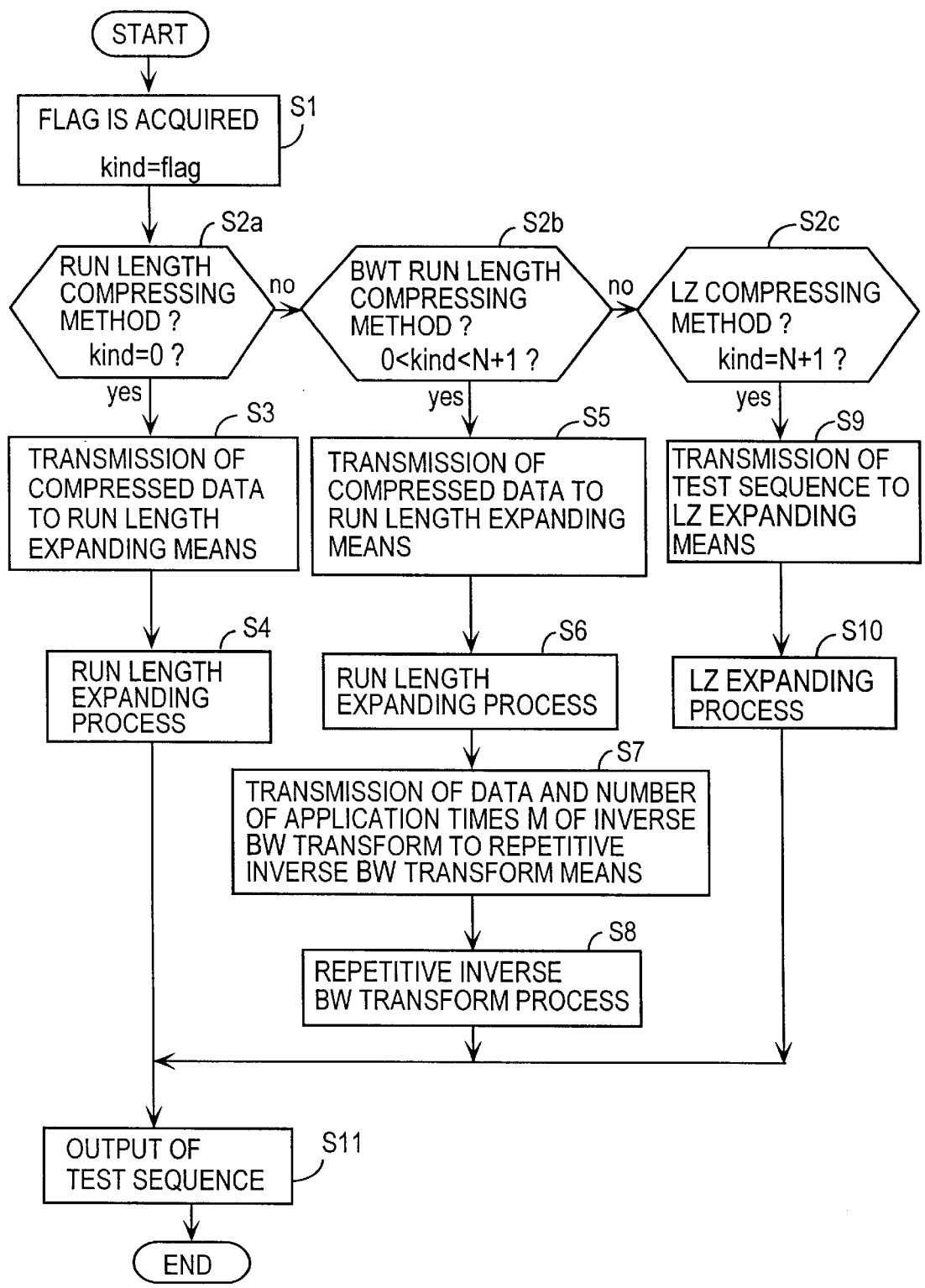
FIG. 92 is a flow chart for explaining a processing procedure of the test sequence expanding means shown in FIG. 91.

Next, the operations for expanding a test sequence using this test sequence expanding apparatus will be explained. FIG. 92 is a flow chart showing the test sequence expanding method of the second embodiment of the present invention. First, in step S1, the compressing method determining means 541 acquires a flag which is outputted together with a compressed data from the test sequence compressing means and unitarily indicates the compressing method to set this flag in "kind" as kind=flag.

Here, the flag is determined to take a value of 0 for the run length compressing method, a value of the number of application times m (M=1, 2, . . . , N where N is a fixed value indicating the maximum number of application times of BW transform, for example, N=5) of BW transform for the BWT run length compressing method, or a value of N+1 for the LZ compressing method. Then in steps S2$a$–S2$c$, different operations are performed in accordance with the compressing method "kind". If the determined compressing method is the run length compressing method (kind=0), the switches 545, 546 and 547 of the test sequence expanding means are connected to a terminal 1, a terminal 1 and a terminal 1, respectively. In step S3, a compressed data is transmitted to the run length expanding means 542 and then in step S4, the run length expanding means 542 expands the compressed data using the run length expanding method.

If, in step S2, the determined compressing method is the run length compressing method (0<kind<N+1), the switches 545, 546 and 547 of the test sequence expanding apparatus are connected to their terminals 1, 2 and 2, respectively. In step S5, the compressed data is transmitted to the run length expanding means 542 and the run length expanding means 542 expands, in step S6, the compressed data. Then in step S7, the expanded data and the number of application times M (=kind) of inverse BW transform are transmitted to the repetitive inverse BW transform means 543 and the repetitive inverse BW transform means 543 inversely transforms the data M times, in step S8, the by inverse BW transform.

If, in step S2, the determined compressing method is the LZ compressing method (kind=N+1), the switches 545 and 547 of the test sequence expanding means are connected to the terminals 2 and 3, respectively. In step S9, the compressed data is transmitted to the LZ expanding means 544 and the LZ expanding means 544 expands, in step S10, the compressed data using the LZ expanding method. Finally, in step S11, the expanded test sequence is outputted and the process ends.

Figure 93:
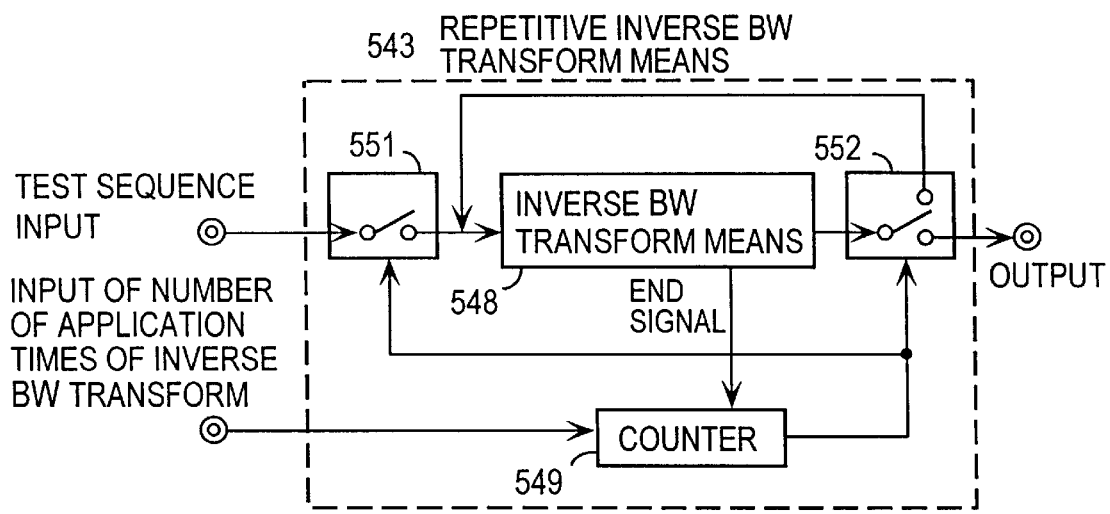
FIG. 93 is a block diagram showing an example of a functional construction of the repetitive inverse BW transform means in the test sequence expanding means shown in FIG. 91.

FIG. 93 is a block diagram showing an example of a construction of the repetitive inverse BW transform means 543 in the test sequence expanding means shown in FIG. 91. This repetitive inverse BW transform means 543 comprises inverse BW transform means 548 for applying inverse BW transform to an inputted data, a counter 549 for is counting the number of application times of inverse BW transform, and two switches 551 and 552 for selecting a data path.

Figure 94:
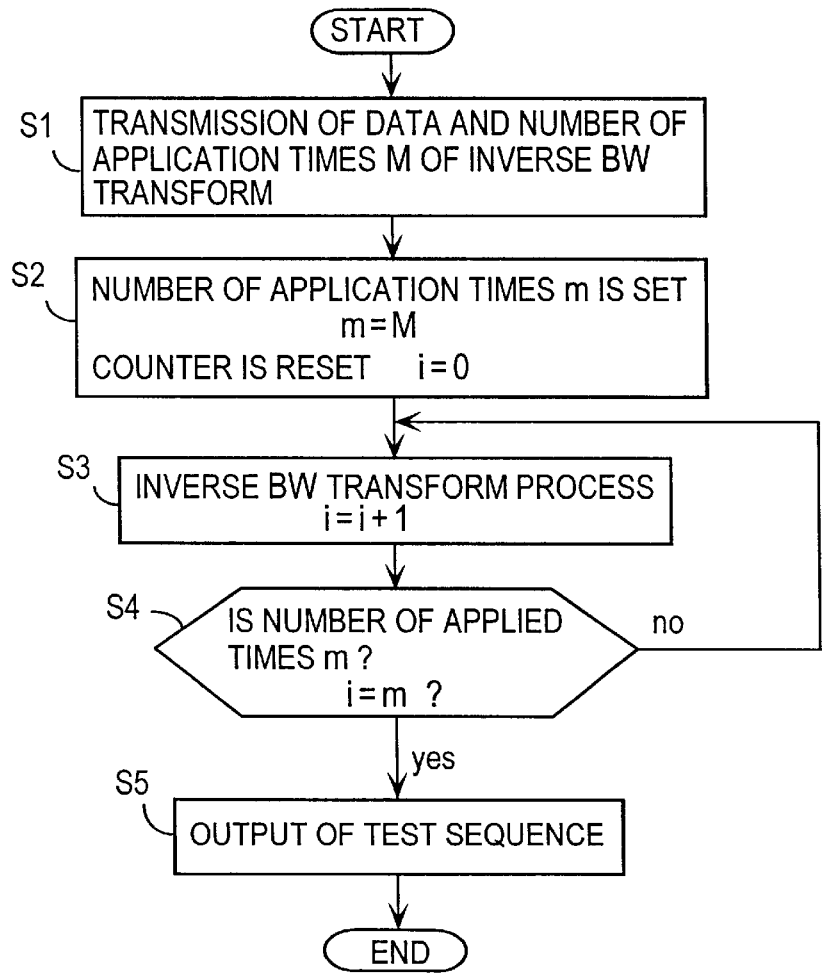
FIG. 94 is a flow chart for explaining a processing procedure of the repetitive inverse BW transform means shown in FIG. 93.

Next, the operations for performing inverse BW transform of a data using this repetitive inverse BW transform means 543 will be explained. FIG. 94 is a flow chart showing the operations of inverse BW transform of a data by the repetitive inverse BW transform means 543. First, in step S1, an input data is transmitted to the inverse BW transform means 548 and the number of application times M of inverse transform is transmitted to the counter 549. Then in step S2, the number of application times m of inverse BW transform is set to m=M and the counter 549 is reset to i=0. In step S3, a test sequence is transformed by inverse BW transform and the counter 549 adds one (1) to i in response to an end signal of an inverse BW transform operation. In step S4, a check is made to see if inverse BW transform is performed m times, i.e., if i is i=m. If the number of applied times i is not i=m, the switch 551 is opened and the switch 552 is connected to terminal 1, and then the inverse BW transform operation of the step 3 is repeated. If the number of applied times i is i=m, the switch 551 is closed and the switch 552 is connected to a terminal 2. Then in next step S5, the data transformed by inverse BW transform is outputted and the process ends.

Here, the run length expansion, the inverse BW transform and the LZ expansion will be explained.

Figure 95:
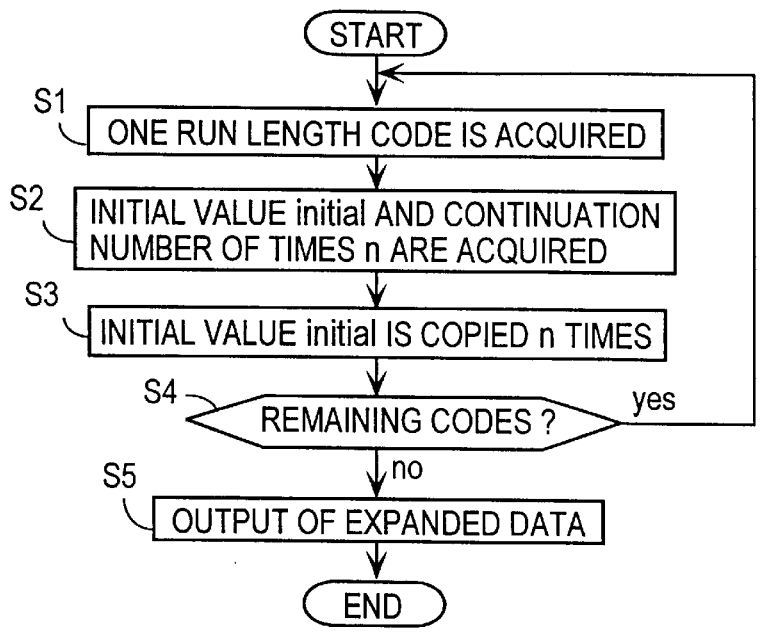
FIG. 95 is a flow chart for explaining a processing procedure of the run length expanding means in the test sequence expanding means shown in FIG. 91.

First, the operations for expanding a data using the run length expanding means 542 will be explained. FIG. 95 is a flow chart showing the run length expanding method. First, in step S1, a compressed data is acquired. In step S2, an initial value "initial" and the number of character continuation times n are acquired from the compressed data. Then in step S3, the initial value "initial" is copied by n times (the number of character continuations). In step S4, a check is made to see if there are remaining compressed data. If there are remaining compressed data, the steps S1–S3 are repeated. If there is no remaining data, the expanded data are outputted in step S5 and the process ends.

Next, the operations for performing inverse transform using the inverse BW transform means 543 will be explained.

Figure 96:
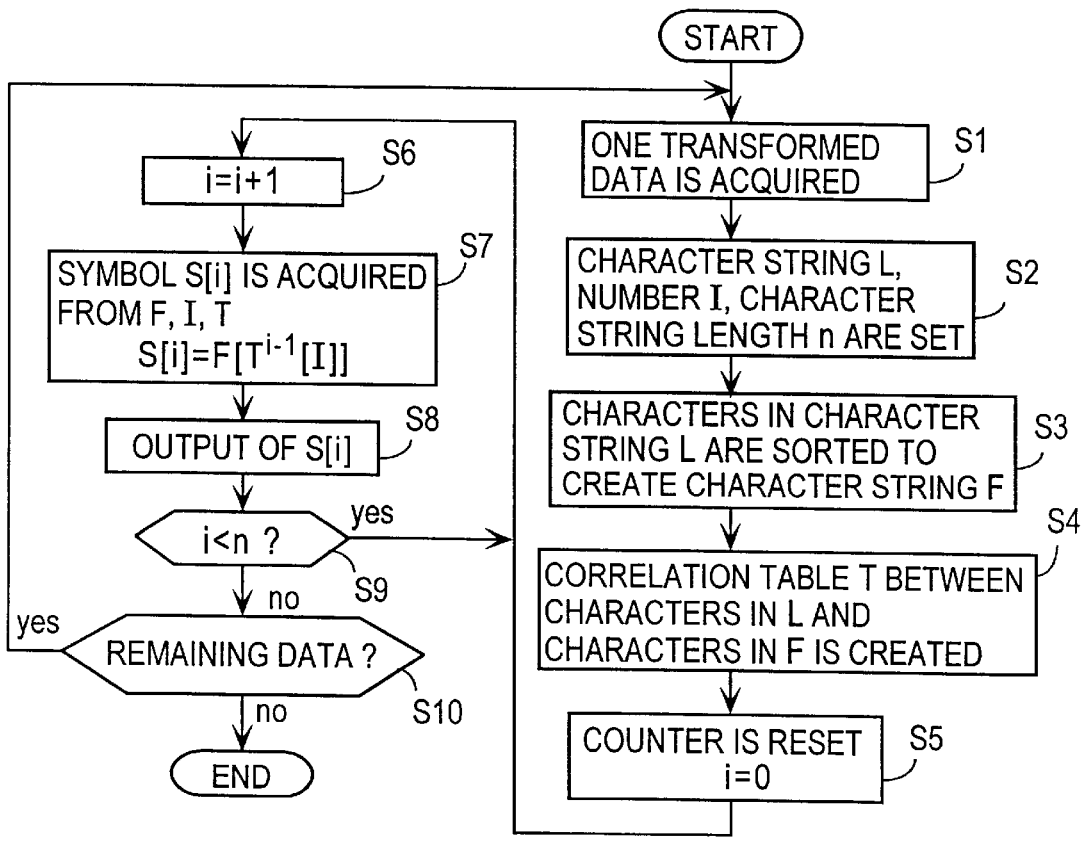
FIG. 96 is a flow chart for explaining a processing procedure of the repetitive inverse BW transform means in the test sequence expanding means shown in FIG. 91.
Figures 97, 98:
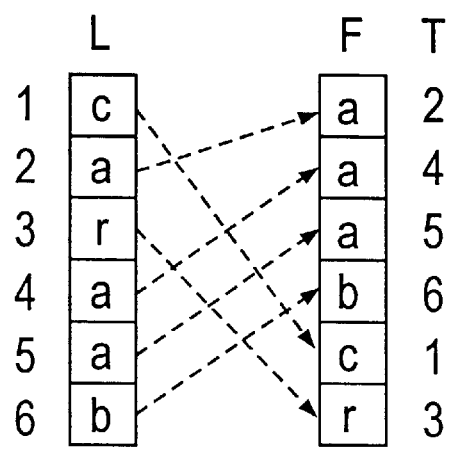
FIG. 97 is a diagram showing an example of correlations between a character string L and a character string F in inverse BW transform.
FIG. 98 is a diagram showing a reconstruction example of a character string S in inverse BW transform.

FIG. 96 is a flow chart showing the inverse BW transform method. Here, an explanation will be given using the example of L='caraab' and I=2 used in the explanation of BW transform. First, in step S1, a transformed data is acquired and in step S2, the character string L and the number I obtained from the transformed data and the length of the character string n are set. In this example, L='caraab', I=2 and n=6 are set. Then in step S3, the characters in the acquired character string L are sorted in alphabetical order to generate a character string F. In the example of L='caraab', F is, as shown in FIG. 97, F='aaabcr'. In step S4, a matrix T indicating the correlations between each character L[i] in the character string L and each character F[i] in the character string F is created. Here, T is a matrix which satisfies L[T[i]]=F[i]. In addition, if the same characters ch are used in the character string L, those characters ch in the character string L are sorted in the character string F such that the sequence of those characters ch are unchanged. Therefore, in the example of L='caraab' and F='aaabcr', T is obtained as T=[245613] as shown in FIG. 97.

Next, in step S5, the counter 549 is reset to i=0. In step S6, the counter 549 is incremented by one (1) and in step S7, ith character S[i] of the original character string S is restored from the character string F, the number I and the matrix T. Here, S[i] is represented by $S[i]=F[T^{-1}[I]]$, $T^0[i]=I$, $T^{i+1}[I]=T[T^i[I]]$. In step S8, the character S[i] is outputted. That is, when i is i=1 first, $S[1]=F[T^0[I]]$. Since, as mentioned above, $T^0[I]=I$ and I=2 in this example, $S[1]=F[2]$ is obtained. Therefore, the second character a of F is S[1]=a. Next, when i is i=2, $S[2]=F[T^1[I]]$ is obtained. Since $T^1[I]=T[T^0[I]]=T[2]$ and the second number of T is 4, $S[2]=F[T[2]]=F[4]$ is obtained. Since the fourth character of F is b, S[2]=b is obtained. When i is i=3, S[3] is $F[T^2[I]]$. Since $T^2[I]$ is $T^2[I]=T[T^1[I]]=T[4]$, the fourth number of T is 6. Therefore, S[3] is F[6]. Since the sixth character of F is r, S[3] is S[3]=r. Hereinafter, inverse BW transform is similarly performed.

Then in step S9, a check is made to see if there are remaining characters not restored yet in the character string S, i.e., if i is i<n. If there are remaining characters not restored yet (if i is i<n), the steps 6–8 are repeated. If the characters have been restored up to the last character (i is i=n), the process proceeds to step S10. In the example used here, as shown in FIG. 98, S[i] is obtained as; S[1]=a, S[2]=b, S[3]=r, S[4]=a, S[5]=c and [6]=a. Thus, the original character string S='abraca' has been reconstructed. Finally, in step S10, a check is made to see if there are remaining data. If there are remaining data, the steps S1–S9 are repeated. If there is no remaining data, the process ends.

Figure 99:
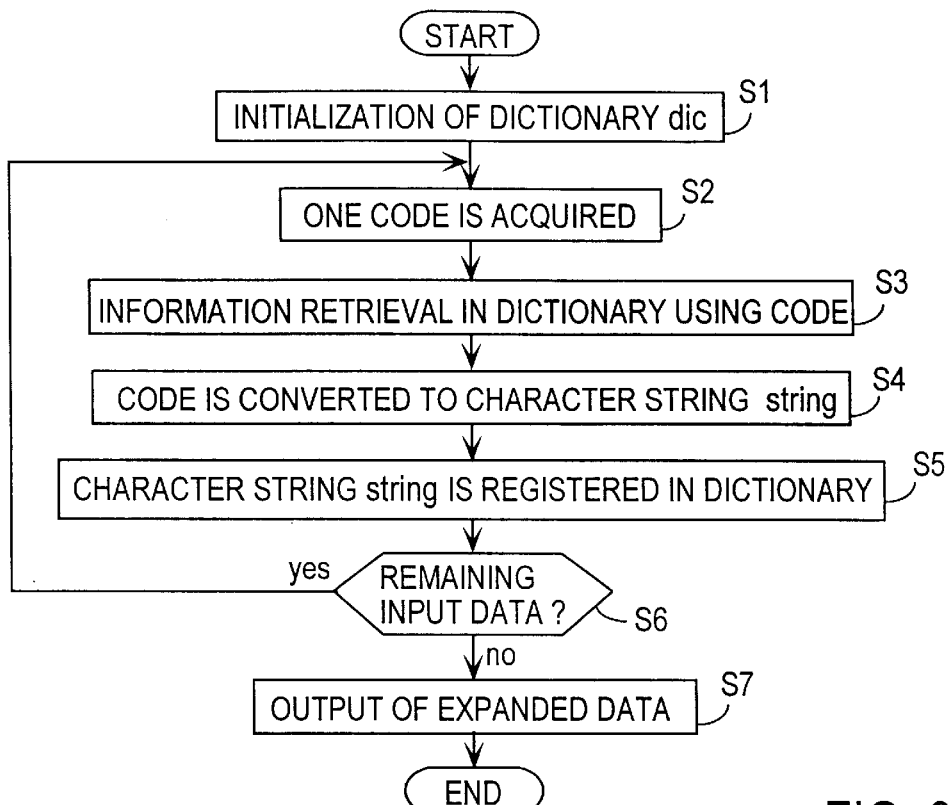
FIG. 99 is a flow chart for explaining a processing procedure of the LZ expanding means in the test sequence expanding means shown in FIG. 91.

Finally, the operations for expanding a data using the LZ expanding means 544 will be explained. FIG. 99 is a flow chart showing the LZ expanding method. First, in step S1, a dictionary dic to be used in the expansion process is initialized. Then in step S2, one code is acquired from an input compressed data. In step S3, an information retrieval is performed in the dictionary using the acquired data. In step S4, the code is converted to a character string "string". Then in step S5, the newly generated character string "string" is registered in the dictionary dic. Finally, a check is made, in step S6, to see if there are remaining compressed data. If there are remaining compressed data, the steps S2–S5 are repeated. If there is no remaining compressed data, the expanded data are outputted in step S7 and the process ends.

Figure 100:
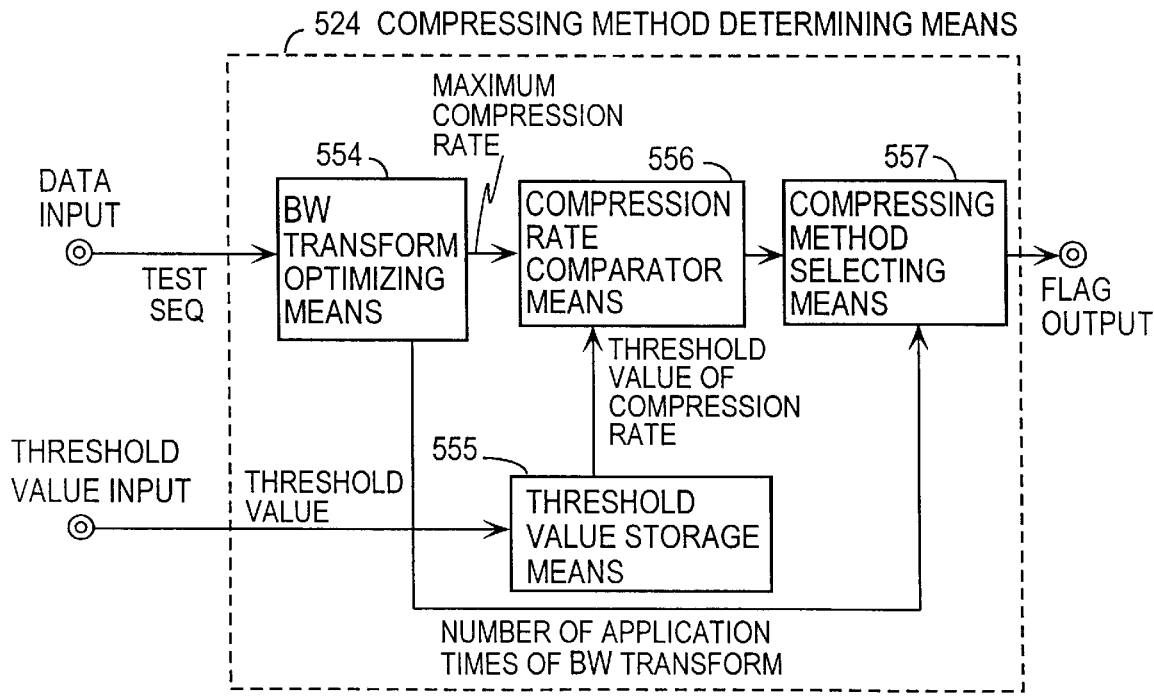
FIG. 100 is a block diagram showing an example of a functional construction of the compressing method determining means in the test sequence compressing means shown in FIG. 81.

FIG. 100 is a block diagram showing an example of a functional construction of the compressing method determining means 524 in the test sequence compressing means shown in FIG. 81. This compressing method determining means 524 comprises BW transform optimizing means 554 for calculating the optimum number of application times for applying BW transform to a test sequence, threshold value storage means 555 for storing a threshold value of compression rate, compression rate comparator means 556 for comparing the maximum value of compression rate obtained from the BW transform optimizing means 544 with the threshold value stored in the threshold value storage means 555, and compressing method selecting means 557 for selecting whether a test sequence is compressed by the run length compressing method, by the BWT run length compressing method, or by the LZ compressing method in accordance with the comparison result obtained from the compression rate comparator means 556 and the optimum number of application times of BW transform obtained from the BW transform optimizing means 554.

Next, the operations for determining the optimum compressing method to be applied to a test sequence using this compressing method determining means 524 will be explained.

Figure 101:
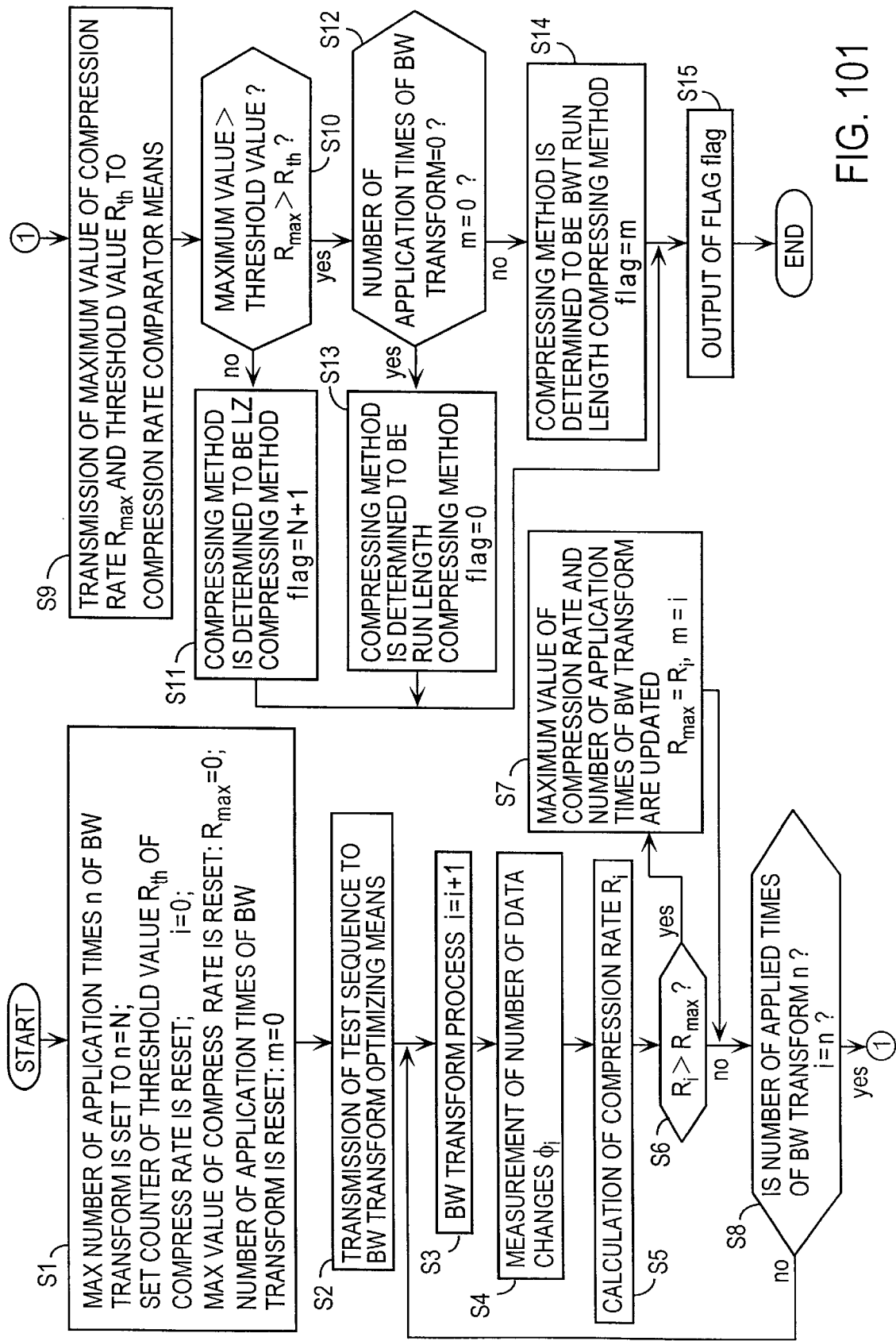
FIG. 101 is a flow chart for explaining a processing procedure of the compressing method determining means shown in FIG. 100.

FIG. 101 is a flow chart showing this compressing method determining method. First, in step S1, the initialized maximum application times n of BW transform is set to n=N (for example, N=5), a threshold value of compression rate $R_{th}$ is externally set to a certain value (for example, $R_{th}$=10), and each of a counter i, the maximum value of compression rate $R_{max}$ and the number of application times n of BW transform is reset to zero to initialize environmental variables. In step S2, an inputted test sequence is transmitted to the BW transform optimizing means 554. Then in step S3, BW transform is applied to the test sequence one time and the counter i is incremented by one. In step S4, the number of data changes $\phi_i$h of the data transformed by BW transform is measured.

Next, in step S5, a compression rate $R_i$ is calculated using the formula (4) from the obtained number of data changes $\phi_i$ and the number of applied times i of BW transform. In step S6, the maximum value $R_{max}$ of the compression rates obtained before now is compared with the newly calculated compression rate $R_i$. If the newly calculated compression rate $R_i$ is greater than the maximum value $R_{max}$ (if $R_i$ is $R_i > R_{max}$), in step S7, the maximum value of compression rate $R_{max}$ is updated to $R_{max} = R_i$ and the number of application times m of BW transform is updated to m=i at that time.

Next, in step S8, a check is made to see if the number of applied times of BW transform has become the number n specified in the step 1, i.e., if i is i<n. If the number of applied times i is less than the specified number n, the steps S3–S7 are repeated. If the number of applied times i has become the specified number n, the process proceeds to step S9. The steps S3–S8 are performed by the BW transform optimizing means 554. That is, the BW transform optimizing means 554 acquires, by repeating the steps S3–S8 by the specified number of times n, the maximum value $R_{max}$ and the number of application times m of BW transform at that time. Then in step S9, the maximum value of compression rate $R_{max}$ obtained by the BW transform optimizing means 554 and the threshold value of compression rate $R_{th}$ stored in the threshold value storage means 555 are transmitted to the compression rate comparator means 556 to be compared with each other.

In step S10, if the maximum value $R_{max}$ of compression rate is equal to or less than the threshold value $R_{th}$, the compressing method to be applied is determined, in step S11, to be the LZ compressing method and a flag is set to flag=N+1. If, in the step S10, the threshold value $R_{th}$ is less than the maximum value $R_{max}$, the number of application times m of BW transform is confirmed in step S12.

If, in step S12, the number of application times m of BW transform is zero, the compressing method to be applied to the test sequence is determined, in step S13, to be the run length compressing method and the flag is set to flag=0. If the number of application times m of BW transform is not zero, the compressing method to be applied to the test sequence is determined, in step S14, to be the BWT run length compressing method and the flag is set to flag=m. The steps S11–S14 are performed by the compressing method selecting means 557. Finally, the compressing method selecting means 557 outputs, in step S15, the flag which unitarily determines a compressing method and then the process ends.

In the above operations, the threshold value $R_{th}$ of compression rate can either externally be set or be set in advance to a fixed value. When the threshold value $R_{th}$ is externally set, the threshold value storage means 555 operates as a RAM. On the other hand, when the threshold value $R_{th}$ is set in advance to a fixed value, the threshold value storage means 555 operates as a ROM and in this case, the threshold value input is not necessary.

Figure 102:
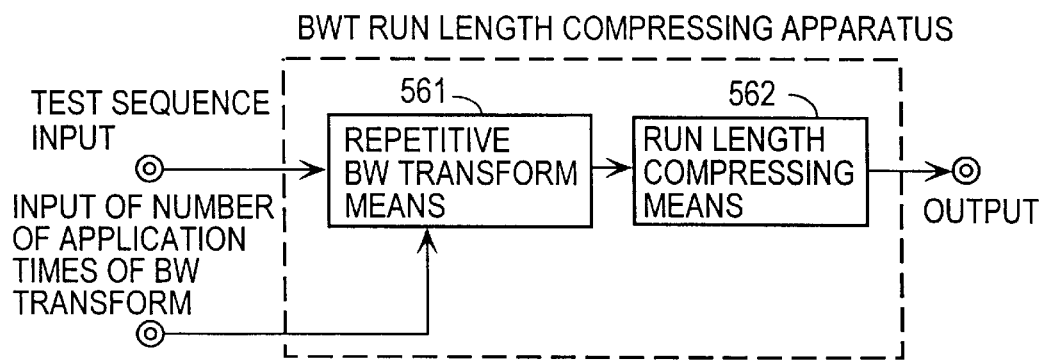
FIG. 102 is a block diagram showing an example of a functional construction of the BWT run length compressing means of the second embodiment of the present invention.

FIG. 102 is a block diagram showing an example of a construction of the BWT run length compressing means. This BWT run length compressing means comprises repetitive BW transform means 561 for applying BW transform one or more times to a test sequence and run length compressing means 562 for compressing a data transformed by BW transform using the run length compressing method.

Figure 103:
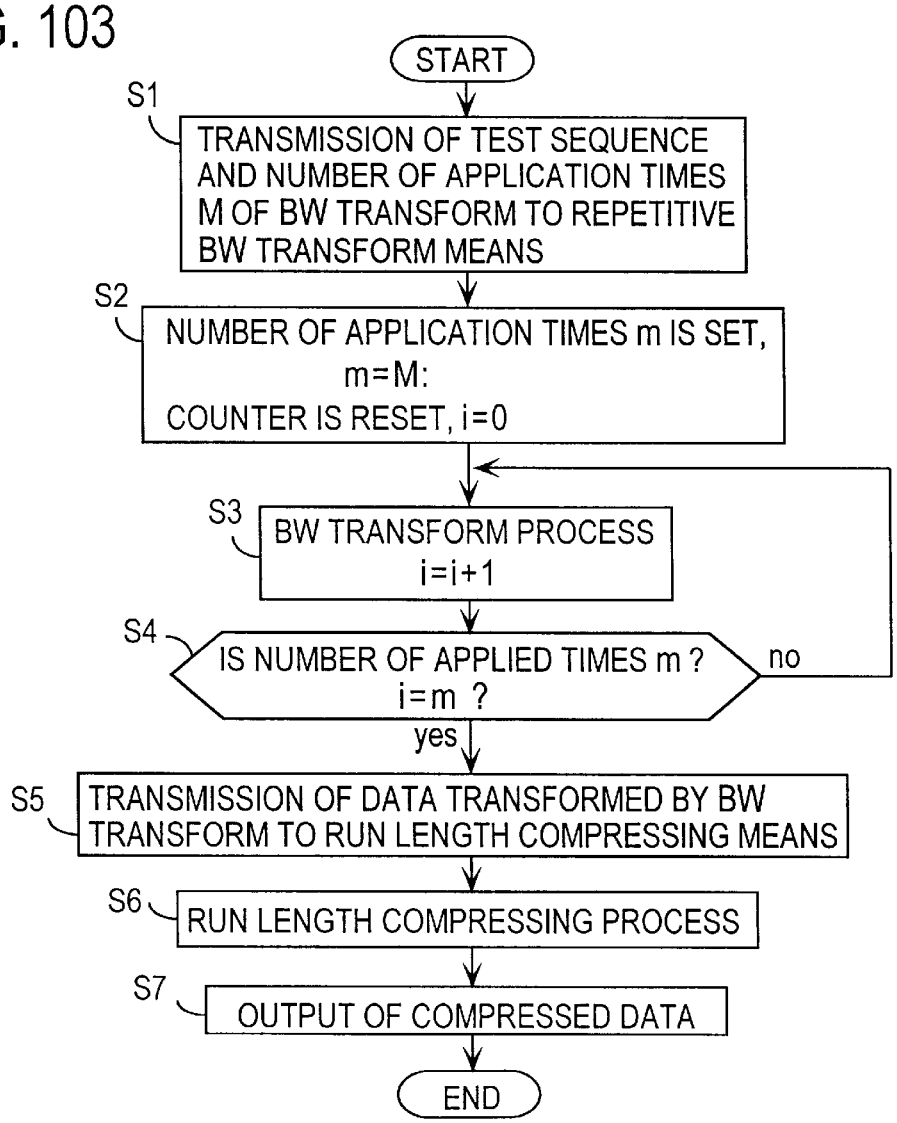
FIG. 103 is a flow chart for explaining a processing procedure of the BWT run length compressing means shown in FIG. 102.

Next, the operations for compressing a test sequence without any information loss using this BWT run length compressing means will be explained. FIG. 103 is a flow chart showing the BWT run length compressing method. First, in step S1, an inputted test sequence and the number of application times M (=kind) of BW transform are transmitted to the repetitive BW transform means 561. Then in step S2, the number of application times m of BW transform is set to m=M and a counter i is reset to i=0. In step S3, the test sequence is transformed by BW transform and one (1) is added to the counter i. In step S4, a check is made to see if BW transform is performed m times, i.e., if i is i=m. The step 3 is repeated until the number of applied times i becomes m. Then in step S5, the data transformed m times by BW transform is transmitted to the run length compressing means 562 and the data is compressed, in step S6, using the run length compressing method. Finally, in step S7, the compressed data is outputted and the process ends.

Figure 104:
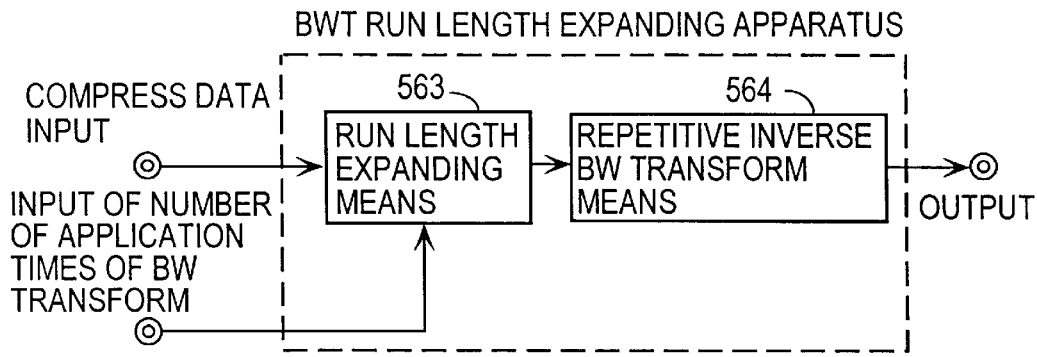
FIG. 104 is a block diagram showing an example of a functional construction of the BWT run length expanding means of the second embodiment of the present invention.

FIG. 104 is a block diagram showing an example of a construction of the BWT run length expanding means. This BWT run length expanding means comprises run length expanding means 563 for expanding an inputted compressed data using the run length expanding method and repetitive inverse BW transform means 564 for applying inverse BW transform one or more times to the data expanded by the run length expanding means.

Figure 105:
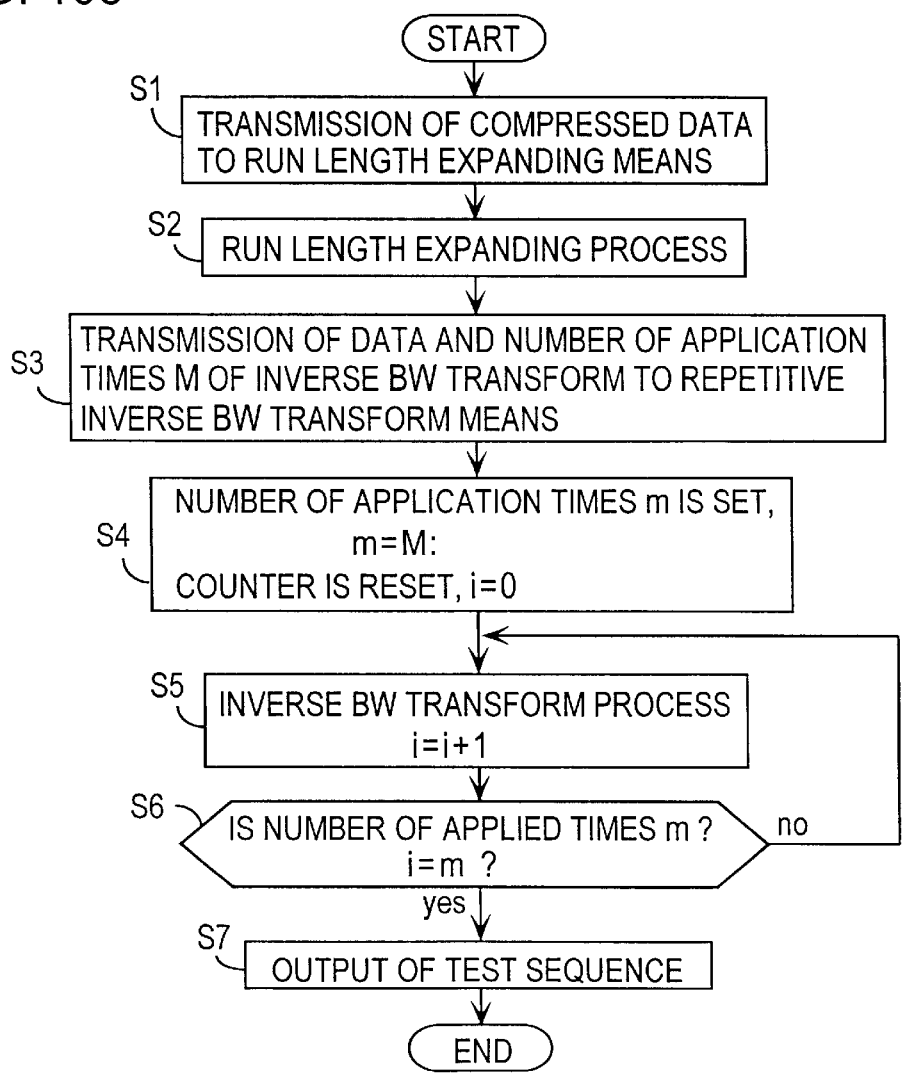
FIG. 105 is a flow chart for explaining a processing procedure of the BWT run length expanding means shown in FIG. 104.

Next, the operations for expanding a compressed data to the original test sequence without any information loss using this BWT run length expanding means will be explained. FIG. 105 is a flow chart showing the BWT run length expanding method. First, in step S1, an inputted compressed data is transmitted to the run length expanding means 563.

Then in step S2, the run length expanding means 563 expands the compressed data. In step S3, the expanded data and the number of application times M (=kind) of inverse BW transform are transmitted to the repetitive inverse BW transform means 564. Then in step S4, the number of application times m of inverse BW transform is set to m=M and a counter i is reset to i=0. The repetitive inverse BW transform means 564 inversely transforms, in step S5, the data by inverse BW transform and the counter i is incremented by one (1). Then in step S6, a check is made to see if inverse BW transform is performed m times, i.e., if i is i<m. The step S5 is repeated until the number of applied times of inverse BW transform becomes m. Finally, in step S7, the reconstructed test sequence is outputted and the process ends.

Heretofore, the test pattern compressing method, the test pattern expanding method, the test pattern compressing apparatus and the test pattern expanding apparatus of the second embodiment of the present invention have been explained. However, the present invention further includes an automatic IC test system which can transfer a test pattern at high speed using the test pattern compressing apparatus or the test pattern compressing method and the test pattern expanding apparatus or the test pattern expanding method according to the present invention. The automatic IC test system (IC tester) having the test pattern expanding apparatus according to the present invention can cope with various test environments such as an environment in which a pattern generator in the main body of the tester is connected to a disk drive storing test patterns via a tester processor, or an environment in which a pattern generator in the main body of the tester is directly connected to a disk array apparatus or the like. There will be explained below with reference to FIGS. 106–113 the embodiments and the variation examples of the automatic IC test system having a test pattern expanding apparatus and the embodiments and the variation examples of the automatic IC test system having a test pattern compressing apparatus.

Figure 106:
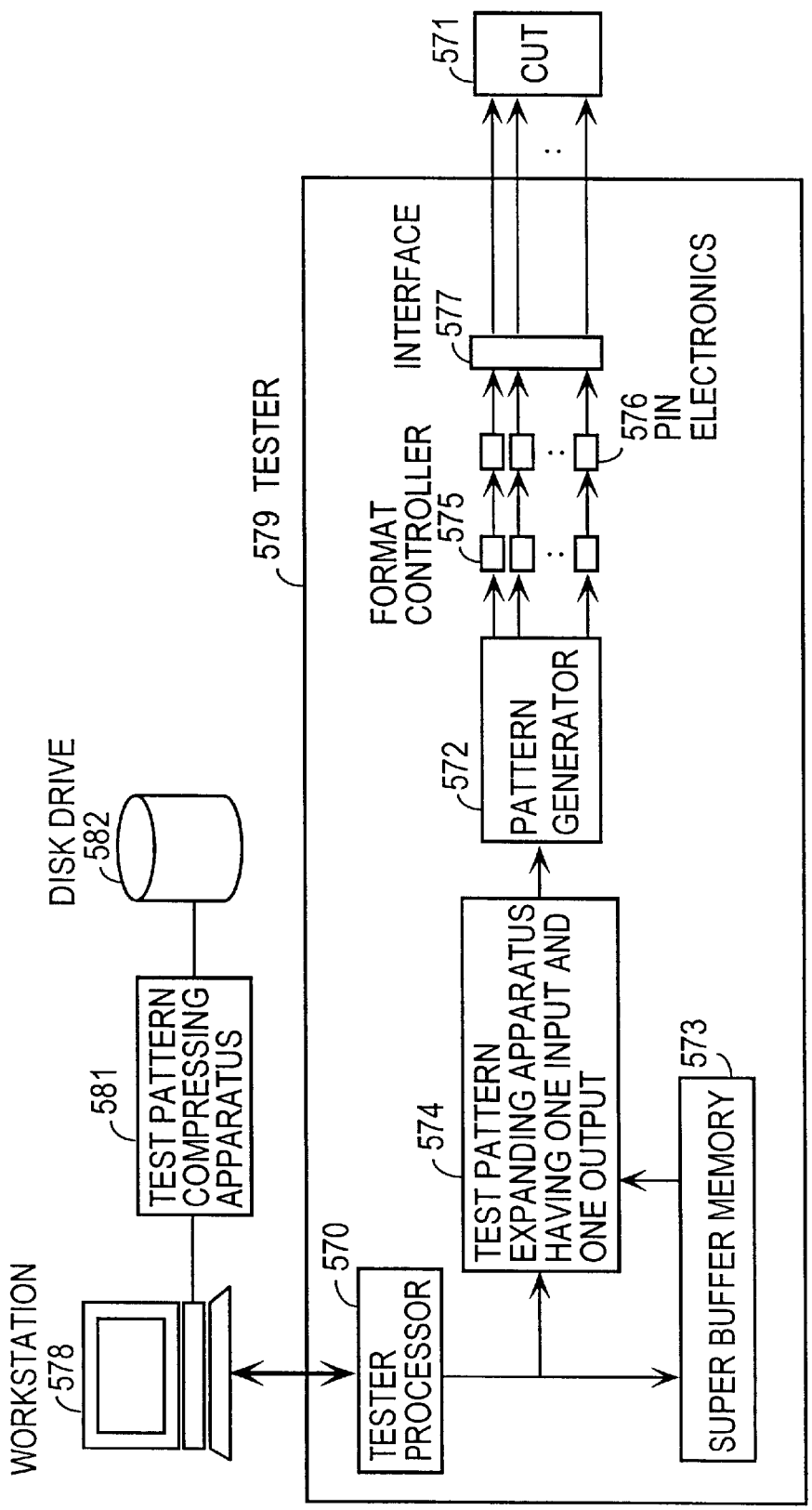
FIG. 106 is a block diagram showing a construction of the automatic test system to which the present invention is applied for testing a semiconductor integrated circuit.

FIG. 106 is a block diagram showing a construction of a first embodiment of an automatic IC test system having a test pattern expanding apparatus and a test pattern compressing apparatus according to the present invention. This test system comprises a tester processor 570 for controlling a main body of the tester 579, a circuit for storing test data and for generating, in synchronism with a basic clock, logical data to be applied to a semiconductor integrated circuit under test (CUT) 571, namely a pattern generator 572 for reading out and outputting in order the stored logical data, a buffer memory 573 which is a circuit for making up for a memory provided in the pattern generator 572 and can perform a high speed data transfer with the pattern generator 572, a test pattern expanding apparatus 574 having one input and one output for expanding a compressed data at high speed and for storing the expanded data in the pattern generator 572, format controllers 575 each being provided for each pin for generating, from logical data generated by the pattern generator 572, pulses having different widths or pulses having phase differences from each other, pin electronics 576 each being provided for each pin and having a driver for applying an electric signal to the CUT 571 and a comparator to which a response from the CUT 571 is supplied, an interface 577 for interfacing with the CUT 571, and a workstation 578 for controlling the main body of the tester.

The controlling workstation 578 is used for operating the main body of the tester 579 to control the automatic test of the IC 571. For example, a SPARC computer of Sun Microsystems Inc. can be used as the workstation 578. Test patterns have been compressed by a test pattern compressing apparatus 581 and have already been stored in a disk drive 582 of the workstation 578.

In a test of the CUT 571, when a test pattern is downloaded into the pattern generator 572 of the main body of the tester, a compressed test pattern data is transferred to the test pattern expanding apparatus 574 via the workstation 578 and the tester processor 570, and then the compressed test pattern data is expanded at high speed and the expanded test pattern data is stored in the pattern generator 572. If the entire test pattern data is not accommodated in the pattern generator 572, the remaining portion of the test pattern data is stored, in compressed state, in the buffer memory 573 and is expanded by the test pattern expanding apparatus 574 when necessary. In this case, if the test pattern is arranged in the same arrangement as in that of a conventional test pattern, a conventional pattern generator can be used as the pattern generator 572. By using the above construction, the data quantity or amount passing through a data transferring path can be reduced and the test pattern down-loading time can be reduced.

Figure 107:
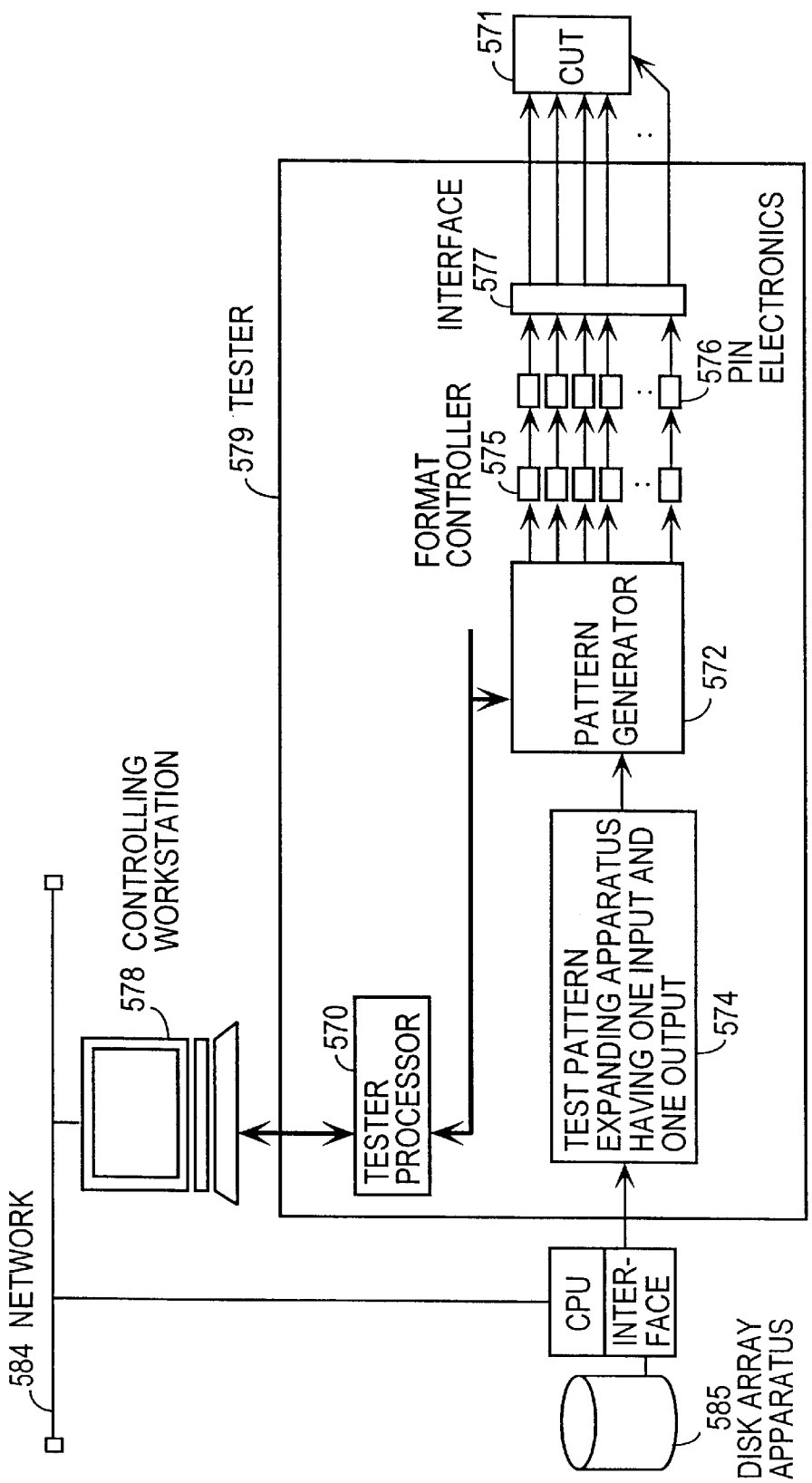
FIG. 107 is a block diagram showing another construction of the automatic test system to which the present invention is applied for testing a semiconductor integrated circuit.

FIG. 107 is a block diagram showing a construction of a second embodiment of the automatic IC test system having the test pattern expanding apparatus according to the present invention. This test system comprises a tester processor 570 for controlling a main body of the tester 579, a pattern generator 572 which is a circuit for storing test data and for generating, in synchronism with basic clock, logical data to be applied to a semiconductor integrated circuit under test (CUT) 571, a test pattern expanding apparatus 574 having one input and one output for expanding a compressed data at high speed and for storing the expanded data in the pattern generator 572, a disk array apparatus 585 which stores therein test pattern data and is connected to a network 584, and can transfer a test pattern data at high speed, format controllers 575 each being provided for each pin for generating, from logical data generated by the pattern generator 572, pulses having different widths or pulses having phase differences from each other, pin electronics 576 each being provided for each pin and having a driver for applying an electric signal to the CUT 571 and a comparator to which a response from the CUT 571 is supplied, an interface 577 for interfacing with the CUT 571, and a workstation 578 for controlling the main body of the tester.

The controlling workstation 578 is used for operating the main body of the tester 579 to control the automatic test of the IC 571. For example, a SPARC Computer of Sun Microsystems Inc. can be used as the workstation 578. Test patterns are compressed by a test pattern compressing apparatus (not shown) and are stored in the disk array apparatus 585 via the network 584. In a test of the CUT 571, when a test pattern stored in the disk array apparatus 585 is downloaded into the pattern generator 572 of the main body of the tester 579, a compressed test pattern data is transferred to the test pattern expanding apparatus 574 from the disk array apparatus 585, and then the compressed test pattern data is expanded at high speed and the expanded test pattern data is stored in the pattern generator 572.

By using the above construction, the data quantity passing through a data transferring path can be reduced. As a result, the test pattern down-loading time can be reduced.

Figure 108:
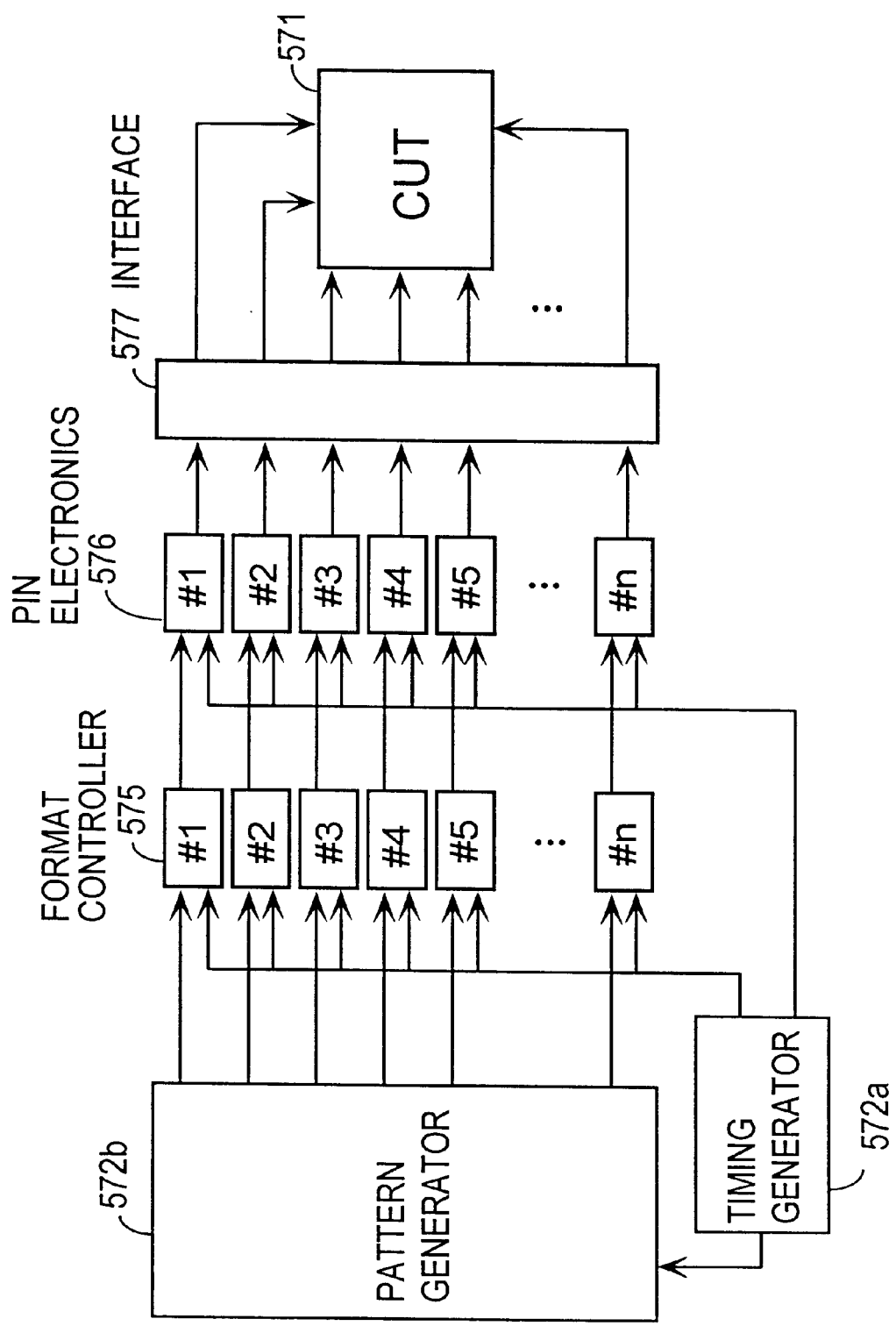
FIG. 108 is a block diagram showing a construction of a measurement system used in the automatic test system shown in FIGS. 106 and 107.

Next, a measuring system of the main body of the tester will be explained in detail. FIG. 108 shows an example of a detail construction of the measuring system of the main body of the tester 579 used in the embodiment shown in FIG. 106. The measuring system used in the above embodiment comprises a timing generator 572*a* for generating a timing pulse for defining a time period such as a delay, a width or the like, a pattern generator 572b for generating an expanded logical data in synchronism with a basic clock, format controllers 575 each being provided for each pin for generating, from the logical data generated by this pattern generator 572b and the clock signal from the timing generator 572a, pulses having different widths or pulses having phase differences from each other, pin electronics 576 each being provided for each pin and having a driver for applying an electric signal to the CUT 571 and a comparator to which a response from the CUT 571 is supplied, and an interface 577 for interfacing with the CUT 571.

In the test of the CUT 571, the pattern generator 572b generates a logical data to be applied to the CUT 571 in accordance with the clock generated by the timing generator 572a. Each of the format controllers 575 forms a pulse based on the logical data. The pulse generated by each of the format controllers 575 is converted to a signal having a level set by the driver of the corresponding pin electronics 576, and then the signal is applied to the CUT 571 via the interface 577. A response from the CUT 571 is acquired by the comparator of the corresponding pin electronics 576, where the response is compared with an expected value data outputted from the pattern generator 572b.

Figure 109:
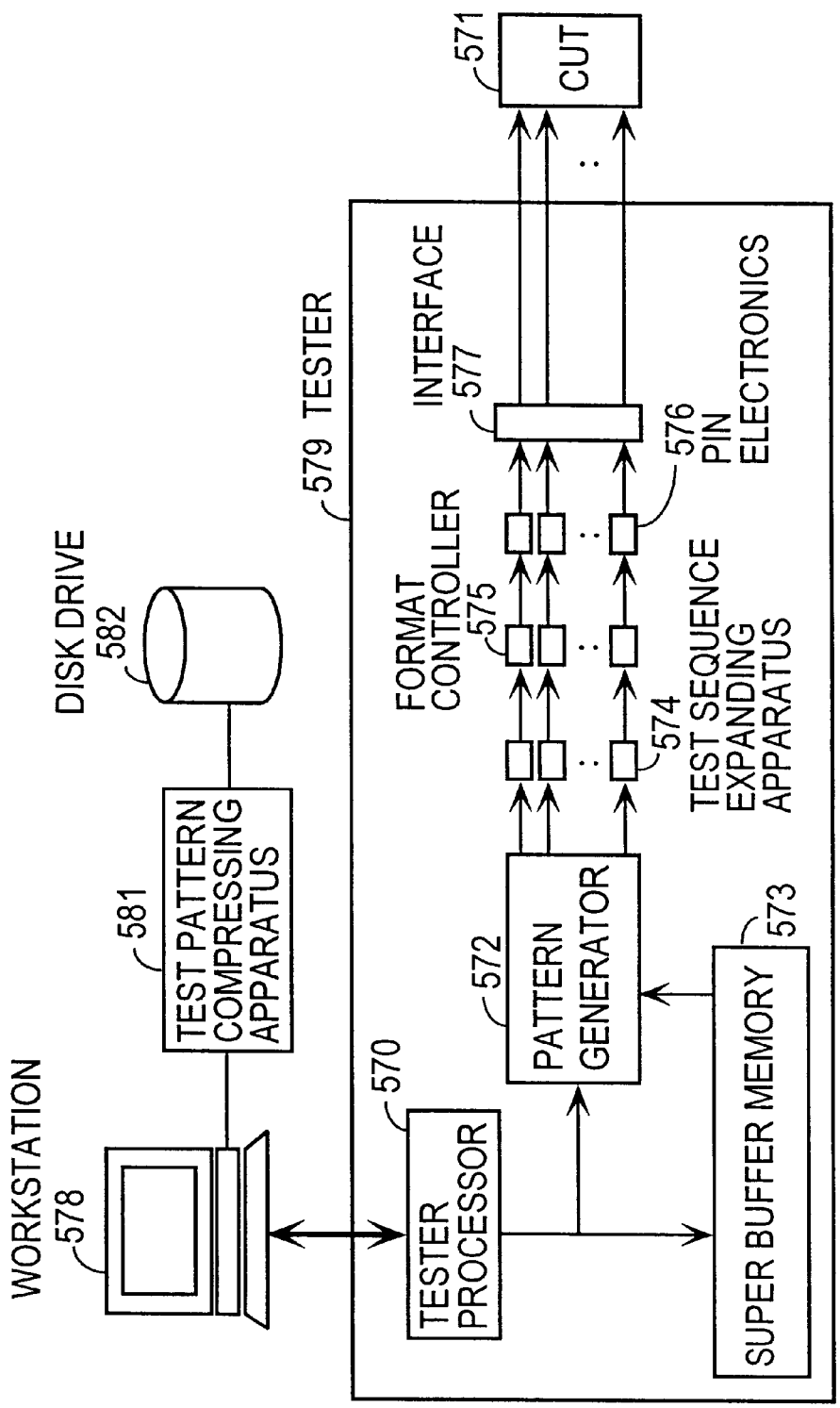
FIG. 109 is a block diagram showing further another construction of the automatic test system to which the present invention is applied for testing a semiconductor integrated circuit.

FIG. 109 is a block diagram showing a construction of a third embodiment of the automatic IC test system having the test pattern expanding apparatus and the test pattern compressing apparatus according to the present invention. This test system comprises a tester processor 570 for controlling a main body of the tester 579, a circuit for storing test data and for generating, in synchronism with a basic dock, logical data to be applied to a semiconductor integrated circuit under test (CUT) 571, namely a pattern generator 572 for reading out and outputting the stored data, a buffer memory 573 which is a circuit for making up for a memory provided in the pattern generator 572 and can perform a high speed data transfer with the pattern generator 572, test sequence expanding apparatus 574 each being provided for each pin for expanding compressed data outputted from the pattern generator 572 in parallel for respective pins at high speed, format controllers 575 each being provided for each pin for generating, from logical data generated by the pattern generator 572, pulses having different widths or pulses having phase differences from each other, pin electronics 576 each being provided for each pin and having a driver for applying an electric signal to the CUT 571 and a comparator to which a response from the CUT 571 is supplied, an interface 577 for interfacing with the CUT 571, and a workstation 578 for controlling the main body of the tester.

The controlling workstation 578 is used for operating the main body of the tester 579 to control the automatic test of the IC 571. For example, a SPARC computer of Sun Microsystems Inc. can be used as the workstation 578. Test patterns have been compressed by a test pattern compressing apparatus 581 and have already been stored in a disk drive 582 of the workstation 578.

In a test of the CUT 571, when a test pattern is downloaded into the pattern generator 572 of the main body of the tester 579, a compressed test pattern data is stored in the pattern generator 572 via the workstation 578 and the tester processor 570. If the entire test pattern data is not accommodated in the pattern generator 572, the remaining portion of the test pattern data is stored, in compressed state, in the buffer memory 573 and is transferred to the pulse generator 572 when necessary. In addition, the compressed data outputted from the pattern generator 572 are transferred to the respective test sequence expanding apparatus 574 in the respective pin basis and are expanded at high speed, and then are sent to the respective format controllers 575.

By using the above construction, the data quantity passing through a data transferring path can be reduced. Hence, the test pattern down-loading time can be reduced.

Figure 110:
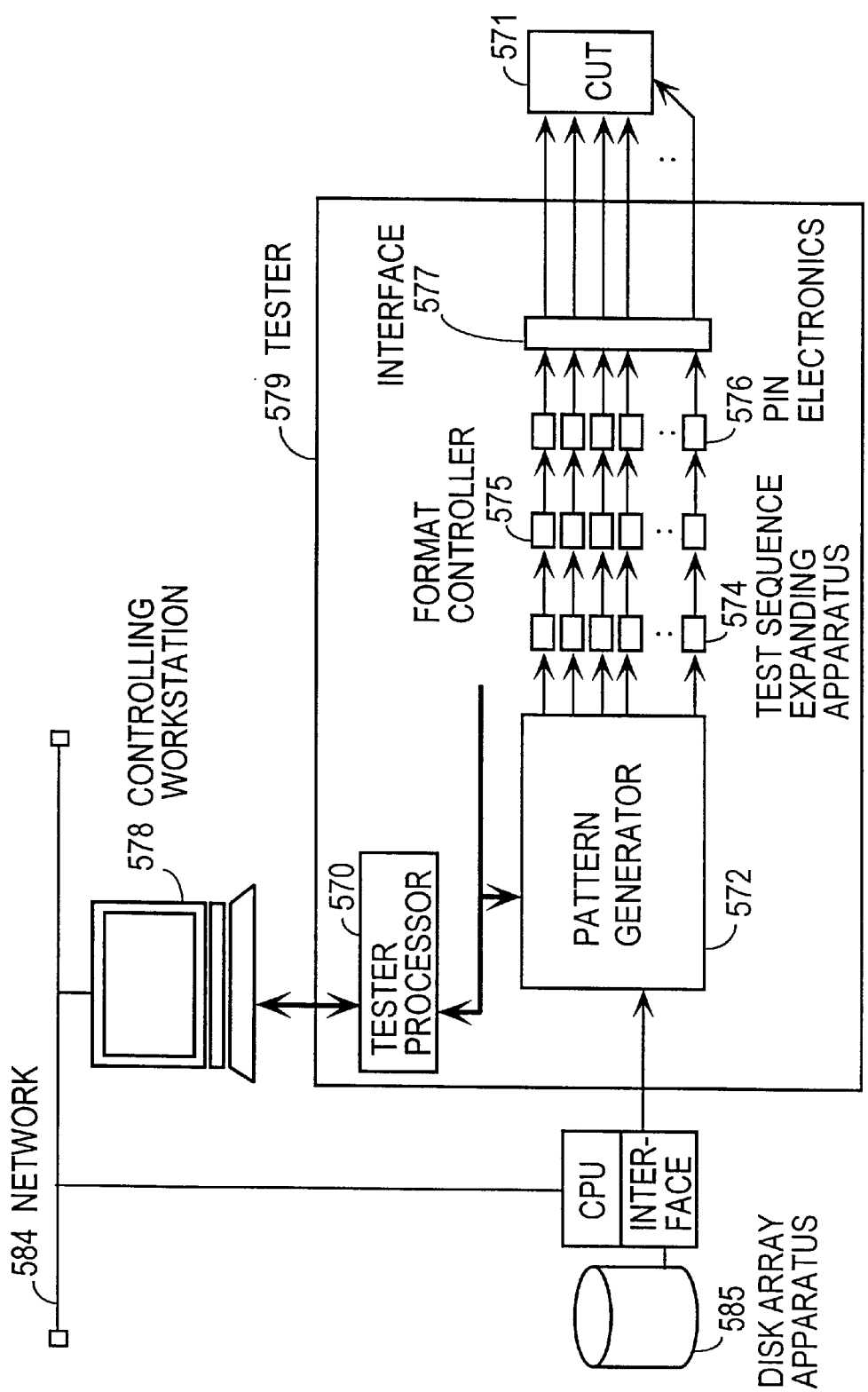
FIG. 110 is a block diagram showing still another construction of the automatic test system to which the present invention is applied for testing a semiconductor integrated circuit.

FIG. 110 is a block diagram showing a construction of a fourth embodiment of the automatic IC test system having the test pattern expanding apparatus according to the present invention. This test system comprises a tester processor 570 for controlling a main body of the tester 579, a pattern generator 572 which is a circuit for storing test data and for generating, in synchronism with a basic clock, logical data to be applied to a semiconductor integrated circuit under test (CUT) 571, test pattern expanding apparatus 574 each being provided for each pin for expanding compressed data outputted from the pattern generator 572 in parallel for respective pins at high speed, a disk array apparatus 585 which stores therein test pattern data and is connected to a network 584, and can transfer a test pattern data at high speed, format controllers 575 each being provided for each pin for generating, from logical data generated by the pattern generator 572, pulses having different widths or pulses having phase differences from each other, pin electronics 576 each being provided for each pin and having a driver for applying an electric signal to the CUT 571 and a comparator to which a response from the CUT 571 is supplied, an interface 577 for interfacing with the CUT 571, and a workstation 578 for controlling the tester.

The controlling workstation 578 is used for operating the main body of the tester 579 to control the automatic test of the IC 571. For example, a SPARC computer of Sun Microsystems Inc. can be used as the workstation 578. Test patterns have been compressed by a test pattern compressing apparatus (not shown) and have already been stored in a disk array apparatus 585 via the network 584.

In a test of the CUT 571, when a test pattern stored in the disk array apparatus 585 is down-loaded into the pattern generator 572 of the main body of the tester 579, a compressed test pattern data is stored in the pattern generator 572 from the disk array apparatus 585. The compressed data outputted from the pattern generator 572 are transferred to the test sequence expanding apparatus 574 in the respective pin basis, where those compressed data are expanded at high speed and sent to the respective format controllers 575.

By using the above construction, the data quantity passing through a data transferring path can be reduced. Hence, the test pattern down-loading time can be reduced.

Figure 111:
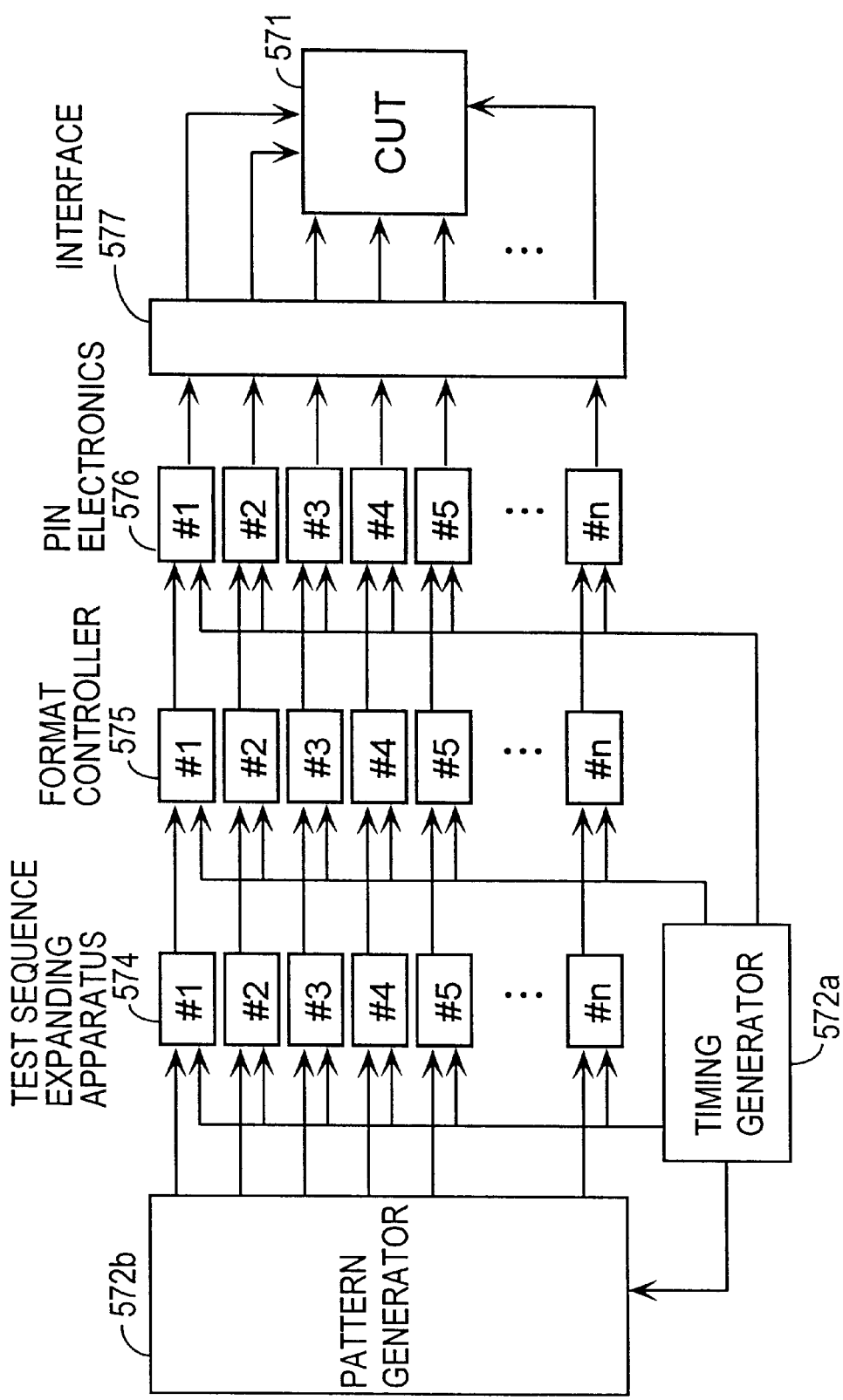
FIG. 111 is a block diagram showing a construction of a measurement system used in the automatic test system shown in FIGS. 109 and 110.

Next, a measuring system of the main body of the tester will be explained in detail. FIG. 111 shows an example of a detail construction of the measuring system of the main body of the tester 579 used in the embodiment shown in FIG. 109 or FIG. 110. The measuring system used in the above embodiments comprises a timing generator 572a for generating timing pulses for defining a time period such as a delay, a width or the like, a pattern generator 572b for generating an expanded logical data in synchronism with a basic clock, test sequence expanding apparatus each being provided for each pin for expanding in parallel the compressed data in the respective pin basis, format controllers 575 each being provided for each pin for generating, from the logical data generated by this pattern generator 572b and the clock signal from the timing generator 572a, pulses having different widths or pulses having phase differences from each other, pin electronics 576 each being provided for each pin and having a driver for applying an electric signal to the CUT 571 and a comparator to which a response from the CUT 571 is supplied, and an interface 577 for interfacing with the CUT 571.

In the test of the CUT 571, a test sequence expanding apparatus 574 generates, in accordance with a clock generated by the timing generator 572a, a logical data to be applied to the CUT 571 based on a compressed data outputted from the pattern generator 572b. Based on the logical data, each of the format controllers 575 forms a pulse. The pulse generated by each of the format controllers 575 is converted to an electric signal by the driver of the pin electronics 576, and then the signal is applied to the CUT 571 via the interface 577. A response from the CUT 571 is acquired by the comparator of the corresponding pin electronics 576, where the response is compared with an expected value data also outputted from the test sequence expanding apparatus 574.

By using the above construction, a compressed test pattern can be expanded in real time and the CUT 571 can be tested in real time using the expanded logical data. Further, by storing the compressed data in the pattern generator 572b, an amount of memory can be reduced.

Figure 112:
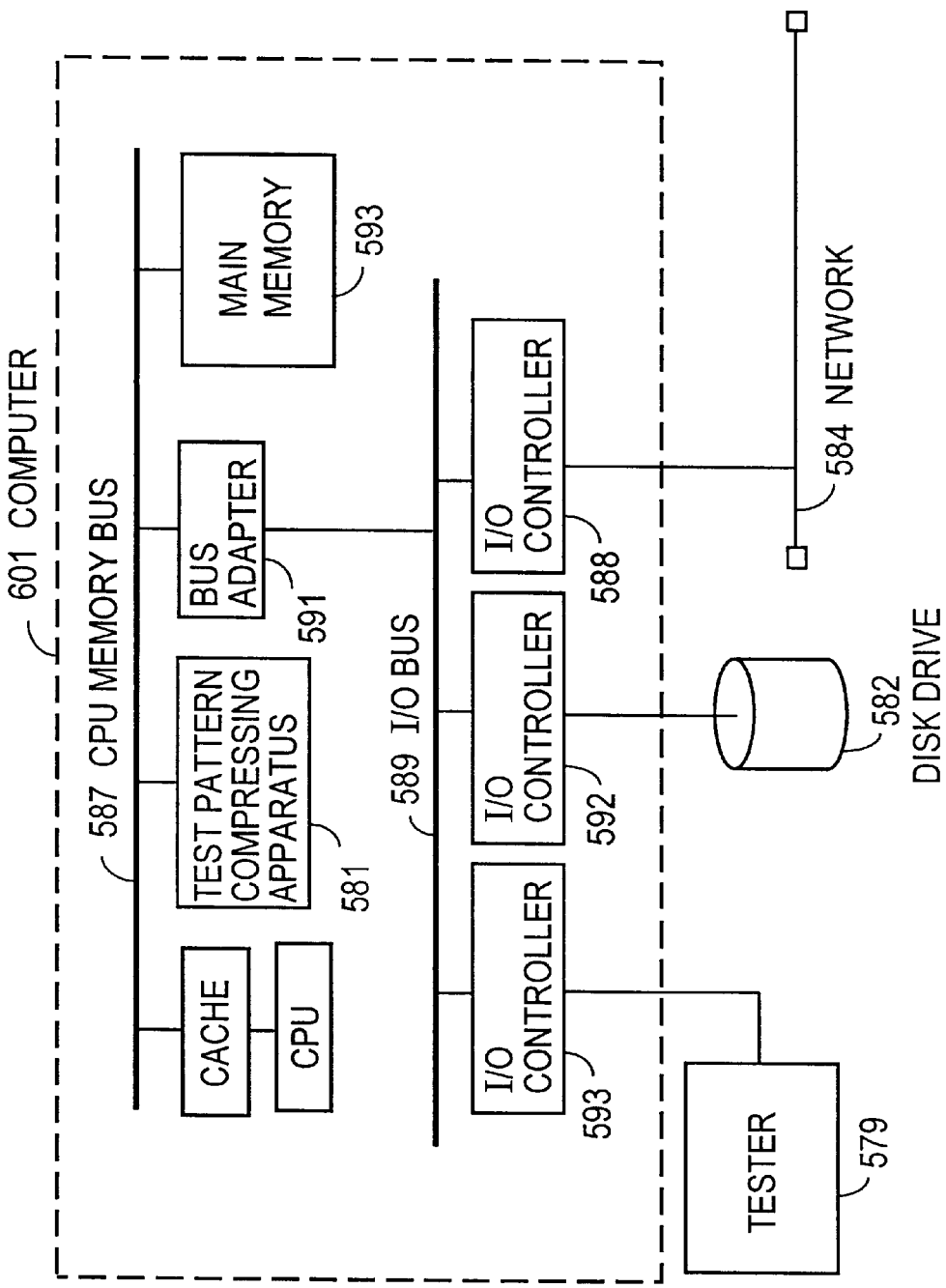
FIG. 112 is a block diagram showing still another construction of the automatic test system to which the present invention is applied for testing a semiconductor integrated circuit.

FIG. 112 is a block diagram showing a construction of a fifth embodiment of the automatic IC test system having the test pattern compressing apparatus according to the present invention. This system includes a test pattern compressing apparatus 581 connected to a CPU memory bus 587 of a computer 601. A test pattern transferred from another computer via a network 584 is sent to the test pattern compressing apparatus 581 via an I/O controller 588, an I/O bus 589, a bus adapter 591 and the CPU memory bus 587. The test pattern is compressed by the test pattern compressing apparatus 581 without any information loss and the compressed data is stored, via the CPU memory bus 587, the bus adapter 591, the I/O bus 589 and the I/O controller 592, in a disk drive 582 or in a disk drive of another computer connected to the network 584. In addition, if the test pattern resides in a main memory 593, the test pattern is sent to the test pattern compressing apparatus 581 via the CPU memory bus 587. The test pattern is compressed by the test pattern compressing apparatus 581 without any information loss and is stored, via the CPU memory bus 587, the bus adapter 591, the I/O bus 589 and the I/O controller 592, in the disk drive 582 or in a disk drive of another computer connected to the network 584.

The compressed data stored in the disk drive 582 is transferred to the main body of the tester 579 via the I/O controllers 592 and 593 and the I/O bus 589. The test pattern to be transferred is already compressed and requires an only short transfer time. Therefore, if the compressed data can be expanded at high speed in the main body of the tester 579, an availability of the test system can be improved.

Figure 113:
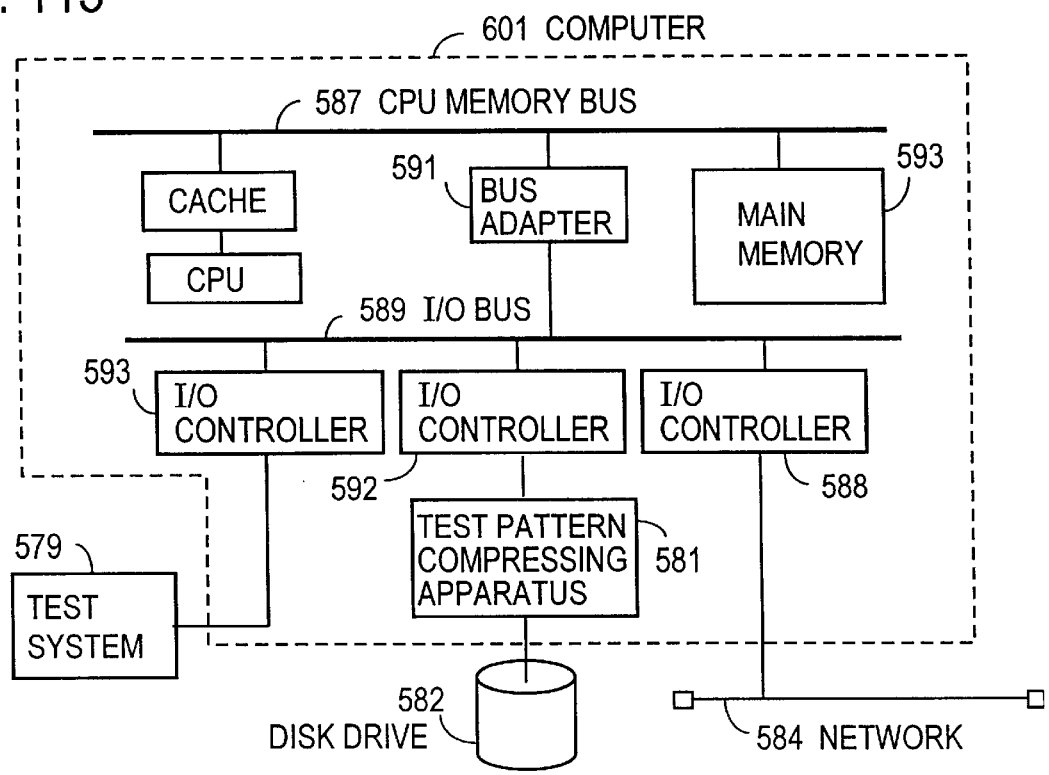
FIG. 113 is a block diagram showing still another construction of the automatic test system to which the present invention is applied for testing a semiconductor integrated circuit.

FIG. 113 is a block diagram showing a construction of a sixth embodiment of the automatic IC test system having the test pattern compressing apparatus according to the present invention. This system includes a test pattern compressing apparatus 581 disposed immediately before a disk drive 582. A test pattern transferred from another computer via a network 584 is sent to the test pattern compressing apparatus 581 via I/O controllers 588 and 592 and an I/O bus 589. Then the test pattern is compressed by the test pattern compressing apparatus 581 without any information loss and is stored in the disk drive 582. In addition, if the test pattern resides in a main memory 593, this test pattern is sent to the test pattern compressing apparatus 581 via the CPU memory bus 587, the bus adapter 591, the I/O bus 589 and the I/O controller 592. The test pattern is compressed by the test pattern compressing apparatus 581 without any information loss and the compressed data is stored in the disk drive 582. The compressed data stored in the disk drive 582 is transferred to the main body of the tester 579 via the I/O controller 592 and the I/O bus 589. The test pattern to be transferred is already compressed and requires an only short transfer time. Therefore, if the compressed data can be expanded at high speed in the test system, an availability of the test system can be improved.

In the case described above, the data compression is performed using the LZ compressing method when the compression rate is greater than the threshold value. However, there is no doubt that the other compressing methods such as the Huffman compressing method, the arithmetic coding compressing method or the like may be used.

According to the present invention, since each of received input data is distributed to one of a plurality of blocks in accordance with its data structure or its statistical characteristic and a proper compressing method is applied to each block, a data comprised of data having different data structures can efficiently be compressed.

In addition, according to the present invention, since an inputted test pattern data is divided into test sequences each being for each pin and a proper compressing method is applied to each test sequence, an efficient data compression of a test pattern data is made possible.

Figure 114:
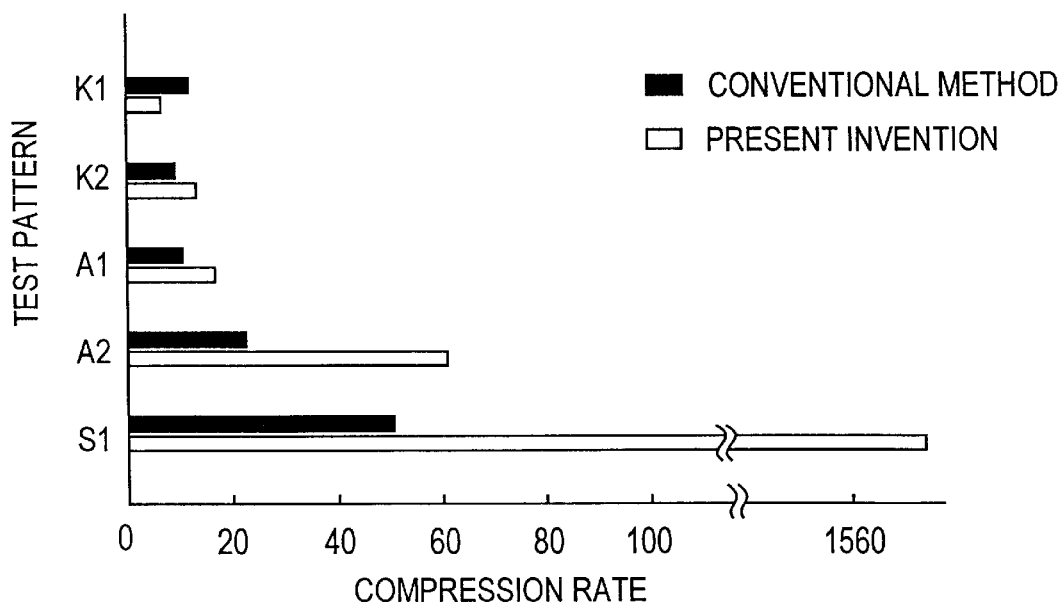
FIG. 114 is a graph showing effects to compression rates in the test pattern compressing apparatus according to the present invention.

FIG. 114 shows results of the compression rate measurements when test patterns being used in an actual device test are compressed using the test pattern compressing method and the test pattern compressing apparatus according to the present invention. As samples of the test patterns, five test patterns (test sequence length is 15000) are used. In the illustration, K1 and K2 are test patterns for a CISC microcomputer (100 pins), A1 and A2 are test patterns for a disk controller (144 pins) and S1 is a test pattern for a RISC microcomputer (144 pins). FIG. 114 shows the comparisons with LZW (a compressing method used in UNIX compress etc.) which is a most generally used compressing method. It is shown that the test pattern compressing method and the test pattern compressing apparatus of the present invention provide better compression rates except for the test pattern of K1. Particularly for the test pattern of S1, a compression rate of more than 1500:1 is obtained by the present invention.

In addition, by using the test pattern expanding apparatus of the present invention, a high speed data expansion is possible in the automatic test system for automatically testing a semiconductor integrated circuit. As a result, a time period required for down-loading a test pattern can be reduced.

Figure 115:
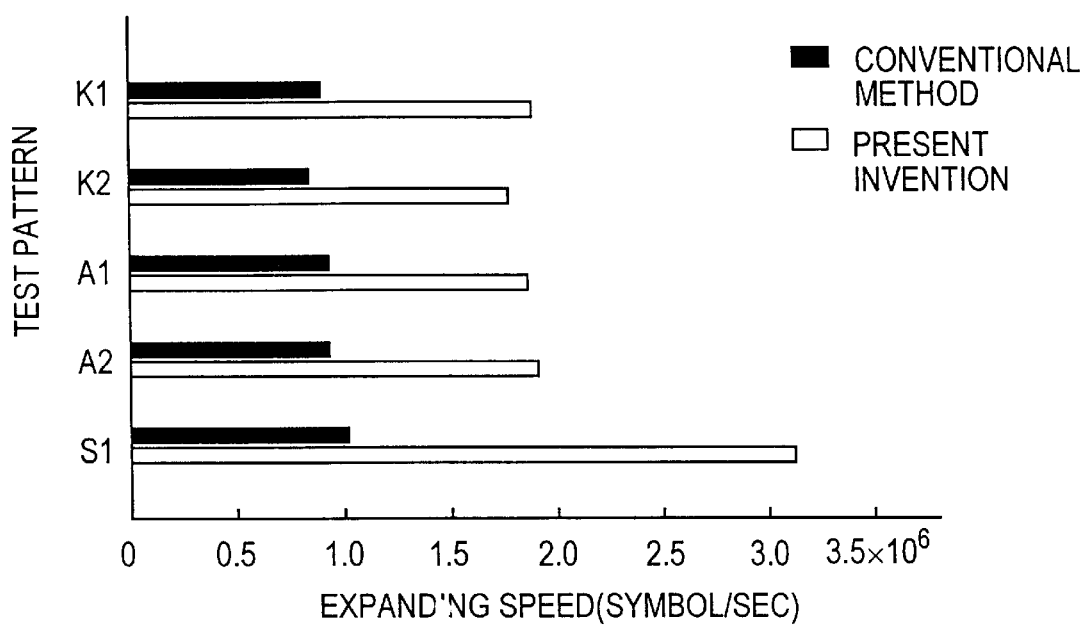
FIG. 115 is a graph showing effects to expanding speeds in the test pattern expanding apparatus according to the present invention.

FIG. 115 shows measurement results of expansion speeds of compressed data in the test pattern expanding apparatus of the present invention. There are shown in FIG. 115 comparisons between the expansion speeds in the test pattern expanding apparatus of the present invention and those similarly measured by the LZW compressing method. From this illustration, it can be seen that the test pattern expanding apparatus of the present invention can provide a data expansion speed approximately two times higher than the conventional LZW compressing method.

Figure 116:
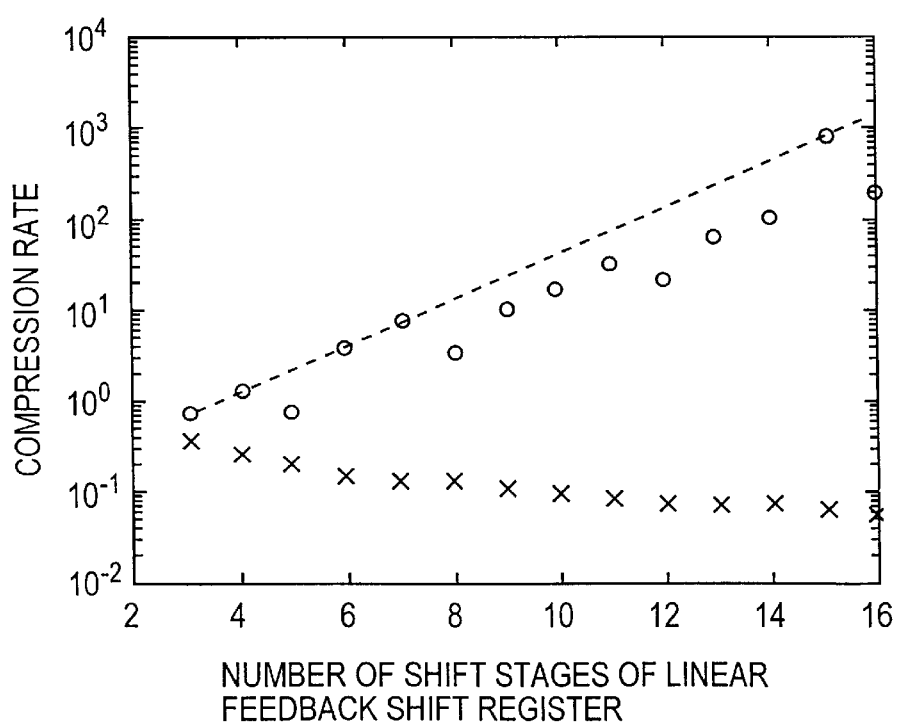
FIG. 116 is a graph showing effects to compression rates in the BWT run length compressing means according to the present invention.

The present invention can efficiently compress, using the BWT run length compressing apparatus, an M sequence (Maximum length sequence) which is one of Pseudorandom Noise sequences (PN sequences). FIG. 116 shows compression rate results when an M sequence is compressed using the BWT run length compressing apparatus. In the illustration, the results when BW transform is applied one time are indicated by a symbol x and the results when BW transform is applied two times are indicated by a symbol o. Further, a dashed line indicates the upper limit value of compression rate that can be obtained by the BWT run length compressing apparatus.

As shown in FIG. 116, by applying BW transform two times to an M sequence using the BWT run length compressing apparatus according to the present invention, a compression rate dose to the upper limit can be obtained. Further, the compression rate is improved as the number of stages of a Linear Feedback Shift Register (LFSR) that generates an M sequence is increased and a compression rate of approximately 700:1 is obtained at the maximum.

In such a way, a high compression rate can be obtained by applying, after BW transform is applied a plurality of times, the run length compressing method to a data.

What is claimed is:

1. A data compressing and expanding method for compressing an inputted data to a compressed data and for expanding the compressed data to an expanded data, wherein the inputted data has a uniform data type and is composed of a plurality of unit data sequences and the respective unit data sequences are different at least either in their data structures or statistical characteristics of data, said method including the steps of:

counting a number of data changes of each said divided unit data sequence as a factor of difference in the data structure;

measuring an appearing probability of each symbol in each said divided unit data sequence and calculating an entropy of the data as a factor of difference in the statistical characteristics of data based on measured result of the appearing probabilities of the symbols;

comparing the number of data changes with a threshold value of the number of data changes and also comparing the entropy of the data with the threshold value of entropy;

dividing the inputted data to the respective unit data sequences and distributing the respective divided unit data sequences in accordance with the comparison results to a plurality of compressing blocks;

compressing the respective divided unit data sequences distributed to said plurality of compressing blocks using different compressing methods which are each suitable for each block to thereby obtain a compressed data;

dividing the compressed data to respective compressed unit data sequences and distributing the thus divided respective compressed unit data sequences in accordance with their compressing methods used to a plurality of expanding blocks in accordance with difference in the compressing methods used; and expanding the respective compressed unit data sequences contained in each of said plurality of the expanding blocks by using a suitable one expanding method which is selected for each said expanding block from different expanding methods so as to correspond to the compressing method used to the compressed unit data sequence.

2. A data compressing and expanding method for compressing an inputted data to a compressed data and for expanding the compressed data to an expanded data, wherein the inputted data has a uniform data type and is composed of a plurality of unit data sequences and the respective unit data sequences are different at least either in their data structures or statistical characteristics of data, said method comprising the steps of:

(a) dividing the inputted data to the respective unit data sequences and selectively distributing the respective divided unit data sequences in accordance with difference in their data structure into a plurality of compressing blocks, wherein step (a) includes:

selectively distributing the respective divided unit data sequences in accordance with difference in their data structures into a plurality of blocks;

counting a number of data changes of each said divided unit data sequence as a factor of difference in the data structure; and comparing said counted number of data changes with a threshold value; and selectively distributing the respective divided unit data sequences to a plurality of blocks in accordance with the comparison result;

(b) compressing the respective divided unit data sequences distributed to said plurality of compressing blocks using different compressing methods which are each suitable for each block to thereby obtain a compressed data, wherein step (b) includes compressing the respective unit data sequences distributed into said plurality of blocks using different compressing methods each of which is suitable for each block;

(c) dividing the compressed data to respective compressed unit data sequences and distributing the thus divided respective compressed unit data sequences in accordance with their compressing methods used to a plurality of expanding blocks in accordance with difference in the compressing methods used; and (d) expanding the respective compressed unit data sequences contained in each of said plurality of the expanding blocks by using a suitable one expanding method which is selected for each said expanding block from different expanding methods so as to correspond to the compressing method used to the compressed unit data sequence.

3. The data compressing method according to claim 2, wherein said compressing step (b) includes the steps of:

applying a run length compressing method to a block in which the unit data sequences having the number of data changes less than the threshold value are contained, and applying another compressing method to another block in which the unit data sequences having the number of data changes greater than the threshold value are contained.

4. A data compressing and expanding method for compressing an inputted data to a compressed data and for expanding the compressed data to an expanded data, wherein the inputted data has a uniform data type and is composed of a plurality of unit data sequences and the respective unit data sequences are different at least either in their data structures or statistical characteristics of data, said method comprising the steps of:

(a) dividing the inputted data to the respective unit data sequences and selectively distributing the respective divided unit data sequences in accordance with difference in their data structure into a plurality of compressing blocks, wherein step (a) includes:

selectively distributing the respective divided unit data sequences in accordance with difference in their data structures into a plurality of blocks;

determining whether the periodicity of data of each said divided unit data sequence is larger than a threshold value; and distributing the respective unit data sequences to a plurality of blocks in accordance with the determination result, and (b) compressing the respective divided unit data sequences distributed to said plurality of compressing blocks using different compressing methods which are each suitable for each block to thereby obtain a compressed data, wherein step (b) includes compressing the respective unit data sequences distributed into said plurality of blocks using different compressing methods each of which is suitable for each block, applying Burrows Wheeler transform (hereinafter referred to as BW transform) to a block in which the unit data sequences having a large periodicity of data larger than the threshold value are contained, and applying a run length compressing method to data transformed by BW transform;

(c) dividing the compressed data to respective compressed unit data sequences and distributing the thus divided respective compressed unit data sequences in accordance with their compressing methods used to a plurality of expanding blocks in accordance with difference in the compressing methods used; and (d) expanding the respective compressed unit data sequences contained in each of said plurality of the expanding blocks by using a suitable one expanding method which is selected for each said expanding block from different expanding methods so as to correspond to the compressing method used to the compressed unit data sequence.

5. A data compressing and expanding method for compressing an inputted data to a compressed data and for expanding the compressed data to an expanded data, wherein the inputted data has a uniform data type and is composed of a plurality of unit data sequences and the respective unit data sequences are different at least either in their data structures or statistical characteristics of data, said method comprising the steps of:

(a) dividing the inputted data to the respective unit data sequences and selectively distributing the respective divided unit data sequences in accordance with difference in their data structure into a plurality of compressing blocks, wherein step (a) includes:

selectively distributing the respective divided unit data sequences in accordance with difference in their statistical characteristic of data into a plurality of blocks;

measuring an appearing probability of each symbol in each said unit data sequence and calculating an entropy of data from thus measured result;

comparing the entropy of the data with a threshold value; and selectively distributing the respective divided unit data sequences to a plurality of blocks in accordance with the comparison results;

(b) compressing the respective divided unit data sequences distributed to said plurality of compressing blocks using different compressing methods which are each suitable for each block to thereby obtain a compressed data, wherein step (b) includes compressing the respective unit data sequences distributed into said plurality of blocks using different compressing methods each of which is suitable for each block;

(c) dividing the compressed data to respective compressed unit data sequences and distributing the thus divided respective compressed unit data sequences in accordance with their compressing methods used to a plurality of expanding blocks in accordance with difference in the compressing methods used; and (d) expanding the respective compressed unit data sequences contained in each of said plurality of the expanding blocks by using a suitable one expanding method which is selected for each said expanding block from different expanding methods so as to correspond to the compressing method used to the compressed unit data sequence.

6. The data compressing method according to claim 5, wherein a Huffman compressing method is applied in said compressing step (b) to a block having an entropy less than the threshold value among the divided blocks.

7. The data compressing method according to claim 5, wherein
an LZ compressing method is applied in said compressing step (b) to a block having an entropy less than the threshold value.

8. The data compressing method according to claim 5, wherein an arithmetic coding compressing method is applied in said compressing step (b) to a block having an entropy less than the threshold value.

9. A data compressing and expanding method for compressing an inputted data to a compressed data and for expanding the compressed data to an expanded data, wherein the inputted data has a uniform data type and is composed of a plurality of unit data sequences and the respective unit data sequences are different at least either in their data structures or statistical characteristics of data, said method comprising the steps of:

(a) dividing the inputted data to the respective unit data sequences and distributing the respective divided unit data sequences in accordance with difference in their data structure to a plurality of compressing blocks, wherein step (a) includes:

counting a number of data changes of each said divided unit data sequence as a factor of difference in the data structure;

measuring an appearing probability of each symbol in each said divided unit data sequence;

calculating an entropy of the data based on measuring result of the appearing probabilities of the symbols;

comparing the number of data changes with a threshold value of the number of data changes and also comparing the entropy of the data with an entropy threshold value; and selectively distributing the respective divided unit data sequences in accordance with the comparison results to a plurality of blocks which include a first block for containing the unit data sequence having its number of data change equal to or less than the threshold value, a second block for containing the unit data sequence having its number of data change larger than the threshold value and its entropy of the data equal to or less than the entropy threshold value, and a third block for containing the unit data sequence having its number of data change larger than the threshold value and its entropy of the data larger than the entropy threshold value; and (b) compressing the respective divided unit data sequences distributed to said plurality of compressing blocks using different compressing methods which are each suitable for each block to thereby obtain a compressed data, wherein step (b) includes:

compressing the respective unit data sequences distributed into said plurality of blocks using different compressing methods each of which is suitable for each block;

(c) dividing the compressed data to respective compressed unit data sequences and distributing the thus divided respective compressed unit data sequences in accordance with their compressing methods used to a plurality of expanding blocks in accordance with difference in the compressing methods used; and (d) expanding the respective compressed unit data sequences contained in each of said plurality of the expanding blocks by using a suitable one expanding method which is selected for each said expanding block from different expanding methods so as to correspond to the compressing method used to the compressed unit data sequence.

10. The data compressing method according to claim 9, wherein said compressing step (b) includes the steps of,
applying a run length compressing method to the first block, and
applying the run length compressing method after performing BW transform at least one time to the second block.

11. The data compressing method according to any one of claims 2, 5 and 13, further including the steps of:
inputting environmental parameters; and
calculating the threshold values using the inputted environmental parameters.

12. The data compressing method according to any one of claims 2, 5 and 13, wherein
said dividing step (a) further includes the steps of:
calculating threshold values for respective possibly appearable unit data sequences;
estimating compression rates of the unit data sequences using the calculated threshold values;
optimizing the threshold value so as to maximize the compression rate; and
said compressing step (b) includes the steps of:
using the optimized threshold value.

13. A data compressing and expanding method for compressing an inputted data to a compressed data and for expanding the compressed data, to an expanded data wherein the inputted data has a uniform data type and is composed of a plurality of unit data sequences and the respective unit data sequences are different at least either in their data structures or statistical characteristics of data, said method comprising the steps of:

(a) dividing the inputted data to the respective unit data sequences and selectively distributing the respective divided unit data sequences in accordance with difference in their data structure into a plurality of compressing blocks, wherein step (a) includes:
selectively distributing the respective divided unit data sequences in accordance with difference in their data structures into a plurality of blocks;
applying BW transform to each the divided unit data sequence;
counting a number of data changes of each the unit data sequence transformed by BW transform;
calculating a compression rate from the number of data changes;
obtaining the maximum value of compression rate and the number of application times of BW transform when the maximum value of compression rate is obtained;
comparing the maximum value of compression rate with a threshold value of compression rate; and
selectively distributing the divided unit data sequences into a plurality of blocks in accordance with the comparison results;

(b) compressing the respective divided unit data sequences distributed to said plurality of compressing blocks using different compressing methods which are each suitable for each block to thereby obtain a compressed data, wherein step (b) includes compressing the respective unit data sequences distributed into said plurality of blocks using different compressing methods each of which is suitable for each block;

(c) dividing the compressed data to respective compressed unit data sequences and distributing the thus divided respective compressed unit data sequences in accordance with their compressing methods used to a plurality of expanding blocks in accordance with difference in the compressing methods used; and (d) expanding the respective compressed unit data sequences contained in each of said plurality of the expanding blocks by using a suitable one expanding method which is selected for each said expanding block from different expanding methods so as to correspond to the compressing method used to the compressed unit data sequence.

14. The data compressing method according to claim 13, wherein
said compressing step (b) comprises the steps of:
applying one of an LZ compressing method, a Huffman compressing method, and an arithmetic coding compressing method to a first block for containing the unit data sequence having compression rate equal to or greater than the threshold value; and
applying a run length compressing method to a second block for containing the unit data sequence having compression rate less than the threshold value after performing BW transform the number of times by which the maximum compression rate is obtained.

15. The data compressing method according to any one of claims 2 to 5 to 10, 13 and 14, wherein
the input data is test pattern which is applicable to a semiconductor integrated circuit for its testing, and
the unit data sequences are test sequences of the test pattern, each said test sequence being applicable to each pin of the semiconductor integrated circuit under test.

16. A data expanding method for expanding an inputted compressed data which has a uniform data type and is composed of a plurality of compressed unit data sequences, the respective compressed unit data sequences being compressed by different compressing methods according to difference at least either in their data structures or statistical characteristics of data, said method comprising the steps of:

(a) dividing the inputted compressed data into the respective compressed unit data sequences, which are in turn distributed to a plurality of blocks in accordance with their compressing methods used for compression of the respective compressed unit data sequences, so that each block contains the compressed unit data sequences compressed by the same compressing method which is different from that of the other block, wherein the inputted compressed data is divided into compressed unit data sequences directly compressed by a run length compressing method and compressed unit data sequences compressed by the run length compressing method after application of BW transform; and (b) expanding the compressed unit data sequences contained in the respective blocks by using different expanding methods each corresponding to the compressing method of each blocks, wherein the compressed unit data sequences directly compressed by the run length compressing method are expanded by the run length expanding method to be outputted, and the compressed unit data sequences compressed by the run length compressing method after application of BW transform are expanded by the run length expanding method and thereafter the expanded data are transformed by inverse BW transform to be outputted.

17. A data expanding method for expanding an inputted compressed data which has a uniform data type and is composed of a plurality of compressed unit data sequences, the respective compressed unit data sequences being compressed by different compressing methods according to difference at least either in their data structures or statistical characteristics of data, said method comprising the steps of:

(a) dividing the inputted compressed data into the respective compressed unit data sequences, which are in turn distributed to a plurality of blocks in accordance with their compressing methods used for compression of the respective compressed unit data sequences, so that each block contains the compressed unit data sequences compressed by the same compressing method which is different from that of the other block, wherein the inputted compressed data is a compressed data of a test pattern which is applicable to a semiconductor integrated circuit for its testing, and which is composed of a plurality of compressed test sequences, the respective test sequences being compressed by different compressing methods in accordance with difference at least either in their data structures or statistical characteristics of data and being applicable to respective pins of the semiconductor integrated circuit under test; and (b) expanding the compressed unit data sequences contained in the respective blocks by using different expanding methods each corresponding to the compressing method of each block, wherein the expanded unit data sequences are the expanded test sequences each correspondingly applicable to each said pin.

18. The data expanding method according to claim 17, wherein
said dividing step (a) comprises a step of dividing the inputted compressed data into compressed unit data sequences compressed by a run length compressing method and compressed unit data sequences compressed by the other compressing methods, and
wherein
the compressed unit data sequences compressed by the run length compressing method are expanded, in said expanding step (b), by a run length expanding method.

19. The data expanding method according to claim 17, wherein
in said dividing step (a), the inputted compressed data is divided into compressed unit data sequences directly compressed by a run length compressing method and compressed unit data sequences compressed by the run length compressing method after application of BW transform, and
wherein
in said expanding step (b), the compressed unit data sequences directly compressed by the run length compressing method are expanded by the run length expanding method to be outputted, and the compressed unit data sequences compressed by the run length compressing method after application of BW transform are expanded by the run length expanding method and thereafter the expanded data are transformed by inverse BW transform to be outputted.

20. The data expanding method according to 17, wherein
in said dividing step (a), if there are compressed unit data sequences compressed by an LZ compressing method in the inputted compressed data, those compressed unit data sequences are separated from the other compressed unit data sequences, and
wherein
in said expanding step (b), the compressed unit data sequences compressed by the LZ compressing method are expanded by an LZ expanding method.

21. The data expanding method according to claim 17, wherein
in said dividing step (a), the inputted compressed data is divided into compressed unit data sequences compressed by a Huffman compressing method and compressed unit data sequences compressed by the other compressing methods, and
wherein
in said expanding step (b), a Huffman expanding method is applied to the compressed unit data sequences compressed by the Huffman compressing method.

22. The data expanding method according to claim 17, wherein
in said dividing step (a), the inputted compressed data is divided into compressed unit data sequences compressed by an LZ compressing method and compressed unit data sequences compressed by the other compressing methods, and
wherein
in said expanding step (b), an LZ expanding method is applied to the compressed unit data sequences compressed by the LZ compressing method.

23. The data expanding method according to claim 17, wherein
in said dividing step (a), the inputted compressed data is divided into compressed unit data sequences compressed by an arithmetic coding compressing method and compressed unit data sequences compressed by the other compressing methods, and
wherein
in said expanding step (b), an arithmetic coding expanding method is applied to the compressed unit data sequences compressed by the arithmetic coding compressing method.

24. The data expanding method according to claim 17, wherein
in said dividing step (a), the inputted compressed data is divided into compressed unit data sequences directly compressed by a run length compressing method, compressed unit data sequences compressed by the run length compressing method after application of BW transform, and compressed unit data sequences compressed by the other compressing methods, and
wherein
in said expanding step (b), a run length expanding method is applied to the compressed unit data sequences directly compressed by the run length compressing method to output the expanded data, the run length expanding method is applied to the compressed unit data sequences compressed by the run length compressing method after application of BW transform and thereafter inverse BW transform is applied to the expanded data the number of times that BW transform was applied thereto at the compression time to output the expanded data, and an expanding method corresponding to one of the other compressing methods is applied to each of the compressed unit data sequences compressed by the other compressing methods to output the expanded data.

25. A test pattern compressing apparatus comprising
a plurality of compressing means each having a different compressing method from one another;
dividing means for dividing an inputted test pattern into test sequences each being for each of pins of an integrated circuit under test; and
compressing method determining means for selecting suitable compressing means out of a plurality of compressing means in accordance with a data structure of each test sequence to compress the corresponding test sequence in the basis of each pin.

26. The test pattern compressing apparatus according to claim 25, wherein said compressing method determining means and said set of the compressing means are provided for each pin of said integrated circuit under test, and said dividing means supplies each test sequence to compressing method determining means of a corresponding pin.

27. The test pattern compressing apparatus according to claim 25 or 26, wherein said set of the compressing means comprise run length compressing means for compressing a test sequence by a run length compressing method, BW transform means for applying BW transform at least one time to the test sequence, and BWT run length compressing means for supplying the transformed output of BW transform to said run length compressing means.

28. The test pattern compressing apparatus according to claim 22, wherein said set of the compressing means further comprise compressing means other than said run length compressing means and said BWT run length compressing means.

29. The test pattern compressing apparatus according to claim 22, wherein said compressing method determining means comprises:
BW transform optimizing means for calculating the appropriate number of application times for applying BW transform to the inputted test sequence;
threshold value storage means for storing a threshold value of compression rate;
compression rate comparator means for comparing maximum value of compression rate obtained from said BW transform optimizing means with the threshold value stored in said threshold value storage means; and
compressing method selecting means for selecting a compressing method to compress a test sequence in accordance with the comparison result obtained from said compression rate comparator means and the appropriate number of application times BW transform obtained from said BW transform optimizing means.

30. A test pattern compressing method including the steps of:
dividing an inputted test pattern into test sequences each being for each of pins of an integrated circuit under test; and
selecting an appropriate compressing method in accordance with a data structure of each divided test sequence to compress the test sequence in the basis of each pin.

31. A test pattern compressing method includes the steps of:
dividing an inputted test pattern into test sequences each being for each of pins of an integrated circuit under test; and
selecting appropriate compressing methods in parallel in accordance with respective data structures of the divided test sequences to compress the respective test sequences in the basis of respective pins.

32. The test pattern compressing method according to claim 30 or 31, further including the steps of:
determining an appropriate compressing method adaptive for an inputted test sequence; and
applying to the test sequence a run length compressing method or the run length compressing method after applying BW transform to the test sequence one or more times (hereinafter referred to as BWT run length compressing method), or one of the other compressing methods such as an LZ compressing method, a Huffman compressing method, an arithmetic coding compressing method to compress the test sequence.

33. The test pattern compressing method according to claim 32, further including the steps of:
applying BW transform to the test sequence;
measuring the number of data changes of the data transformed by BW transform;
calculating a compression rate from the number of data changes;
obtaining the maximum value of compression rate and the number of application times of BW transform for maximizing the compression rate;
comparing the maximum value of compression rate with a threshold value of compression rate; and
selecting in accordance with the comparison result whether the test sequence is to be compressed by the run length compressing method, the BWT run length compressing method, or one of the other compressing methods.

34. A test pattern expanding apparatus comprising:
compressed data dividing means for dividing an inputted data into compressed data each being for each pin of an integrated circuit under test; and
a plurality of test sequence expanding means each for selecting an expanding method in accordance with a flag indicating a compressing method to apply the expanding method to each compressed data.

35. The test pattern expanding apparatus according to claim 34, wherein
said plurality of test sequence expanding means are provided for each pin of the integrated circuit under test;
said compressed data dividing means supplies each of the divided compressed data to corresponding one of said test sequence expanding means; and
said plurality of test sequence expanding means operate in parallel.

36. The test pattern expanding apparatus according to claim 34 or 35, further including:
compressing method determining means for determining, by the flag of the compressed data, whether the compressing method is a run length compressing method, a BWT run length compressing method, or one of the other compressing methods;
run length expanding means for expanding the compressed data using the run length expanding method;
repetitive inverse BW transform means for applying inverse BW transform one or more times to a data expanded by said run length expanding apparatus, and
the other expanding means for expanding the compressed data using the other expanding methods.

37. A test pattern expanding method including the steps of:
dividing an inputted compressed data into compressed data each being for each pin of an integrated circuit under test; and expanding each divided compressed data by an expanding method corresponding to the compressing method specified by a flag of the compressed data.

38. A test pattern expanding method according to claim 37, wherein said expanding step is performed such that the compressed data are expanded in parallel in the basis of respective pins.

39. A The test pattern expanding method according to claim 37 or 38, wherein
the expanding method used in said expanding step is a run length expanding method or an expanding method in which inverse BW transform is applied to the data expanded by the run length expanding method.

40. The test pattern expanding method according to claim 39, wherein said expanding step further includes expanding method other than said run length expanding method and said expanding method in which inverse BW transform is applied to the data expanded by the run length expanding method.

41. A test pattern compressing and expanding apparatus comprising:
a plurality of compressing means each having a different compressing method from one another;
dividing means for dividing an inputted test pattern into test sequences each being for each of pins of an integrated circuit under test;
compressing method determining means for selecting suitable compressing means out of a plurality of compressing means in accordance with a data structure of each test sequence to compress the corresponding test sequence in the basis of a pin;
compressed data dividing means for dividing an inputted data into compressed data each being for each pin of an integrated circuit under test; and
a plurality of test sequence expanding means each for selecting an expanding method in accordance with a flag indicating a compressing method to apply the expanding method to the corresponding compressed data.

42. A test pattern compressing and expanding method including the steps of:
dividing an inputted test pattern into test sequences each being for each of pins of an integrated circuit under test;
selecting an appropriate compressing method in accordance with a data structure of each divided test sequence data to compress the test sequence in the basis of a pin;
dividing an inputted compressed data into compressed data each being for each pin of an integrated circuit under test; and
expanding each divided compressed data by an expanding method corresponding to the compressing method specified by a flag of the compressed data.

43. A test pattern compressing and expanding method including the steps of:
dividing an inputted test pattern into test sequences each being for each of pins of an integrated circuit under test;
selecting appropriate compressing methods in parallel in accordance with respective data structures of the divided test sequences to compress the respective test sequences in the basis of respective pins;
dividing an inputted compressed data into compressed data each being for each pin of an integrated circuit under test; and
expanding each divided compressed data by an expanding method corresponding to the compressing method specified by a flag of the compressed data.

44. An automatic semiconductor integrated circuit test system for automatically testing a semiconductor integrated circuit comprising:
a test pattern compressing apparatus recited in claim 25;
a large capacity storage apparatus for storing compressed test pattern data;
a pattern generator for storing the test pattern data and for generating a test pattern; and
test pattern expanding means for restoring a compressed test pattern data to an original test pattern without any information loss.

45. The automatic semiconductor integrated circuit test system according to claim 44, wherein said test pattern expanding means is comprised of a plurality of test sequence expanding means for restoring test sequence data each being compressed for each pin in parallel in the basis of respective pins.

46. An automatic semiconductor integrated circuit test system for automatically testing a semiconductor integrated circuit comprising:
means for compressing a test pattern;
a large capacity storage apparatus for storing compressed test pattern data;
a pattern generator for storing the test pattern data and for generating a test pattern; and
a test pattern compressing and expanding apparatus recited in claim 41.

47. The data compressing method according to claim 11, wherein
the inputted data is test pattern which is applicable to a semiconductor integrated circuit for its testing, and
the unit data sequences are test sequences of the test pattern, each said test sequence being applicable to each pin of the semiconductor integrated circuit under test.

48. The data compressing method according to claim 12, wherein
the inputted data is test pattern which is applicable to a semiconductor integrated circuit for its testing, and
the unit data sequences are test sequences of the test pattern, each said test sequence being applicable to each pin of the semiconductor integrated circuit under test.

49. The test pattern compressing apparatus according to claim 28, wherein said compressing method determining means comprises:
BW transform optimizing means for calculating the appropriate number of application times for applying BW transform to the inputted test sequence;
threshold value storage means for storing a threshold value of compression rate;
compression rate comparator means for comparing maximum value of compression rate obtained from said BW transform optimizing means with the threshold value stored in said threshold value storage means; and
compressing method selecting means for selecting a compressing method to compress a test sequence in accordance with the comparison result obtained from said compression rate comparator means and the appropriate number of application times BW transform obtained from said BW transform optimizing means.

50. A test pattern compressing apparatus comprising:
a plurality of compressing means each having a different compressing method from one another;
dividing means for dividing an inputted test pattern into test sequences each being for each of pins of an integrated circuit under test; and compressing method determining means for selecting suitable compressing means out of the plurality of compressing means in accordance with difference in statistical characteristics of data of each test sequence to compress the corresponding test sequence in the basis of each pin.

51. A data expanding method for expanding an inputted compressed data which has a uniform data type and is composed of a plurality of compressed unit data sequences, the respective compressed unit data sequences being compressed by different compressing methods according to difference at least either in their data structures or statistical characteristics of data, said method comprising the steps of:

(a) dividing the inputted compressed data into the respective compressed unit data sequences, which are in turn distributed to a plurality of blocks in accordance with their compressing methods used for compression of the respective compressed unit data sequences, so that each block contains the compressed unit data sequences compressed by the same compressing method which is different from that of the other block, wherein the inputted compressed data is divided into compressed unit data sequences directly compressed by a run length compressing method, compressed unit data sequences compressed by the run length compressing method after application of BW transform, and compressed unit data sequences compressed by the other compressing methods; and (b) expanding the compressed unit data sequences contained in the respective blocks by using different expanding methods each corresponding to the compressing method of each block, wherein a run length expanding method is applied to the compressed unit data sequences directly compressed by the run length compressing method to output the expanded data, the run length expanding method is applied to the compressed unit data sequences compressed by the run length compressing method after application of BW transform and thereafter inverse BW transform is applied to the expanded data the number of times that BW transform was applied thereto at the compression time to output the expanded data, and an expanding method corresponding to one of the other compressing methods is applied to each of the compressed unit data sequences compressed by the other compressing methods to output the expanded data.

52. A data compressing and expanding method for compressing an inputted data to a compressed data and for expanding the compressed data to an expanded data, wherein the inputted data has a uniform data type and is composed of a plurality of unit data sequences and the respective unit data sequences are different at least either in their data structures or statistical characteristics of data, said method comprising the steps of:

(a) dividing the inputted data to the respective unit data sequences and selectively distributing the respective divided unit data sequences in accordance with difference in their data structure into a plurality of compressing blocks, wherein step (a) includes selectively distributing the respective divided unit data sequences in accordance with difference in their data structures into plurality of blocks, wherein the inputted data is a test pattern which is applicable to a semiconductor integrated circuit for its testing, and the unit data sequences are test sequences of the test pattern, each said test sequence being applicable to each pin of the semiconductor integrated circuit under test;

(b) compressing the respective divided unit data sequences distributed to said plurality of compressing blocks using different compressing methods which are each suitable for each block to thereby obtain a compressed data, wherein step (b) includes compressing the respective unit data sequences distributed into said plurality of blocks using different compressing methods each of which is suitable for each block;

(c) dividing the compressed data to respective compressed unit data sequences and distributing the thus divided respective compressed unit data sequences in accordance with their compressing methods used to a plurality of expanding blocks in accordance with difference in the compressing methods used; and (d) expanding the respective compressed unit data sequences contained in each of said plurality of the expanding blocks by using a suitable one expanding method which is selected for each said expanding block from different expanding methods so as to correspond to the compressing method used to the compressed unit data sequence.

53. A data compressing and expanding method for compressing an inputted data to a compressed data and for expanding the compressed data to an expanded data, wherein the inputted data has a uniform data type and is composed of a plurality of unit data sequences and the respective unit data sequences are different at least either in their data structures or statistical characteristics of data, said method comprising the steps of:

(a) dividing the inputted data to the respective unit data sequences and selectively distributing the respective divided unit data sequences in accordance with difference in their data structure into a plurality of compressing blocks, wherein step (a) includes selectively distributing the respective divided unit data sequences in accordance with difference in their statistical characteristic of data into a plurality of blocks, wherein the inputted data is a test pattern which is applicable to a semiconductor integrated circuit for its testing, and the unit data sequences are test sequences of the test pattern, each said test sequence being applicable to each pin of the semiconductor integrated circuit under test; (b) compressing the respective divided unit data sequences distributed to said plurality of compressing blocks using different compressing methods which are each suitable for each block to thereby obtain a compressed data, wherein step (b) includes compressing the respective unit data sequences distributed into said plurality of blocks using different compressing methods each of which is suitable for each block;

(c) dividing the compressed data to respective compressed unit data sequences and distributing the thus divided respective compressed unit data sequences in accordance with their compressing methods used to a plurality of expanding blocks in accordance with difference in the compressing methods used; and (d) expanding the respective compressed unit data sequences contained in each of said plurality of the expanding blocks by using a suitable one expanding method which is selected for each said expanding block from different expanding methods so as to correspond to the compressing method used to the compressed unit data sequence.

\* \* \* \* \*